US007773537B2

(12) United States Patent
Geile et al.

(10) Patent No.: US 7,773,537 B2
(45) Date of Patent: *Aug. 10, 2010

(54) RANGING AND ROUND TRIP DELAY TIMING ADJUSTMENT IN A MULTI-POINT TO POINT BIDIRECTIONAL COMMUNICATION SYSTEM

(75) Inventors: Michael J. Geile, Loveland, OH (US); Jeffrey Brede, Eden Prairie, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/272,535

(22) Filed: Nov. 17, 2008

(65) Prior Publication Data

US 2009/0080505 A1 Mar. 26, 2009

Related U.S. Application Data

(60) Continuation of application No. 11/686,808, filed on Mar. 15, 2007, now Pat. No. 7,492,791, which is a continuation of application No. 11/420,851, filed on May 30, 2006, now Pat. No. 7,535,822, which is a division of application No. 09/903,273, filed on Jul. 11, 2001, now Pat. No. 7,069,577, which is a continuation of application No. 09/397,443, filed on Sep. 15, 1999, now Pat. No. 6,279,158, which is a division of application No. 08/673,002, filed on Jun. 28, 1996, now Pat. No. 6,334,219, which is a continuation-in-part of application No. 08/650,408, filed on May 20, 1996, now abandoned, and a continuation-in-part of application No. 08/457,295, filed on Jun. 1, 1995, now abandoned, and a continuation-in-part of application No. 08/457,317, filed on Jun. 1, 1995, now abandoned, and a continuation-in-part of application No. 08/384,659, filed on Feb. 6, 1995, now abandoned.

(51) Int. Cl.
*H04J 1/16* (2006.01)
*H04J 1/00* (2006.01)
*H04J 3/16* (2006.01)

(52) U.S. Cl. ....................... 370/252; 370/343; 370/465; 370/480

(58) Field of Classification Search ................. 370/252, 370/343, 465, 480
See application file for complete search history.

(56) References Cited

U.S. PATENT DOCUMENTS 3,539,924 A 11/1970 Daskalakis et al.

(Continued)

FOREIGN PATENT DOCUMENTS

CA 1204230 5/1986

(Continued)

OTHER PUBLICATIONS

Hara, Shinsuke, "Overview of Multicarrier CDMA", "IEEE Communications Magazine", Dec. 1997, pp. 126-133, Publisher: IEEE.

(Continued)

*Primary Examiner*—Kevin C Harper
(74) *Attorney, Agent, or Firm*—Fogg & Powers LLC

(57) ABSTRACT

Systems and methods for ranging adjustments are provided. In one embodiment, a remote service unit comprises: a transceiver communicatively coupled with a host in a multi-point to point configuration, the transceiver configured to communicate with the host via an OFDM waveform; and a multi-carrier modem coupled to the transceiver and configured to demodulate downstream information data from the OFDM waveform, the multi-carrier modem further configured to modulate upstream information data onto the OFDM waveform. The multi-carrier modem modulates upstream information data onto distinct subcarriers of the OFDM waveform, the multi-carrier modem synchronized with the host so that upstream OFDM signals transmitted by the transceiver and other upstream OFDM signals received at the host unit combine to a unified OFDM waveform. The multi-carrier modem adjusts a round trip path delay between the remote service unit and the host based on a path delay correction received from the host unit.

18 Claims, 108 Drawing Sheets

U.S. PATENT DOCUMENTS 3,609,328 A 9/1971 Kieburtz
3,628,057 A 12/1971 Mueller
3,639,838 A 2/1972 Kuhn et al.
3,700,820 A 10/1972 Blasbalg et al.
3,706,933 A 12/1972 Bidell et al.
3,742,145 A 6/1973 Clark et al.
3,750,022 A 7/1973 Curry et al.
3,750,175 A 7/1973 Lockerd et al.
3,780,230 A 12/1973 Bowen et al.
3,796,970 A 3/1974 Snell, Jr.
3,805,265 A 4/1974 Lester
3,838,343 A 9/1974 Yactor
3,868,605 A 2/1975 Poole
3,916,379 A 10/1975 Dulaney et al.
3,934,224 A 1/1976 Dulaney et al.
4,009,343 A 2/1977 Markey et al.
4,053,713 A 10/1977 Nitadori
4,090,220 A 5/1978 Gargini
4,092,596 A 5/1978 Dickinson et al.
4,101,738 A 7/1978 Bellanger et al.
4,105,863 A 8/1978 Kustka
4,107,470 A 8/1978 Maruta
4,135,202 A 1/1979 Cutler
4,156,847 A 5/1979 Tazawa et al.
4,161,786 A 7/1979 Hopkins et al.
4,185,168 A 1/1980 Graupe et al.
4,191,860 A 3/1980 Weber
4,206,320 A 6/1980 Keasler et al.
4,215,366 A 7/1980 Davidson
4,267,591 A 5/1981 Wissel et al.
4,275,452 A 6/1981 White
4,290,142 A 9/1981 Schnee et al.
4,291,403 A 9/1981 Waddill et al.
4,300,229 A 11/1981 Hirosaki
4,316,284 A 2/1982 Howson
4,316,285 A 2/1982 Bobilin et al.
4,331,974 A 5/1982 Cogswell et al.
4,343,042 A 8/1982 Schrock et al.
4,367,548 A 1/1983 Cotten, Jr. et al.
4,381,546 A 4/1983 Armstrong
4,387,456 A 6/1983 Creteau
4,393,493 A 7/1983 Edwards
4,395,768 A 7/1983 Goethals et al.
4,395,780 A 7/1983 Gohm et al.
4,397,020 A 8/1983 Howson
4,404,589 A 9/1983 Wright, Jr.
4,430,731 A 2/1984 Gimple et al.
4,438,511 A 3/1984 Baran
4,441,180 A 4/1984 Schussler
4,466,017 A 8/1984 Banker
4,472,802 A 9/1984 Pin et al.
4,475,211 A 10/1984 Mattis, Jr. et al.
4,484,218 A 11/1984 Boland et al.
4,488,004 A 12/1984 Bogart et al.
4,488,294 A 12/1984 Christensen et al.
4,491,983 A 1/1985 Pinnow et al.
4,494,228 A 1/1985 Gutleber
4,495,619 A 1/1985 Acampora
4,500,989 A 2/1985 Dahod
4,503,533 A 3/1985 Tobagi et al.
4,506,387 A 3/1985 Walter
4,512,033 A 4/1985 Schrock
4,516,170 A 5/1985 Skerlos
4,519,074 A 5/1985 Basile
4,528,656 A 7/1985 Morais
4,528,663 A 7/1985 Citta
4,533,948 A 8/1985 McNamara et al.
4,545,048 A 10/1985 Hauk et al.
4,558,358 A 12/1985 Onda
4,561,101 A 12/1985 Pinsard et al.
4,566,100 A 1/1986 Mizuno et al.
4,574,305 A 3/1986 Campbell et al.
4,575,682 A 3/1986 Aoyagi et al.
4,587,066 A 5/1986 Rodriguez
4,602,375 A 7/1986 Inukai
4,604,721 A 8/1986 Gray
4,604,745 A 8/1986 Takasaki et al.
4,612,626 A 9/1986 Marchant
4,613,975 A 9/1986 Aoyagi et al.
4,613,980 A 9/1986 Newlin et al.
4,617,656 A 10/1986 Kobayashi et al.
4,618,955 A 10/1986 Sharpe et al.
4,621,355 A 11/1986 Hirosaki et al.
4,623,920 A 11/1986 Dufresne et al.
4,642,688 A 2/1987 Lowry et al.
4,642,806 A 2/1987 Hewitt et al.
4,644,526 A 2/1987 Wu
4,644,535 A 2/1987 Johnson et al.
4,646,296 A 2/1987 Bartholet et al.
4,648,123 A 3/1987 Schrock
4,651,320 A 3/1987 Thapar
4,651,330 A 3/1987 Ballance
4,661,945 A 4/1987 Hirosaki
4,677,647 A 6/1987 Aoyagi
4,677,686 A 6/1987 Hustig et al.
4,679,227 A 7/1987 Hughes-Hartogs
4,686,667 A 8/1987 Ohnsorge
4,688,210 A 8/1987 Eizenhofer et al.
4,691,314 A 9/1987 Bergins et al.
4,701,911 A 10/1987 Ulug
4,705,350 A 11/1987 Cheng
4,707,832 A 11/1987 Glenn et al.
4,709,406 A 11/1987 Omoto
4,709,418 A 11/1987 Fox
4,710,918 A 12/1987 Miyao
4,710,924 A 12/1987 Chum
4,727,575 A 2/1988 Hansen et al.
4,731,816 A 3/1988 Hughes-Hartogs
4,734,764 A 3/1988 Pocock et al.
4,745,592 A 5/1988 Gabriagues
4,748,689 A 5/1988 Mohr
4,757,495 A 7/1988 Decker et al.
4,763,317 A 8/1988 Lehman et al.
4,768,188 A 8/1988 Barnhart et al.
4,769,761 A 9/1988 Downes et al.
4,773,066 A 9/1988 Kirkman
4,774,707 A 9/1988 Raychaudhuri
4,775,210 A 10/1988 Fioretti
4,783,779 A 11/1988 Takahata et al.
4,791,590 A 12/1988 Ku et al.
4,799,252 A 1/1989 Eizenhoffer et al.
4,800,588 A 1/1989 Poster, Jr.
4,807,259 A 2/1989 Yamanaka et al.
4,809,298 A 2/1989 Sakane et al.
4,821,120 A 4/1989 Tomlinson
4,827,473 A 5/1989 Tsuzuki et al.
4,847,872 A 7/1989 Hespelt et al.
4,847,880 A 7/1989 Kamerman et al.
4,853,686 A 8/1989 Kueng et al.
4,858,225 A 8/1989 deSantis
4,860,018 A 8/1989 Counselman, III
4,860,287 A 8/1989 Kelly
4,862,104 A 8/1989 Muratani et al.
4,866,732 A 9/1989 Carey et al.
4,868,811 A 9/1989 Suzuki
4,879,527 A 11/1989 Geile et al.
4,881,241 A 11/1989 Pommier et al.
4,881,243 A 11/1989 Whitt
4,891,694 A 1/1990 Way
4,907,233 A 3/1990 Deutsch et al.
4,912,705 A 3/1990 Paneth et al.
4,912,721 A 3/1990 Pidgeon, Jr. et al.
4,942,602 A 7/1990 Baker, Jr. et al.
4,943,980 A 7/1990 Dobson et al.

4,953,197 A 8/1990 Kaewell, Jr. et al.
4,959,862 A 9/1990 Davidov et al.
4,975,899 A 12/1990 Faulkner
4,975,916 A 12/1990 Miracle et al.
4,977,593 A 12/1990 Ballance
4,977,612 A 12/1990 Wilson
4,980,897 A 12/1990 Decker et al.
4,985,902 A 1/1991 Gurcan
4,991,133 A 2/1991 Davis et al.
4,996,706 A 2/1991 Cho
4,998,244 A 3/1991 Lee et al.
5,005,169 A 4/1991 Bronder et al.
5,005,183 A 4/1991 Carey et al.
5,010,586 A 4/1991 Mortimore et al.
5,014,267 A 5/1991 Tompkins et al.
5,022,024 A 6/1991 Paneth et al.
5,025,485 A 6/1991 Csongor et al.
5,027,426 A 6/1991 Chiocca, Jr.
5,029,164 A 7/1991 Goldstein et al.
5,038,342 A 8/1991 Crisler et al.
5,042,000 A 8/1991 Baldwin
5,054,050 A 10/1991 Burke et al.
5,058,133 A 10/1991 Duncanson et al.
5,063,574 A 11/1991 Moose
5,063,595 A 11/1991 Ballance
5,072,441 A 12/1991 Szware
5,073,899 A 12/1991 Collier et al.
5,084,903 A 1/1992 McNamara et al.
5,086,470 A 2/1992 Ballance
5,088,111 A 2/1992 McNamara et al.
5,091,906 A 2/1992 Reed et al.
5,095,482 A 3/1992 Grallert
5,101,290 A 3/1992 Eng et al.
RE33,900 E 4/1992 Howson
5,103,459 A 4/1992 Gilhousen et al.
5,111,460 A 5/1992 Botzenhardt et al.
5,111,497 A 5/1992 Bliven et al.
5,115,451 A 5/1992 Furlong
5,121,409 A 6/1992 Goss
5,124,980 A 6/1992 Maki
5,125,100 A 6/1992 Katznelson
5,128,625 A 7/1992 Yatsuzuka et al.
5,128,967 A 7/1992 Durkin et al.
5,134,464 A 7/1992 Basile et al.
5,136,411 A 8/1992 Paik et al.
5,138,635 A 8/1992 Ballance
5,142,532 A 8/1992 Adams
5,153,763 A 10/1992 Pidgeon
5,153,764 A 10/1992 Faulkner et al.
5,157,659 A 10/1992 Schenkel
5,166,924 A 11/1992 Moose
5,170,470 A 12/1992 Pindar et al.
5,173,899 A 12/1992 Ballance
5,175,817 A 12/1992 Adams et al.
5,175,867 A 12/1992 Wejke et al.
5,177,739 A 1/1993 Basnuevo et al.
5,181,106 A 1/1993 Sutherland
5,185,736 A 2/1993 Tyrrell et al.
5,185,738 A 2/1993 Kelly
5,185,742 A 2/1993 Bales et al.
5,191,459 A 3/1993 Thompson et al.
5,191,576 A 3/1993 Pommier et al.
5,193,103 A 3/1993 Singh et al.
5,193,109 A 3/1993 Chien-Yeh Lee
5,195,092 A 3/1993 Wilson et al.
5,197,061 A 3/1993 Halbert-Lassalle et al.
5,204,874 A 4/1993 Falconer et al.
5,206,886 A 4/1993 Bingham
5,208,812 A 5/1993 Dudek et al.
5,214,687 A 5/1993 Kansakoski et al.
5,216,696 A 6/1993 Poklemba
5,216,697 A 6/1993 Ohnuki
5,225,902 A 7/1993 McMullan, Jr.
5,226,081 A 7/1993 Hinokimoto
5,228,025 A 7/1993 Le Floch et al.
5,228,062 A 7/1993 Bingham
5,235,615 A 8/1993 Omura
5,235,619 A 8/1993 Beyers, II et al.
5,243,598 A 9/1993 Lee
5,245,459 A 9/1993 Faulkner et al.
5,249,305 A 9/1993 Wieczorek et al.
5,255,086 A 10/1993 McMullan, Jr. et al.
5,255,290 A 10/1993 Anvari
5,262,883 A 11/1993 Pidgeon
5,272,700 A 12/1993 Hansen et al.
5,274,629 A 12/1993 Helard et al.
5,276,703 A 1/1994 Budin et al.
5,278,889 A 1/1994 Papanicolaou et al.
5,280,630 A 1/1994 Wang
5,282,023 A 1/1994 Scarpa
5,282,222 A 1/1994 Fattouche et al.
5,283,811 A 2/1994 Chennakeshu et al.
5,285,474 A 2/1994 Chow et al.
5,289,474 A 2/1994 Purcell et al.
5,291,289 A 3/1994 Hulyalkar et al.
5,293,329 A 3/1994 Wishart et al.
5,293,382 A 3/1994 Carson et al.
5,297,136 A 3/1994 Soprano et al.
5,297,186 A 3/1994 Dong
5,299,192 A 3/1994 Guo et al.
5,299,201 A 3/1994 Carusone, Jr. et al.
5,303,229 A 4/1994 Withers et al.
5,307,376 A 4/1994 Castelain et al.
5,313,169 A 5/1994 Fouche et al.
5,313,413 A 5/1994 Bhatia et al.
5,315,583 A 5/1994 Murphy et al.
5,315,584 A 5/1994 Savary et al.
5,317,596 A 5/1994 Ho et al.
5,321,542 A 6/1994 Freitas et al.
5,323,391 A 6/1994 Harrison
5,327,455 A 7/1994 De Gaudenzi et al.
5,327,575 A 7/1994 Menich et al.
5,329,552 A 7/1994 de Couasnon et al.
5,331,642 A 7/1994 Valley et al.
5,337,175 A 8/1994 Ohnsorge et al.
5,341,365 A 8/1994 Clarke
5,343,209 A 8/1994 Sennott et al.
5,343,499 A 8/1994 Jasper et al.
5,345,439 A 9/1994 Marston
5,345,440 A 9/1994 Gledhill et al.
5,347,304 A 9/1994 Moura et al.
5,347,632 A 9/1994 Filepp et al.
5,349,580 A 9/1994 Hester et al.
5,351,245 A 9/1994 Pregont et al.
5,353,307 A 10/1994 Lester et al.
5,355,114 A 10/1994 Sutterlin et al.
5,355,401 A 10/1994 Skinner, Sr.
5,357,249 A 10/1994 Azaren et al.
5,357,502 A 10/1994 Castelain et al.
5,365,525 A 11/1994 Newberg et al.
5,371,548 A 12/1994 Williams
5,371,696 A 12/1994 Sundararajan et al.
5,371,761 A 12/1994 Daffara et al.
5,371,780 A 12/1994 Amitay
5,373,502 A 12/1994 Turban
5,375,140 A 12/1994 Bustamante et al.
5,381,459 A 1/1995 Lappington
5,387,941 A 2/1995 Montgomery et al.
5,390,216 A 2/1995 Bilitza et al.
5,400,322 A 3/1995 Hunt et al.
5,406,551 A 4/1995 Saito et al.
5,408,260 A 4/1995 Arnon
5,408,465 A 4/1995 Gusella et al.
5,408,681 A 4/1995 Ressler et al.
5,416,767 A 5/1995 Koppelaar et al.
5,416,801 A 5/1995 Chouly et al.

5,420,851 A 5/1995 Seshadri et al.
5,423,067 A 6/1995 Manabe
5,425,027 A 6/1995 Baran
5,425,050 A 6/1995 Schreiber et al.
5,430,799 A 7/1995 Katznelson
5,440,268 A 8/1995 Taga et al.
5,440,335 A 8/1995 Beveridge
5,444,697 A 8/1995 Leung et al.
5,446,727 A 8/1995 Bruckert et al.
5,446,918 A 8/1995 Lamy
5,448,750 A 9/1995 Eriksson et al.
5,454,037 A 9/1995 Pacella
5,455,547 A 10/1995 Lin et al.
5,467,384 A 11/1995 Skinner, Sr.
5,469,468 A 11/1995 Schilling
5,469,495 A 11/1995 Beveridge
5,471,464 A 11/1995 Ikeda
5,471,474 A 11/1995 Grobicki et al.
5,479,168 A 12/1995 Johnson et al.
5,479,447 A 12/1995 Chow et al.
5,483,529 A 1/1996 Baggen et al.
5,483,550 A 1/1996 Hulbert
5,485,630 A 1/1996 Lee et al.
5,487,066 A 1/1996 McNamara et al.
5,488,412 A 1/1996 Majeti et al.
5,488,413 A 1/1996 Elder et al.
5,488,632 A 1/1996 Mason et al.
5,495,283 A 2/1996 Cowe
5,499,047 A 3/1996 Terry et al.
5,499,236 A 3/1996 Giallorenzi et al.
5,499,241 A 3/1996 Thompson et al.
5,499,273 A 3/1996 Kull et al.
5,504,773 A 4/1996 Padovani et al.
5,504,775 A 4/1996 Chouly et al.
5,507,034 A 4/1996 Bodin et al.
5,509,003 A 4/1996 Snijders et al.
5,512,937 A 4/1996 Beierle
5,513,184 A 4/1996 Vannucci
5,513,248 A 4/1996 Evans et al.
5,519,706 A 5/1996 Bantz et al.
5,519,731 A 5/1996 Cioffi
5,519,830 A 5/1996 Opoczynski
5,521,943 A 5/1996 Dambacher
5,526,348 A 6/1996 Ichiyoshi
5,528,283 A 6/1996 Burton
5,528,582 A 6/1996 Bodeep et al.
5,528,585 A 6/1996 Cooley et al.
5,528,621 A 6/1996 Heiman et al.
5,533,008 A 7/1996 Grube et al.
5,533,012 A 7/1996 Fukasawa et al.
5,534,913 A 7/1996 Majeti et al.
5,535,206 A 7/1996 Bestler et al.
5,537,414 A 7/1996 Takiyasu et al.
5,537,443 A 7/1996 Yoshino et al.
5,541,955 A 7/1996 Jacobsmeyer
5,541,965 A 7/1996 Daffara
5,546,119 A 8/1996 Bestler et al.
5,546,383 A 8/1996 Cooley et al.
5,548,582 A 8/1996 Brajal et al.
5,550,812 A 8/1996 Philips
5,553,064 A 9/1996 Paff et al.
5,553,076 A 9/1996 Behtash et al.
5,557,612 A 9/1996 Bingham
5,557,639 A 9/1996 Heikkila et al.
5,559,795 A 9/1996 Ahl
5,559,833 A 9/1996 Hayet
5,559,858 A 9/1996 Beveridge
5,570,364 A 10/1996 Bar-David
5,576,702 A 11/1996 Samoylenko
5,579,321 A 11/1996 Van Grinsven et al.
5,581,554 A 12/1996 Van Driel et al.
5,581,555 A 12/1996 Dubberly et al.
5,584,051 A 12/1996 Goken
5,586,121 A 12/1996 Moura et al.
5,588,022 A 12/1996 Dapper et al.
5,588,413 A 12/1996 Stone et al.
5,590,403 A 12/1996 Cameron et al.
5,592,470 A 1/1997 Rudrapatna et al.
5,592,540 A 1/1997 Beveridge
5,594,726 A 1/1997 Thompson et al.
5,596,604 A 1/1997 Cioffi et al.
5,600,672 A 2/1997 Oshima et al.
5,600,754 A 2/1997 Gardner et al.
5,602,836 A 2/1997 Papadopoulos et al.
5,603,081 A 2/1997 Raith et al.
5,606,576 A 2/1997 Dapper et al.
5,606,725 A 2/1997 Hart
5,608,764 A 3/1997 Sugita et al.
5,610,944 A 3/1997 Mau et al.
5,613,193 A 3/1997 Ishikawa et al.
5,617,148 A 4/1997 Montgomery
5,619,504 A 4/1997 Van Grinsven et al.
5,621,753 A 4/1997 Weber
5,625,651 A 4/1997 Cioffi
5,627,863 A 5/1997 Aslanis et al.
5,631,846 A 5/1997 Szurkowski
5,636,246 A 6/1997 Tzannes et al.
5,644,573 A 7/1997 Bingham et al.
5,646,935 A 7/1997 Ishikawa et al.
5,650,997 A 7/1997 Yang et al.
5,652,772 A 7/1997 Isaksson et al.
5,655,068 A 8/1997 Opoczynski
5,659,351 A 8/1997 Huber
5,666,293 A 9/1997 Metz et al.
5,673,252 A 9/1997 Johnson et al.
5,673,291 A 9/1997 Dent
5,673,292 A 9/1997 Carlin
5,680,388 A 10/1997 Kahre
5,694,389 A 12/1997 Seki et al.
5,699,365 A 12/1997 Klayman et al.
5,703,873 A 12/1997 Ojanpera et al.
5,715,242 A 2/1998 Ortel et al.
5,719,872 A 2/1998 Dubberly et al.
5,726,973 A 3/1998 Isaksson
5,732,068 A 3/1998 Takahashi et al.
5,745,837 A 4/1998 Fuhrmann
5,748,677 A 5/1998 Kumar
5,751,766 A 5/1998 Kletsky et al.
5,754,650 A 5/1998 Katznelson
5,764,706 A 6/1998 Carlin et al.
5,765,097 A 6/1998 Dail
5,768,269 A 6/1998 Rakib et al.
5,768,309 A 6/1998 Olafsson
5,771,449 A 6/1998 Blasing et al.
5,774,689 A 6/1998 Curtis et al.
5,784,363 A 7/1998 Engstrom et al.
5,784,597 A 7/1998 Chiu et al.
5,784,683 A 7/1998 Sistanizadeh et al.
5,787,483 A 7/1998 Jam et al.
5,790,607 A 8/1998 Burke et al.
5,793,759 A 8/1998 Rakib et al.
5,793,772 A 8/1998 Burke et al.
5,794,119 A 8/1998 Evans et al.
5,802,044 A 9/1998 Baum et al.
5,802,117 A 9/1998 Ghosh
5,802,173 A 9/1998 Hamilton-Piercy et al.
5,802,241 A 9/1998 Oshima
5,802,278 A 9/1998 Isfeld et al.
5,809,431 A 9/1998 Bustamante et al.
5,815,488 A 9/1998 Williams et al.
5,815,794 A 9/1998 Williams
5,828,660 A 10/1998 Baum et al.
5,838,799 A 11/1998 Cioffi et al.
5,852,604 A 12/1998 Cooley et al.
5,859,876 A 1/1999 Dapper et al.
5,864,621 A 1/1999 Katznelson

| | | | |
|---|---|---|---|
| 5,867,489 | A | 2/1999 | Hershey et al. |
| 5,867,764 | A | 2/1999 | Williams |
| 5,878,325 | A | 3/1999 | Dail |
| 5,896,382 | A | 4/1999 | Davis et al. |
| 5,898,732 | A | 4/1999 | Dapper et al. |
| 5,903,546 | A | 5/1999 | Ikeda et al. |
| 5,907,586 | A | 5/1999 | Katsuragawa et al. |
| 5,909,436 | A | 6/1999 | Engstrom et al. |
| 5,910,970 | A | 6/1999 | Lu |
| 5,933,454 | A | 8/1999 | Cioffi |
| 5,943,361 | A | 8/1999 | Gilhousen et al. |
| 5,946,322 | A | 8/1999 | Moura et al. |
| 5,956,338 | A | 9/1999 | Ghaibeh |
| 5,959,660 | A | 9/1999 | Levan |
| 5,963,557 | A | 10/1999 | Eng |
| 5,966,376 | A | 10/1999 | Rakib et al. |
| 5,969,584 | A | 10/1999 | Huang et al. |
| 5,987,014 | A | 11/1999 | Magill et al. |
| 5,987,061 | A | 11/1999 | Chen |
| 5,991,308 | A | 11/1999 | Fuhrmann et al. |
| 5,995,539 | A | 11/1999 | Miller |
| RE36,430 | E | 12/1999 | Halbert-Lassalle et al. |
| 5,999,970 | A | 12/1999 | Krisbergh et al. |
| 6,002,722 | A | 12/1999 | Wu |
| 6,005,861 | A | 12/1999 | Humpleman |
| 6,011,950 | A | 1/2000 | Young |
| 6,018,528 | A | 1/2000 | Gitlin et al. |
| 6,021,158 | A | 2/2000 | Schurr et al. |
| 6,021,423 | A | 2/2000 | Nag et al. |
| 6,028,933 | A | 2/2000 | Heer et al. |
| 6,038,251 | A | 3/2000 | Chen |
| 6,041,051 | A | 3/2000 | Doshi et al. |
| 6,041,056 | A | 3/2000 | Bigham et al. |
| 6,044,107 | A | 3/2000 | Gatherer et al. |
| 6,055,242 | A | 4/2000 | Doshi et al. |
| 6,055,268 | A | 4/2000 | Timm et al. |
| 6,058,307 | A | 5/2000 | Garner |
| 6,064,662 | A | 5/2000 | Gitlin et al. |
| 6,075,787 | A | 6/2000 | Bobeck et al. |
| 6,075,972 | A | 6/2000 | Laubach et al. |
| 6,091,932 | A | 7/2000 | Langlais |
| 6,097,736 | A | 8/2000 | Proctor et al. |
| 6,125,139 | A | 9/2000 | Hendrickson et al. |
| 6,128,276 | A | 10/2000 | Agee |
| 6,141,546 | A | 10/2000 | Thomas et al. |
| 6,157,669 | A | 12/2000 | Kotzin |
| 6,201,796 | B1 | 3/2001 | Agazzi et al. |
| 6,208,630 | B1 | 3/2001 | Cooley et al. |
| 6,212,225 | B1 | 4/2001 | Agazzi |
| 6,219,840 | B1 | 4/2001 | Corrigan et al. |
| 6,243,369 | B1 | 6/2001 | Grimwood et al. |
| 6,275,990 | B1 | 8/2001 | Dapper et al. |
| 6,279,158 | B1 | 8/2001 | Geile et al. |
| 6,282,683 | B1 | 8/2001 | Dapper et al. |
| 6,292,651 | B1 | 9/2001 | Dapper et al. |
| 6,307,868 | B1 | 10/2001 | Rakib et al. |
| 6,330,241 | B1 | 12/2001 | Fort |
| 6,334,219 | B1 | 12/2001 | Hill et al. |
| 6,336,201 | B1 | 1/2002 | Geile et al. |
| 6,349,138 | B1 | 2/2002 | Doshi et al. |
| 6,356,555 | B1 | 3/2002 | Rakib et al. |
| 6,366,585 | B1 | 4/2002 | Dapper et al. |
| 6,415,133 | B1 | 7/2002 | Brede et al. |
| 6,418,558 | B1 | 7/2002 | Roberts et al. |
| 6,426,983 | B1 | 7/2002 | Rakib et al. |
| 6,430,417 | B1 | 8/2002 | Raith et al. |
| 6,434,583 | B1 | 8/2002 | Dapper et al. |
| 6,467,092 | B1 | 10/2002 | Geile et al. |
| 6,477,354 | B1 | 11/2002 | Roberts et al. |
| 6,487,258 | B1 | 11/2002 | Jedwab et al. |
| 6,487,405 | B1 | 11/2002 | Dapper |
| 6,496,488 | B1 | 12/2002 | Cooley et al. |
| 6,496,982 | B1 | 12/2002 | Johansson et al. |
| 6,510,229 | B1 | 1/2003 | Geile |
| 6,512,737 | B1 | 1/2003 | Agee |
| 6,535,715 | B2 | 3/2003 | Dapper et al. |
| 6,577,642 | B1 | 6/2003 | Fijolek et al. |
| 6,594,322 | B2 | 7/2003 | Dapper et al. |
| 6,603,822 | B2 | 8/2003 | Brede et al. |
| 6,606,351 | B1 | 8/2003 | Dapper et al. |
| 6,608,835 | B2 | 8/2003 | Geile et al. |
| 6,662,367 | B2 | 12/2003 | Dapper et al. |
| 6,792,038 | B2 | 9/2004 | Agazzi |
| 6,819,709 | B1 | 11/2004 | Agazzi et al. |
| 6,937,617 | B2 | 8/2005 | Rakib et al. |
| 7,002,898 | B1 | 2/2006 | Lou |
| 7,068,678 | B2 | 6/2006 | Cioffi et al. |
| 7,069,577 | B2 | 6/2006 | Geile et al. |
| 7,071,994 | B2 | 7/2006 | Harris et al. |
| 7,079,549 | B2 | 7/2006 | Cioffi et al. |
| 7,123,592 | B2 | 10/2006 | Geile et al. |
| 7,280,564 | B1 | 10/2007 | Geile et al. |
| 7,310,522 | B2 | 12/2007 | Geile |
| 7,352,690 | B2 | 4/2008 | Geile et al. |
| 7,352,779 | B2 | 4/2008 | Geile et al. |
| 7,355,963 | B2 | 4/2008 | Geile et al. |
| 7,355,964 | B2 | 4/2008 | Geile et al. |
| 7,372,859 | B2 | 5/2008 | Hall et al. |
| 7,385,916 | B2 | 6/2008 | Geile et al. |
| 7,391,711 | B2 | 6/2008 | Geile et al. |
| 7,391,712 | B2 | 6/2008 | Geile et al. |
| 7,394,753 | B2 | 7/2008 | Geile |
| 7,400,572 | B2 | 7/2008 | Geile et al. |
| 7,408,873 | B2 | 8/2008 | Geile et al. |
| 7,414,960 | B2 | 8/2008 | Geile et al. |
| 7,414,961 | B2 | 8/2008 | Geile et al. |
| 7,417,944 | B2 | 8/2008 | Geile |
| 7,420,913 | B2 | 9/2008 | Geile et al. |
| 7,420,914 | B2 | 9/2008 | Geile et al. |
| 7,426,177 | B2 | 9/2008 | Geile et al. |
| 7,436,812 | B2 | 10/2008 | Geile |
| 7,440,391 | B2 | 10/2008 | Geile et al. |
| 7,443,784 | B2 | 10/2008 | Geile et al. |
| 7,492,791 | B2 * | 2/2009 | Geile et al. ................. 370/480 |
| 7,539,126 | B2 * | 5/2009 | Geile et al. ................. 370/208 |
| 2001/0001616 | A1 | 5/2001 | Rakib et al. |
| 2001/0024474 | A1 | 9/2001 | Rakib et al. |
| 2001/0032334 | A1 | 10/2001 | Dapper et al. |
| 2001/0033611 | A1 | 10/2001 | Grimwood et al. |
| 2001/0050926 | A1 | 12/2001 | Kumar |
| 2001/0055319 | A1 | 12/2001 | Quigley et al. |
| 2002/0012421 | A1 | 1/2002 | Geile et al. |
| 2002/0015423 | A1 | 2/2002 | Rakib et al. |
| 2002/0015477 | A1 | 2/2002 | Geile et al. |
| 2002/0061012 | A1 | 5/2002 | Thi et al. |
| 2002/0090909 | A1 | 7/2002 | Dapper et al. |
| 2002/0098795 | A1 | 7/2002 | Brede et al. |
| 2002/0098796 | A1 | 7/2002 | Dapper et al. |
| 2002/0098797 | A1 | 7/2002 | Brede et al. |
| 2002/0098798 | A1 | 7/2002 | Solum et al. |
| 2002/0102937 | A1 | 8/2002 | Dapper et al. |
| 2002/0105950 | A1 | 8/2002 | Dapper et al. |
| 2002/0106060 | A1 | 8/2002 | Dapper et al. |
| 2002/0107979 | A1 | 8/2002 | Sarnikowski et al. |
| 2002/0116719 | A1 | 8/2002 | Dapper et al. |
| 2003/0026282 | A1 | 2/2003 | Gross et al. |
| 2003/0032390 | A1 | 2/2003 | Geile et al. |
| 2003/0043928 | A1 | 3/2003 | Ling et al. |
| 2003/0123384 | A1 | 7/2003 | Agee |
| 2004/0012387 | A1 | 1/2004 | Shattil |
| 2004/0042387 | A1 | 3/2004 | Geile |
| 2005/0122218 | A1 | 6/2005 | Goggin |
| 2007/0053465 | A1 | 3/2007 | Koo et al. |
| 2007/0076589 | A1 | 4/2007 | Stopler et al. |
| 2007/0098047 | A1 | 5/2007 | Iida |
| 2007/0110096 | A1 | 5/2007 | Geile et al. |

| | | | |
|---|---|---|---|
| 2007/0110220 | A1 | 5/2007 | Geile et al. |
| 2007/0115803 | A1 | 5/2007 | Geile et al. |
| 2007/0116209 | A1 | 5/2007 | Geile et al. |
| 2007/0121546 | A1 | 5/2007 | Zuckerman et al. |
| 2007/0121573 | A1 | 5/2007 | Zuckerman et al. |
| 2007/0121743 | A1 | 5/2007 | Zuckerman et al. |
| 2007/0121744 | A1 | 5/2007 | Zuckerman et al. |
| 2007/0121745 | A1 | 5/2007 | Zuckerman et al. |
| 2007/0141997 | A1 | 6/2007 | Wulff et al. |
| 2007/0147229 | A1 | 6/2007 | Geile et al. |
| 2007/0157277 | A1 | 7/2007 | Geile |
| 2007/0157278 | A1 | 7/2007 | Geile et al. |
| 2007/0162943 | A1 | 7/2007 | Geile et al. |
| 2007/0174890 | A1 | 7/2007 | Geile et al. |
| 2007/0183591 | A1 | 8/2007 | Geile et al. |
| 2007/0186260 | A1 | 8/2007 | Geile et al. |
| 2007/0186261 | A1 | 8/2007 | Geile et al. |
| 2007/0192815 | A1 | 8/2007 | Geile et al. |
| 2007/0195687 | A1 | 8/2007 | Geile et al. |
| 2007/0195689 | A1 | 8/2007 | Dapper et al. |
| 2007/0195902 | A1 | 8/2007 | Geile et al. |
| 2007/0201345 | A1 | 8/2007 | Geile et al. |
| 2007/0201346 | A1 | 8/2007 | Geile et al. |
| 2007/0201347 | A1 | 8/2007 | Geile |
| 2007/0201348 | A1 | 8/2007 | Geile et al. |
| 2007/0201573 | A1 | 8/2007 | Geile et al. |
| 2007/0201628 | A1 | 8/2007 | Geile et al. |
| 2007/0204317 | A1 | 8/2007 | Geile et al. |
| 2007/0206491 | A1 | 9/2007 | Geile et al. |
| 2007/0206693 | A1 | 9/2007 | Geile et al. |
| 2007/0211617 | A1 | 9/2007 | Geile et al. |
| 2007/0217324 | A1 | 9/2007 | Geile et al. |
| 2007/0217325 | A1 | 9/2007 | Geile et al. |
| 2007/0223363 | A1 | 9/2007 | Geile |
| 2007/0230325 | A1 | 10/2007 | Geile |
| 2007/0237070 | A1 | 10/2007 | Geile et al. |
| 2007/0237182 | A1 | 10/2007 | Geile et al. |
| 2007/0242597 | A1 | 10/2007 | Geile et al. |
| 2007/0253500 | A1 | 11/2007 | Dapper et al. |
| 2007/0263665 | A1 | 11/2007 | Dapper et al. |
| 2007/0274200 | A1 | 11/2007 | Geile et al. |
| 2007/0274202 | A1 | 11/2007 | Geile et al. |
| 2007/0280099 | A1 | 12/2007 | Geile et al. |
| 2007/0286240 | A1 | 12/2007 | Geile |
| 2008/0025201 | A1 | 1/2008 | Geile et al. |
| 2008/0025202 | A1 | 1/2008 | Geile et al. |
| 2008/0025284 | A1 | 1/2008 | Geile et al. |
| 2008/0031127 | A1 | 2/2008 | Geile |
| 2008/0037414 | A1 | 2/2008 | Geile et al. |
| 2008/0037415 | A1 | 2/2008 | Geile et al. |
| 2008/0037663 | A1 | 2/2008 | Geile |
| 2008/0040763 | A1 | 2/2008 | Geile et al. |
| 2008/0043612 | A1 | 2/2008 | Geile et al. |
| 2008/0043704 | A1 | 2/2008 | Geile |
| 2008/0049599 | A1 | 2/2008 | Dapper et al. |
| 2008/0049604 | A1 | 2/2008 | Dapper et al. |
| 2008/0049856 | A1 | 2/2008 | Dapper et al. |
| 2008/0049860 | A1 | 2/2008 | Dapper et al. |
| 2008/0056119 | A1 | 3/2008 | Dapper et al. |
| 2008/0056398 | A1 | 3/2008 | Dapper et al. |
| 2008/0063010 | A1 | 3/2008 | Dapper et al. |
| 2008/0082598 | A1 | 4/2008 | Dapper et al. |
| 2008/0123514 | A1 | 5/2008 | Geile et al. |
| 2008/0225690 | A1 | 9/2008 | Dapper et al. |
| 2008/0225691 | A1 | 9/2008 | Dapper et al. |
| 2008/0225692 | A1 | 9/2008 | Dapper et al. |
| 2008/0240214 | A1 | 10/2008 | Dapper et al. |
| 2008/0240410 | A1 | 10/2008 | Dapper et al. |
| 2008/0253435 | A1 | 10/2008 | Dapper et al. |
| 2008/0273607 | A1 | 11/2008 | Geile et al. |

FOREIGN PATENT DOCUMENTS

| | | |
|---|---|---|
| CA | 2051252 | 3/1992 |
| DE | 3311386 | 10/1984 |
| DE | 3403206 | 8/1985 |
| DE | 4019725 | 1/1992 |
| DE | 4019726 | 1/1992 |
| DE | 4125075 | 3/1992 |
| EP | 0080782 | 6/1983 |
| EP | 0118763 | 9/1984 |
| EP | 0131662 | 1/1985 |
| EP | 0162994 | 12/1985 |
| EP | 0269001 | 6/1988 |
| EP | 0282298 | 9/1988 |
| EP | 0308150 | 3/1989 |
| EP | 0318331 | 5/1989 |
| EP | 0318332 | 5/1989 |
| EP | 0318333 | 5/1989 |
| EP | 0325331 | 7/1989 |
| EP | 0329023 | 8/1989 |
| EP | 0382431 | 8/1990 |
| EP | 0392723 | 10/1990 |
| EP | 0399611 | 11/1990 |
| EP | 0411597 | 2/1991 |
| EP | 0421602 | 4/1991 |
| EP | 0425732 | 5/1991 |
| EP | 0462495 | 12/1991 |
| EP | 0472824 | 3/1992 |
| EP | 0493287 | 7/1992 |
| EP | 0498369 | 8/1992 |
| EP | 0499065 | 8/1992 |
| EP | 0507379 | 10/1992 |
| EP | 0521315 | 1/1993 |
| EP | 0578313 | 1/1994 |
| EP | 0580216 | 1/1994 |
| EP | 0584820 | 3/1994 |
| EP | 0595710 | 5/1994 |
| EP | 0599515 | 6/1994 |
| EP | 0599632 | 6/1994 |
| EP | 0613266 | 8/1994 |
| EP | 0618692 | 10/1994 |
| EP | 0630133 | 12/1994 |
| EP | 0637181 | 2/1995 |
| EP | 0647043 | 4/1995 |
| EP | 0669749 | 8/1995 |
| EP | 0673131 | 9/1995 |
| EP | 0689313 | 12/1995 |
| EP | 0695054 | 1/1996 |
| EP | 0730357 | 9/1996 |
| EP | 0735733 | 10/1996 |
| GB | 2253770 | 9/1992 |
| GB | 2254984 | 10/1992 |
| GB | 2266433 | 10/1993 |
| JP | 57107646 | 7/1982 |
| JP | 5963833 | 4/1984 |
| JP | 61111036 | 5/1986 |
| JP | 1256833 | 10/1989 |
| JP | 1319319 | 12/1989 |
| JP | 2104049 | 4/1990 |
| JP | 04025246 | 1/1992 |
| JP | 4156735 | 5/1992 |
| JP | 5002038 | 1/1993 |
| JP | 5030085 | 2/1993 |
| JP | 5083218 | 4/1993 |
| JP | 5122700 | 5/1993 |
| JP | 5145525 | 6/1993 |
| JP | 5167632 | 7/1993 |
| JP | 5207466 | 8/1993 |
| JP | 6338091 | 12/1994 |
| JP | 11177550 | 7/1999 |
| SE | 9203384 | 10/1993 |
| WO | WO-8805233 | 7/1988 |
| WO | WO-8809093 | 11/1988 |

| | | |
|---|---|---|
| WO | WO-8905070 | 6/1989 |
| WO | WO-8905077 | 6/1989 |
| WO | WO-9014733 | 11/1990 |
| WO | WO-9014734 | 11/1990 |
| WO | WO-9108623 | 6/1991 |
| WO | WO-9109478 | 6/1991 |
| WO | WO-9111867 | 8/1991 |
| WO | WO-9115925 | 10/1991 |
| WO | WO-9207431 | 4/1992 |
| WO | WO-9207432 | 4/1992 |
| WO | WO-9216063 | 9/1992 |
| WO | WO-9218940 | 10/1992 |
| WO | WO-9300751 | 1/1993 |
| WO | WO-9300760 | 1/1993 |
| WO | WO-9311616 | 6/1993 |
| WO | WO-9407314 | 3/1994 |
| WO | WO-9411961 | 5/1994 |
| WO | WO-9429978 | 12/1994 |
| WO | WO-9429983 | 12/1994 |
| WO | WO-9503656 | 2/1995 |
| WO | WO-9508228 | 3/1995 |
| WO | WO-9508894 | 3/1995 |
| WO | WO-9513579 | 5/1995 |
| WO | WO-9527352 | 10/1995 |
| WO | WO-9534149 | 12/1995 |
| WO | WO-9534168 | 12/1995 |
| WO | WO-9610303 | 4/1996 |
| WO | WO-9617455 | 6/1996 |
| WO | WO-9624989 | 8/1996 |
| WO | WO-9624995 | 8/1996 |
| WO | WO-9637062 | 11/1996 |
| WO | WO-9748197 | 12/1997 |

OTHER PUBLICATIONS

Sari et al., "Orthogonal Frequency-Divisional Multiple Access and Its Application to CATV Networks", "European Transations on Telecommunications", Nov. 1998, pp. 507-516, vol. 9, No. 6, Publisher: AEI, Published in: Italy.

Sari et al., "Orthogonal Frequency-Divison Multiple Access for the Return Channel on CATV Networks", "Proceeding of the International Conference Telecommunications", Apr. 1996, pp. 602-607, Published in: Turkey.

ADC Telecommunications Network Configuration, Advertising Literature, 1995, p. 1, Publisher: ADC Telecommunications Inc.

Aikawa, Performance Fo Trellis Coded 256 QZM Super Multicarrier Modem Using VLSIs For SDH Interface Outage Free Digital Microwav, IEEE Transactions on Communication, Feb. 1994, pp. 1415-1421, vol. 24, No. 2-3-4, Publisher: IEEE.

Chow et al., A Multicarrier E1-HDSL Transceiver System With Coded Modulation, May 1993-Jun. 1993, pp. 257-266, vol. 4, No. 3, Publisher: ETT.

Andres, Oss, A Must For Fiber to the Curb TE & M, Jul. 15, 1990, pp. 1-3.

Automatic Protection Switching (APS), TR-TSY-000253-5. 3, Sep. 1989, pp. 5.4-5.6, 9.1, No. 1.

Baggett, Cost Factors Relative to the Fiberoptic Backbone System, 1988 NCTA Technical Papers, 1988, pp. 102-106, Publisher: NCTA.

Barsellotti et al., Overcoming problems in the CATV Return Path With OFDM, http://www.catv.org/modem/technical/ofdm.html, May 9, 2000, pp 1-10, Publisher: Cable Modem University.

Barsellotti et al., Paddling Upstream—Overcoming Problems in the CATV Return Path, International TV Symposium, Jun. 1995, pp. 738-750, No. 19.

Bernier, Rochester Tel Taps ADC for Video Trial, Telephony, May 31,1993, pp. 8, 10.

Bickers et al., Plans for the Bishops Stortford (UK) Fibre to the Home Trials, British Telecom Research Laboratories, 1990, pp. 203.1.1-203.1.5 Publisher: IEEE.

Bingham, Multicarrier Modulation for Data Transmission—An Idea Whose Time Has Com, IEEE Communications Magazine, May 28, 1990, pp. 5-12, No. 5, Publisher: IEEE.

Carroll, Development of Integrated Cable-Telephony in the United Kingdom, IEEE Communications Magazine, Aug. 1995, pp. 48-50, 55-60, No. 33, Publisher: IEEE.

Chamberlin, British Telecom PLC (BT)-BT Fulcrun TPON Advanced Demonstrator (AD) System Description and Specification, Apr. 1990, pp. 1-8, Publisher: Fulcrum.

Chase et al., Spread Spectrum Multiple Access Performance of Orthogonal Codes in Fading Multipath Channels, Military Communication Conference, 1988, pp. 143-147, vol. 1, Publisher: IEEE.

Chiddix et al., Fiber Backbone—A Proposal for an Evolutionary CATV Network Architecture, 1988 NCTA Technical Papers, 1988, pp. 73-82.

Chiddix, Optical Fiber Super Trunking, the Time Has Come, a Performance Report on a Real-World System, NCTA Technical Papers, 1986, pp. 82-93, Publisher: NCTA.

Chiddix, Fiber Optic Technology for CATV Supertrunk Applications, 1985 NCTA Technical Papers, 1985, pp. 157-165, Publisher: NCTA.

Chiddix et al., Introduction of Optical Fiber Transmission Technology into Existing Cable Television Networks and its Impact on the , IEEE Transactions on Consumer Electronics, May 1989, pp. 51-62, vol. 35, No. 2, Publisher: IEEE.

Chow et al., A Discrete Multitone Transceiver System for HDSL Applications, IEEE Journal on Selected Areas in Communications, Aug. 1991, pp. 895-908, vol. 9, No. 6, Publisher: IEEE.

Chow et al., Equalizer Training Algorithms for Multicarrier Modulation Systems, 1993, pp. 761-765, Publisher: IEEE.

Cimini, Analysis and Simulation of a Digital Mobile Channel Using Orthogonal Frequency Division Multiplexing, IEEE Transactions on Communications, Jul. 1985, pp. 665-675, vol. 33, No. 7, Publisher: IEEE, Published in: New York, US.

Cioffi et al., A Data-Driven Multitone Echo Canceller, Globecom '91, 1991, pp. 57-61, Publisher: IEEE.

Citta et al., Performance History in Two-Way Cable Plants Utilizing a PSK Communication System, 1987 NCTA Technical Papers, 1987, pp. 251-260, Publisher: NCTA.

Clarke et al., The Design of a TDMA System for Passive Optical Networks, Conference Record, 1990 IEEE International Conference on Communications , 1990, pp. 654-658, vol. 2, Publisher: IEEE.

Combined Use of Collision-Resolution and Collision-Avoidance Media-Access Communcation Protocols, IBM Technical Disclosure Bulletin, Oct. 1994, pp. 299-301, No. 37, Publisher: IBM.

Cook et al., Low-Cost Digital Passive Optical Networks, IEEE International Conference on Communications, 1990, pp. 659-662, vol. 2, Publisher: IEEE.

Debot, An Example of a Multi-Resolution Digital Terrestrial TV Modem, Conference Proceedings, 1993 IEEE International Conference on Communications, May 23-26, 1993, pp. 1785-1790, vol. 3, Publisher: IEEE, Published in: Geneva, Switzerland.

Engstrom et al., A System for Test of Multiaccess Methods Based on OFDM, Conference Proceedings, 1994 IEEE 44th Vehicular Technology Conference, Jun. 8-10, 1994, pp. 1843-1845, vol. 3, Publisher: IEEE, Published in: Stockholm, Sweden.
Siala et al., Equalization for Orthogonal Frequency Division Multiplexing System, 1993, pp. 649-652, Publisher: IEEE, Published in: New York, NY.
Huckett et al. , Fehlernalyse BEI Digitalen Ubertragungssystemen: Error Anyalysis in Digital Transmission, May 7, 1982, pp. 51-58, Publisher: Elektronik.
Faulkner, Broadband Passive Optical Network Evolution, Conference Proceedings, Broadband '89, 1989, pp. 202-204.
Faulkner et al., Digital CATV Via Passive Optical Networks, Conference Proceedings, EFOC-LAN 88, 1988, pp. 127-130.
Fiber Optics Seminar, Conference Record, Society of Cable Television Engineers, Orlando, FL, Jan. 18, 1988, pp. 1-6, Publisher: Society of Cable Television Engineers.
Fliege, Orthogonal Multiple Carrier Data Transmission, European Transactions on Telecommunications and Related Technologies, May-Jun. 1992, pp. 255-264.
Fox et al., Star-Structure Optical Local Networks, British Telecommunications Technology Journal, Apr. 1989, pp. 76-88, vol. 7, No. 2, Publisher: FULCRUM.
Foxton et al., Optically Coupled Remote Multiplexers, British Telecommunications Technology Journal, Apr. 1989, pp. 55-64, vol. 7, No. 2, Publisher: FULCRUM.
Garbanati, Economic Analysis of Telecommunications Loop Architectures, Conferene Record, Electronicast Conference on Fiber Optics, Beyond the Year 2000, Jun. 11, 1987.
Gawdun, Lightwave Systems in the Subscriber Loop, Telecommunications, May, 1987, pp. 65-85, vol. 21.
Golasa et al., Performance Monitoring for Ditial Radio, Conference Proceedings, 1981 IEEE International Conference on Communications, Jun. 14-18, 1981, vol. 2, No. 35.4.1-35.4.3, Publisher: IEEE, Published in : Denver, CO.
Goldberg, Brains and Bandwidth: Fiber Service at Copper Prices, Electronic Design, Oct. 2, 1995, pp. 51-60, No. 43.
Greethouse, Raynet, BT Team to Seek RHC Home-Fiber Sales, BOC Week—Executive Briefings on the Bell Operating Companies-Regional Holding Companies, Apr. 16, 1990, pp. 1-2, vol. 7, No. 15, Publisher: Telecom Publishing Group, Published in: Alexandria, VA.
Grover et al., Design and Characterization of an Erroer-Correcting Code for the Sonet STS-1 Tributary, IEEE Transactions on Communications, Apr. 1990, pp. 467-476, vol. 38, No. 4, Publisher: IEEE.
Hara, Conceptual Design of a Switched Television-Distribution System Using Optical-Fiber Waveguides, IEEE Transactions on Cable Television, Jul. 1977, pp. 120-130, vol. CATV-2, No. 3, Publisher: IEEE.
Higgins, The Discrete Fourier Transform and the Fast Fourier Transform Algorithm, Analog Devices Digital Signal Processing in VLSI, 1990, pp. 117-173, No. 3.
Hightower, Economic Fo System for New Residential Services, Telephony, Mar. 17, 1986, pp. 44-56.
Hirosaki et al., A 19.2 KBPS Voiceband Data Modem Based on Orhtogonally Multiplexed QAM Techniques, C & C Systems Research Laboratories-Transmission Division- NEC Corporation, 1985, pp. 661-665, Publisher: IEEE.
Hirosaki et al., Advanced Groupband Data Modem Using Orthogonally Multiplexed QAM Technique, IEEE Transactions on Communications, Jun. 1986, pp. 587-592, vol. 34, Publisher: IEEE.
Hirosaki et al., An Orthogonally Multiplexed QAM Syystem Using the Discrete Fourier Transform, IEEE Transactions on Communications, Jul. 1981, pp. 982-989, vol. 29, Publisher: IEEE.
Homeworx Fiber in the Loop System, Product Brochure, Mar. 1992, pp. 1-7, Publisher: ADC Telecommunications, Published in: Minneapolis, MN.
Homeworx Fiber in the Loop System, Product Brochure, Jun. 1992, pp. 1-3, Publisher: ADC Telecommunications Inc., Published in: Minneapolis, MN.
Hoppitt et al., The Provision of Telephony Over Passive Optical Networks, British Telecommunications Technology Journal, Apr. 1989, pp. 100-114, vol. 7, No. 2.
Horden, an FFT Algorithm for MCS-96 Products Including Supporting Routines and Examples, Intel Imbedded Applications, Intel Corporations, Application Note AP-275, Oct. 1988, pp. 6-103-6-178, Publisher: Intel Corporations.
Huckett et al., Error Performance Analysis of Digital Transmission Systems Telecommunications Measurements, Analysis and Instrumentation, 1987, pp. 136-151, Publisher: Prentice-Hall, Inc., Published in: New Jersey.
Part 5—Media Access Control (MAC) Bridging of Ethernet V2.0 in Local Area Networks, IEEE Standards 802.1H, Aug. 12, 1997, Publisher: IEEE, Published in; New York, NY.
Recommended Practice for Media Access Control (MAX) Bridging of Ethernet V2.0 in IEEE 802 Local Area Networks, IEEE Standards for Local and Metropolital Area Networks, 1995, pp. 1-18, Publisher: IEEE.
Secure Data Exchange (SDE) Sublayer Management (Subclause 2.8) and Recommended Practice for SDE on Ethernet V2.0 in IEEE, IEEE Standards for Local and Metropolitan Area Networks: Supplements to Standard for Interoperable Lan-Man Security (SILS), 1992, pp. 1-40, Publisher: IEEE.
Saito et al., Improvements in TDMA Circuit Switching Services on a Tree-Shaped Broadband Network, Electronics and Communications in Japan Part I: Communications, Jul. 1992, pp. 1-11, vol. 75, No. 7, Publisher: Scripta Technica, Inc.
Ishio et al., A Two-Way Wavelength-Division-Multiplexing Transmission and its Application to a Switched TV Distribution System, Conference Record, Fourth European Conference on Optical Communication, Sep. 12, 1978, pp. 645-665, Publisher: IIC.
Ju, Algorithm of Defining 1-D Indexing for M-D Mixed Radix Implementation, IEEE Pacific Rim Conference on Communications, Computers and Signal Processing, May 19, 1993, pp. 484-488, vol. 2, Publisher: IEEE.
Kim, Voice Follows Video CED: Communications Engineering and Design, Jun. 1993, pp. 67-68, Publisher: Horizons.
Kim, Hierarchical Wideband Multicarrier CDMA Systems, Vehicular Technology Conference, IEEE VTS 543th, Oct. 7, 2001, pp. 1843-1847, Publisher: IEEE.
Knowles, VLSI Architecture for the Discrete Wavelet Transform, Electronic Letters, Jul. 19, 1990, pp. 1184-1185, vol. 26, No. 15.
Kreidl, British Fiber Loop Trial to Deliver Telephone Service, Lightwave, Jun. 1989, p. 10, No. 12.
Litwin, an Intorduction to Multicarrier Modulation, IEEE Potentials, Apr. 2000, pp. 36-38, vol. 19, No. 2, Publisher: IEEE.
Luff, the Broward Cable Area Network Fiber Model, Communication Engineering and Design, Feb. 1989, pp. 28-42.
Luikuo et al., A 500 MOPS DSP Chip Set, Electronic Engineering, Jun. 1988, pp. 109-113, vol. 60, No. 738, Published in: Woolwich, London.
Maney, Cable, Phone Firms Wrangle Over Future, USA Today, Feb. 11, 1993, pp. 1B-2B.

Maney, Phone, Cable Deals let U.S. Test Future, USA Today, Jun. 28, 1993, pp. 1B-2B.
Mesiya, a Passive Optical-Coax Hybrid Network Architecture for Delivery of CATV, Telephony and Data Services, Proceedings From Eleven Technical Sessions, 42nd Annual Convention and Exposition of the NCTA, Jun. 6, 1993, pp. 358-364, Publisher: NCTA.
Reiners et al., Multicarrier Transmission Technique in Cellular Mobile Communications Systems, Aug. 6, 1994, pp. 1645-1649, Publisher: IEEE, Published in: New York, NY.
Sistanizadeh et al., Multi-Tone Transmission for Asymmetric Digital Subscriber Lines (ADSL), 1993, pp. 756-760, Publisher: IEEE, Published in: New York, NY.
Nakamura et al., 256 QAM Modem for Multicarrier 400 Mbit-s Digital Radio, IEEE Journal on Selected Areas in Communicaitons, Apr. 1987, pp. 329-335, vol. SAC-5, No. 3, Publisher: IEEE.
Narayan et al., Noise Detected, Fractionally Spaced Equalization for Analog Cellular Data Modems, IEEE Transactions on Communications, Feb.-Mar.-Apr. 1994, pp. 1270-1276, vol. 42, No. 2-3-4, Publisher: IEEE.
Newcombe et al., Error Rate Monitoring for Digital Communications, Proceedings of the IEEE, Aug. 1982, pp. 805-828, vol. 70, No. 8, Publisher: IEEE, Published in: New York, NY.
Oakley, Passive Optical Networks: the Low Cost Road to the Future, Broadband '89, 1989, pp. 313-318.
Oakley, Fibre to the Home—The Passive Bus Way, Product Literature, British Telecom Network Systems Engineering and Technology, 1988, pp. 1-20.
OFDM: An Alternative Digital Modulation Scheme, 1993, pp. 3-6, Publisher: Cable Television Laboratories, Inc.
Omaha Selected for Broadband Roll-Out, US West Today, Apr. 26, 1993, p. 1.
Oppenheim et al., Computation of the Discrete Fourier Transform, Discrete-Time Signal Processing, 1989, pp. 581-661, Publisher: Prentice-Hall.
Payne et al., An Advance Demonstration System for TPON, Program and Abstracts, IEEE Workshop on Passive Optical Networks for the Local Loop, May 8, 1990, pp. 1-8, Publisher: IEEE.
PDSP16510 Stand Alone FFT Processor, Plessey DSP Databook, 1991, pp. 127-145, Publisher: Plessey Semiconductors.
Personick, Analog Links for Video, Telemetry, i.f. and r.f. Remoting, Fiber Optics: Technology and Applications, 1985, pp. 194-215, Publisher: Plenum Press, Published in: New York, NY.
Personick et al., Broadband Networks, Fiber Optics: Technology and Applications, 1985, pp. 216-223, Publisher: Plenum Press, Published in: New York, NY.
Rabiner et al., Spectrum Analysis and the Fast Fourier Transform, Theory and Application of Digital Signal Processing, 1993, pp. 356-438.
Ramakrishna et al., A Testable CMOS Signal Processor for Fast Fourier Transforms, Proceedings, 1988 IEEE International Symposium on Circuits and Systems, Jun. 7-9, 1988, pp. 73-76, vol. 1, Publisher: IEEE.
Ramaswami et al., Analysis for the Link Error Monitoring Algorithms in the Signaling System No. 7 Protocol, 1993, pp. 859-866, Publisher: IEEE.
Reeve et al., Design of Passive Optical Networks, British Telecommunications Technology Journal, Apr. 1989, pp. 89-99, vol. 7, No. 2, Publisher: Fulcrum.
Regnault, a Range of Easy-to-Build RFI Filters, Coaxial Stub Filters, 1994-1997, pp. 1-7, Publisher: http://www.ifwtech.co.uk/g3sek/swxfiltr/swxfiltr.html.
Wei et al., Requirements of Timing and Frequency Synchronizations for Multi-User OFDM on Satellite Mobile Channel, Nov. 28-Dec. 2, 1994, pp. 735-739, Publisher: IEEE, Published in: New York, NY.
Rogan et al., A Technical Analysis of a Hybrid Fiber-Coaxial Cable Television System, 1988 NCTA Technical Papers, 1988, pp. 83-93, Publisher: NCTA.
Schmidt, Das Bigfon-Systemkonzept Anforderungen and Aufgabenstellung (Media Policy Aspects), Nachrichtentechnische Berichte (Communications Engineering Reports), May 1984, pp. 5-12.
Schneidawind, Bell's Brash CEO Bets Big on TV Dream, USA Today, Apr. 22, 1993, pp. 1-2.
Schreier et al., Bandpass Sigma-Delta Modulation, Electronics Letters, Nov. 9, 1989, pp. 1560-1561, vol. 25, No. 23.
Settle et al., Trade-Off Between SNR and ISI in Multi-Channel Zero-Forcing Equalizers, Proceedings, Ninth IEEE SP Workshop on Statistical Signal and Array Processing, Sep. 16, 1988, pp. 96-99, Publisher: IEEE.
Sharrock et al., A Broadband-Based Integrated Voice-Data-Video Network of Multiple LANS with Dynamic Bandwidth Allocation, Proceedings, IEEE Inforcom '87, Mar. 31, 1987, pp. 417-425, Publisher: IEEE.
Sheng et al., A Monolithic CMOS Radio Systems for Wideband CDMA Communications, Wireless '94, 1994, Publisher: http://citeseer.ist.psu.edu/sheng94monolithic, Published in: Calgary, Canada.
Sierens et al., Subcarrier Multiple Access for Passive Optical Networks and Comparison to Other Multiple Access Techniques, Conference Record, IEEE Global Telecommunications Conference, Dec. 2-5, 1991, pp. 619-623, vol. 1, Publisher: IEEE, Published in: Phoenix, AZ.
Stark, AM Transmission on Fiber, Communications Engineering and Design, Apr. 1988, pp. 20-32.
Stern et al., Passive Optical Local Networks for Telephony Applications and Beyond, Electronics Letters, Nov. 19, 1987, pp. 1255-1257, vol. 23, No. 24, Publisher: IEEE.
Sunada et al., Cobra: An 1.2 Million Transistor Expandable Column FFT Chip Proceedings of the 1994 IEEE International Conferene on Computer Design: VLS in Computers and Processing, Oct. 10, 1994, pp. 546-550, Publisher: IEEE.
Wei et al., Synchronization Requirements for Multi-User OFDN on Satellite Mobile and Two-Path Rayleigh Fading Channels, IEEE Transactions on Communications, Feb.-Apr. 1995, pp. 387-395, vol. 43, No. 2,4, Publisher: IEEE, Published in: New York, NY.
Tietze et al., In: Halbleiter-Schaltungstechnik (Semiconductor Switching Technique—Translation), 1980, pp. 619-620, Publisher: Springer Verlag.
Von Der Embse, High Dynamic Range FFT Processors for Multiple Channel Receivers, Conference Record, WESCON-80, Sep. 16, 1980, pp. 1-13.
Weinstein et al., Data Transmission by Frequency-Division Multiplexing Using the Discrete Fourier Transform, IEEE Transactions on Communication Technology, Oct. 1971, pp. 628-634, vol. 19, No. 3, Publisher: IEEE.
Williamson, Big Business Drives U.K. Local Fiber, Telephony, Aug. 28, 1989, pp. 28-32.
Wilson, ADC Launches Fiber-Coax Platform, Telephony, May 24, 1993, pp. 1-2.
Wintermantel et al., A Class of DFT Polyphase Filter Banks for Orthogonal Multiple Carrier Data Transmission , Proceedings of the 1992IEEE International Symposium on Circuits and Systems, May 10-13, 1992, pp. 1332-1335, vol. 3, Publisher: IEEE, Published in: San Diego, CA.
Woodward et al., Time-Spread Decoding: A Method for the Implementation of Error-Control Algorithms in Fast Digital Transmission Channels , Conference Proceedings, Digital Processing of Signals in Communications, Apr. 22-26, 1985, pp. 119-124.
Yang, Performance Analysis of Multicarrier Modems in an Office Environment Using 3D Ray Tracing, 1994, pp. 42-46, Publisher: IEEE.
Zeiger, U.S. West Picks Omaha to Test New Data Network, The Denver Post. Apr. 24, 1993, pp. 1C-2C.

* cited by examiner

Subscriber Modem

THIS TABLE SHOWS THE ORDER OF CALCULATION FOR A TRANSPOSED BUTTERFLY:

CO

2632

| | | | |
|---|---|---|---|
| AWR=WR<br>AWI =WI | AXR =XR<br>AXI =XI | AYR =YR<br>AYI =YI | AZR =ZR<br>AZI =ZI |
| BWR=WR<br>BWI =WI | BXR=XR<br>BXI =XI | BYR =YR<br>BYI =YI | BZR=ZR<br>BZI =ZI |
| CWR=WR<br>CWI =WI | CXR=XR<br>CXI =XI | CYR =YR<br>CYI =YI | CZR=ZR<br>CZI =ZI |
| DWR=WR<br>DWI =WI | DXR=XR<br>DXI =XI | DYR =YR<br>DYI =YI | DZR=ZR<br>DZI =ZI |

| | | | |
|---|---|---|---|
| AWR=AWR −WI<br>AWI=AWI +WR | AXR=AXR −XI<br>AXI=AXI +XR | AYR=AYR −YI<br>AYI=AYI +YR | AZR=AZR −ZI<br>AZI=AZI +ZR |
| BWR=BWR−WI<br>BWI=BWI +WR | BXR=BXR −XI<br>BXI=BXI +XR | BYR=BYR −YI<br>BYI=BYI +YR | BZR=BZR −ZI<br>BZI=BZI +ZR |
| CWR=CWR−WI<br>CWI=CWI +WR | CXR=CXR −XI<br>CXI=CXI +XR | CYR=CYR −YI<br>CYI=CYI +YR | CZR=CZR −ZI<br>CZI=CZI +ZR |
| DWR=DWR−WI<br>DWI=DWI +WR | DXR=DXR −XI<br>DXI=DXI +XR | DYR=DYR −YI<br>DYI=DYI +YR | DZR=DZR −ZI<br>DZI=DZI +ZR |

| | | | |
|---|---|---|---|
| AWR=AWR +WR<br>AWI=AWI +WI | AXR=AXR +XI<br>AXI=AXI −XR | AYR=AYR −YR<br>AYI=AYI −YI | AZR=AZR −ZI<br>AZI=AZI +ZR |
| BWR=BWR+WR<br>BWI=BWI +WI | BXR=BXR +XI<br>BXI=BXI −XR | BYR=BYR −YR<br>BYI=BYI −YI | BZR=BZR −ZI<br>BZI=BZI +ZR |
| CWR=CWR+WR<br>CWI=CWI +WI | CXR=CXR +XI<br>CXI=CXI −XR | CYR=CYR −YR<br>CYI=CYI −YI | CZR=CZR −ZI<br>CZI=CZI +ZR |
| DWR=DWR+WR<br>DWI=DWI +WI | DXR=DXR +XI<br>DXI=DXI −XR | DYR=DYR −YR<br>DYI=DYI −YI | DZR=DZR −ZI<br>DZI=DZI +ZR |

| | | | |
|---|---|---|---|
| AWR=AWR −WI<br>AWI=AWI +WR | AXR=AXR +XR<br>AXI=AXI +XI | AYR=AYR +YI<br>AYI=AYI −YR | AZR=AZR −ZR<br>AZI=AZI −ZI |
| BWR=BWR−WI<br>BWI=BWI +WR | BXR=BXR +XR<br>BXI=BXI +XI | BYR=BYR +YI<br>BYI=BYI −YR | BZR=BZR −ZR<br>BZI=BZI −ZI |
| CWR=CWR−WI<br>CWI=CWI +WR | CXR=CXR +XR<br>CXI=CXI +XI | CYR=CYR +YI<br>CYI=CYI −YR | CZR=CZR −ZR<br>CZI=CZI −ZI |
| DWR=DWR−WI<br>DWI=DWI +WR | DXR=DXR +XR<br>DXI=DXI +XI | DYR=DYR +YI<br>DYI=DYI −YR | DZR=DZR −ZR<br>DZI=DZI −ZI |

| | | | |
|---|---|---|---|
| AWR=AWR +WR<br>AWI=AWI +WI | AXR=AXR −XR<br>AXI=AXI −XI | AYR=AYR +YR<br>AYI=AYI +YI | AZR=AZR −ZR<br>AZI=AZI −ZI |
| BWR=BWR+WR<br>BWI=BWI +WI | BXR=BXR −XR<br>BXI=BXI −XI | BYR=BYR +YR<br>BYI=BYI +YI | BZR=BZR −ZR<br>BZI=BZI −ZI |
| CWR=CWR+WR<br>CWI=CWI +WI | CXR=CXR −XR<br>CXI=CXI −XI | CYR=CYR +YR<br>CYI=CYI +YI | CZR=CZR −ZR<br>CZI=CZI −ZI |
| DWR=DWR+WR<br>DWI=DWI +WI | DXR=DXR −XR<br>DXI=DXI −XI | DYR=DYR +YR<br>DYI=DYI +YI | DZR=DZR −ZR<br>DZI=DZI −ZI |

| | | | |
|---|---|---|---|
| AWR=AWR −WI<br>AWI=AWI +WR | AXR=AXR +XI<br>AXI=AXI −XR | AYR=AYR −YI<br>AYI=AYI +YR | AZR=AZR +ZI<br>AZI=AZI −ZR |
| BWR=BWR−WI<br>BWI=BWI +WR | BXR=BXR +XI<br>BXI=BXI −XR | BYR=BYR −YI<br>BYI=BYI +YR | BZR=BZR +ZI<br>BZI=BZI −ZR |
| CWR=CWR−WI<br>CWI=CWI +WR | CXR=CXR +XI<br>CXI=CXI −XR | CYR=CYR −YI<br>CYI=CYI +YR | CZR=CZR +ZI<br>CZI=CZI −ZR |
| DWR=DWR−WI<br>DWI=DWI +WR | DXR=DXR +XI<br>DXI=DXI −XR | DYR=DYR −YI<br>DYI=DYI +YR | DZR=DZR +ZI<br>DZI=DZI −ZR |

| | | | |
|---|---|---|---|
| AWR=AWR +WR<br>AWI=AWI +WI | AXR=AXR −XI<br>AXI=AXI +XR | AYR=AYR −YR<br>AYI=AYI −YI | AZR=AZR +ZI<br>AZI=AZI −ZR |
| BWR=BWR+WR<br>BWI=BWI +WI | BXR=BXR −XI<br>BXI=BXI +XR | BYR=BYR −YR<br>BYI=BYI −YI | BZR=BZR +ZI<br>BZI=BZI −ZR |
| CWR=CWR+WR<br>CWI=CWI +WI | CXR=CXR −XI<br>CXI=CXI +XR | CYR=CYR −YR<br>CYI=CYI −YI | CZR=CZR +ZI<br>CZI=CZI −ZR |
| DWR=DWR+WR<br>DWI=DWI +WI | DXR=DXR −XI<br>DXI=DXI +XR | DYR=DYR −YR<br>DYI=DYI −YI | DZR=DZR +ZI<br>DZI=DZI −ZR |

| | | | |
|---|---|---|---|
| AWR=AWR −WI<br>AWI=AWI +WR | AXR=AXR −XR<br>AXI=AXI −XI | AYR=AYR +YI<br>AYI=AYI −YR | AZR=AZR −ZR<br>AZI=AZI +ZI |
| BWR=BWR−WI<br>BWI=BWI +WR | BXR=BXR −XR<br>BXI=BXI −XI | BYR=BYR +YI<br>BYI=BYI −YR | BZR=BZR −ZR<br>BZI=BZI +ZI |
| CWR=CWR−WI<br>CWI=CWI +WR | CXR=CXR −XR<br>CXI=CXI −XI | CYR=CYR +YI<br>CYI=CYI −YR | CZR=CZR −ZR<br>CZI=CZI +ZI |
| DWR=DWR−WI<br>DWI=DWI +WR | DXR=DXR −XR<br>DXI=DXI −XI | DYR=DYR +YI<br>DYI=DYI −YR | DZR=DZR −ZR<br>DZI=DZI +ZI |

THIS TABLE SHOWS THE ORDER OF CALCULATION FOR A TRANSPOSED BUTTERFLY:

C0 2632 2810

| | | | |
|---|---|---|---|
| AWR =WR+XR+YR+ZR<br>AWI =WI+XI+YI+ZI | AXR =WR−XI−YR+ZI<br>AXI =WI+XR−YI−ZR | AYR =WR−XR+YR−ZR<br>AYI =WI−XI+YI−ZI | AZR =WR+XI−YR−ZI<br>AZI =WI−XR−YI+ZR |
| –<br>– | –<br>– | –<br>– | –<br>– |
| –<br>– | –<br>– | –<br>– | –<br>– |
| –<br>– | –<br>– | –<br>– | –<br>– |

| | | | |
|---|---|---|---|
| AWR =AWR−(WI+XI+YI+ZI)<br>AWI =AWI+(WR+XR+YR+ZR) | AXR =AXR−(WI+XR−YI−ZR)<br>AXI =AXI+(WR−XI−YR+ZI) | AYR =AYR−(WI−XI+YI−ZI)<br>AYI =AYI+(WR−XR+YR−ZR) | AZR =AZR−(WI−XR−YI+ZR)<br>AZI =AZI+(WR+XI−YR−ZI) |
| –<br>– | –<br>– | –<br>– | –<br>– |
| –<br>– | –<br>– | –<br>– | –<br>– |
| –<br>– | –<br>– | –<br>– | –<br>– |

| | | | |
|---|---|---|---|
| —<br>— | —<br>— | —<br>— | —<br>— |
| BWR =WR+XR+YR+ZR<br>BWI =WI+XI+YI+ZI | BXR =WR−XI−YR+ZI<br>BXI =WI+XR−YI−ZR | BYR =WR−XR+YR−ZR<br>BYI =WI−XI+YI−ZI | BZR =WR+XI−YR−ZI<br>BZI =WI−XR−YI+ZR |
| —<br>— | —<br>— | —<br>— | —<br>— |
| —<br>— | —<br>— | —<br>— | —<br>— |

| | | | |
|---|---|---|---|
| —<br>— | —<br>— | —<br>— | —<br>— |
| BWR =BWR−(WI+XI+YI+ZI)<br>BWI =BWI+(WR+XR+YR+ZR) | BXR =BXR−(WI+XR−YI−ZR)<br>BXI =BXI+(WR−XI−YR+ZI) | BYR =BYR−(WI−XI+YI−ZI)<br>BYI =BYI+(WR−XR+YR−ZR) | BZR =BZR−(WI−XR−YI+ZR)<br>BZI =BZI+(WR+XI−YR−ZI) |
| —<br>— | —<br>— | —<br>— | —<br>— |
| —<br>— | —<br>— | —<br>— | —<br>— |

| | | | |
|---|---|---|---|
| –<br>– | –<br>– | –<br>– | –<br>– |
| –<br>– | –<br>– | –<br>– | –<br>– |
| CWR =WR+XR+YR+ZR<br>CWI =WI+XI+YI+ZI | CXR =WR−XI−YR+ZI<br>CXI =WI+XR−YI−ZR | CYR =WR−XR+YR−ZR<br>CYI =WI−XI+YI−ZI | CZR =WR+XI−YR−ZI<br>CZI =WI−XR−YI+ZR |
| –<br>– | –<br>– | –<br>– | –<br>– |

| | | | |
|---|---|---|---|
| –<br>– | –<br>– | –<br>– | –<br>– |
| –<br>– | –<br>– | –<br>– | –<br>– |
| CWR =CWR−(WI+XI+YI+ZI)<br>CWI =CWI+(WR+XR+YR+ZR) | CXR =CXR−(WI+XR−YI−ZR)<br>CXI =CXI+(WR−XI−YR+ZI) | CYR =CYR−(WI−XI+YI−ZI)<br>CYI =CYI+(WR−XR+YR−ZR) | CZR =CZR−(WI−XR−YI+ZR)<br>CZI =CZI+(WR+XI−YR−ZI) |
| –<br>– | –<br>– | –<br>– | –<br>– |

| | | | |
|---|---|---|---|
| –<br>– | –<br>– | –<br>– | –<br>– |
| –<br>– | –<br>– | –<br>– | –<br>– |
| –<br>– | –<br>– | –<br>– | –<br>– |
| DWR =WR+XR+YR+ZR<br>DWI =WI+XI+YI+ZI | DXR =WR−XI−YR+ZI<br>DXI =WI+XR−YI−ZR | DYR =WR−XR+YR−ZR<br>DYI =WI−XI+YI−ZI | DZR =WR+XI−YR−ZI<br>DZI =WI−XR−YI+ZR |

| | | | |
|---|---|---|---|
| –<br>– | –<br>– | –<br>– | –<br>– |
| –<br>– | –<br>– | –<br>– | –<br>– |
| –<br>– | –<br>– | –<br>– | –<br>– |
| DWR =DWR−(WI+XI+YI+ZI)<br>DWI =DWI+(WR+XR+YR+ZR) | DXR =DXR−(WI+XR−YI−ZR)<br>DXI =DXI+(WR−XI−YR+ZI) | DYR =DYR−(WI−XI+YI−ZI)<br>DYI =DYI+(WR−XR+YR−ZR) | DZR =DZR−(WI−XR−YI+ZR)<br>DZI =DZI+(WR+XI−YR−ZI) |

FIG. 90

RANGING AND ROUND TRIP DELAY TIMING ADJUSTMENT IN A MULTI-POINT TO POINT BIDIRECTIONAL COMMUNICATION SYSTEM

CROSS REFERENCE TO RELATED CASES

This application is a continuation of application Ser. No. 11/686,808 filed on Mar. 15, 2007 (allowed), which is a continuation of application Ser. No. 11/420,851 filed on May 30, 2006, entitled "DYNAMIC BANDWIDTH ALLOCATION", which is a divisional of application Ser. No. 09/903,273 filed Jul. 11, 2001, entitled "DYNAMIC BANDWIDTH ALLOCATION" (now U.S. Pat. No. 7,069,577), which is a continuation of application Ser. No. 09/397,443, filed Sep. 15, 1999, entitled "DYNAMIC BANDWIDTH ALLOCATION" (now U.S. Pat. No. 6,279,158), which is a divisional of U.S. application Ser. No. 08/673,002 filed Jun. 28, 1996 (now U.S. Pat. No. 6,334,219) which is a continuation-in-part of U.S. application Ser. No. 08/650,408 filed May 20, 1996 (abandoned), 08/457,295 filed Jun. 1, 1995 (abandoned), 08/457,317 filed Jun. 1, 1995 (abandoned), and 08/384,659 filed Feb. 6, 1995 (abandoned) whose applications are incorporated herein by reference.

This application is related to U.S. application Ser. No. 08/311,964 filed Sep. 26, 1994 (abandoned), Ser. No. 08/455,340 filed May 31, 1995 (abandoned), Ser. No. 08/455,059 filed May 31, 1995 (abandoned), Ser. No. 08/457,294 filed Jun. 1, 1995 (abandoned), Ser. No. 08/457,110 filed Jun. 1, 1995 (abandoned), Ser. No. 08/456,871 filed Jun. 1, 1995 (abandoned), Ser. No. 08/457,022 filed Jun. 1, 1995 (abandoned), and Ser. No. 08/457,037 filed Jun. 1, 1995 (abandoned), whose applications are incorporated herein by reference.

BACKGROUND

Information services found in households and businesses today include television (or video) services and telephone services. Another information service involves digital data transfer which is most frequently accomplished using a modem connected to a telephone service. All further references to telephony herein shall include both telephone services and digital data transfer service.

Characteristics of telephony and video signals are different and therefore telephony and video networks are designed differently as well. For example, telephony information occupies a relatively narrow band when compared to the bandwidth for video signals. In addition, telephony signals are low frequency whereas NTSC standard video signals are transmitted at carrier frequencies greater than 50 MHz. Accordingly, telephone transmission networks are relatively narrow band systems which operate at audio frequencies and which typically serve the customer by twisted wire drops from a curb-side junction box. On the other hand, cable television services are broad band and incorporate various frequency carrier mixing methods to achieve signals compatible with conventional very high frequency television receivers. Cable television systems or video services are typically provided by cable television companies through a shielded cable service connection to each individual home or business.

One attempt to combine telephony and video services into a single network is described in U.S. Pat. No. 4,977,593 to Balance entitled "Optical Communications Network." Balance describes a passive optical communications network with an optical source located in a central station. The optical source transmits time division multiplexed optical signals along an optical fiber and which signals are later split by a series of splitters between several individual fibers servicing outstations. The network allows for digital speech data to be transmitted from the outstations to the central station via the same optical path. In addition, Balance indicates that additional wavelengths could be utilized to add services, such as cable television, via digital multiplex to the network.

A 1988 NCTA technical paper, entitled "Fiber Backbone: A Proposal For an Evolutionary Cable TV network Architecture," by James A. Chiddix and David M. Pangrac, describes a hybrid optical fiber/coaxial cable television (CATV) system architecture. The architecture builds upon existing coaxial CATV networks. The architecture includes the use of a direct optical fiber path from a head end to a number of feed points in an already existing CATV distribution system.

U.S. Pat. No. 5,153,763 to Pidgeon, entitled "CATV Distribution Networks Using Light Wave Transmission Lines," describes a CATV network for distribution of broad band, multichannel CATV signals from a head end to a plurality of subscribers. Electrical to optical transmitters at the head end and optical to electrical receivers at a fiber node launch and receive optical signals corresponding to broad band CATV electrical signals. Distribution from the fiber node is obtained by transmitting electrical signals along coaxial cable transmission lines. The system reduces distortion of the transmitted broad band CATV signals by block conversion of all or part of the broad band of CATV signals to a frequency range which is less than an octave. Related U.S. Pat. No. 5,262,883 to Pidgeon, entitled "CATV Distribution Networks Using Light Wave Transmission Lines," further describes the distortion reducing system.

Although the above-mentioned networks describe various concepts for transmitting broad band video signals over various architectures, which may include hybrid optical fiber/coax architectures, none of these references describe a cost effective, flexible, communications system for telephony communications. Several problems are inherent in such a communication system.

One such problem is the need to optimize the bandwidth used for transporting data so that the bandwidth used does not exceed the allotted bandwidth. Bandwidth requirements are particularly critical in multi-point to point communication where multiple transmitters at remote units must be accommodated such that allotted bandwidth is not exceeded.

A second problem involves power consumption of the system. The communication system should minimize the power used at the remote units for the transport of data, as the equipment utilized at the remote units for transmission and reception may be supplied by power distributed over the transmission medium of the system.

Another problem arises from a fault in the system preventing communication between a head end and multiple remote units of a multi-point to point system. For example, a cut transmission line from a head end to many remote units may leave many users without service. After the fault is corrected, it is important to bring as many remote units back into service as quickly as possible.

Data integrity must also be addressed. Both internal and external interference can degrade the communication. Internal interference exists between data signals being transported over the system. That is, transported data signals over a common communication link may experience interference there between, decreasing the integrity of the data. Ingress from external sources can also effect the integrity of data transmissions. A telephony communication network is susceptible to "noise" generated by external sources, such as HAM radio. Because such noise can be intermittent and vary in intensity, a method of transporting data over the system should correct or avoid the presence of such ingress.

These problems, and others as will become apparent from the description to follow, present a need for an enhanced communication system. Moreover, once the enhanced system is described, a number of practical problems in its physical realization are presented and overcome.

Another embodiment provides a method and apparatus for a fast Fourier transform (FFT). This invention relates to the field of electronic communication systems, and more specifically to an improved method and apparatus for providing an FFT.

There are many advanced digital signal-processing applications requiring analysis of large quantities of data in short time periods, especially where there is interest in providing "real time" results. Such applications include signal processing in modems which use OFDM (orthogonal frequency division multiplexing). In order to be useful in these and other applications, Discrete Fourier Transform (DFT) or FFT signal processors must accommodate large numbers of transforms, or amounts of data, in very short processing times, often called high data throughput.

In addition to the speed and data-throughput requirements, power consumption is a major concern for many applications. In some signal-processing applications, power is supplied by portable generation or storage equipment, such as batteries, where the ultimate power available is limited by many environment. In such applications, processor power consumption must be as low as possible. One useful measure of utility or merit for FFT processors is the energy dissipation per transform point. Ultimately, one key problem with any FFT processor is the amount of power consumed per transform. Generally, high-performance, efficient FFT processors exhibit energy dissipations per transform in the range of 100 to 1000 times $\log_2 N$ nanojoules, where N is the number of points in a given transform. As a consequence, reasonably large transforms required to process large arrays of data, result in large power consumption.

Machine-implemented computation of an FFT is often simplified by cascading together a series of simple multiply-and-add stages. When a recursive process is used, data circulates through a single stage and the computational structure of the stage is made variable for each circulation. Each circulation through the stage is referred to as a "pass."

A plurality of computational elements, each known as a radix-r butterfly, may be assembled to define a single stage for carrying out a particular pass. A radix-r butterfly receives r input signals and produces a corresponding number of r output signals, where each output signal is the weighted sum of the r input signals. The radix number, r, in essence, defines the number of input components which contribute to each output component.

By way of example, a radix-2 butterfly receives two input signals and produces two output signals. Each output signal is the weighted sum of the two input signals. A radix-4 butterfly receives four input signals and produces four corresponding output signals. Each output signal of the radix-4 butterfly constitutes a weighted sum of the four input signals.

Completion of an N-point FFT requires that the product of the butterfly radix values, taken over the total number of stages or passes, equals the total point count, N. Thus, a 64-point FFT can be performed by one radix-64 butterfly, or three cascaded stages where each stage has sixteen radix-4 butterflies (the product of the radix values for stage-1 and stage-2 and stage-3 is 4×4×4=64), or six cascaded stages where each of the six stages comprises 32 radix-2 butterflies (the product of the radix values for stage-1 through stage-6 is 2×2×2×2×2×2=64).

A multi-stage or multi-pass FFT process can be correctly carried out under conditions where the number of butterfly elements changes from one pass (or stage) to the next and the radix value, r, of the butterfly elements also changes from one pass (or stage) to the next. A paper by Gordon DeMuth, "ALGORITHMS FOR DEFINING MIXED RADIX FFT FLOW GRAPHS," IEEE Transactions on Acoustics, Speech, and Signal Processing, Vol. 37, No. 9, September 1989, Pages 1349-1358, describes a generalized method for performing an FFT with a mixed-radix system. A mixed-radix system is one where the radix value, r, in one stage or pass is different from that of at least one other stage or pass.

An advantage of a mixed-radix computing system is that it can be "tuned" to optimize the signal-to-noise ratio of the transform (or more correctly speaking, to minimize the accumulated round-off error of the total transform) for each particular set of circumstances. By way of example, it is advantageous in one environment to perform a 512-point FFT using the mixed-radix sequence: 4, 4, 4, 4, 2. In a different environment, it may be more advantageous to use the mixed-radix sequence: 4, 2, 4, 4, 4. Round-off error varies within a machine of finite precision as a function of radix value and the peak signal magnitudes that develop in each stage or pass.

In addition, it may be advantageous to scale intermediate results between each stage or pass, in order to minimize round-off errors and the problem of overflow. Further, it may be advantageous to vary the amount of scaling performed between each pass, for example, either to scale by ¼ between each radix-4 stage or to scale by ½ for some stages and ⅛ for other stages.

Heretofore, FFT processors generally fetched data values from their working storage in a serial manner, thus limiting the speed which could be obtained. Further, current FFT processors generally were limited in speed by loading the working storage with input values, then processing the data in the working storage, then unloading the result values.

There are many advanced digital signal-processing applications requiring analysis of large quantities of data in short time periods, especially where there is interest in providing "real time" results. Such applications include signal processing in modems which use OFDM (orthogonal frequency division multiplexing).

One need in the art is for an accurate analog-to-digital conversion (ADC) at moderate frequencies having limited bandwidth. One technology known in the art is the "Sigma-Delta" ADC which provides very good resolution (high number of bits in the digital result), but only for signals whose converted signal bandwidth is low.

Another need is for an ADC which provides bandwidth-limited digital I and Q signals (representing amplitude and quadrature) for a 200 kHz bandwidth received analog modem signal, wherein the digital result has very high resolution and accuracy.

What is needed is a method and apparatus which addresses the above problems in the art.

SUMMARY

The present invention describes a multi-point to point communication system including multicarrier telephony transport. The multi-point to point communication system includes a hybrid fiber/coax distribution network. A head end terminal provides for downstream transmission of downstream control data and downstream telephony information in a first frequency bandwidth over the hybrid fiber/coax distribution network and reception of upstream telephony information and upstream control data in a second frequency bandwidth over the hybrid fiber/coax distribution network. The head end terminal includes a head end multicarrier modem for modulating at least downstream telephony information on a plurality of orthogonal carriers in the first frequency bandwidth and demodulating at least upstream telephony information modulated on a plurality of orthogonal carriers in the second frequency bandwidth. The head end terminal further includes a head end controller operatively connected to the head end multicarrier modem for controlling transmission of the downstream telephony information and downstream control data and for controlling receipt of the upstream control data and upstream telephony information. The system further includes at least one service unit, each service unit associated with at least one remote unit and operatively connected to the hybrid fiber/coax distribution network for upstream transmission of upstream telephony information and upstream control data in the second frequency bandwidth and for receipt of the downstream control data and downstream telephony information in the first frequency bandwidth. Each service unit includes a service unit multicarrier modem for modulating at least the upstream telephony information on at least one carrier orthogonal at the head end to at least one other carrier in the second frequency bandwidth and for demodulating at least the downstream telephony information modulated on at least a band of a plurality of orthogonal carriers in the first frequency bandwidth. Each service unit also includes a service unit controller operatively connected to the service unit multicarrier modem for controlling the modulation of and demodulation performed by the service unit multicarrier modem.

Another embodiment prevents untoward spectral effects in the multicarrier signal from variations in channel activity and from highly repetitive data patterns in the payload channels. Data is the payload channels can be scrambled with pseudorandom sequences, and different sequences can be applied to different channels in order to produce a more balanced multicarrier spectrum.

In another embodiment, the plurality of orthogonal carriers in the first frequency bandwidth include at least one control channel for transmission of downstream control data and a plurality of telephony information channels for transmission of downstream telephony information. Further, the plurality of orthogonal carriers in the second frequency bandwidth include at least one control channel for transmission of upstream control data and a plurality of telephony information channels for transmission of upstream telephony information.

In other embodiments, a plurality of control channels are interspersed among the telephony information channels in the first frequency bandwidth and a plurality of control channels are interspersed among the telephony channels of the second frequency bandwidth. The telephony channels may be divided into subbands each having multiple data or payload channels and a control channel; this allows the remote modems to be realized as less expensive and/or better performing narrow-band modems. The clock signals for generating the carriers and the symbols representing the transmitted data may be locked to each other or generated from the same source, to reduce intersymbol interference significantly.

Another technique for reducing intersymbol interference is the transmission of each symbol with more than 360° of phase in one cycle of its carrier, in order to allow some leeway in tracking the phase of a channel carrier in a receiving modem. Some applications demand more or different error detection and correction capability than others. An embodiment is shown which handles both unencoded parity-type detection/correction and more multiple types of more powerful methods, such as Reed-Solomon encoding, in a transparent, real-time fashion, by packing the data words differently for each case. Moreover, the processor loading involved in these error-correction techniques can be spread out in time, so that not all channels need to be handled at the same time. This is accomplished by staggering the beginning times of different data messages.

In another embodiment, the at least one service unit includes a service modem for upstream transmission of upstream telephony information and upstream control data within a channel band of the second frequency bandwidth corresponding to one of the channel bands of the first frequency bandwidth in which the service modem receives downstream telephony information and downstream control information. Alternatively, the at least one service unit includes a multi-service modem for upstream transmission of upstream telephony information and upstream control data within a plurality of channel bands of the second frequency bandwidth corresponding to a plurality of the channel bands of the first frequency bandwidth in which the multi-service modem receives downstream telephony information and downstream control information.

In still another embodiment, the plurality of control channels of the first frequency bandwidth and the plurality of control channels of the second frequency bandwidth each include at least one synchronization channel.

In other embodiments, different modulation techniques are utilized for different carriers. For example, different modulation techniques are utilized for different telephony channels. As another example, the aforementioned IOC channels may be modulated as differential binary phase-shift keyed (BPSK) signals, while the payload data channels are modulated as 5-bit quadrature amplitude modulated (QAM32) signals, in order to enhance the use of IOC channels for subband tracking, and for other purposes. The constellation defining the modulated signals can be constructed to achieve a minimal number of bit errors for small errors in amplitude or phase of the received signal; broadly, the constellation points are mapped to bit combinations in a scheme analogous to a Gray code.

A communication system which addresses the problems inherent in the system, in particular, ingress problems is also described. The communication system includes a distribution network between a head end terminal and at least one remote unit. The head end terminal receives upstream telephony information and upstream control data in a frequency bandwidth over the distribution network. The head end terminal includes a head end multicarrier demodulator for demodulating at least upstream telephony information modulated on a plurality of orthogonal carriers in the frequency bandwidth. The demodulator includes at least one polyphase filter for filtering the at least upstream telephony information modulated on the plurality of orthogonal carriers to provide ingress protection for the modulated orthogonal carriers. The head end terminal also includes a head end controller operatively connected to the head end multicarrier demodulator for controlling receipt of the upstream control data and upstream telephony information. The system further includes at least one service unit modulator, each service unit modulator associated with at least one remote unit and operatively connected to the distribution network for modulating at least upstream telephony information on at least one carrier orthogonal at the head end terminal to at least one other carrier in the frequency bandwidth. The system also includes a service unit controller operatively connected to the service unit multicarrier modulator for controlling the modulation performed by the service unit multicarrier modulator.

In another embodiment, the plurality of orthogonal carriers in the frequency bandwidth include a plurality of telephony information channels for transmission of upstream telephony information after modulation of telephony information thereon and at least one control channel associated with the plurality of telephony channels for transmission of upstream control data thereon. Here also, the IOC may be placed in the midpoint of the subbands.

In another embodiment, the at least one polyphase filter includes a first and second polyphase filter. The first polyphase filter filters a first plurality of channel sets and passes a first plurality of at least telephony channels within each channel set of the first plurality of channel sets. The second polyphase filter filters a second plurality of channel sets and passes a second plurality of at least telephony channels within each channel set of the second plurality of channel sets. The first and second polyphase filter are offset from one another such that all at least telephony channels of the first and second plurality of channel sets are passed. In another embodiment, the polyphase filters include at least two overlapping polyphase filters.

In another alternate embodiment, the demodulator includes a tunable notch filter for filtering the at least upstream telephony information modulated on a plurality of orthogonal carriers to prevent passage of corrupted modulated orthogonal carriers.

In addition, a method of polyphase filtering in a communication system is also described. The method includes receiving a plurality of orthogonal carriers having modulated telephony information thereon. The plurality of orthogonal carriers includes a first and second plurality of noncontiguous channel sets. The first plurality of noncontiguous channel sets is filtered and a first plurality of channels of each channel set of the first plurality of noncontiguous channel sets is passed. The second plurality of noncontiguous channel sets is filtered and a second plurality of channels of each channel set of the second plurality of noncontiguous channel sets is also passed. The second plurality of channels passed includes channels of the first plurality of noncontiguous channel sets not passed when filtering the first plurality of noncontiguous channel sets.

A receiver apparatus is also described which receives a frequency bandwidth having a plurality of modulated orthogonal carriers. At least one polyphase filter provides ingress protection for the frequency bandwidth by filtering a plurality of channel sets of the modulated orthogonal carriers.

The use of channel monitoring to address some of the problems inherent in a multi-point to point communication system, in particular, with respect to ingress, is also described. The monitoring method of the present invention monitors a telephony communication n-bit channel wherein one of the bits is a parity bit. The parity bit of the n-bit channel is sampled and a probable bit error rate is derived from the sampling of the parity bit.

In one embodiment, the probable bit error rate over a time period is compared to a predetermined bit error rate value representing a minimum bit error rate to determine if the n-bit channel is corrupted. A corrupted channel can then either be reallocated or, in another embodiment, the transmission power of the channel can be increased to overcome the corruption.

In an alternate method embodiment, the method comprises the steps of sampling the parity bit of the n-bit channel over a first time period, deriving a probable bit error rate from the sampling of the parity bit over the first time period, comparing the probable bit error rate over the first time period to a pre-determined bit error rate value to determine if the n-bit channel is corrupted, and accumulating a probable bit error rate over a plurality of successive time periods if the n-bit channel is not corrupted.

In another alternate method embodiment, the method comprises the steps of sampling the parity bit of the n-bit channel and deriving a probable bit error rate from the sampling of the parity bit over a first time period. The probable bit error rate over the first time period is compared to a first predetermined bit error rate value to determine if the n-bit channel is corrupted. A probable bit error rate from the sampling of the parity bit over a second time period is derived. The second time period is longer than the first time period and runs concurrently therewith. The probable bit error rate over the second time period is compared to a second predetermined bit error rate value to determine if the n-bit channel is corrupted.

In yet another alternate embodiment, a method for monitoring at least one telephony communication channel includes equalizing a signal on the channel and monitoring the equalization of the signal to produce a probable bit error rate as a function of the equalization.

In still yet another alternate embodiment, a method for monitoring at least one unallocated telephony communication channel includes periodically monitoring the at least one unallocated telephony communication channel. Error data for the at least one unallocated telephony communication channel accumulated and the at least one unallocated telephony communication channel is allocated based on the error data.

A multi-point to point communication system utilizing a distributed loop method is also described. The communication system in accordance with the present invention includes a distribution network and a head end terminal for downstream transmission of downstream control data and downstream telephony information in a first frequency bandwidth over the distribution network. The head end terminal receives upstream telephony information and upstream control data in a second frequency bandwidth over the distribution network. The head end terminal further includes a head end multicarrier modem for modulating at least downstream telephony information on a plurality of orthogonal carriers in the first frequency bandwidth and demodulating at least upstream telephony information modulated on a plurality of orthogonal carriers in the second frequency bandwidth. A head end controller is operatively connected to the head end multicarrier modem for controlling transmission of the downstream telephony information and downstream control data and for controlling receipt of the upstream control data and upstream telephony information. The system includes a plurality of service units. Each service unit is associated with at least one remote unit and operatively connected to the distribution network for upstream transmission of upstream telephony information and upstream control data in the second frequency bandwidth and for receipt of the downstream control data and downstream telephony information in the first frequency bandwidth. Each service unit includes a service unit multicarrier modem for modulating at least the upstream telephony information on at least one carrier orthogonal to at least one other carrier in the second frequency bandwidth and for demodulating at least the downstream telephony information modulated on at least a band of a plurality of orthogonal carriers in the first frequency bandwidth. Each service unit also includes a service unit controller operatively connected to the service unit multicarrier modem for controlling the modulation of and demodulation performed by the service unit multicarrier modem. The service unit controller adjusts at least one local transmission characteristic in response to an adjustment command from the head end controller transmitted in the downstream control data to the at least one remote unit. The head end controller further includes a detector for detecting the at least one local transmission characteristic of the service unit modem associated with the at least one remote unit and for generating the adjustment command as a function of the detected at least one transmission characteristic for transmittal to the service unit associated with the at least one remote unit in the downstream control data.

Distributed system control is also employed for acquiring and tracking remote service units newly connected to (or activated within) the system. An acquisition process makes rough estimates of the frequency, phase, and data-symbol timing of the head-end transmitter, calculates the round-trip delay of data to and from the head end, and then tracks changes in the frequency, phase, and timing of the head end, all with minimal overhead to the transmission of payload data within the system. A special non-valid data signal is used to signal the start of a training pattern for acquisition purposes. Maintaining accurate power balancing or leveling among the remote units transmitting upstream to the head end is both necessary and difficult in a multipoint-to-point multicarrier system. One embodiment of the invention uses both an automatic gain control or equalizer at the head end and a transmitter output or power control at the remote end to achieve the conflicting goals of wide dynamic range and high resolution amplitude control.

Furthermore, a communication system having a distribution network between a head end and a plurality of remote units using a scanning method is described. The system includes the transmission, from the head end, of a plurality of modulated orthogonal carriers having telephony information modulated thereon in a plurality of regions of a first frequency bandwidth. Each of the regions has at least one control channel associated therewith having control information modulated thereon. A scanner at the remote units, scans each of the plurality of regions in the first frequency bandwidth and locks onto the at least one control channel associated with each of the plurality of regions to detect a unique identifier to determine which region of the first frequency bandwidth the remote unit is to tune to and which region in a second frequency bandwidth the remote unit is to transmit within.

In another embodiment, the communication system includes a distribution network between a head end and a plurality of remote units. The head end includes a head end terminal for downstream transmission of downstream control data and downstream telephony information in a first frequency bandwidth over the distribution network and for receipt of upstream telephony information and upstream control data in a second frequency bandwidth over the distribution network. The head end terminal includes a head end multicarrier modem for modulating at least downstream telephony information on a plurality of orthogonal carriers in a plurality of regions of the first frequency bandwidth. The head end multicarrier modem also demodulates at least upstream telephony information modulated on a plurality of orthogonal carriers of a plurality of regions in the second frequency bandwidth. The plurality of orthogonal carriers in each of the regions includes a plurality of telephony information channels for transmission of telephony information thereon with each of the regions having at least one control channel associated therewith for transmission of control data. The head end terminal also includes a head end controller operatively connected to the head end multicarrier modem for controlling transmission of the downstream telephony information and downstream control data and for controlling receipt of the upstream control data and upstream telephony information. The system further includes a plurality of service unit modems with each service unit modem associated with at least one remote unit and operatively connected to the distribution network for upstream transmission of upstream telephony information and upstream control data in one of the plurality of regions of the second frequency bandwidth and for receipt of the downstream control data and downstream telephony information in one of the plurality of regions in the first frequency bandwidth. Each service unit modem includes a scanner for scanning each of the plurality of regions in the first frequency bandwidth and for locking onto the at least one control channel in each of the plurality of regions to detect a unique identifier for each service unit modem to determine which region of the first frequency bandwidth the service unit modem is to tune to and which region in the second frequency bandwidth the service unit modem is to transmit within.

This invention further provides a three-part RAM structure, the functions of which can be permuted between input, conversion, and output functions. In one embodiment, the conversion RAM section is configured to offer four values to be accessed simultaneously in order to speed operations.

In another embodiment, this invention relates to the field of electronic communication systems, and more specifically to an improved method and apparatus for providing a Sigma-Delta analog-to-digital conversion and decimation for a modem.

According to another aspect of the invention there is provided a data delivery system having a head end connected to a plurality of remote subscribers over a network, the data originating from general purpose digital computers, wherein the data is transmitted to the remote subscribers in a plurality of data channels, and at the start of a data transmission session, one or more channels are selectively assigned to carry the data between the head end and the subscriber premises with each of the data channels maintaining a substantially constant rate of data transfer between the head end and the destination premise. The system and method further allows that the number of assigned channels assigned to a particular subscriber can be changed from one connection to another to accommodate changes in overall system loading, but at all times maintaining a minimum number of assigned channels so that a minimum rate of data transfer can be maintained between the head end and a subscriber premise. The system also provides asymmetrical operation so that the number of data channels assigned in the downstream path from the head end to the subscribers is much greater in number than the number of upstream data channels.

According to another aspect of the invention there is provided a system of computer data and telephony data transmission over a telecommunications network having a head end connected to a plurality of remote subscribers, the computer data originating from general purpose digital computers, and the telephony data received from or conveyed to the public telephone network. The system comprises transmitting the computer data and telephony data to the remote subscribers in a plurality of data channels, and establishing a computer data or telephony data connection between the head end and a subscriber premise independently of one another. Each of the computer data or telephony data connections are established by assigning one or more of the data channels to carry the computer data and one or more of the data channels to carry the telephony data with at least some of the data channels being available to carry either computer data or telephony data. The system further allows that the number assigned data channels can be changed from one connection to another to the same subscriber so that the overall bandwidth of the network can be reallocated. The system further allows that the data channels are transmitted using Radio Frequency (RF) signaling, and that the RF is scrambled, thereby providing data security.

According to yet another aspect of the invention, the system allows that a computer data received at the head end can initiate a connection to a remote subscriber, wherein the connection comprises the assignment of one or more data channels to carry the computer data to the subscriber.

According to yet another embodiment, the system 10 or 500 of the present invention includes an ATM modulator which can receive ATM data and modulate it onto the HFC network. In one preferred embodiment, digital video data is delivered over an ATM network, multiplexed and modulated onto the HFC in RF digital OFDM format on data connections established between the head end and a subscriber, as for example described above with respect to system 500. A digital set top box receives the digital video, for example in 4.0 Mbps MPEG or equivalent, and converts it to video for display on a television. A return path over a telephony or data channel allows for interactive digital video.

In another embodiment, a method for transmitting data over a telecommunication system from a head end to a service unit is provided. The service unit is assigned to subband of a transmission channel of the telecommunication system. The subband includes a number of payload channels that transmit data at a first rate and a control channel that transmits data at a second rate. The second rate is slower than the first rate. The system receives a request to transmit data to a service unit at the second, slower rate. The system further determines whether to transmit the data at the first, faster, rate based on the size of the data. When a payload channel in the subband is available to transmit the data at the first rate, the system allocates the payload channel to transmit the data to the service unit over the payload channel at the first rate. When the payload channels are allocated to service units and at least one of the allocated payload channels is idle, the system allocates the idle payload channel to transmit the data to the service unit over the payload channel at the first rate. This method can be used to download software and transmission protocols as well as other data that is not time sensitive. Further, the method advantageously provides flexibility in providing bandwidth for transmission of data in the telecommunications system.

In another embodiment, a telecommunications system dynamically allocates bandwidth among a plurality of service units. The system comprises a head end that transmits data over a transmission medium to the service units. The head end includes a modem circuit for narrow band transmission in at least one transmission channel. Each transmission channel includes a number of subbands having a number of payload channels and a control channel in each subband. Further, a control circuit in the head end assigns each service unit to a subband for transmission and receipt of data. The control circuit also allocates a payload channel to a service unit in response to a request for bandwidth for a service unit.

In another embodiment, the control circuit assigns a number of service units to each subband. The control circuit dynamically allocates bandwidth to the service units for selective use of the payload channels in the subband. This increases the number of service units that can be coupled to the system.

In another embodiment, a method for dynamically allocating bandwidth to a service unit in a telecommunications system is provided. The system uses a multi-channel transmission scheme with transmission channels that include a number of subbands. Each subband further includes a number of payload channels. The method begins by receiving a request for a payload channel for a service unit that is assigned to a first subband. The method selects an available payload channel in the first subband and determines if the payload channel is acceptable for providing service to the service unit, for example, acceptable transmission quality. When the payload channel is acceptable, the method allocates the payload channel to the service unit. When, however, the payload channel is unacceptable, the method selects other channels to find an acceptable payload channel.

In another embodiment, a telecommunications system implements a method for allocating payload channels for a service that use multiple payload channels to communicate with a service unit. The system assigns an identifier for each payload channel that indicates the relative order of the multiple payload channels for the service. The system further monitors the quality of the payload channels of the system. When the quality of one of the multiple payload channels drops below a threshold, the system allocates a different payload channel to replace the original payload channel for the service. Once reallocated, the system uses the identifier for the original payload channel so that the proper order for the allocated payload channels is maintained by the service irrespective of the order that the payload channels are received at the service unit.

In another embodiment, a telecommunications system provides a method for using an upstream payload channel to inform the head end of errors that occur in downstream payload channels. The system, monitors a downstream transmission channel at a service unit for transmission errors. Further, the system generates a signal at the service unit that indicates transmission errors in the downstream payload channel. The system also transmits the signal to the head end on an associated upstream payload channel thus allowing the head end to monitor and respond to the performance of the service unit and associated payload channels.

In another embodiment, a method for controlling a plurality of service units in a telecommunication system is provided. The method first assigns an identifier to each service unit. The method further assigns each service unit to a subband of a transmission channel of a narrow band transmission scheme. In the transmission channel, each subband includes a control channel for receiving and transmitting control signals. The method broadcasts the control signals for the service units over the control channels. The method identifies the terminal to use the control signal with the identifier.

In another embodiment, a service unit for use with a communication system transmits signals with a narrow band transmission scheme. The transmission channel is divided into a number of subbands with each subband including a number of payload channels and a control channel. The service unit includes a modem that is tunable to receive telephony and control signals on a subband of a transmission channel. The service unit further includes a controller circuit coupled to the modem to receive control signals over the control channel and to determine which control signals to use to control the operation of the modem. The service unit also includes interface circuits coupled to the controller for providing signals to a channel unit.

In another embodiment, a method for controlling power usage at a service unit of a telecommunications system is provided. The method comprises determining the type of service supported by each line of a service unit. When the service unit supports analog telephony service, the method determines the hook status of all of the lines of the service unit. When the lines are on-hook, the method powers down the service units to conserve power usage until a request is received to use a line of the service unit.

The present invention describes a method of establishing communication between a head end and a plurality of remote units in a multi-point to point communication system, such as when a fault as described above has left many users of the system without service. The method includes transmitting information from the head end to the plurality of remote units in a plurality of regions of a first frequency bandwidth. Each of the regions has at least one control channel associated therewith. The information transmitted includes identification information corresponding to each of n remote units of the plurality of remote units. Such information is periodically transmitted for the n remote units from the head end on the at least one control channel of one of the plurality of regions of the first frequency bandwidth during a first predetermined time period. The identification information for each of the plurality of n remote units is transmitted out of phase with respect to the identification information for the other of the n remote units. At each of the n remote units, the at least one control channel of each of the plurality of regions in the first frequency bandwidth is scanned to detect identification information corresponding to each of the n remote units to identify a particular region of the plurality of regions that each of the n remote units is to use for receiving information from the head end.

In one embodiment, a region is identified in a second frequency bandwidth in which each of the n remote units is to transmit within. The method further includes serially performing synchronization for each of the n remote units for communication with the head end, during a second predetermined time period after the first predetermined time period.

A multi-point to point communication system having a distribution network between a head end and a plurality of remote units for accomplishing the above method includes means for transmitting information from the head end to the plurality of remote units in a plurality of regions of a first frequency bandwidth. Each of the regions has at least one control channel associated therewith. The transmitting means further periodically transmits identification information corresponding to each of a set of n remote units of the plurality of remote units on at least one control channel of one of the plurality of regions of the first frequency bandwidth during a first predetermined time period of an identification and synchronization time period. The identification information for each of the plurality of n remote units is transmitted out of phase with respect to the identification information for the other of the n remote units. The system further includes at each of the n remote units, means for scanning the at least one control channel of each of the plurality of regions in the first frequency bandwidth to detect identification information during the first predetermined time period corresponding to each of the n remote units to identify a particular region of the plurality of regions that each of the n remote units is to use for receiving information from the head end. Further, at each of the n remote units, the system includes means for modulating at least upstream telephony information on at least one carrier in a second frequency bandwidth orthogonal at the head end terminal to at least one other carrier in the second frequency bandwidth and for adjusting at least one local transmission characteristic in response to an adjustment command from the head end. Means at the head end for detecting the at least one local transmission characteristic of each of the n remote units and for generating the adjustment commands as a function of the detected at least one transmission characteristic for transmittal to the n remote units to serially perform synchronization for each of the n remote units during a second predetermined time period of the identification and synchronization time period is also included in the system.

The present invention is a hybrid fiber/coax video and telephony communication network which integrates bi-directional telephony and interactive video services into one network including optical fiber and coaxial cable distribution systems. The present invention utilizes optical fiber as the transmission medium for feeding a plurality of optical distribution nodes with video and telephony information from a head end. Coaxial cable distribution systems are utilized for connection of the distribution nodes to a plurality of remote units. The head end optically transmits the video information downstream to the nodes where it is converted to electrical signals for distribution to the remote units. Telephony information is also optically transmitted to the nodes in frequency bandwidths unused by the video information. The downstream telephony and video optical signals are converted to electrical telephony and video signals for distribution to the plurality of remote units. The network provides for transmission of upstream electrical data signals, for example telephony signals, to the head end by transmitting from the remote units upstream electrical data signals to the distribution nodes where such upstream electrical data signals are converted to upstream optical signals for transmission to the head end.

In one embodiment, the head end includes a first distribution terminal having at least one optical transmitter for transmitting optical downstream telephony signals on at least one optical fiber. In addition, the head end includes a second distribution terminal having a separate optical transmitter for transmitting an optical downstream video signal on an optical fiber line.

In another embodiment, the video and telephony signal distribution network transmits optical downstream video and telephony signals on at least one optical fiber in a first frequency bandwidth. In this embodiment, a second frequency bandwidth is reused for transmission of upstream electrical data signals generated at the remote units. The second frequency bandwidth is reused for transmission by each remote unit.

In another embodiment of the invention, a filter is utilized at service units which interface the coaxial distribution systems to user equipment. The ingress filter allows for passage of downstream video signals to video equipment units and blocks downstream telephony signals transmitted in a different frequency bandwidth.

DRAWINGS

Figure 58:
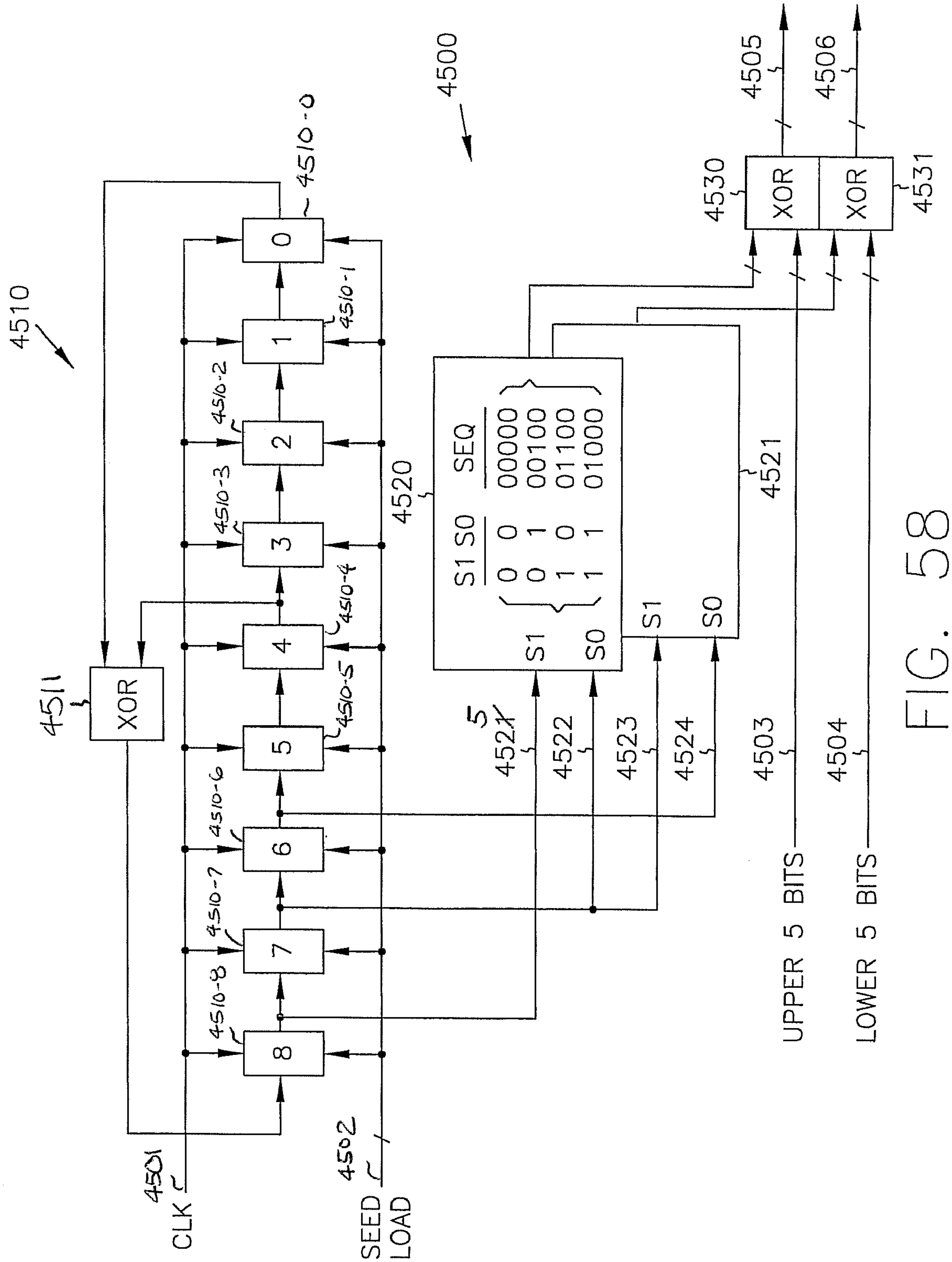
Figure 59:
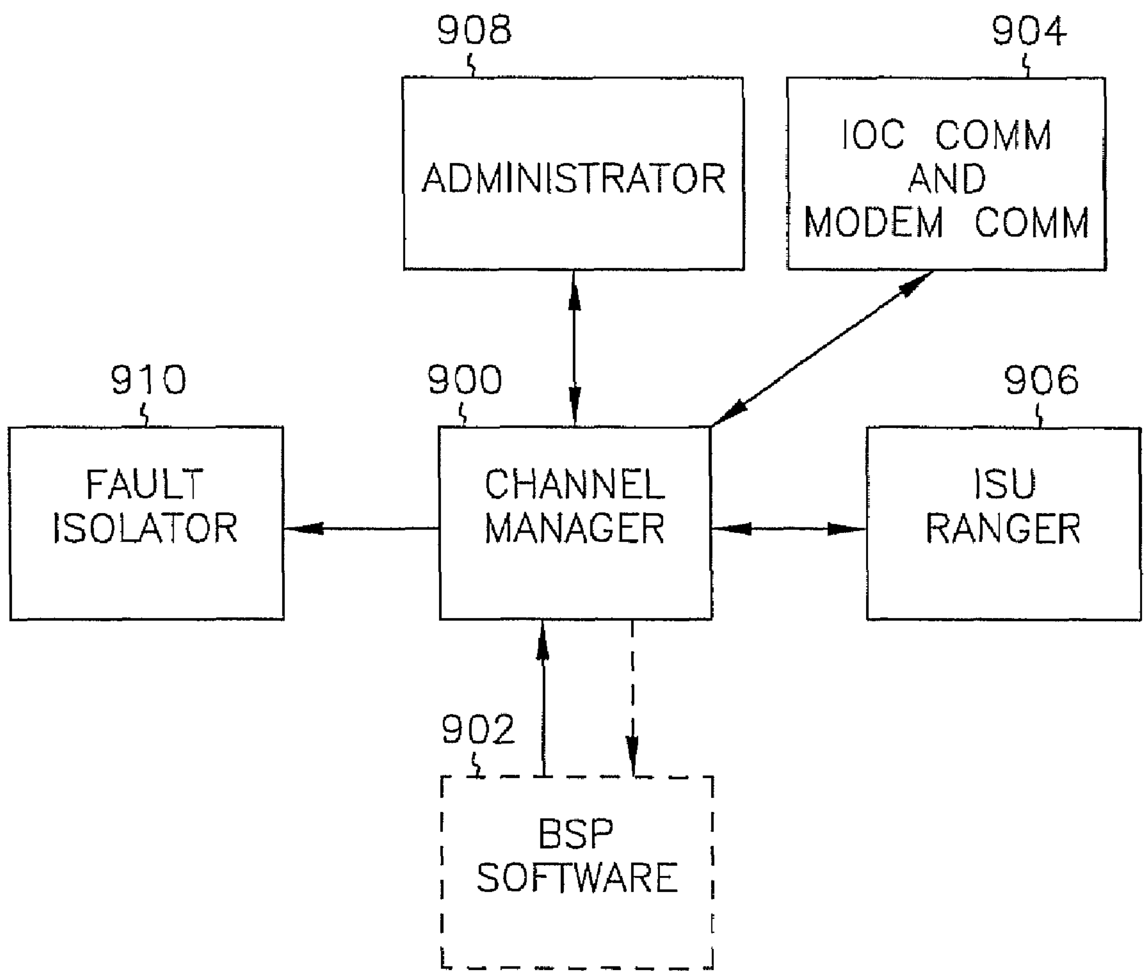
Figure 60:
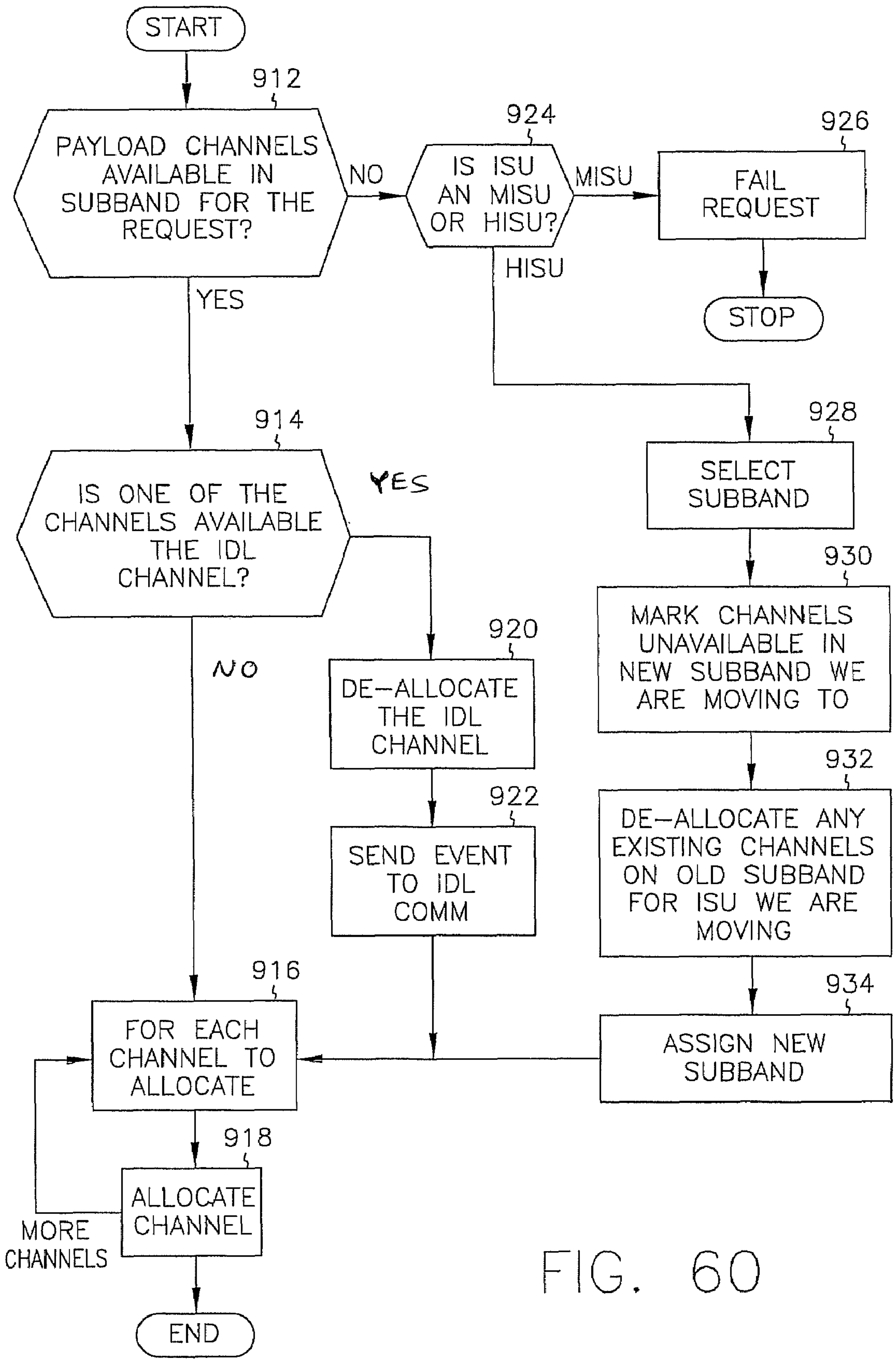
Figure 61:
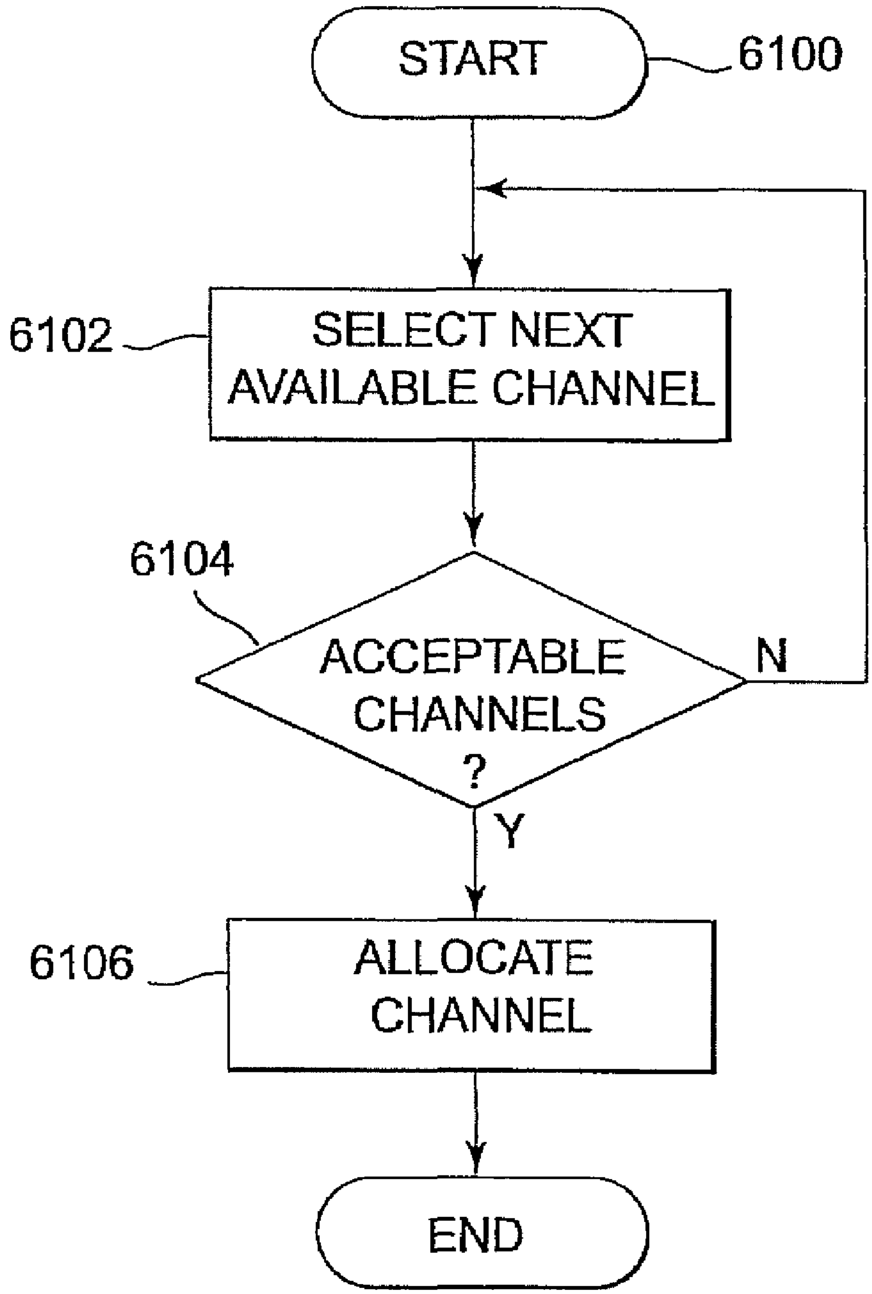
Figure 62:
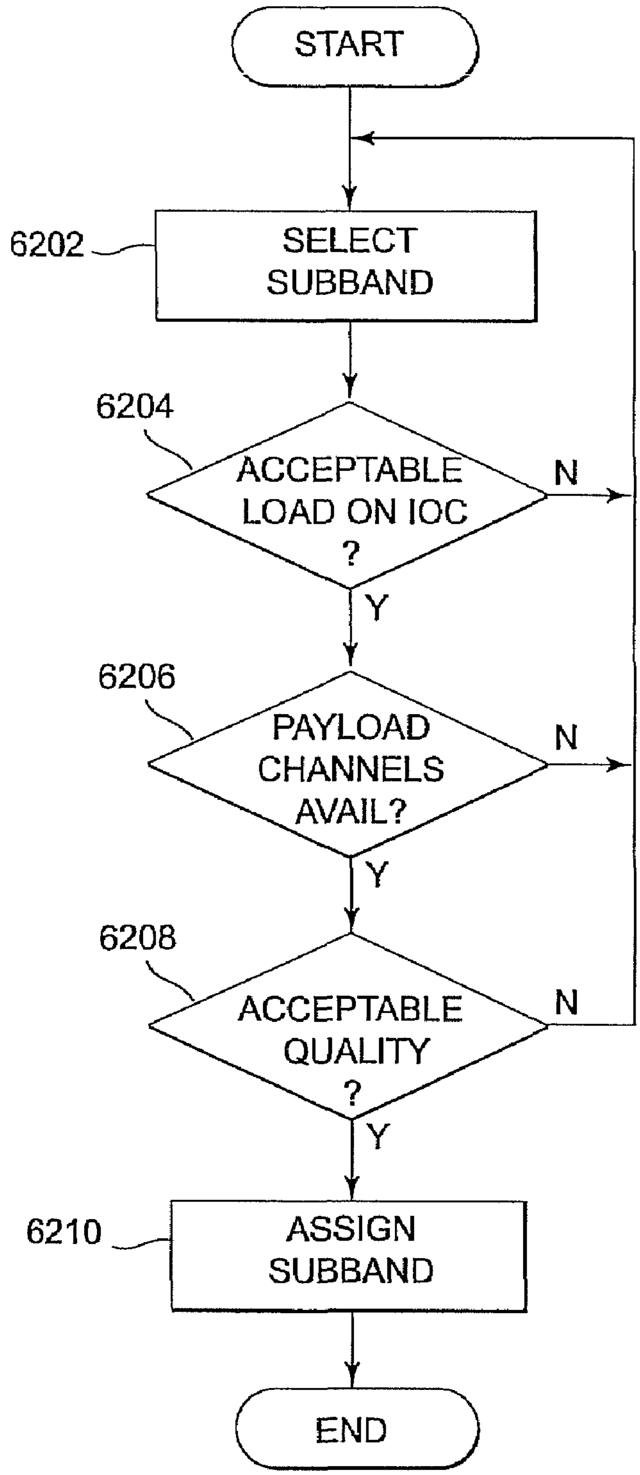
Figure 68:
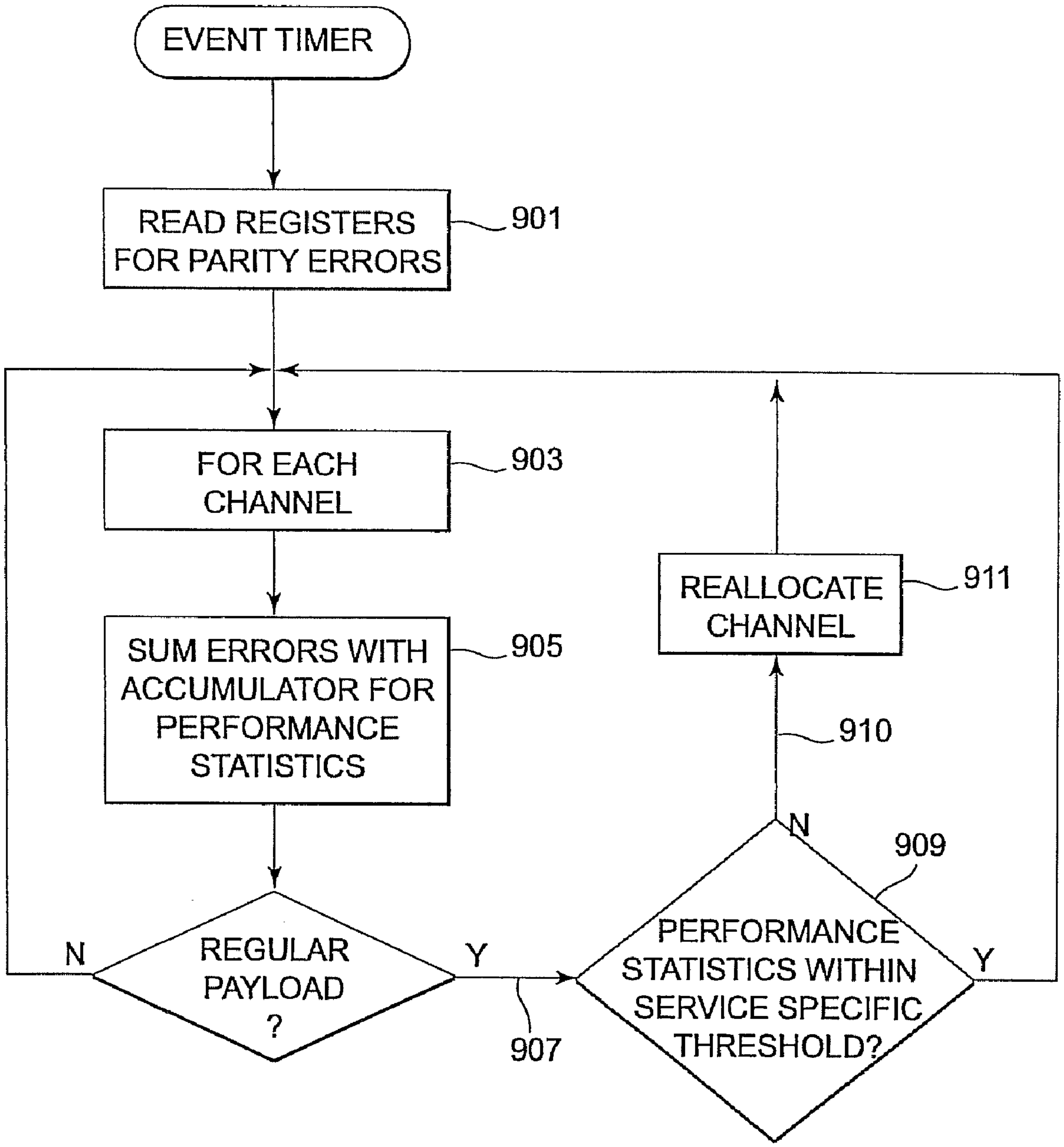
Figure 69:
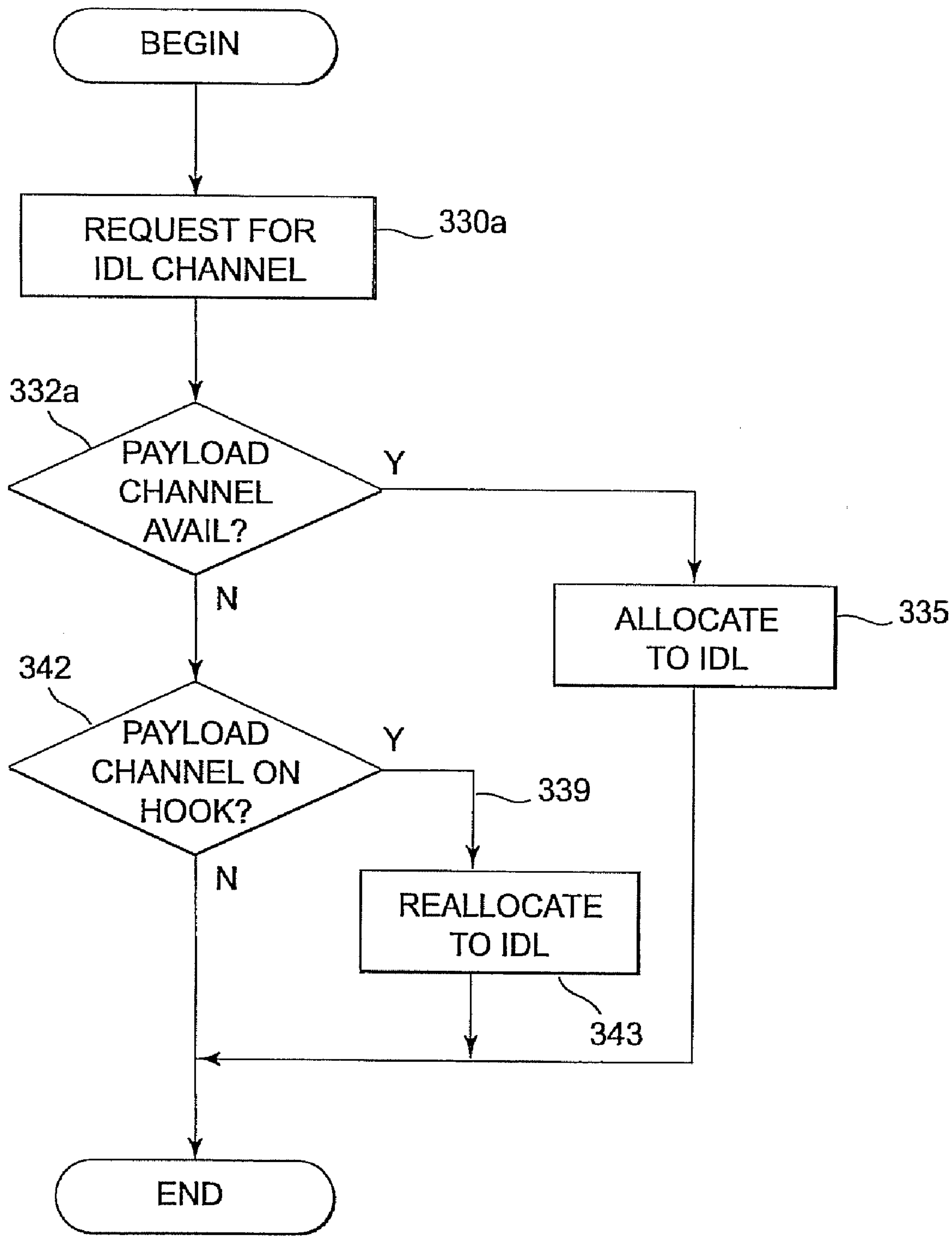
Figure 70:
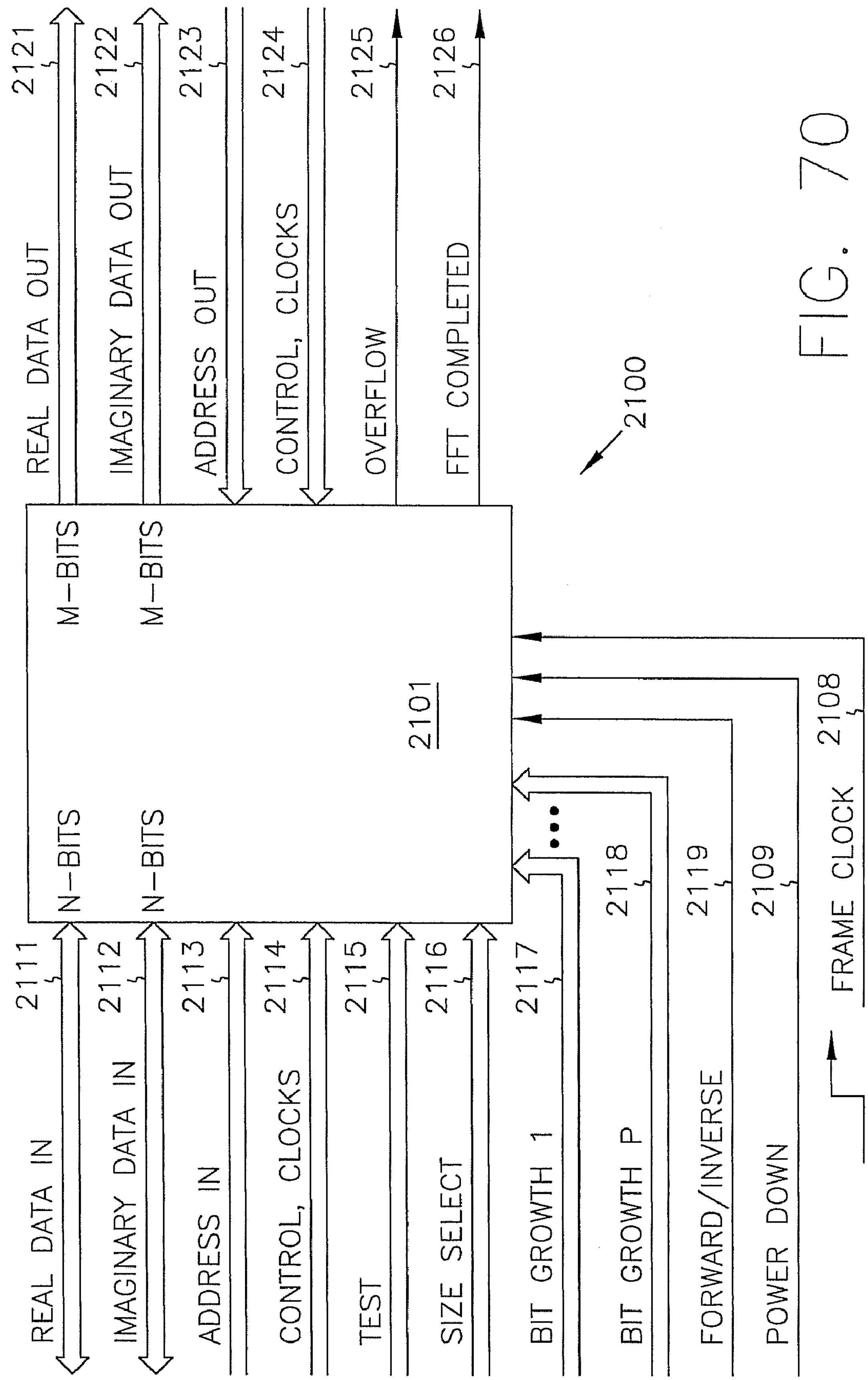
Figure 71:
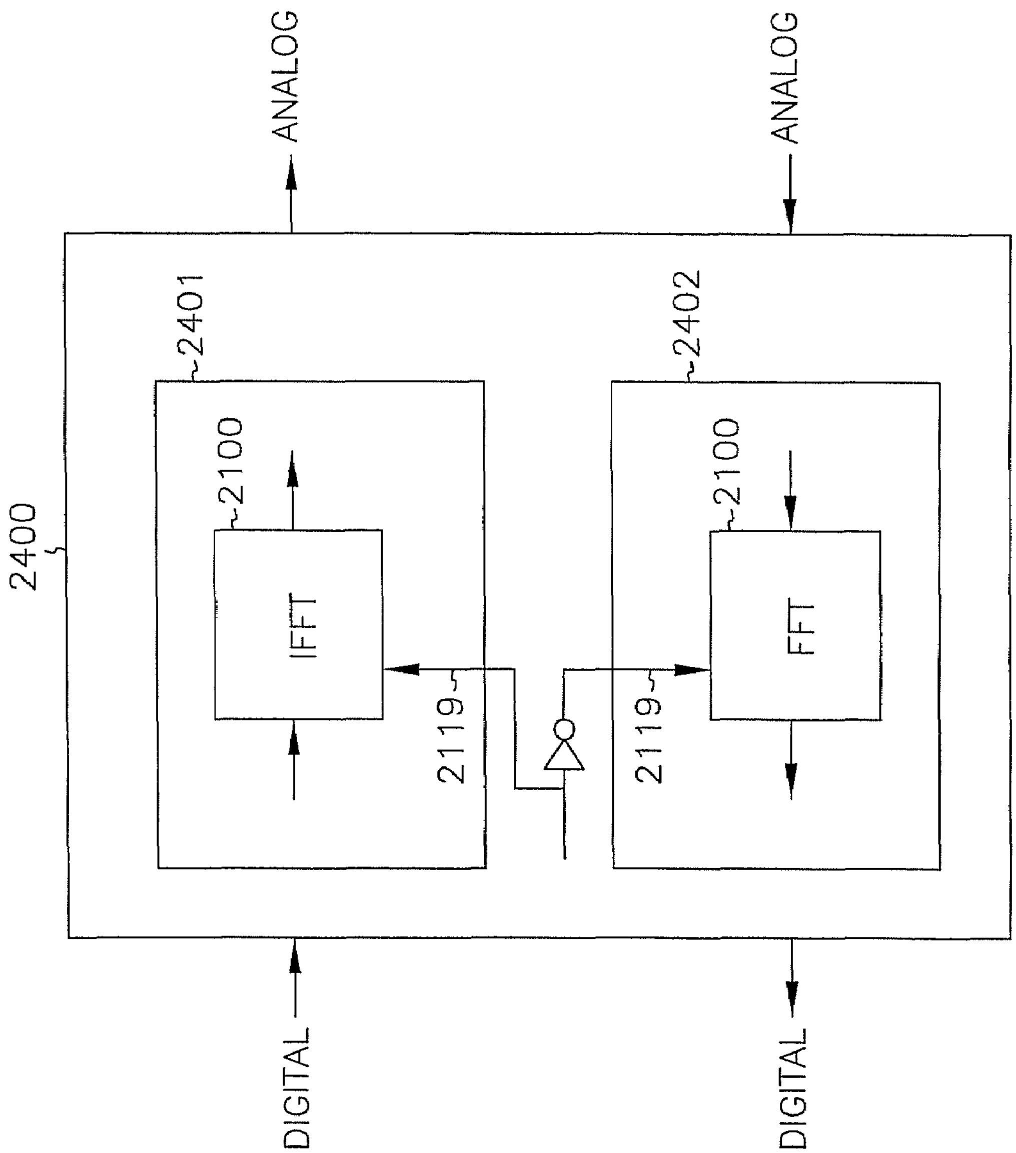
Figure 72:
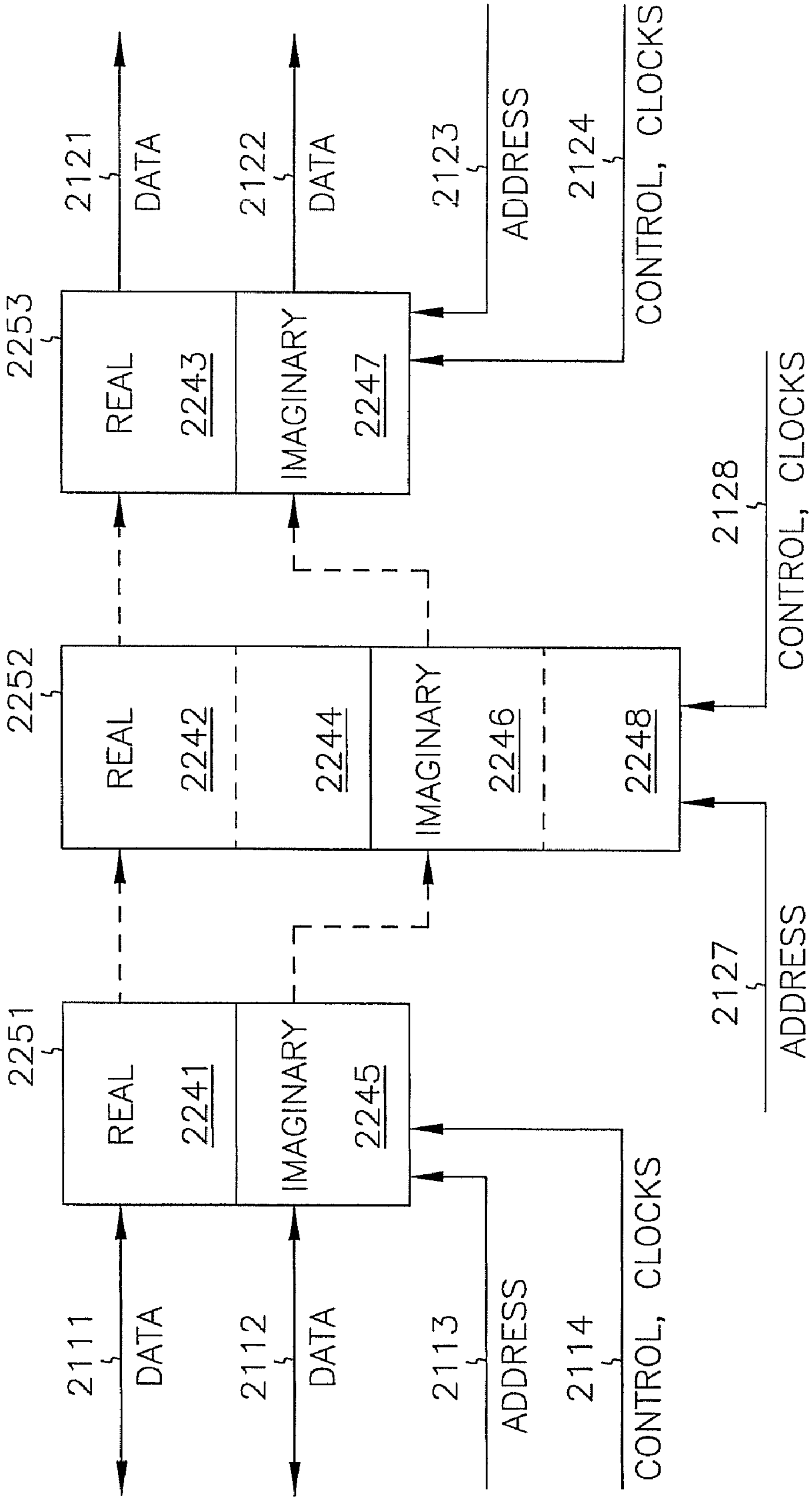
Figure 73:
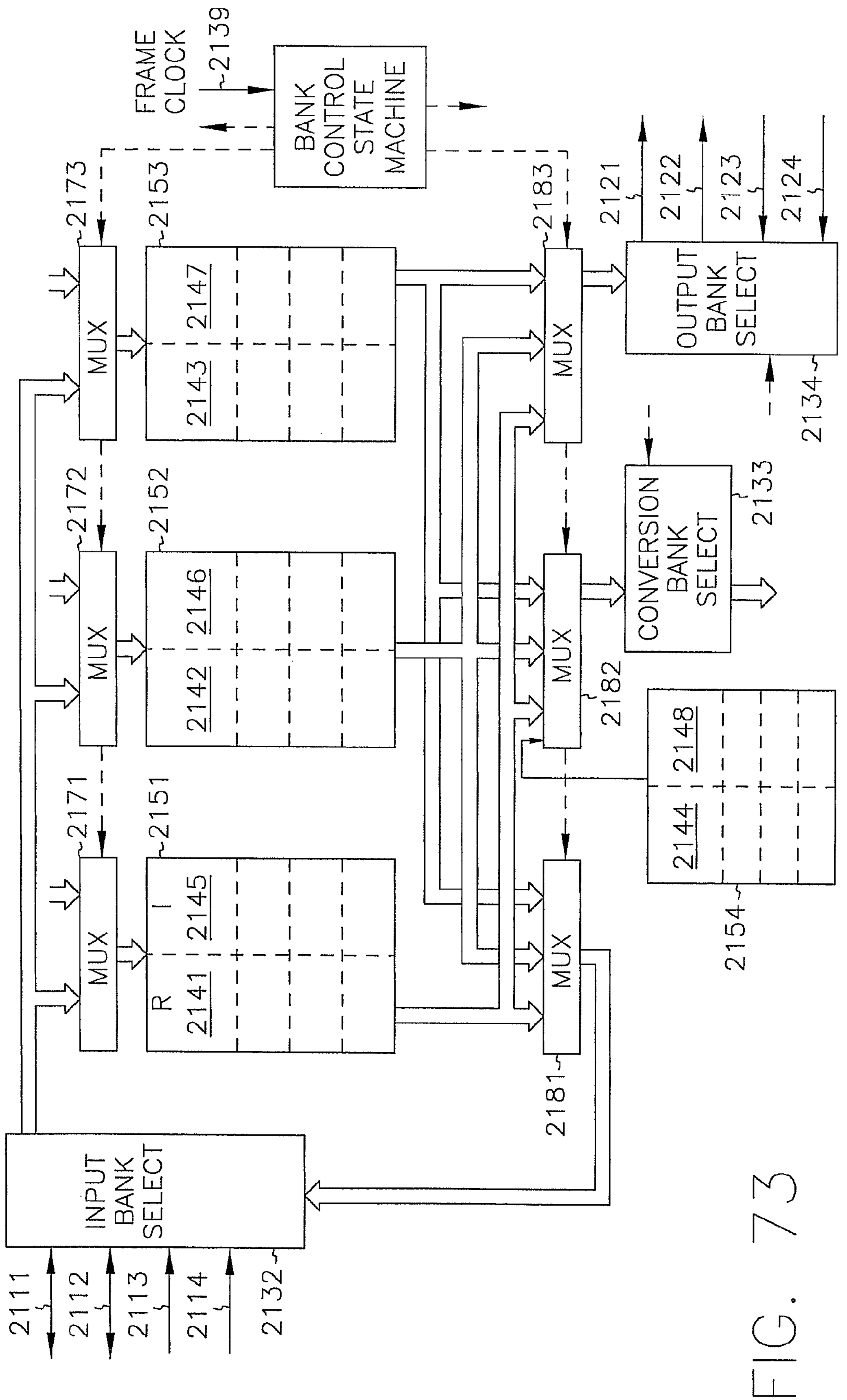
Figure 74:
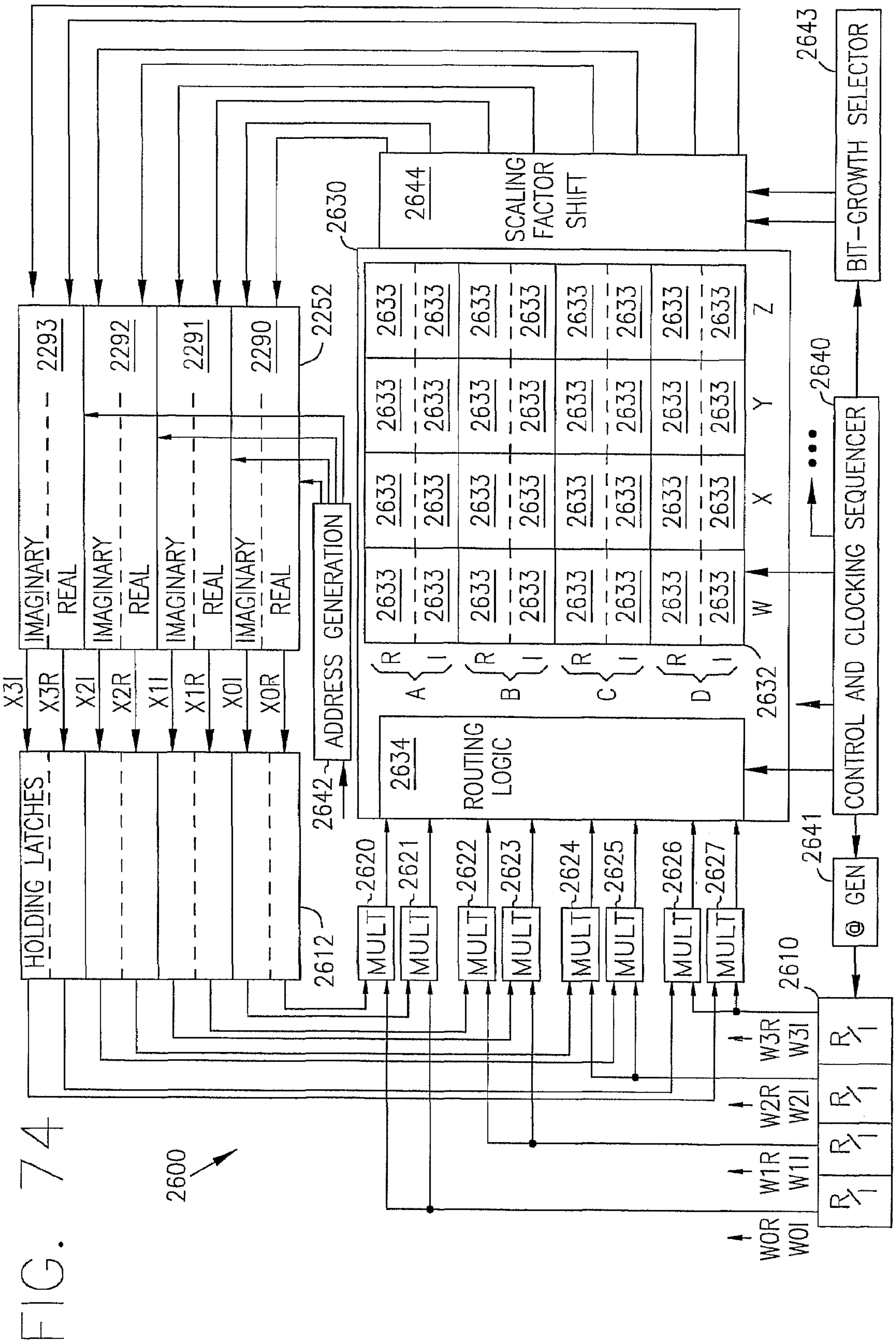
Figure 91:
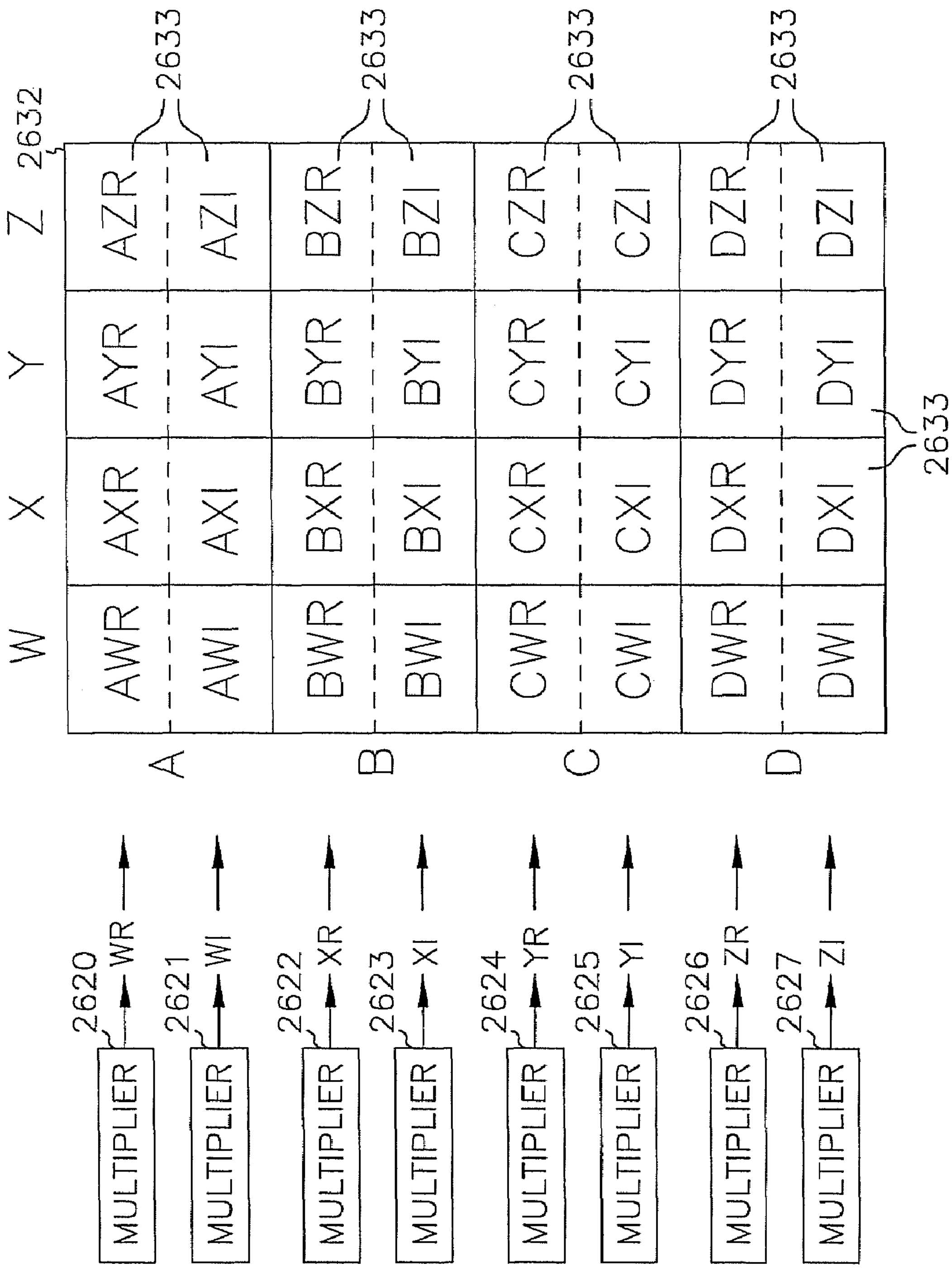
Figure 92:
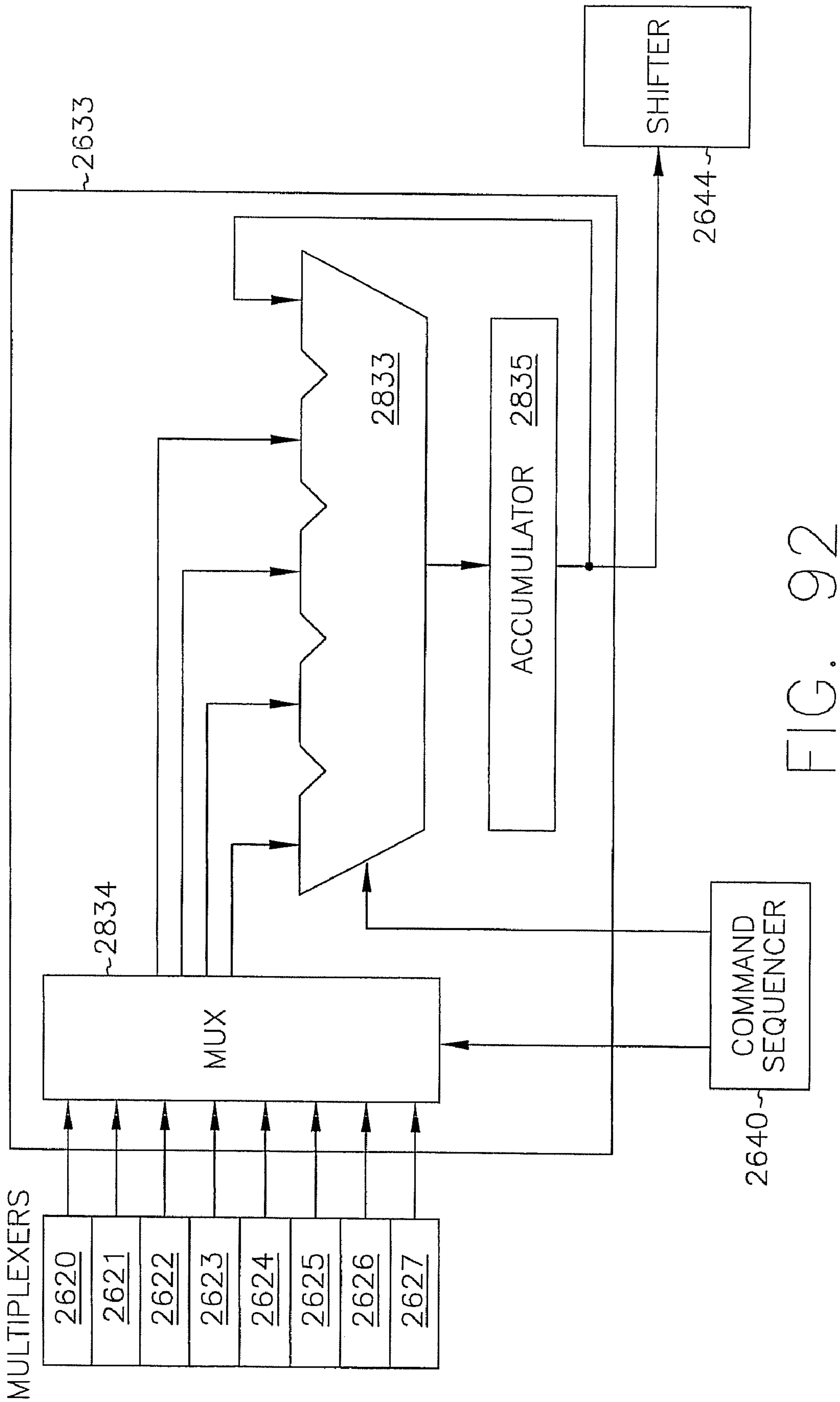
Figure 93:
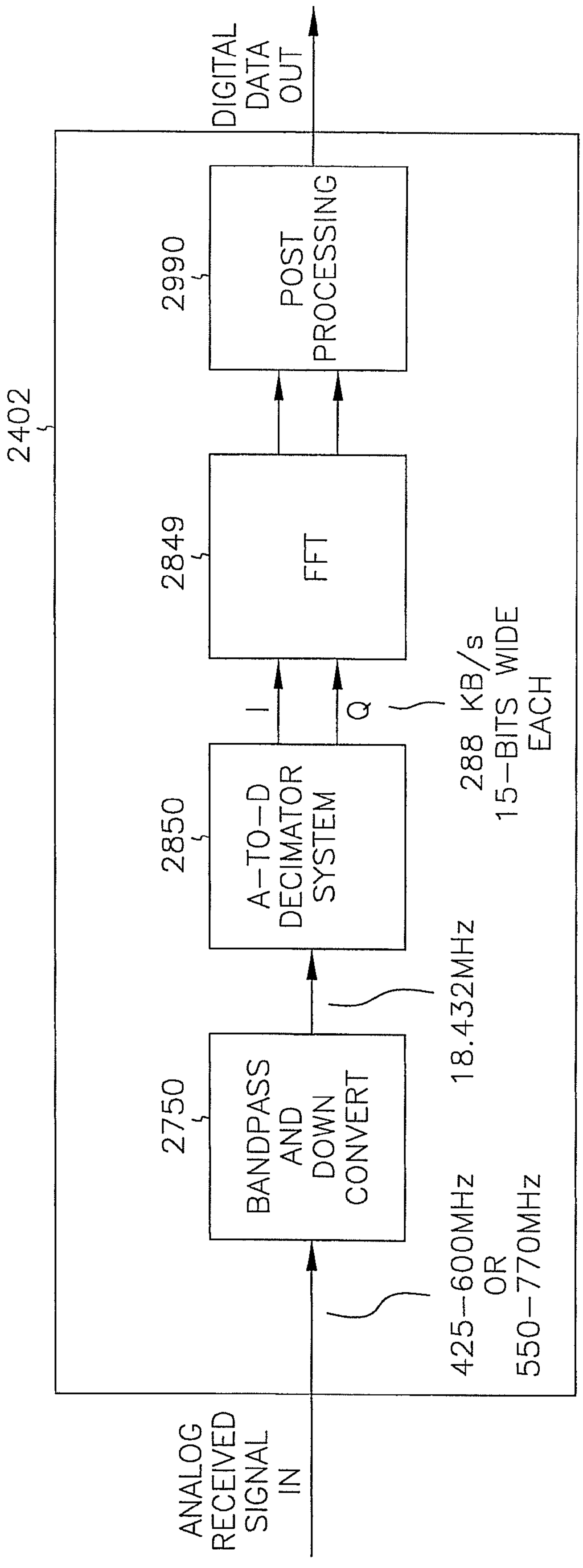
Figure 94:
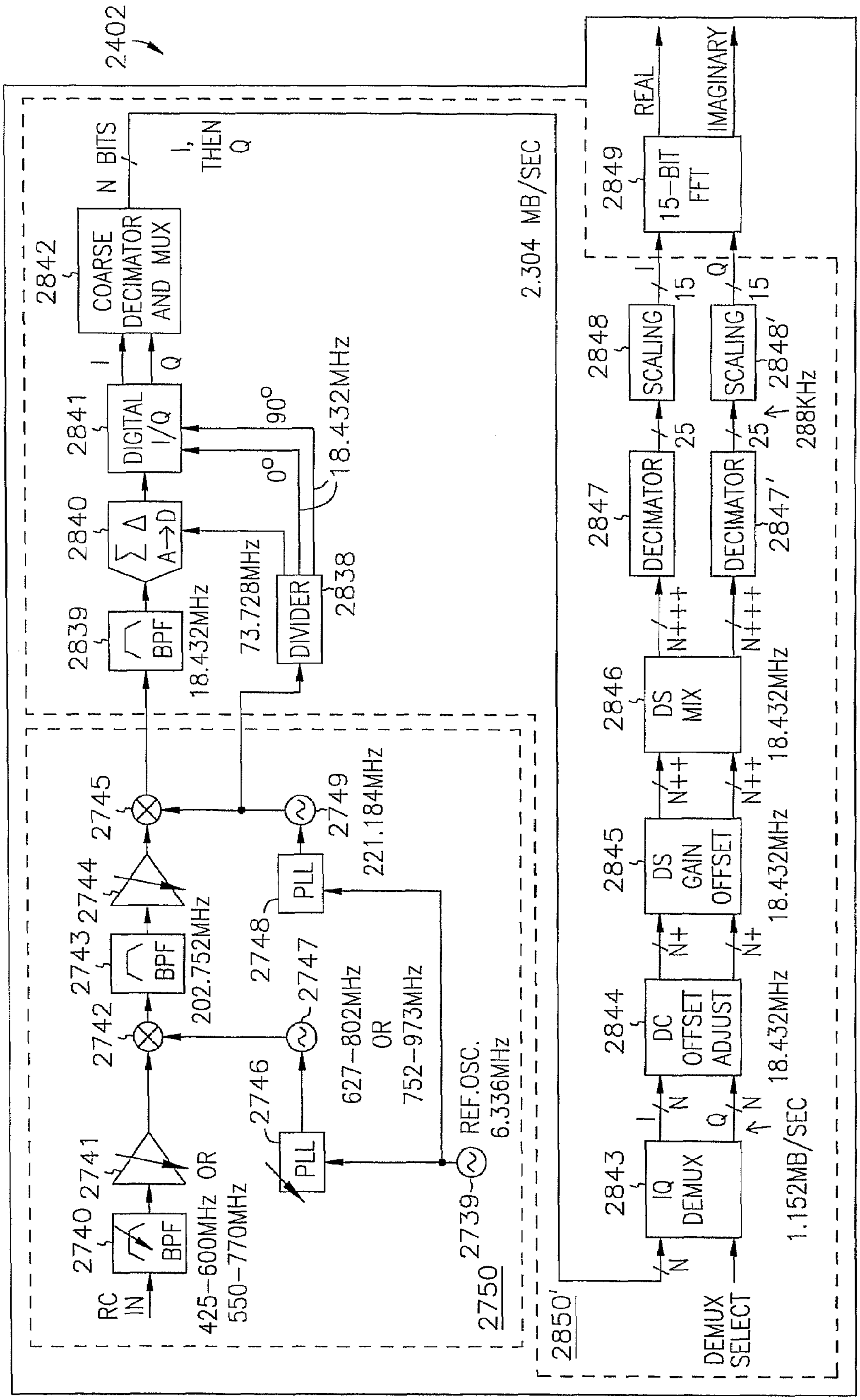
Figure 95:
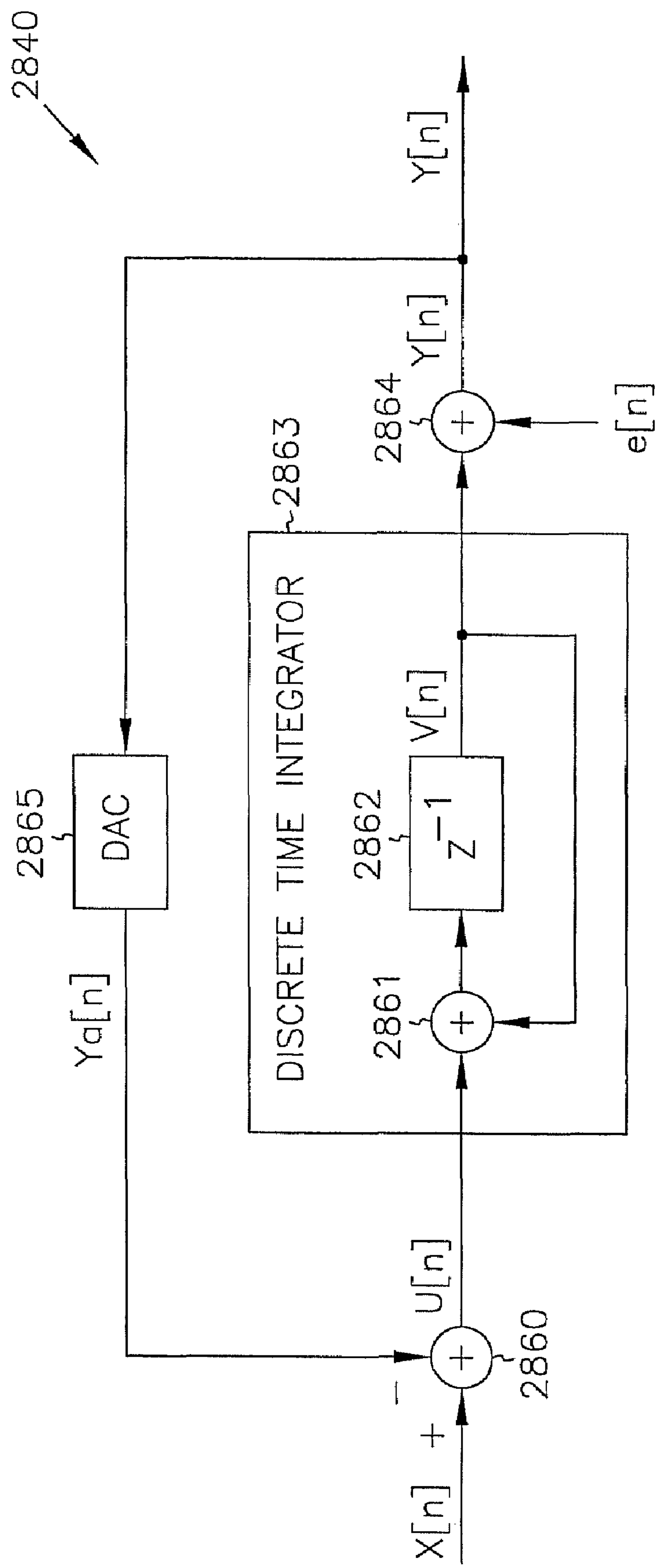
Figure 96:
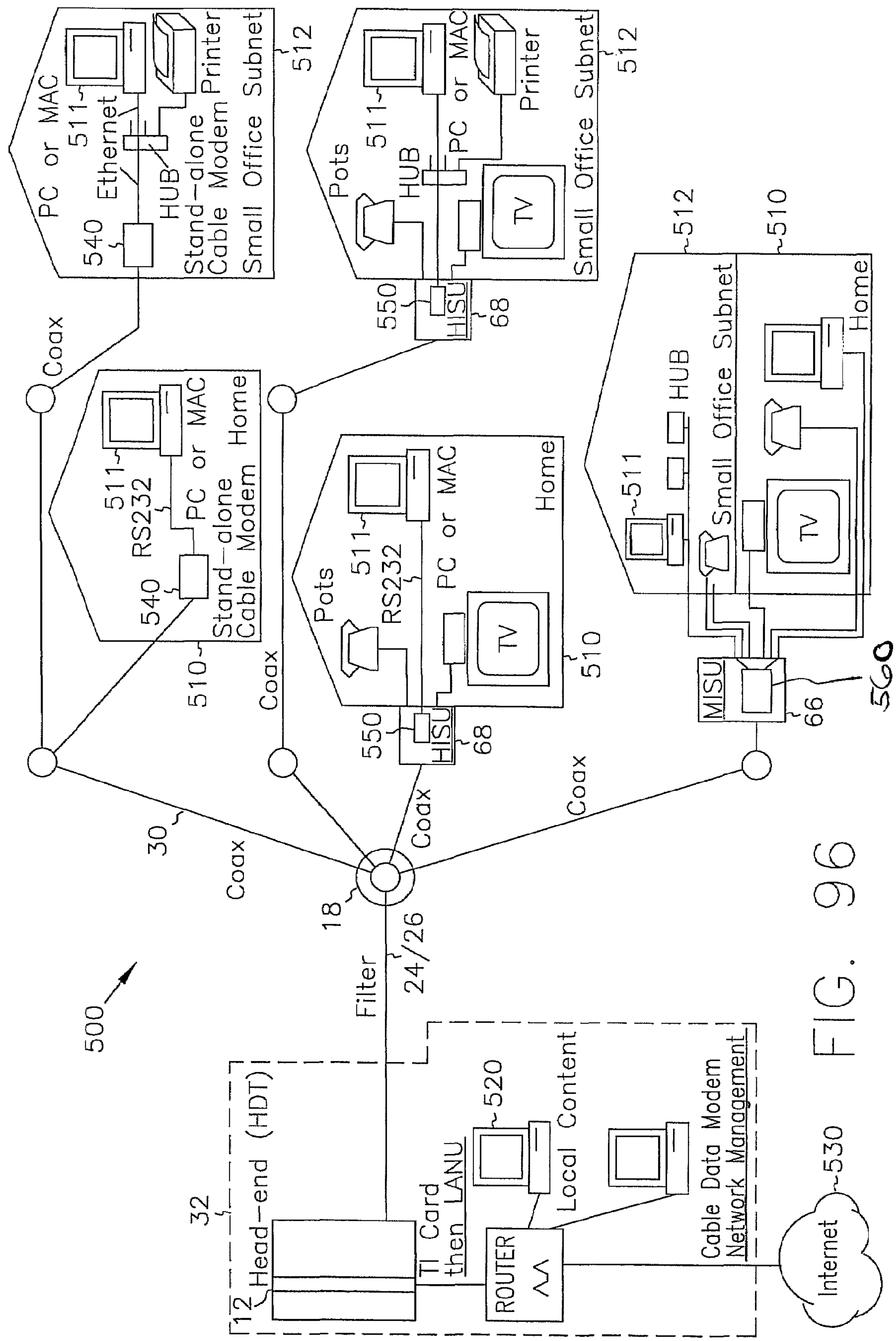
Figure 97:
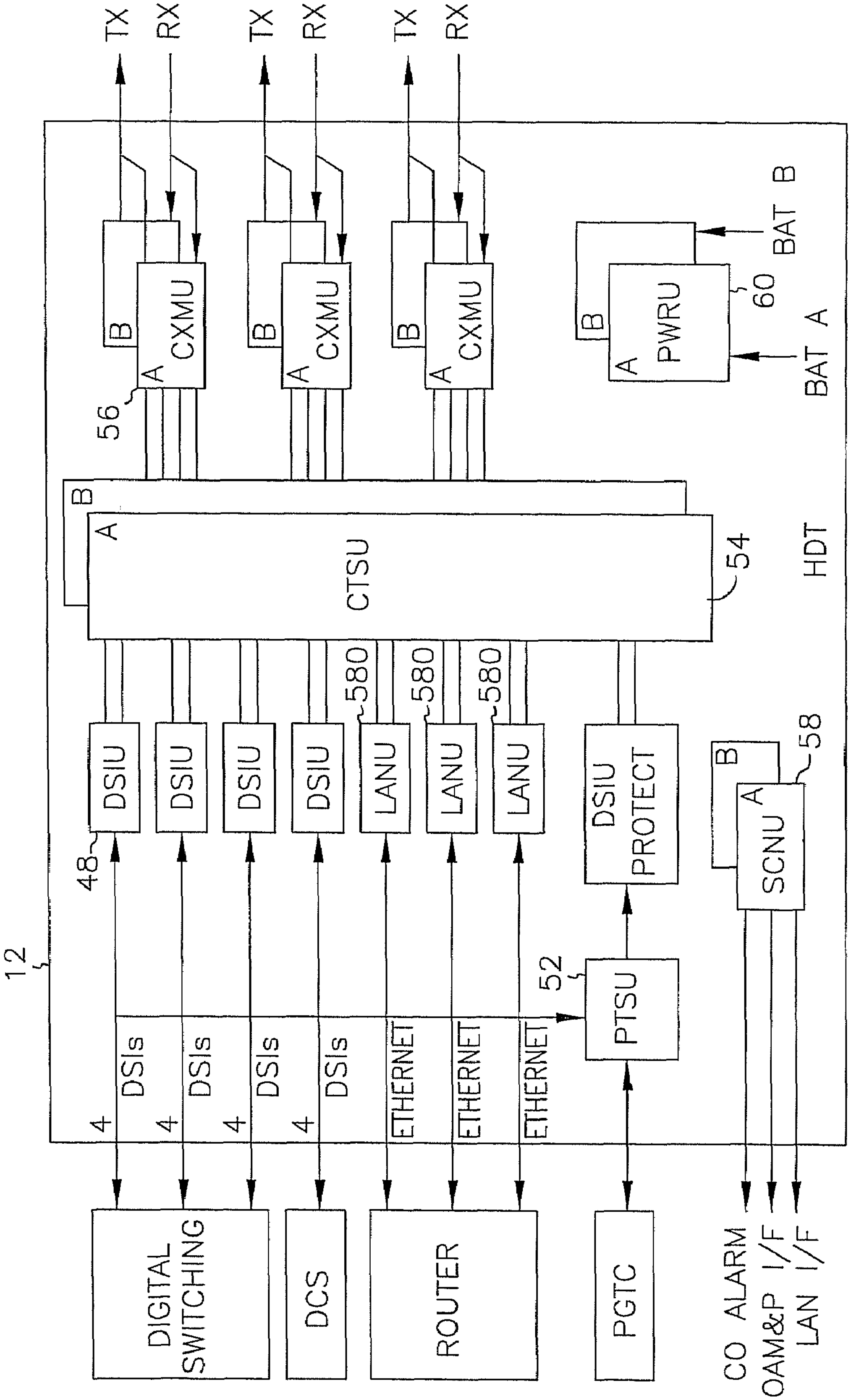
Figure 98:
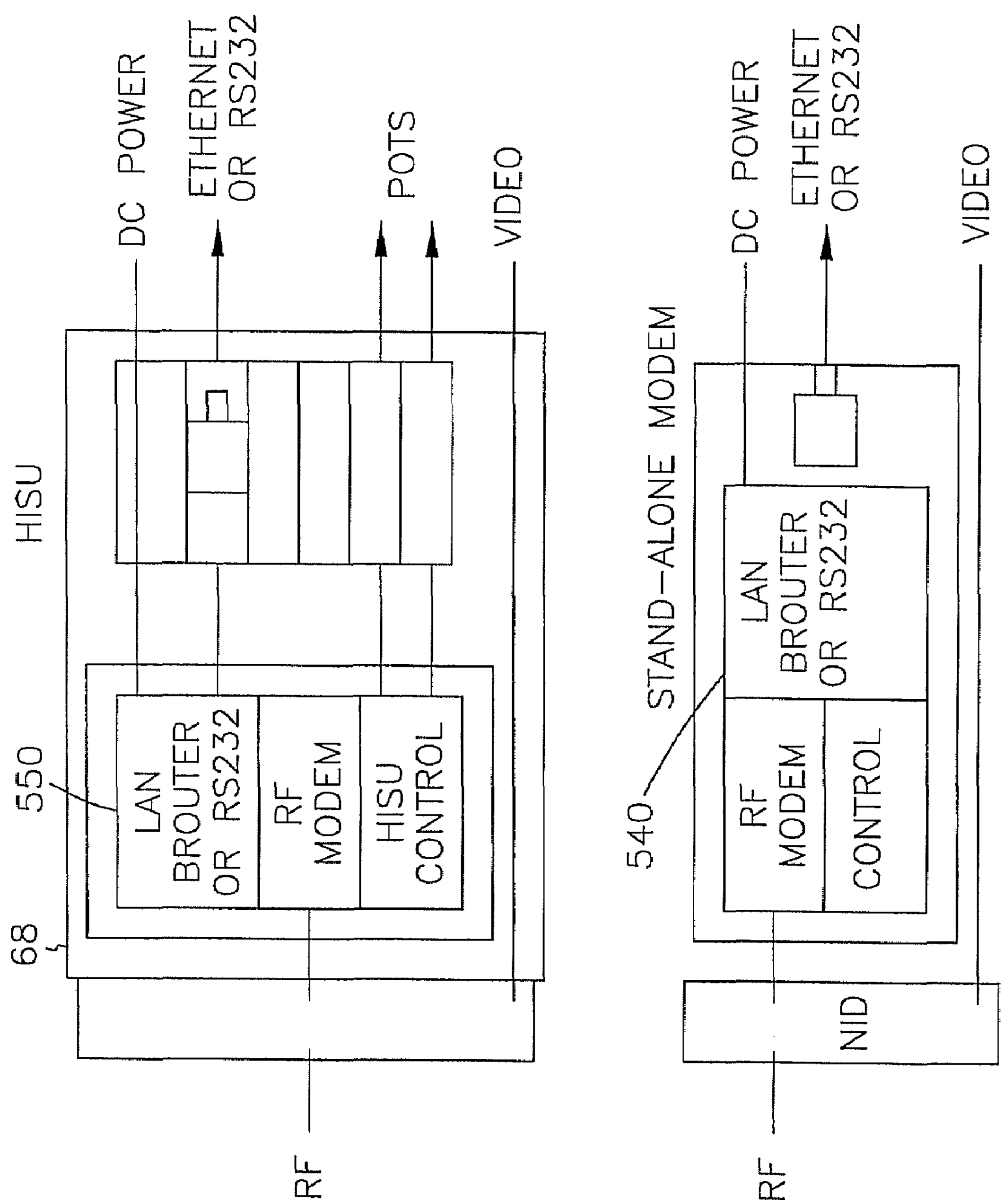
Figure 99:
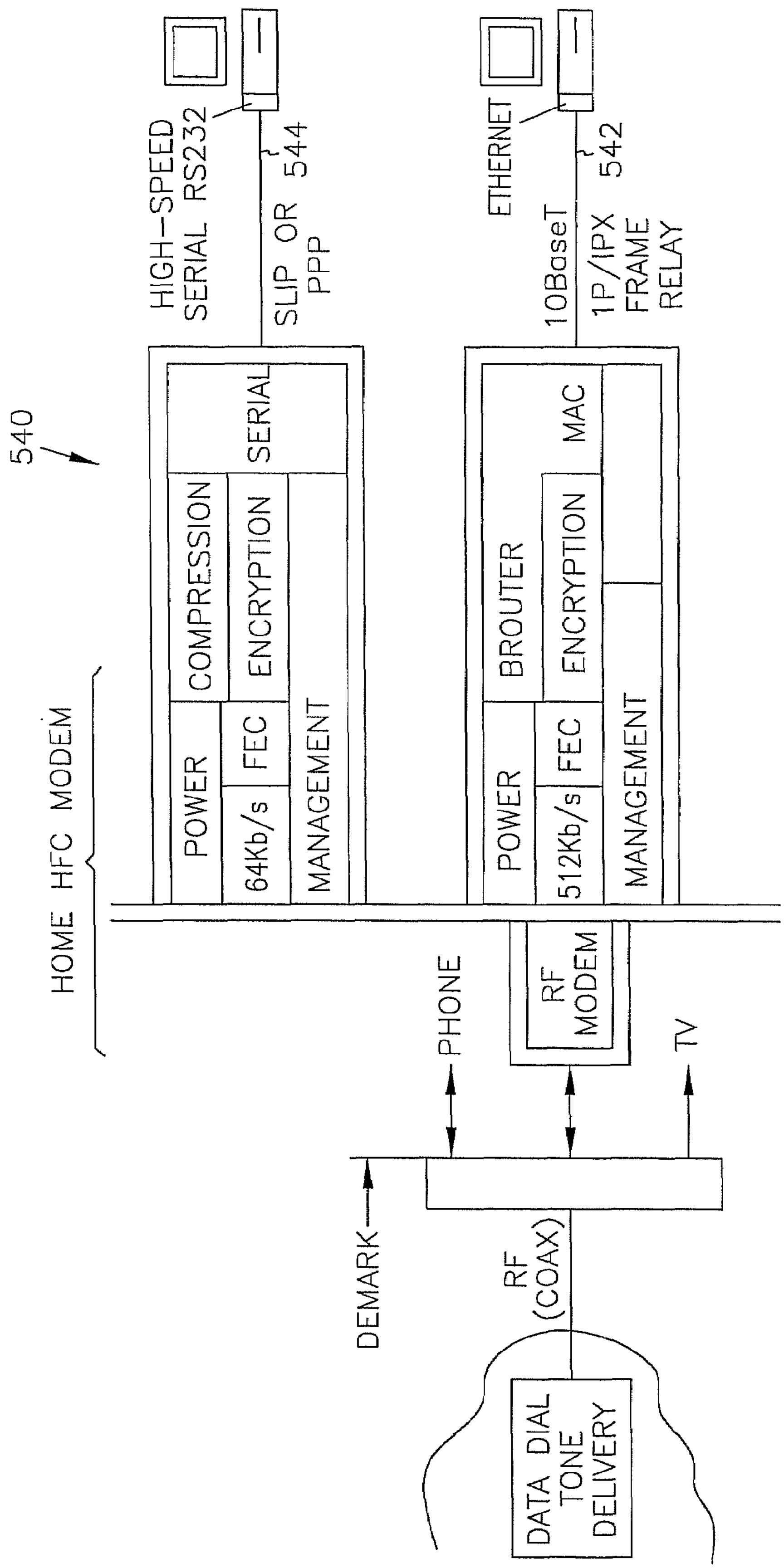
Figure 100:
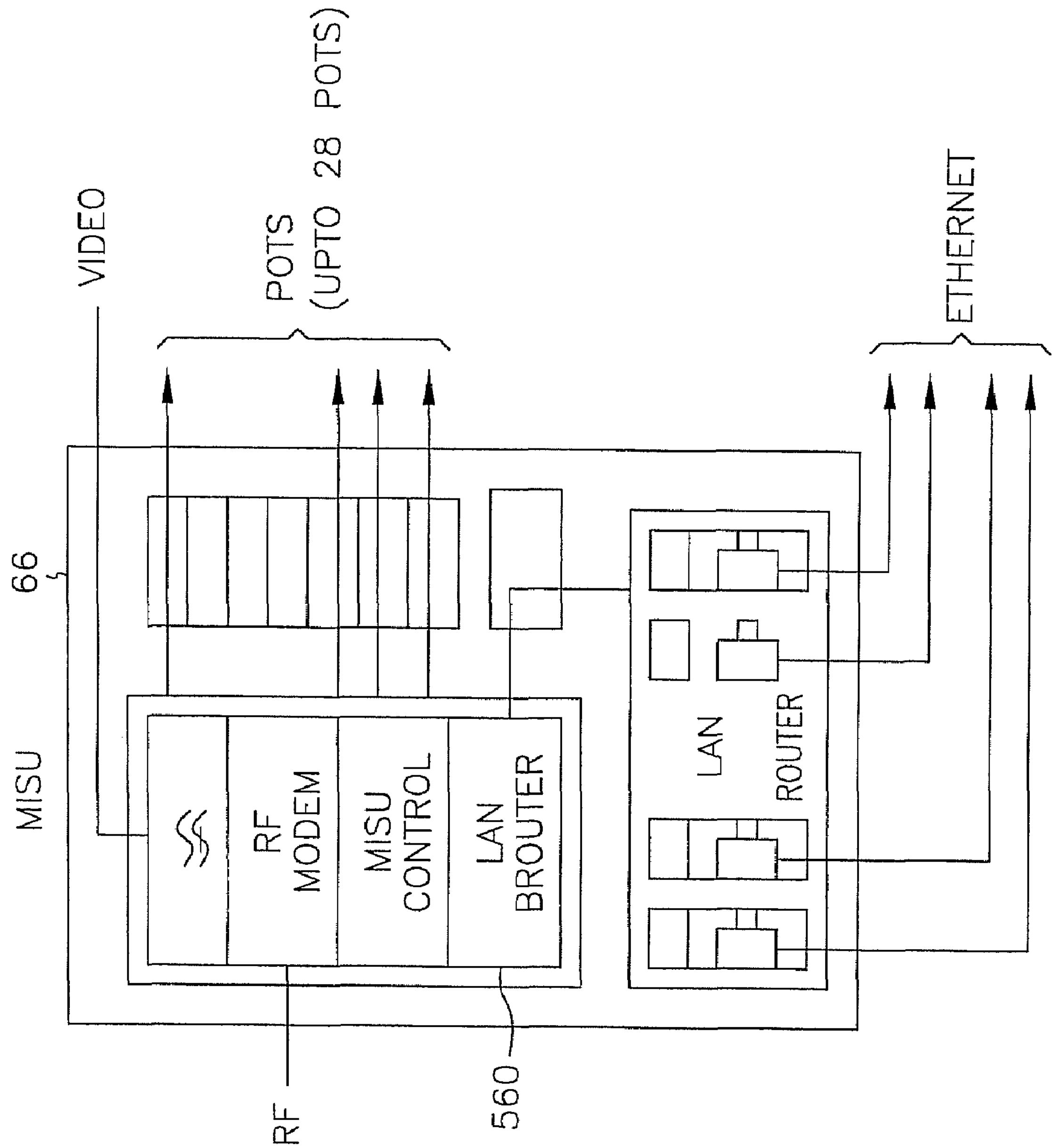
Figure 101:
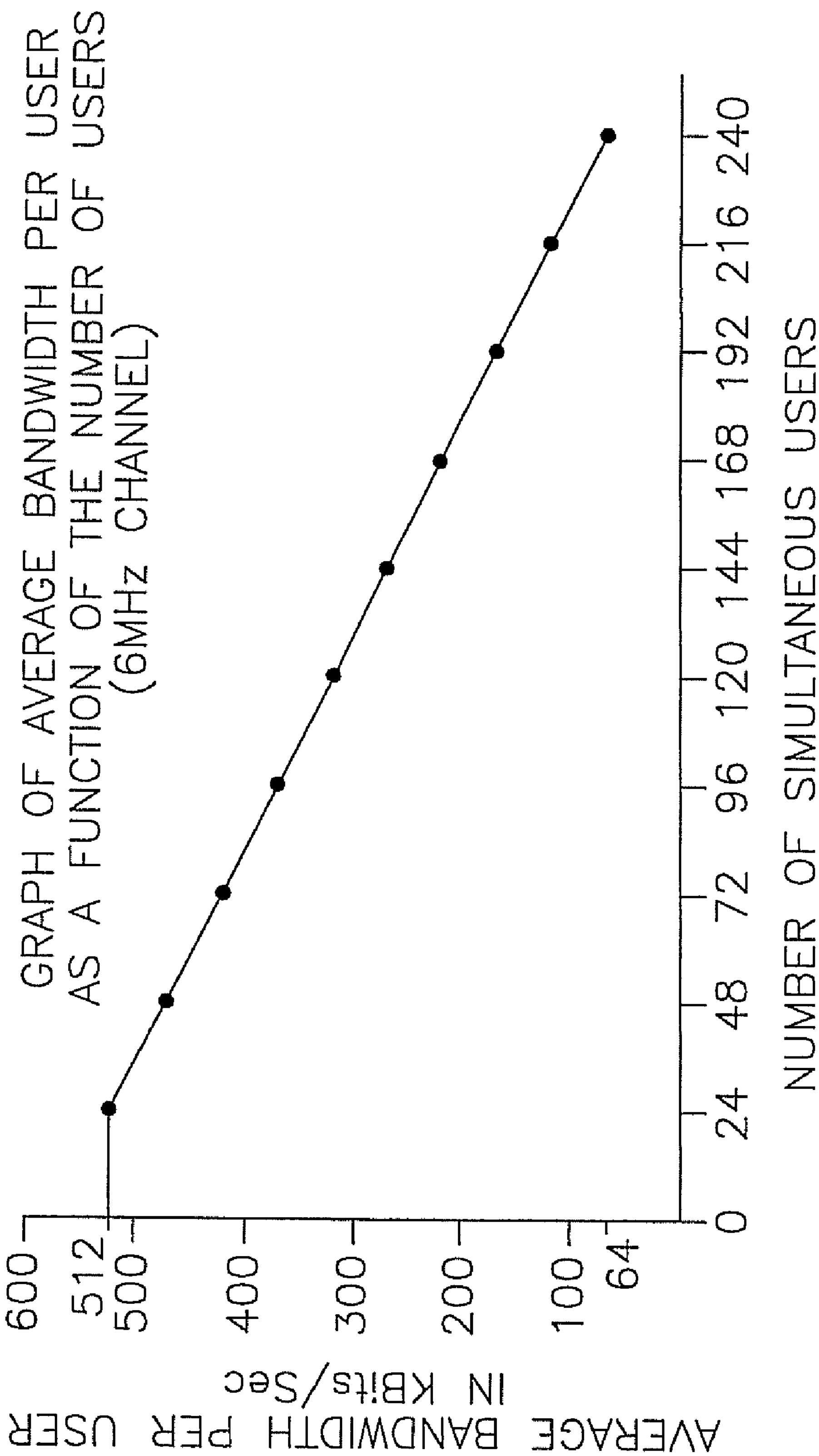
Figure 102:
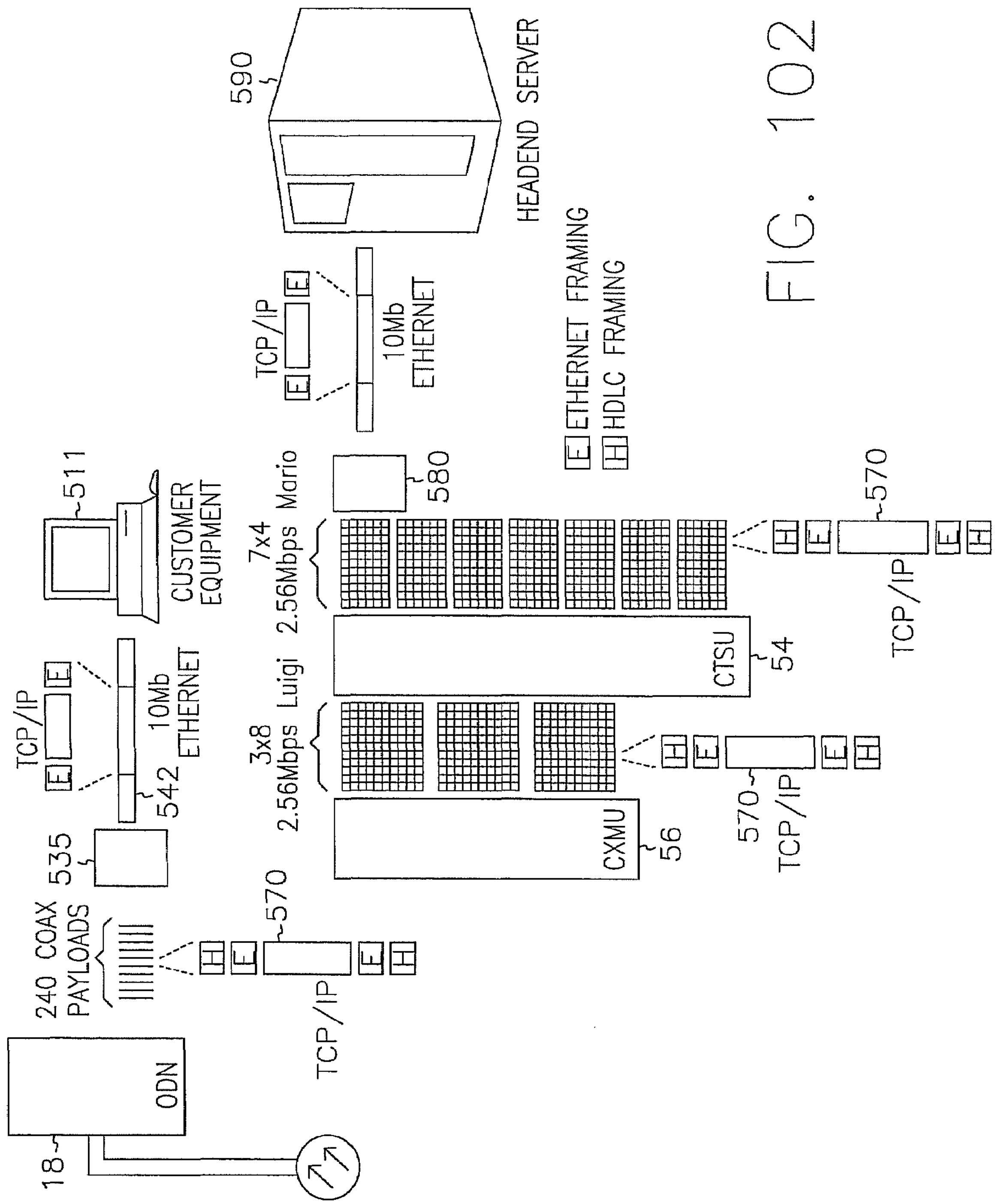
Figure 103:
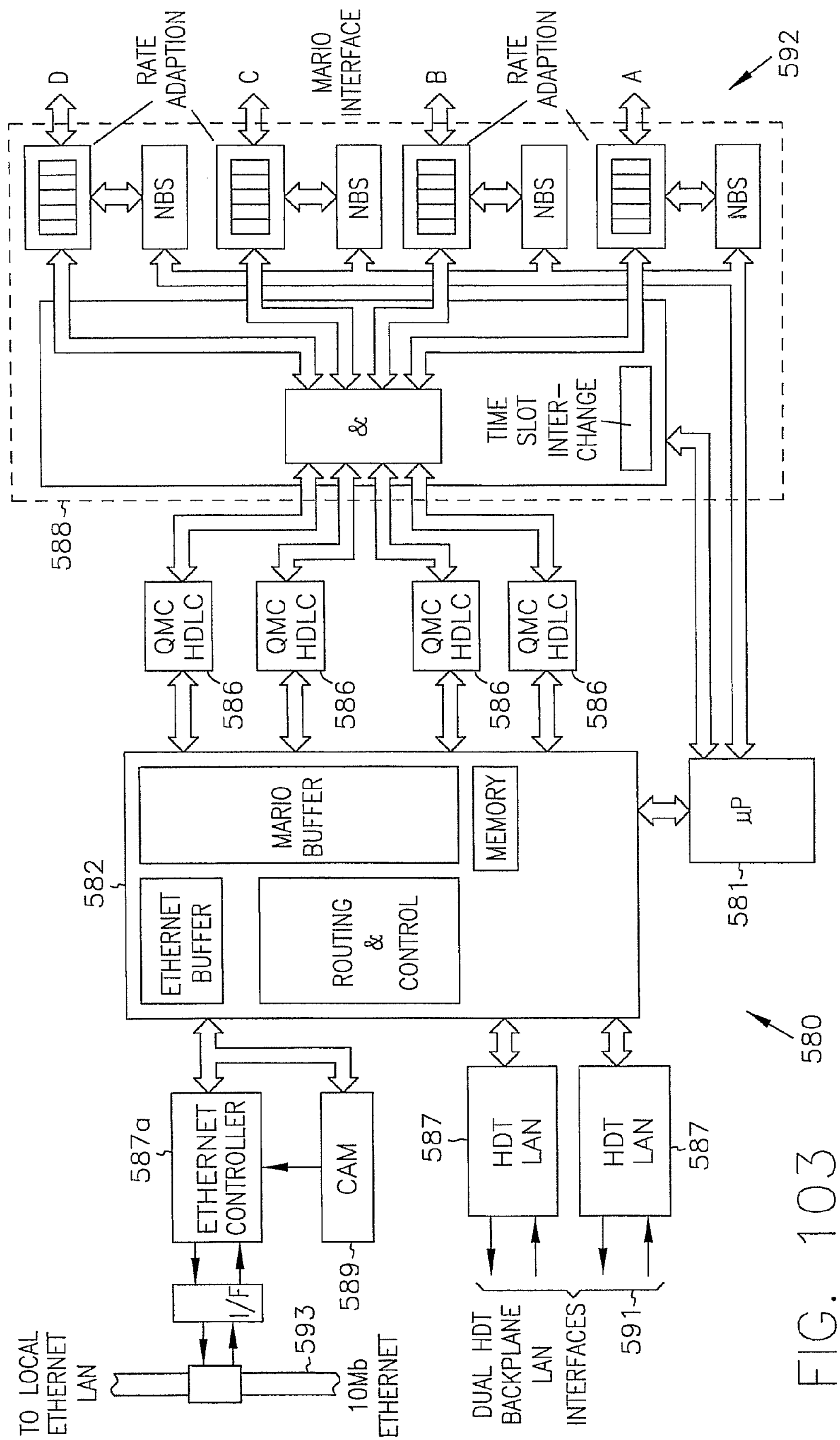
Figure 104:
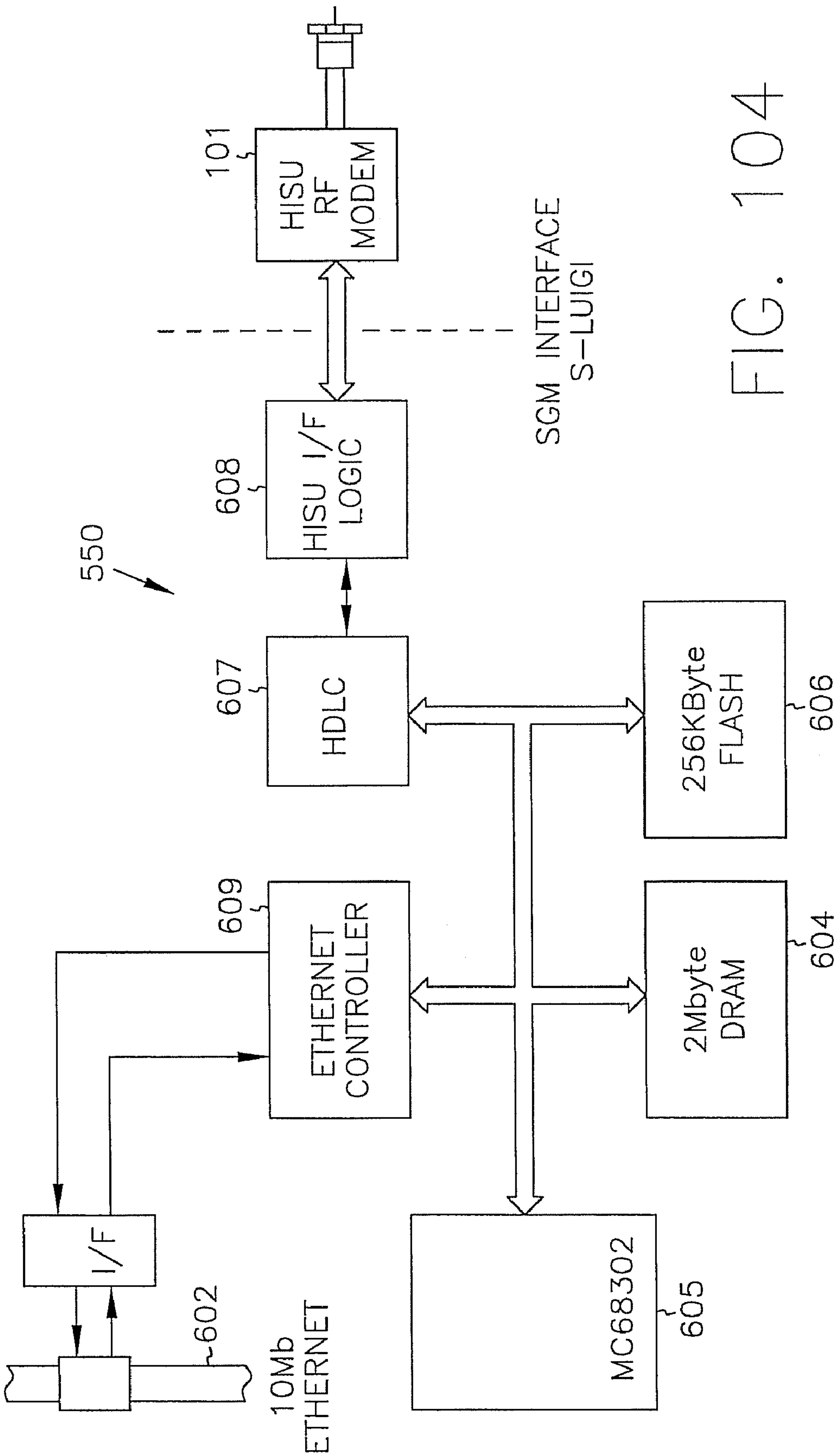
Figure 105:
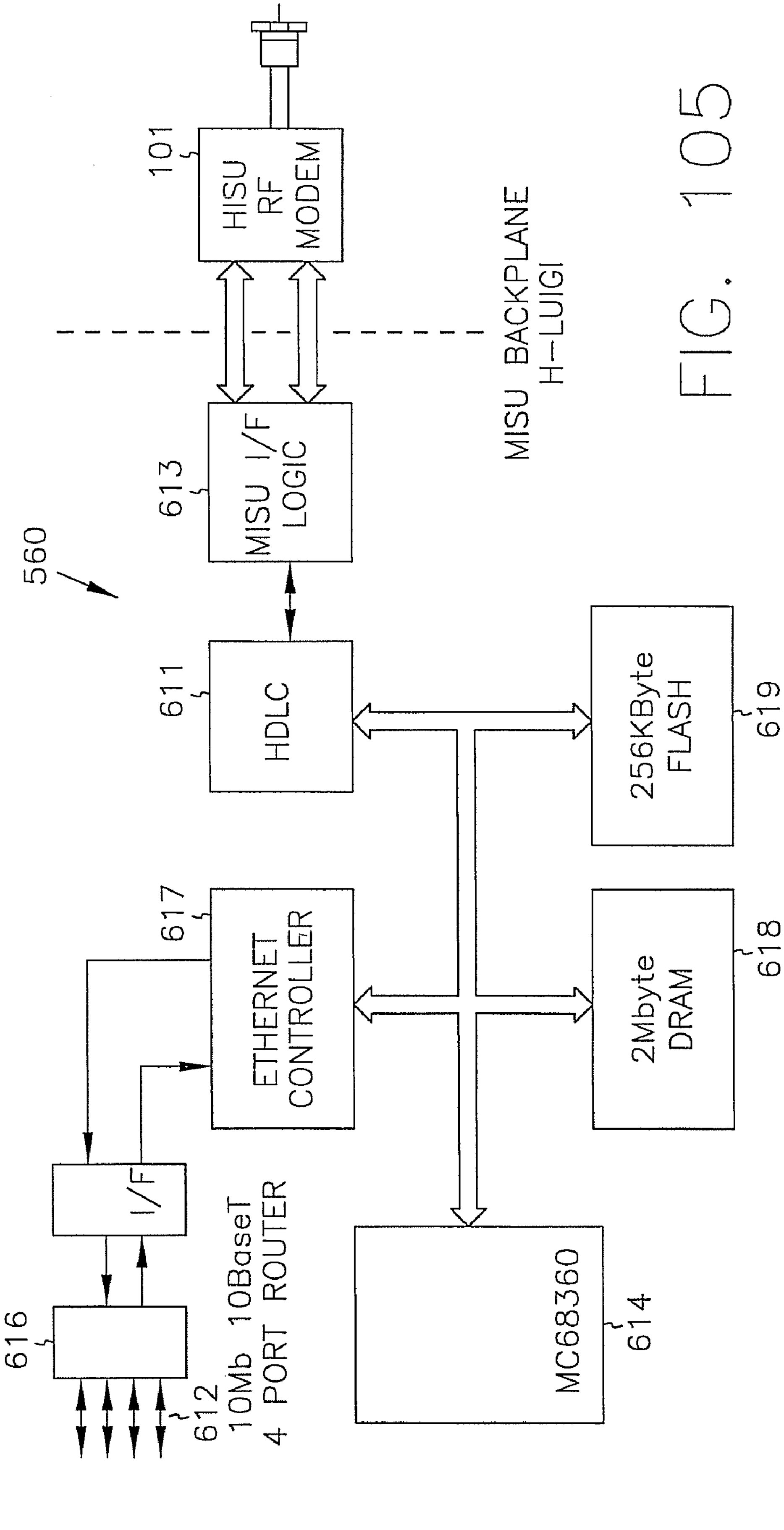
Figure 106:
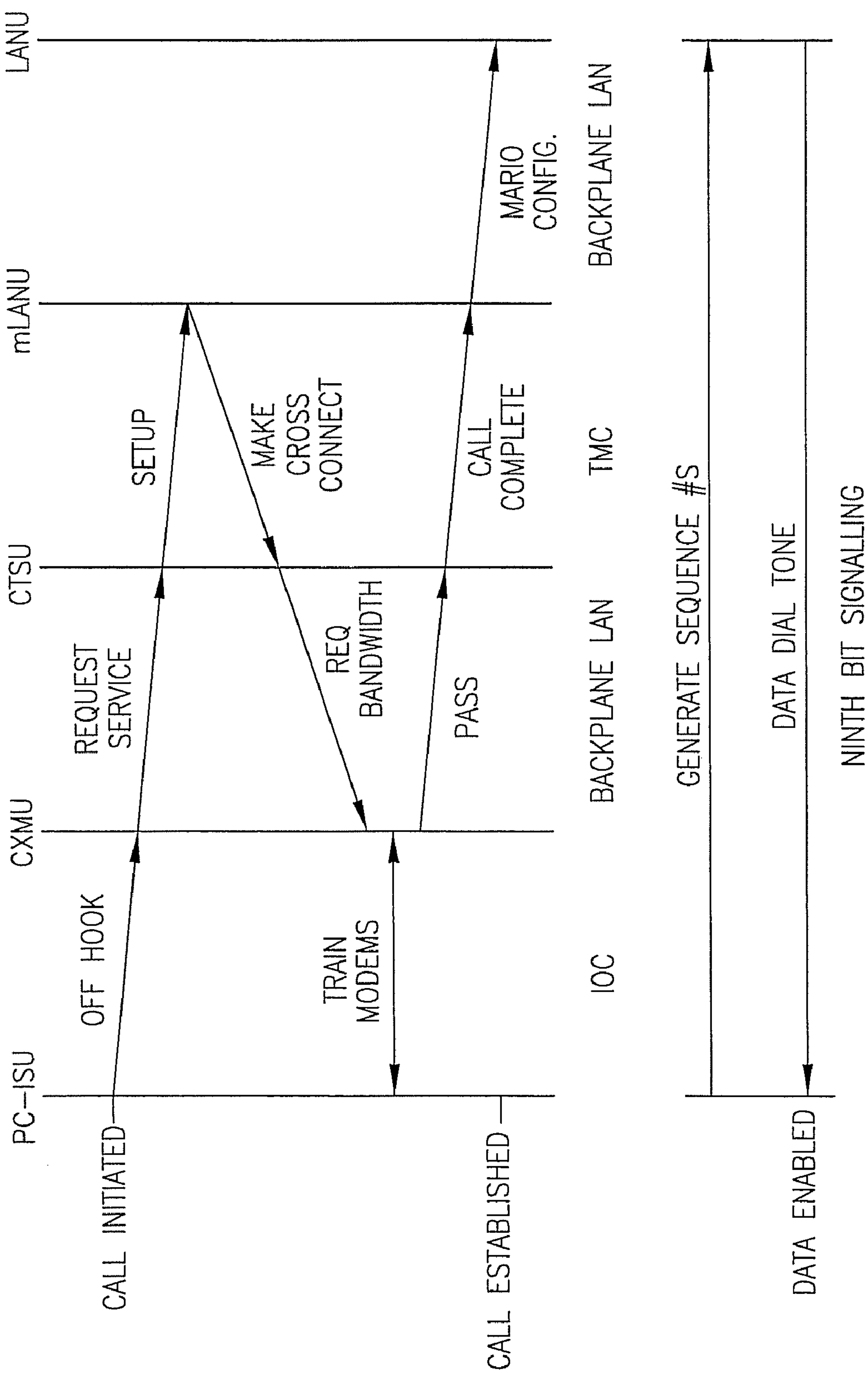
Figure 110:
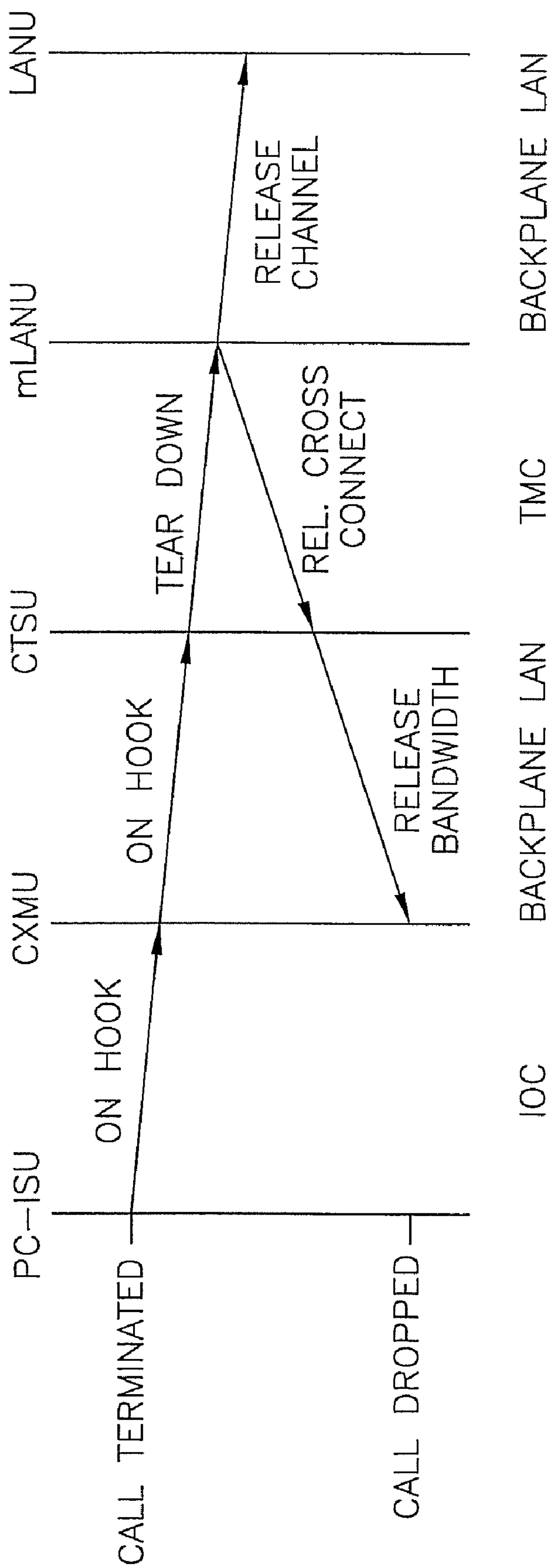
Figure 111:
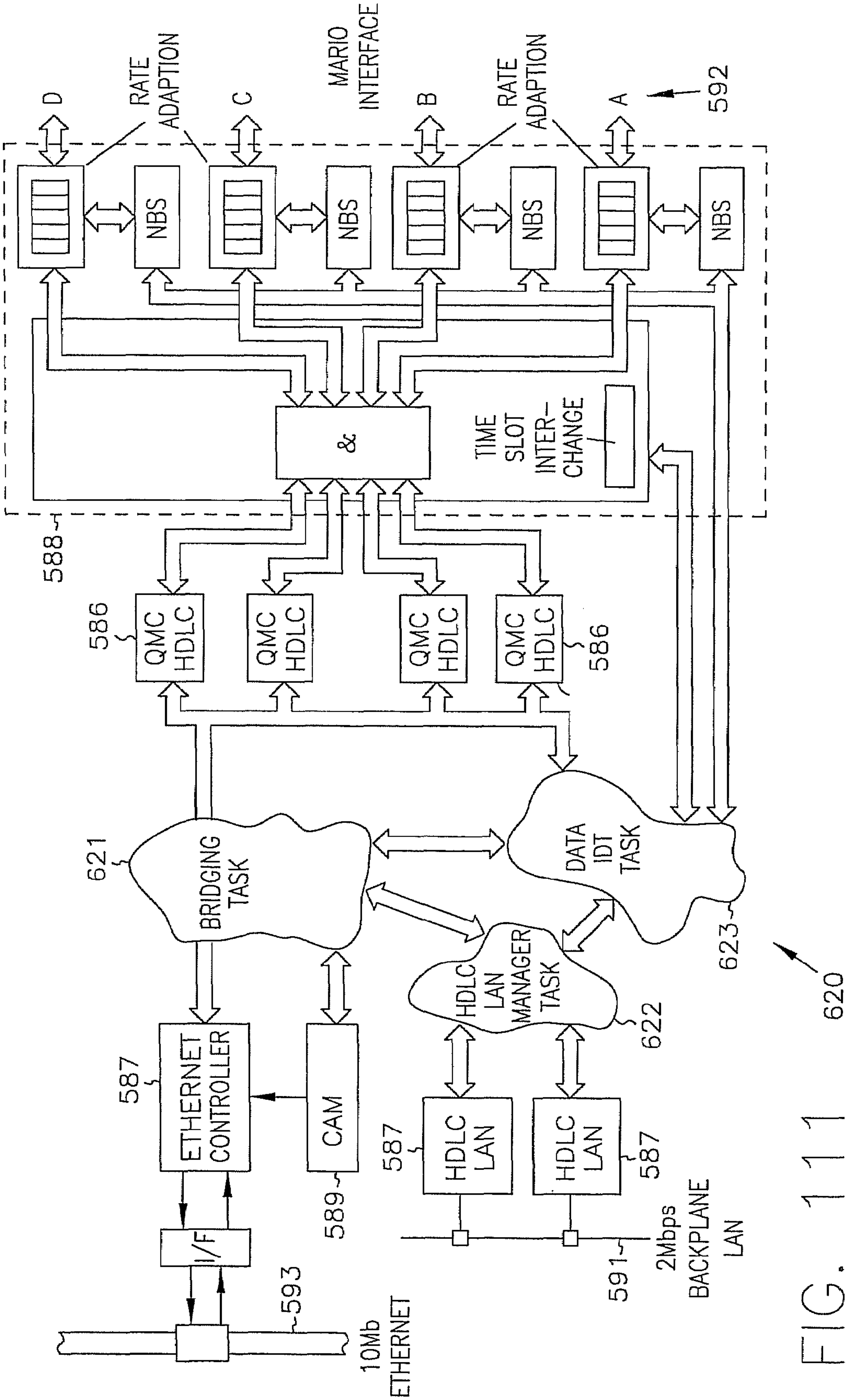
Figure 112:
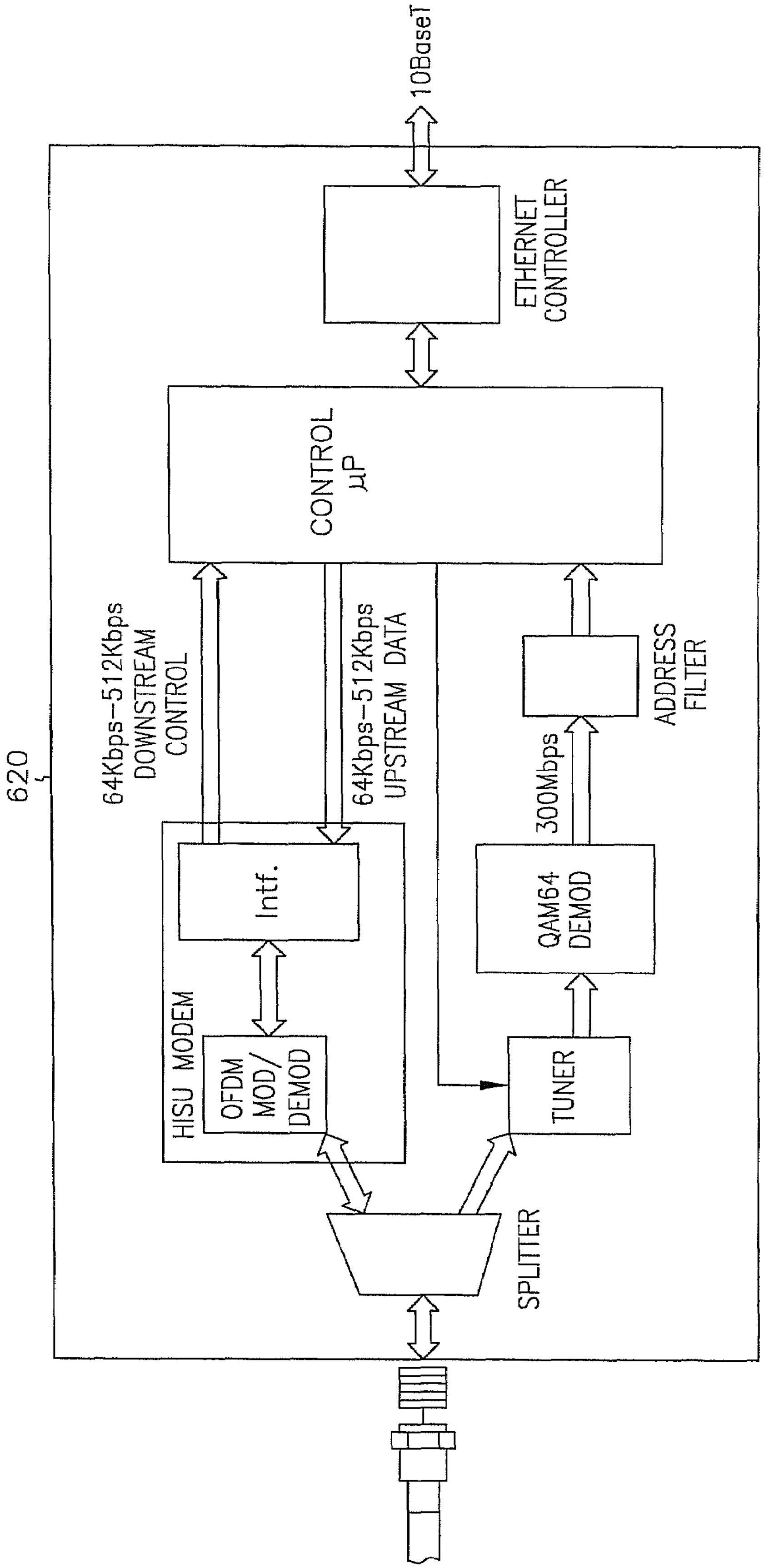
Figure 113:
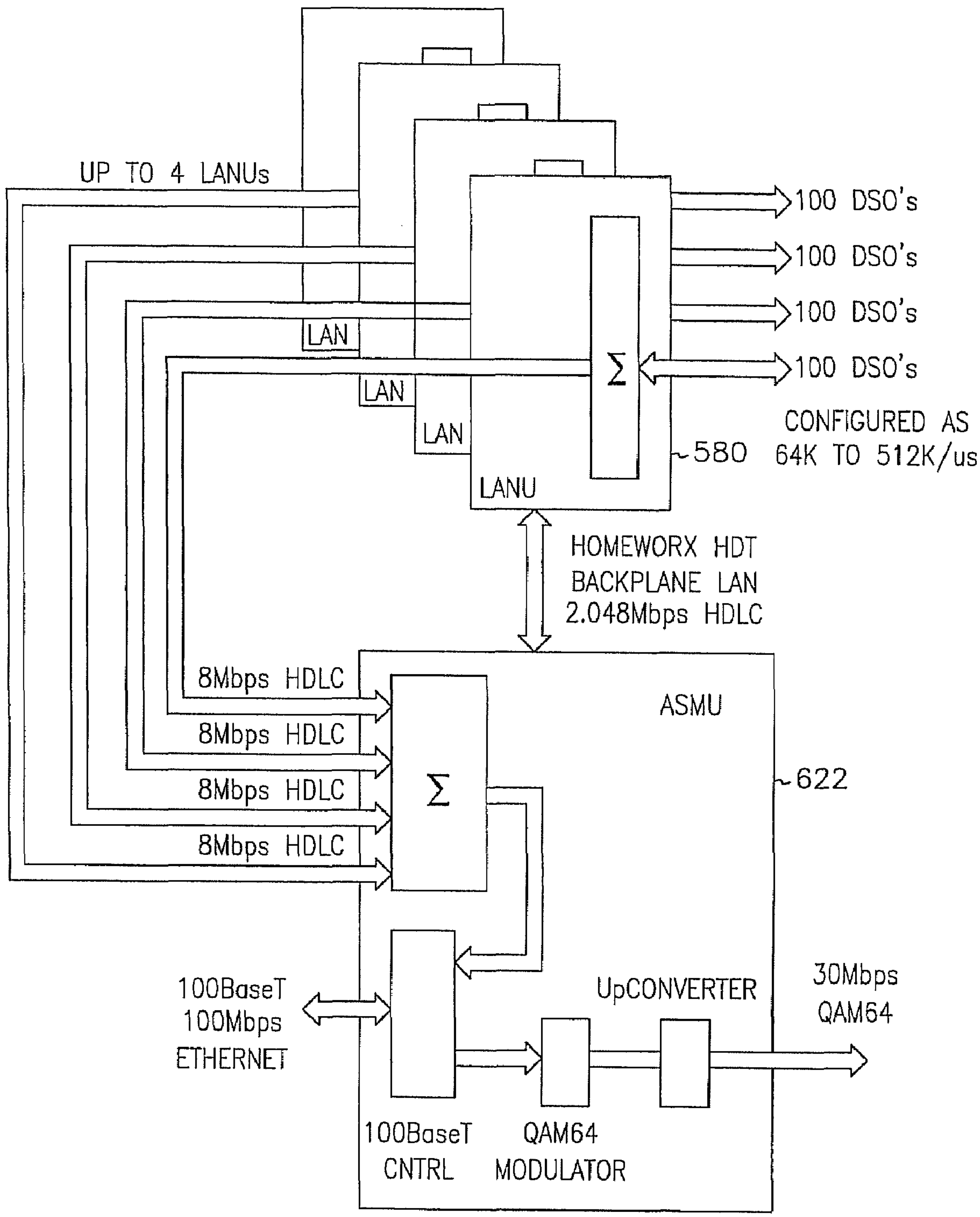
Figure 114:
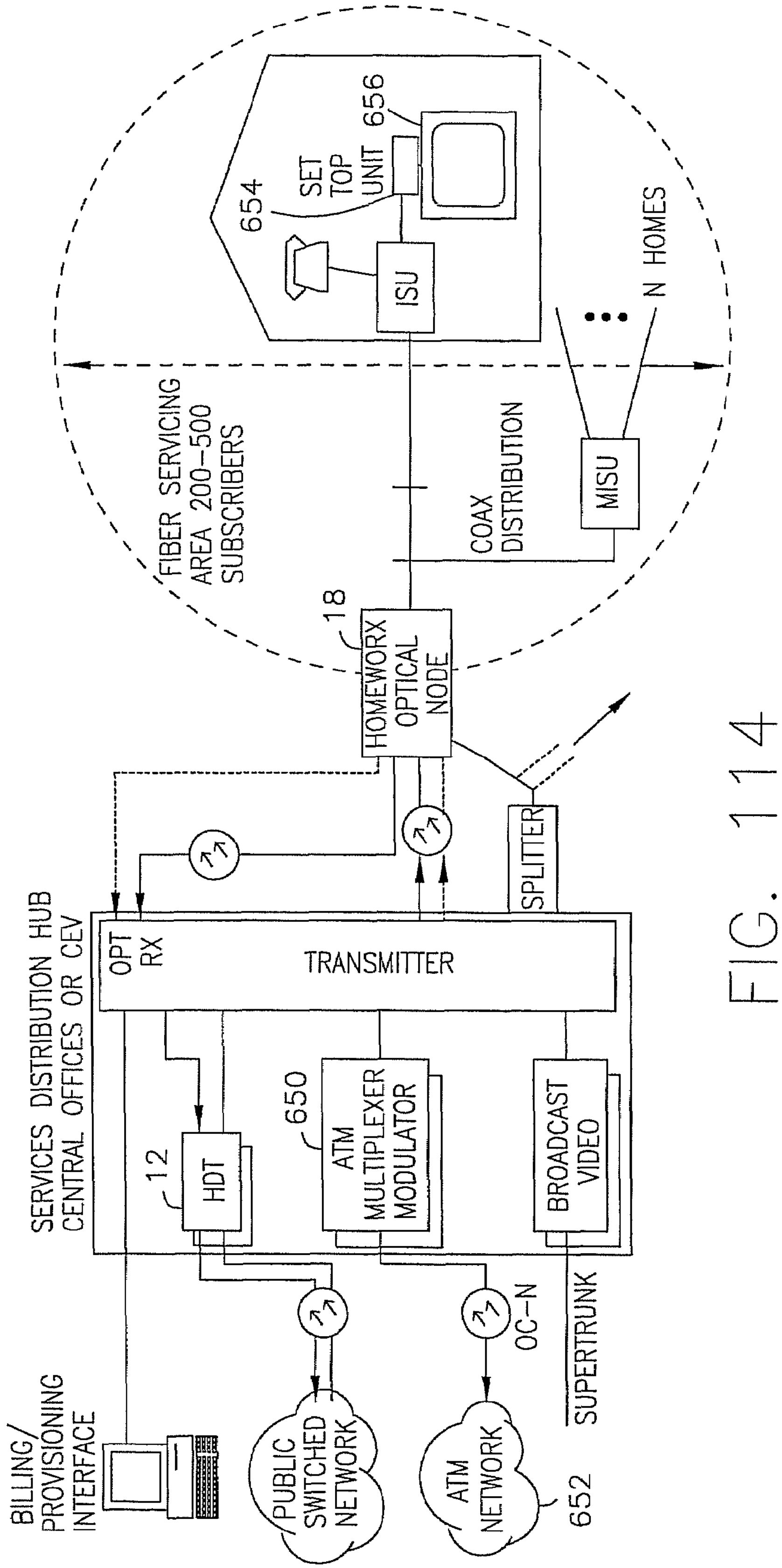
Figure 115:
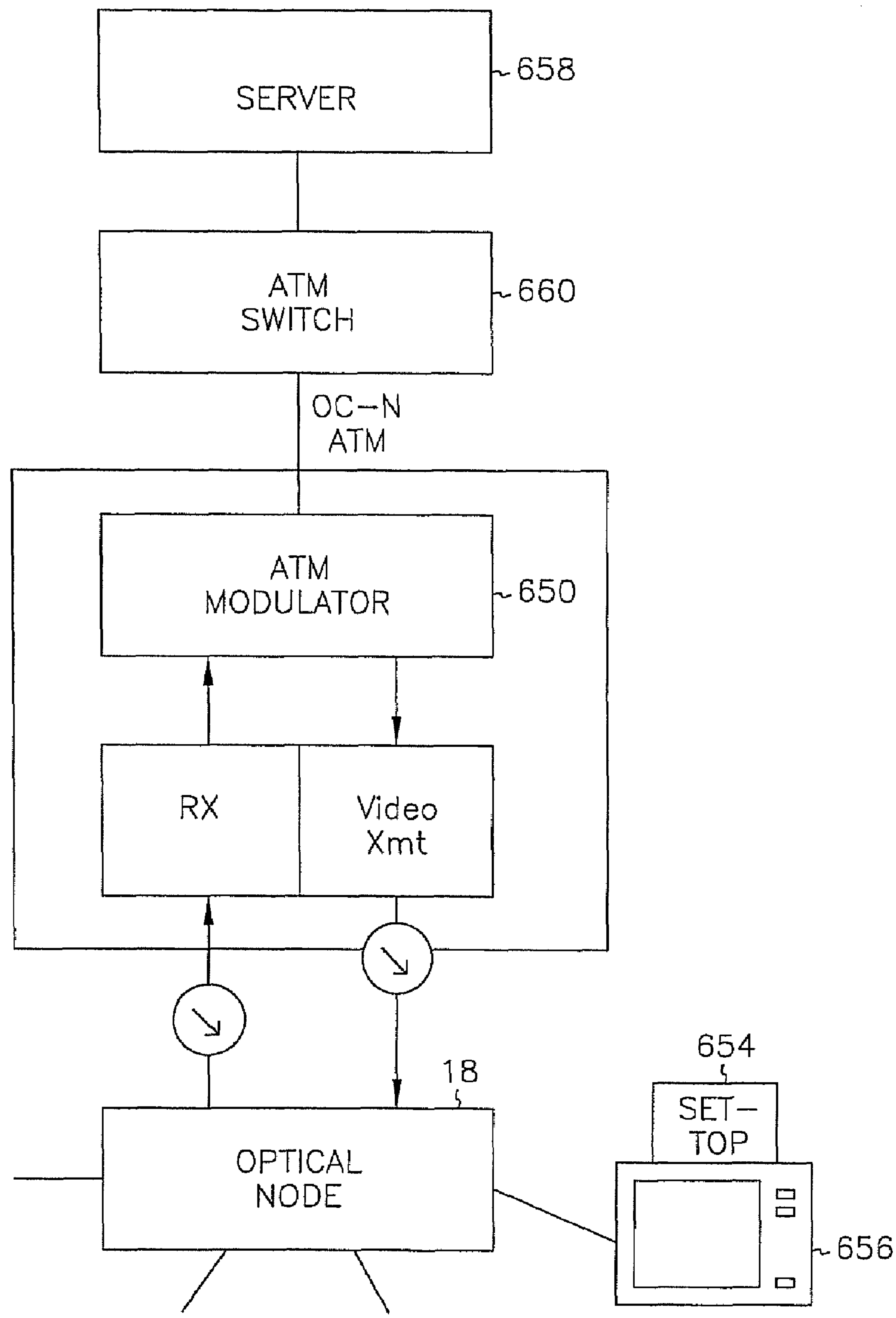
Figure 116:
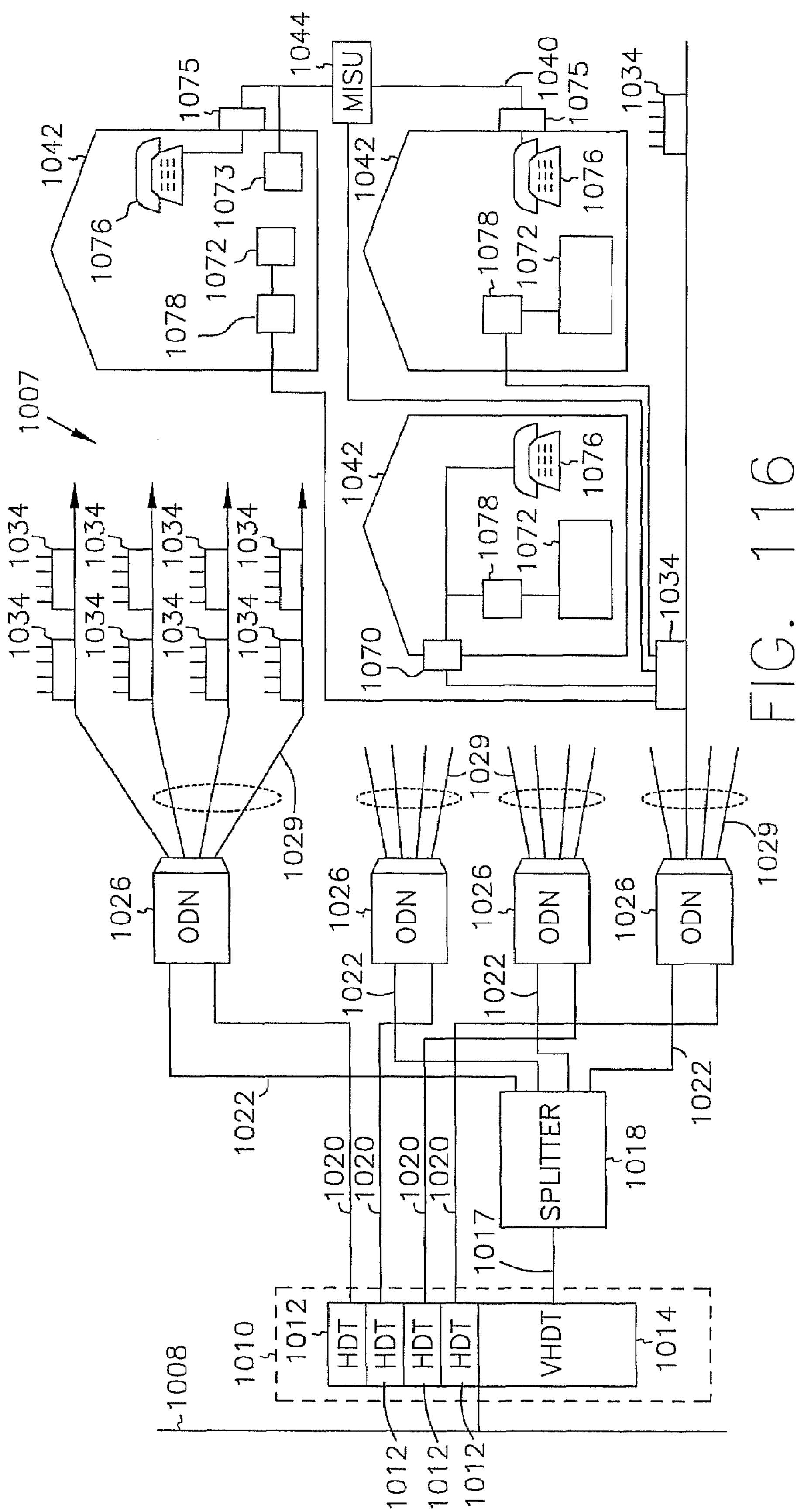
Figure 117:
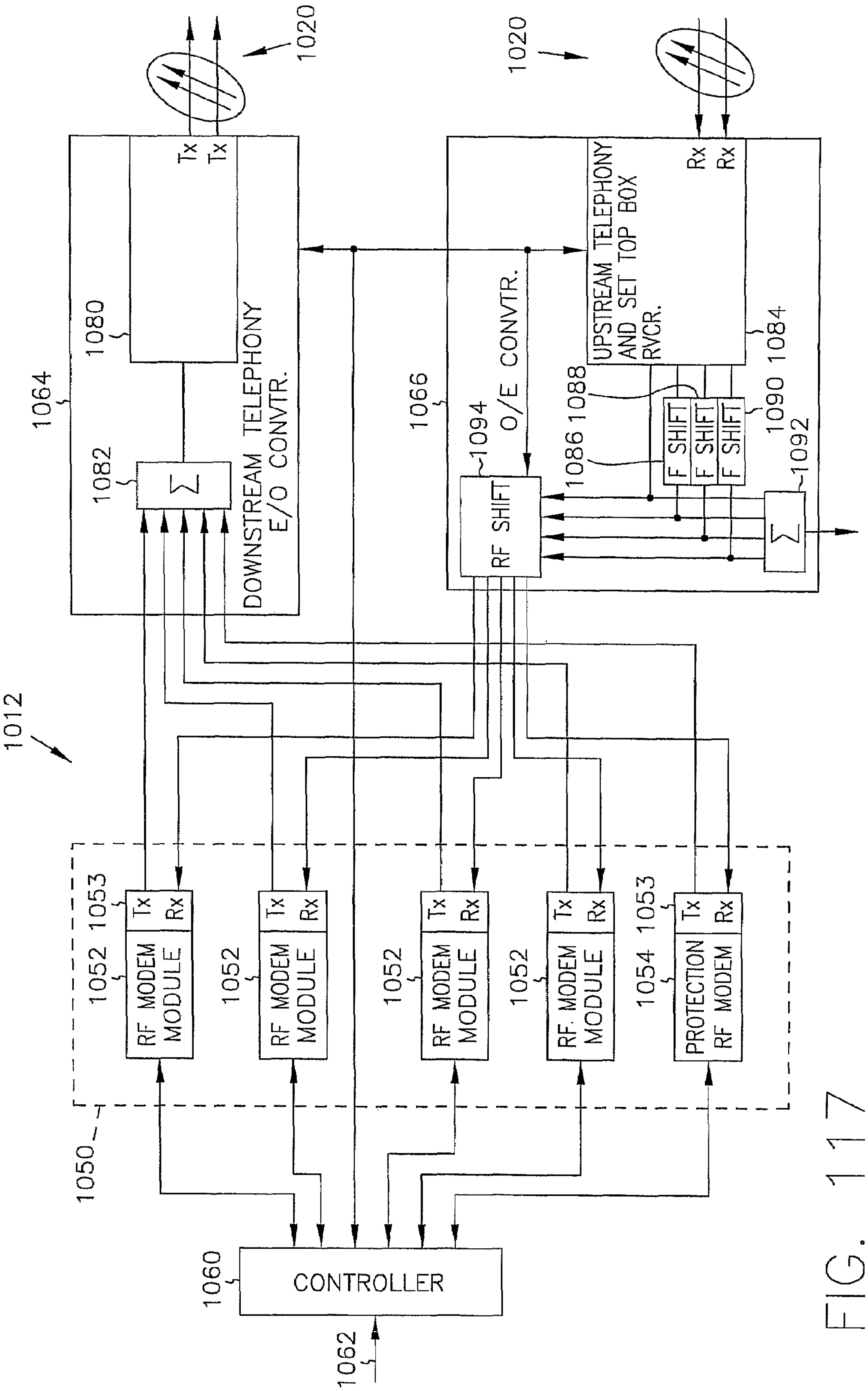
Figure 118:
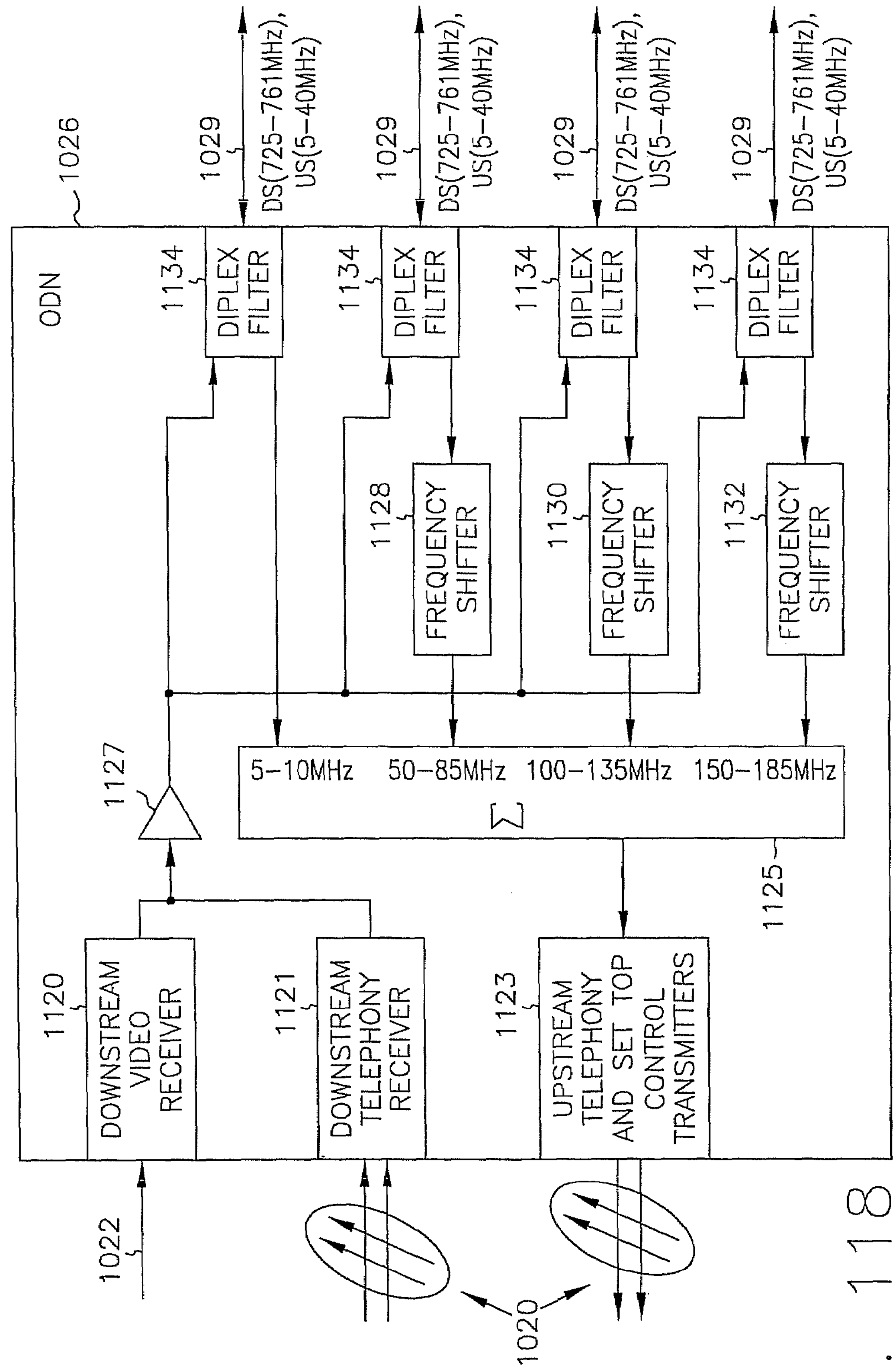
Figure 119:
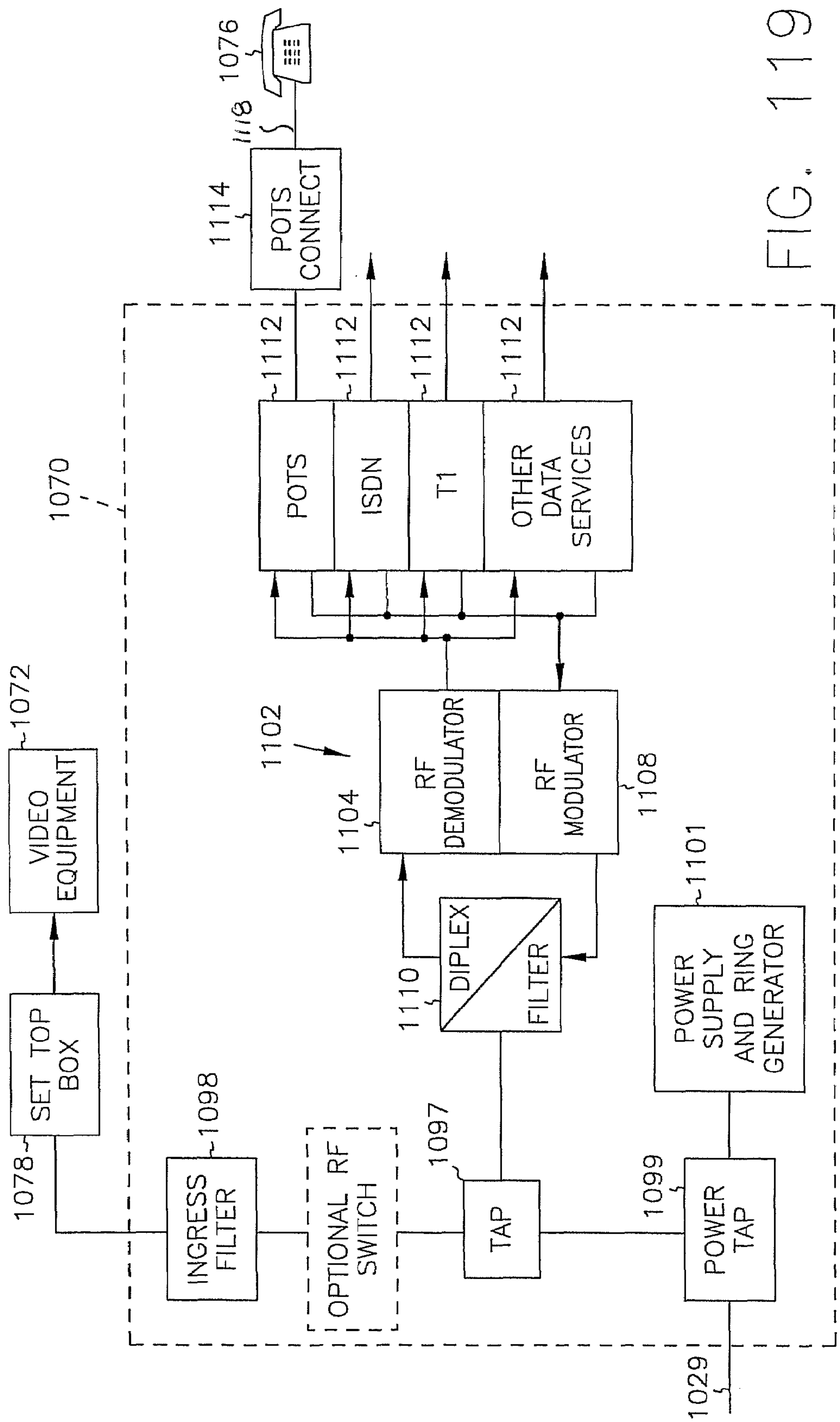
Figure 120:
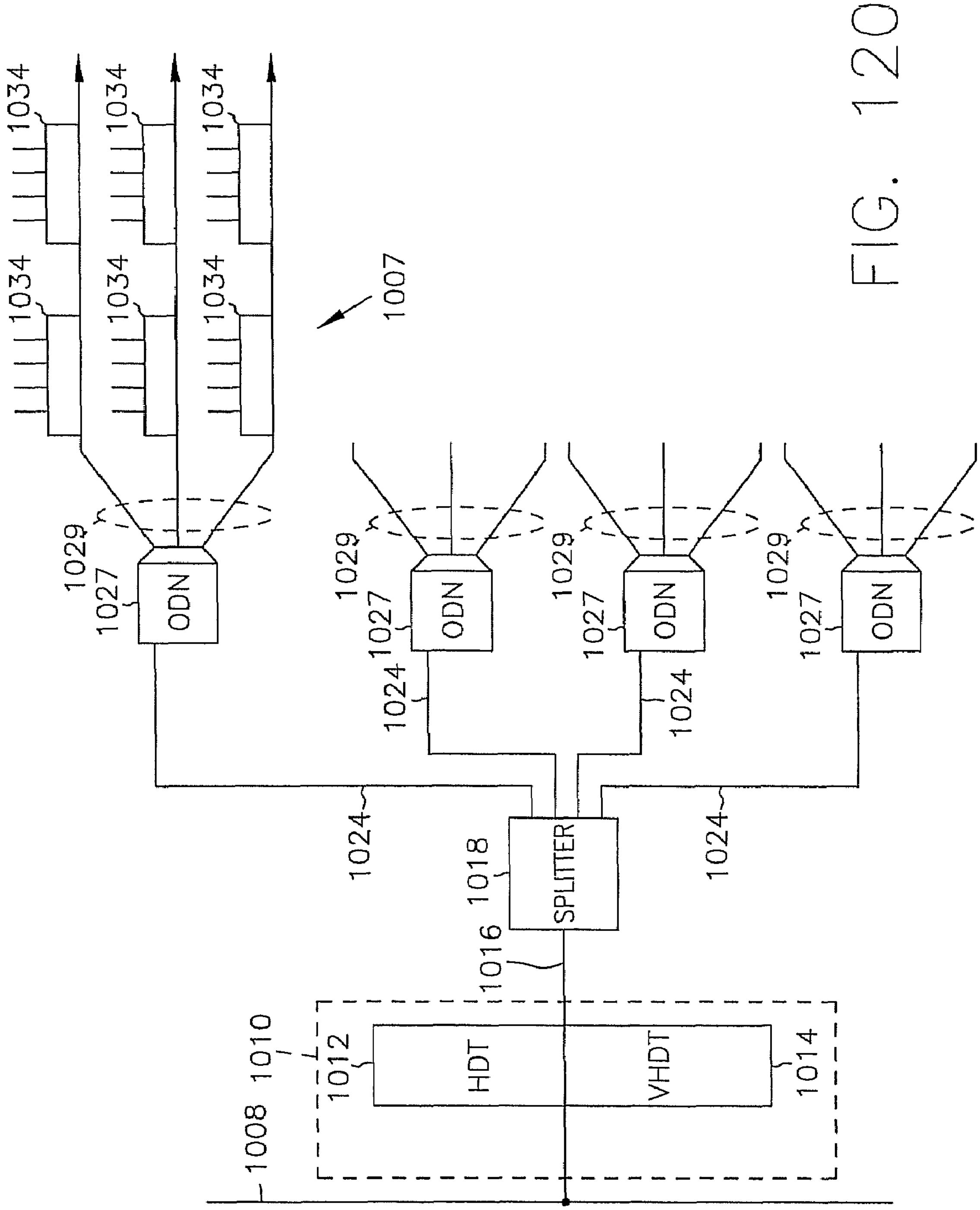
Figure 121:
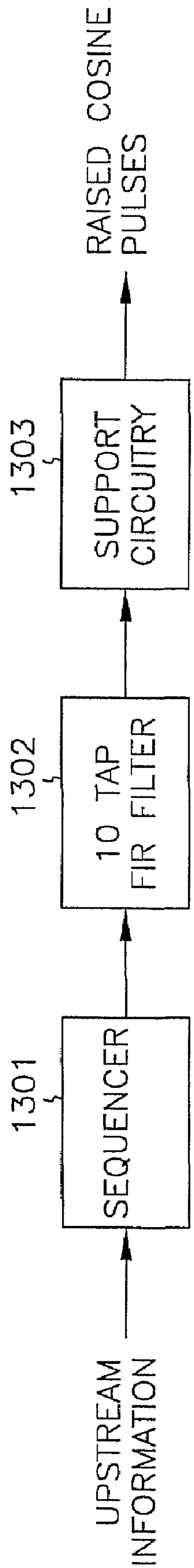
Figure 122:
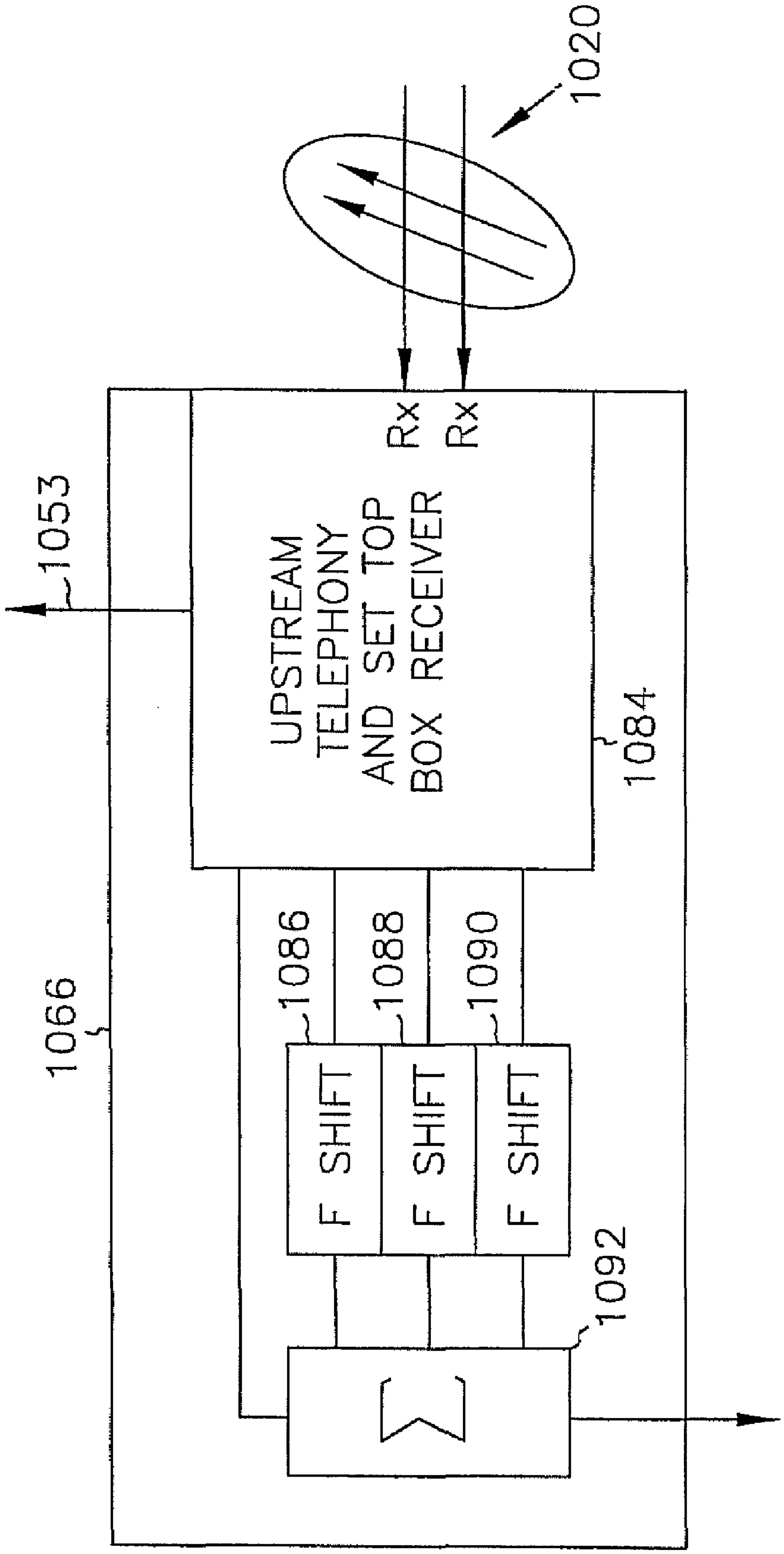
Figure 123:
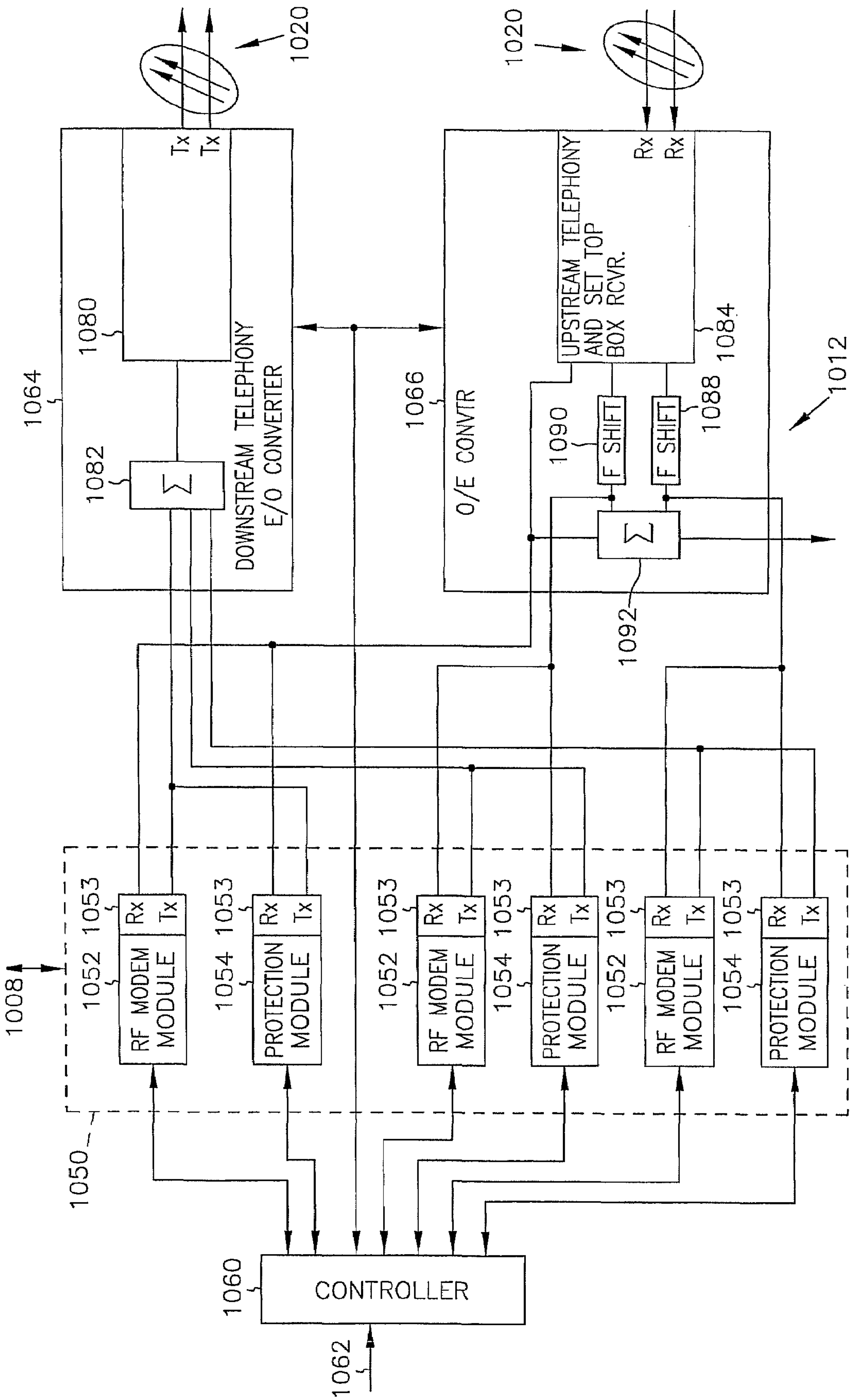
Figure 124:
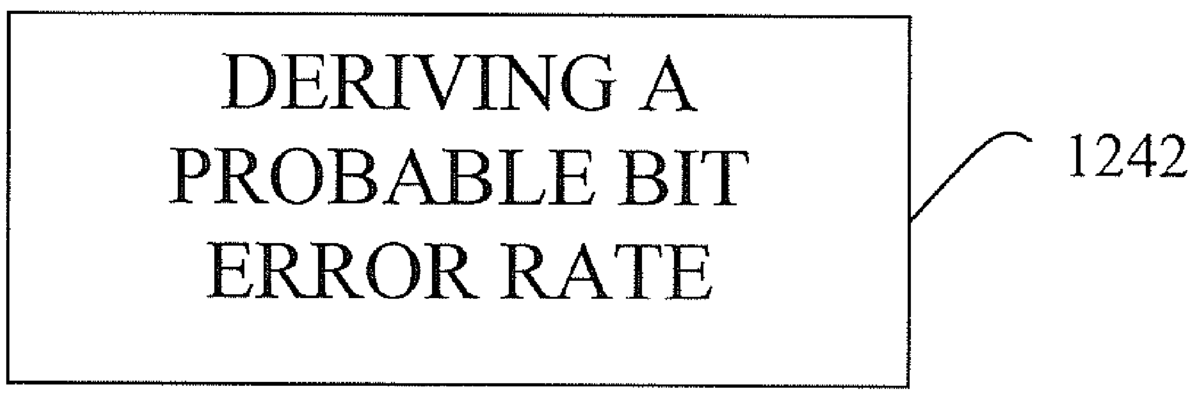

FIGS. 54, 55, 56, 57 describe error rates and message-encoding methods for use in a system;

FIG. 58 is a block diagram of a scrambler;

FIG. 59 is a block diagram of a control circuit for a CXMU of an HDT in a telecommunications system;

FIGS. 60, 61, 62 are flow charts that illustrate methods for assigning subbands and allocating payload channels in a telecommunications system that uses a multi-carrier communication scheme;

FIGS. 63, 64, 65, 66, 67 are frequency spectrum diagrams that illustrate examples of assigning service units to subbands;

FIG. 68 is a flow chart that illustrates error monitoring by the channel manager;

FIG. 69 is a flow chart that illustrates a method for allocating an ISU data-link (IDL) channel in a telecommunications system;

FIG. 70 is a block diagram of FFT system 2100;

FIG. 71 is a block diagram of modem 2400 which includes a FFT system 2100 configured to perform an IFFT in transmitter section 2401 and another FFT system 2100 configured to perform an FFT in receiver section 2402;

FIG. 72 is a block diagram of three logical banks of RAM: an input RAM 2251, an output RAM 2253, and a conversion RAM 2252;

FIG. 73 is a block diagram of one embodiment of a physical implementation which provides the function of input RAM 2241, conversion RAM 2242, and output RAM 2243;

FIG. 74 is a block diagram of one embodiment of a dual radix core 2600;

FIGS. 75, 76, 77, 78, 79, 80, 81, 82 together form a table showing the order of calculations for a "normal butterfly sub-operation";

FIGS. 83, 84, 85, 86, 87, 88, 89, 90 together form a table showing the order of calculations for a "transposed butterfly sub-operation";

FIG. 91 is a block diagram of one embodiment of dual-radix core 2600 showing the nomenclature used for the products output by multipliers 2620 through 2627 and for adder-subtractor-accumulators 2633;

FIG. 92 is a block diagram of one embodiment of an adder-subtractor-accumulator 2633;

FIG. 93 is a block diagram of modem 2400 which includes a Sigma-Delta ADC and decimator system to drive FFT system 2100;

FIG. 94 is a more detailed block diagram of modem receiver 2402;

FIG. 95 is a detailed block diagram of one embodiment of a Sigma-Delta converter 2840;

FIG. 96 is an overall schematic diagram of the data delivery transport system according to the present invention;

FIG. 97 is a simplified block diagram of the head-end terminal 12 of the system 500 according to the present invention;

FIG. 98 illustrates a Personal Cable Data Modem (PCDM) 540 and a Data Modem Service Module (DMSM) 550;

FIG. 99 illustrates in greater detail a PCDM 540;

FIG. 100 illustrates a Data Modem Channel Unit (DMCU) 560;

FIG. 101 shows a graph of average bandwidth per user as a function of the number of users for the system 500;

FIG. 102 is a simplified block diagram of the data transport and framing of the system 500;

FIG. 103 illustrates a Local Area Network Unit (LANU) 580;

FIG. 104 illustrates in more detail a DMSM 550;

FIG. 105 illustrates in more detail a DMCU 560;

FIGS. 106, 107, 108, 109 illustrate the call setup for a data connection on the system 500;

FIG. 110 illustrates a call termination sequence on the system 500;

FIG. 111 illustrates the software of a LANU 580;

FIG. 112 illustrates a PCDM 620 adapted for asymmetrical data delivery;

FIG. 113 illustrates the head-end configuration for asymmetrical data delivery;

FIGS. 114, 115 illustrate another alternate embodiment of the invention wherein digital video is received over an ATM network and transmitted over a modified form of system 10/500;

FIG. 116 shows a block diagram of a hybrid fiber/coax network;

FIG. 117 is a block diagram of a head end host distribution terminal of the network of FIG. 116;

FIG. 118 is a block diagram of an optical distribution node of the network of FIG. 116;

FIG. 119 is a block diagram of a home coaxial line unit of the network of FIG. 116;

FIG. 120 is a block diagram of an alternative embodiment for transmission from the head end to the optical distribution nodes;

FIG. 121 is a block diagram of an impulse shaping technique utilized in accordance with the present invention;

FIG. 122 is a block diagram of an alternative embodiment of the optical to electrical converter of the head end host distribution terminal of FIG. 117;

FIG. 123 is a block diagram of an alternative embodiment of the head end host distribution terminal of FIG. 117; and FIG. 124 is a flow chart that illustrates an embodiment of a method for communicating errors in a communication system.

DETAILED DESCRIPTION

Figure 1:
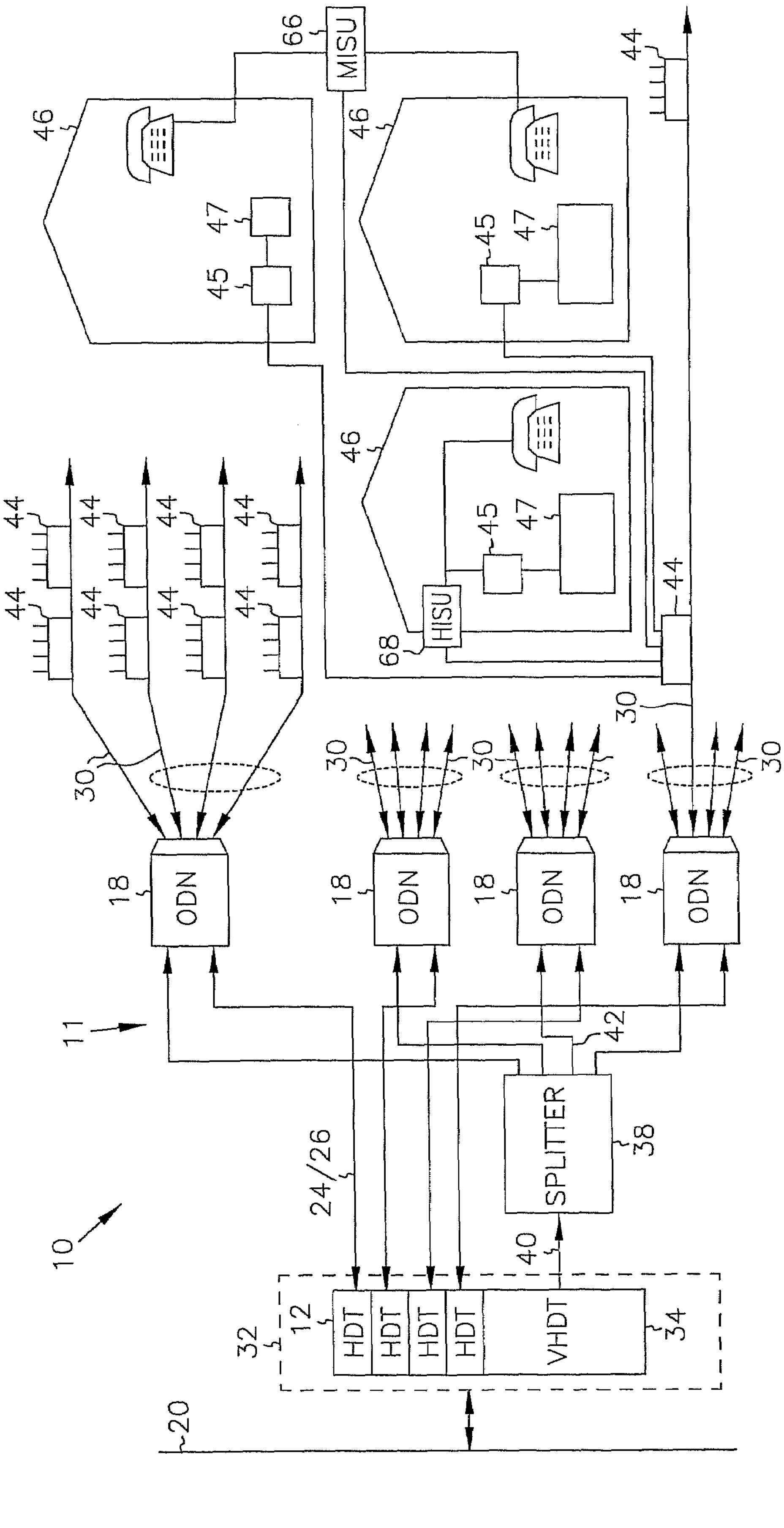
FIG. 1 shows a block diagram of a communication system utilizing a hybrid fiber/coax distribution network.

The communication system 10, as shown in FIG. 1, is an access platform primarily designed to deliver residential and business telecommunication services over a hybrid fiber-coaxial (HFC) distribution network 11. The system 10 is a cost-effective platform for delivery of telephony and video services. Telephony services may include standard telephony, computer data and/or telemetry. In addition, the system 10 is a flexible platform for accommodating existing and emerging services for residential subscribers.

The hybrid fiber-coaxial distribution network 11 utilizes optical fiber feeder lines to deliver telephony and video service to a distribution node 18 (referred to hereinafter as the optical distribution node (ODN)) remotely located from a central office or a head end 32. From the ODNs 18, service is distributed to subscribers via a coaxial network. Several advantages exist by utilizing the HFC-based communication system 10. By utilizing fiber installed in the feeder, the system 10 spreads the cost of optoelectronics across hundreds of subscribers. Instead of having a separate copper loop which runs from a distribution point to each subscriber ("star" distribution approach), the system 10 implements a bused approach where a distribution coaxial leg 30 passes each home and subscribers "tap" the distribution coaxial leg 30 for service. The system 10 also allows non-video services to be modulated for transmission using more cost-effective RF modem devices in dedicated portions of the RF spectrum. Finally, the system 10 allows video services to be carried on existing coaxial facilities with no additional subscriber equipment because the coaxial distribution links can directly drive existing cable-ready television sets.

It should be apparent to one skilled in the art that the modem transport architecture described herein and the functionality of the architecture and operations surrounding such architecture could be utilized with distribution networks other than hybrid fiber coax networks. For example, the functionality may be performed with respect to wireless systems. Therefore, the present invention contemplates use of such systems in accordance with the accompanying claims.

Figure 8:
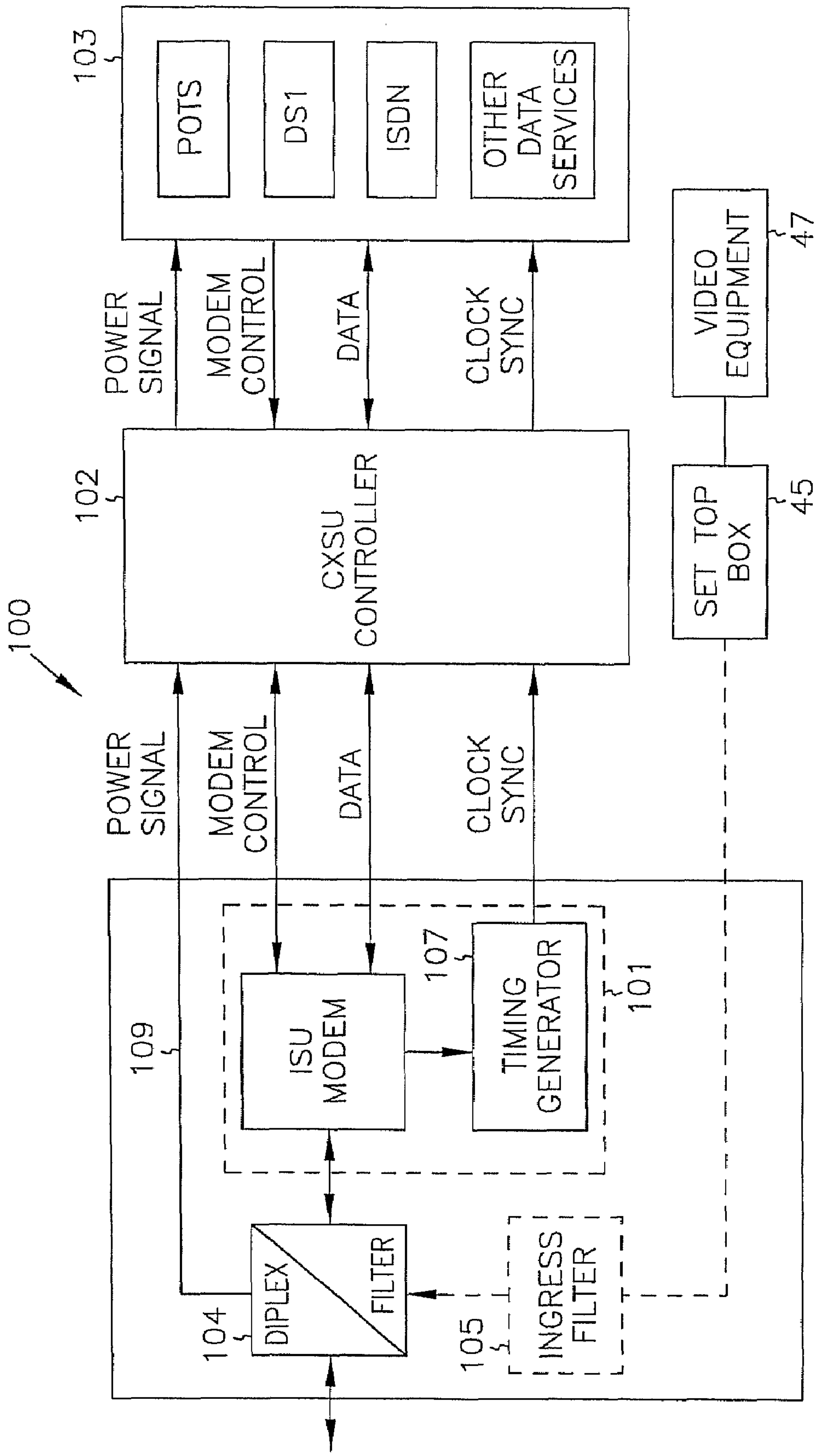
FIG. 8 is a general block diagram of an integrated service unit (ISU) such as a home integrated service unit (HISU) or a multiple integrated service unit (MISU) of FIG. 1.

The system 10 includes host digital terminals 12 (HDTs) which implement all common equipment functions for telephony transport, such as network interface, synchronization, DS0 grooming, and operations, administration, maintenance and provisioning (OAM&P) interfaces, and which include the interface between the switching network and a transport system which carries information to and from customer interface equipment such as integrated service units 100 (ISUs), shown generally in FIG. 8. Integrated services units (ISUs) 100, such as home integrated service units (HISUs) 68 or multiple user integrated service units (MISUs) 66, which may include a business integrated service unit as opposed to a multiple dwelling integrated service unit, implement all customer interface functions and interface to the transport system which carries information to and from the switched network. In the present system, the HDT 12 is normally located in a central office and the ISUs 100 are remotely located in the field and distributed in various locations. The HDT 12 and ISUs 100 are connected via the hybrid fiber-coax distribution network 11 in a multi-point to point configuration. In the present system, the modem functionality required to transport information over the HFC distribution network 11 is performed by interface equipment in both the HDT 12 and the ISUs 100. Such modem functionality is performed utilizing orthogonal frequency division multiplexing.

The communication system shall now be generally described with reference to FIGS. 1, 3 and 8. The primary components of system 10 are host digital terminals (HDTs) 12, video host distribution terminal (VHDT) 34, telephony downstream transmitter 14, telephony upstream receiver 16, the hybrid fiber coax (HFC) distribution network 11 including optical distribution node 18, and integrated service units 66, 68 (shown generally as ISU 100 in FIG. 8) associated with remote units 46. The HDT 12 provides telephony interface between the switching network (noted generally by trunk line 20) and the modem interface to the HFC distribution network for transport of telephony information. The telephony downstream transmitter 14 performs electrical to optical conversion of coaxial RF downstream telephony information outputs 22 of an HDT 12, shown in FIG. 3, and transmits onto redundant downstream optical feeder lines 24. The telephony upstream receiver 16 performs optical to electrical conversion of optical signals on redundant upstream optical feeder lines 26 and applies electrical signals on coaxial RF upstream telephony information inputs 28 of HDT 12. The optical distribution node (ODN) 18 provides interface between the optical feeder lines 24 and 26 and coaxial distribution legs 30. The ODN 18 combines downstream video and telephony onto coaxial distribution legs 30. The integrated services units provide modem interface to the coaxial distribution network and service interface to customers.

The HDT 12 and ISUs 100 implement the telephony transport system modulator-demodulator (modem) functionality. The HDT 12 includes at least one RF MCC modem 82, shown in FIG. 3 and each ISU 100 includes an RF ISU modem 101, shown in FIG. 8. The MCC modems 82 and ISU modems 101 use a multi-carrier RF transmission technique to transport telephony information, such as DS0+ channels, between the HDT 12 and ISUs 100. This multi-carrier technique is based on orthogonal frequency division multiplexing (OFDM) where a bandwidth of the system is divided up into multiple carriers, each of which may represent an information channel. Multi-carrier modulation can be viewed as a technique which takes time-division multiplexed information data and transforms it to frequency-division multiplexed data. The generation and modulation of data on multiple carriers is accomplished digitally, using an orthogonal transformation on each data channel. The receiver performs the inverse transformation on segments of the sampled waveform to demodulate the data. The multiple carriers overlap spectrally. However, as a consequence of the orthogonality of the transformation, the data in each carrier can be demodulated with negligible interference from the other carriers, thus reducing interference between data signals transported. Multi-carrier transmission obtains efficient utilization of the transmission bandwidth, particularly necessary in the upstream communication of a multi-point to point system. Multi-carrier modulation also provides an efficient means to access multiple multiplexed data streams and allows any portion of the band to be accessed to extract such multiplexed information, provides superior noise immunity to impulse noise as a consequence of having relatively long symbol times, and also provides an effective means for eliminating narrowband interference by identifying carriers which are degraded and inhibiting the use of these carriers for data transmission (such channel monitoring and protection is described in detail below). Essentially, the telephony transport system can disable use of carriers which have interference and poor performance and only use carriers which meet transmission quality targets.

Further, the ODNs 18 combine downstream video with the telephony information for transmission onto coaxial distribution legs 30. The video information from existing video services, generally shown by trunk line 20, is received by and processed by head end 32. Head end 32 or the central office, includes a video host distribution terminal 34 (VHDT) for video data interface. The VHDT 34 has optical transmitters associated therewith for communicating the video information to the remote units 46 via the ODNs 18 of the HFC distribution network 11.

Figure 3:
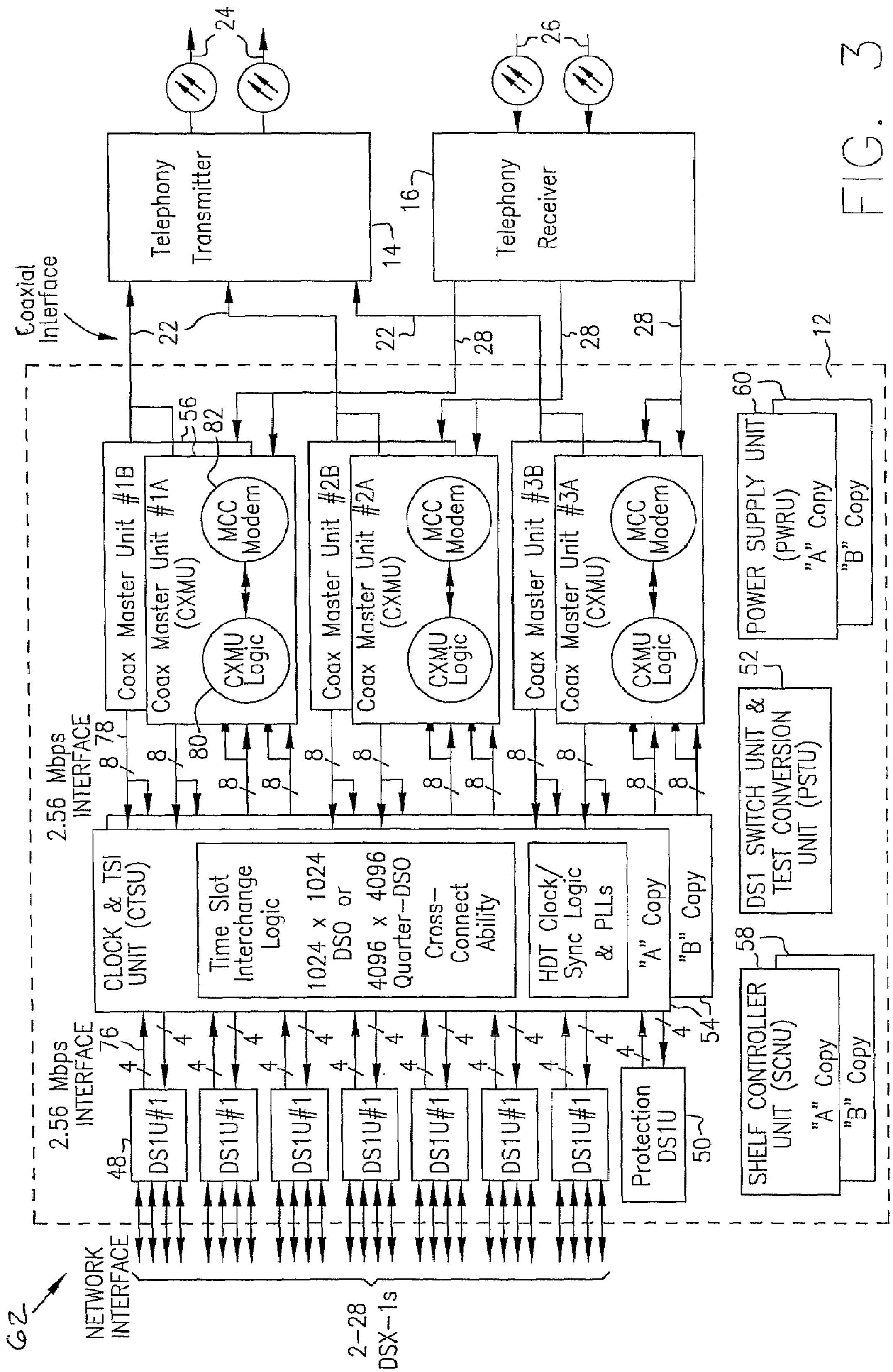
FIG. 3 is a detailed block diagram of a host digital terminal (HDT) with associated transmitters and receivers of the system of FIG. 1.
Figure 4:
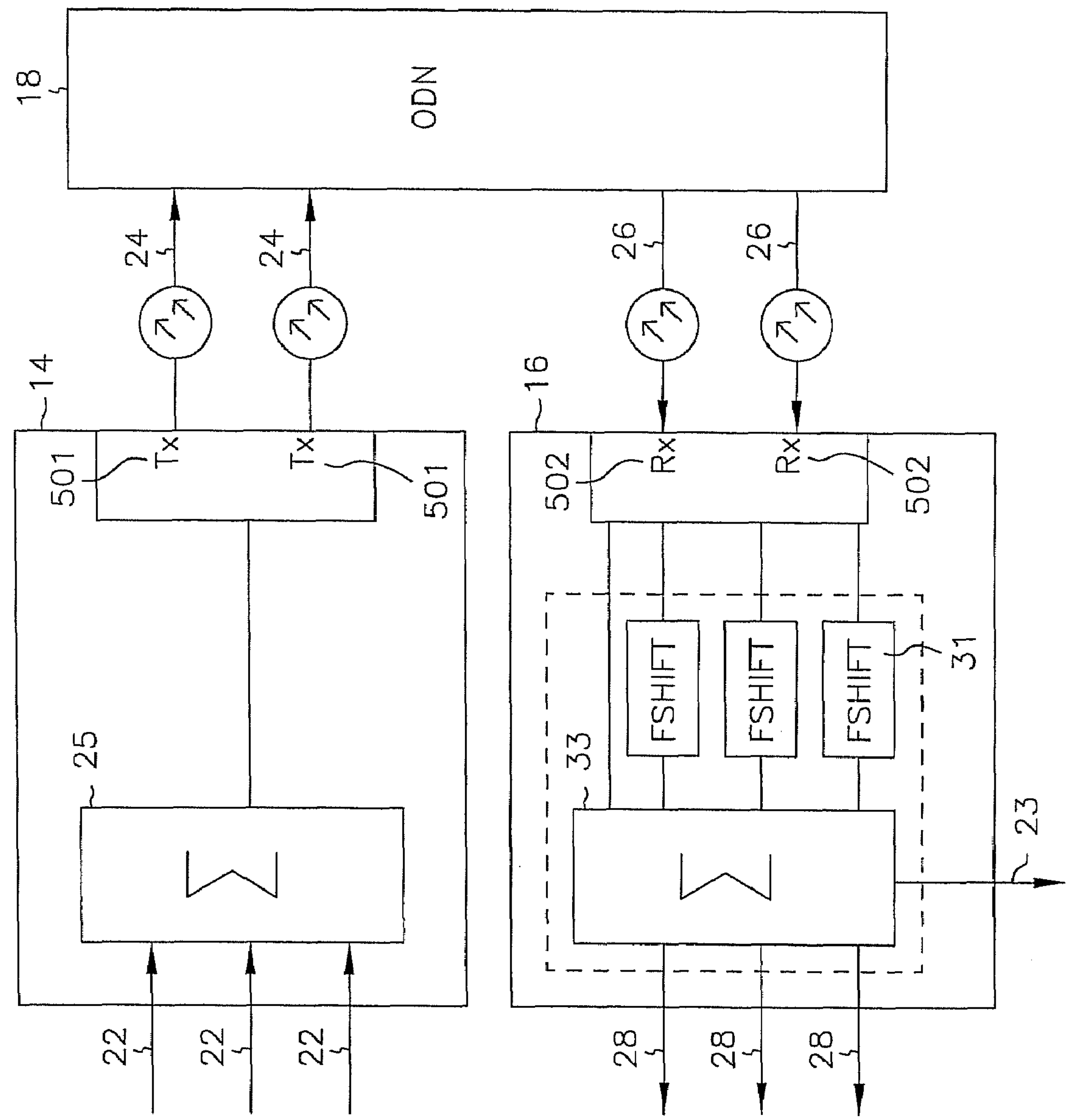
FIG. 4 is a block diagram of the associated transmitters and receivers of FIG. 3.

The telephony transmitter 14 of the HDTs 12, shown in FIGS. 3 and 4, includes two transmitters for downstream telephony transmission to protect the telephony data transmitted. These transmitters are conventional and relatively inexpensive narrow band laser transmitters. One transmitter is in standby if the other is functioning properly. Upon detection of a fault in the operating transmitter, the transmission is switched to the standby transmitter. In contrast, the transmitter of the VHDT 34 is relatively expensive as compared to the transmitters of HDT 12 as it is a broad band analog DFB laser transmitter. Therefore, protection of the video information, a non-essential service unlike telephony data, is left unprotected. By splitting the telephony data transmission from the video data transmission, protection for the telephony data alone can be achieved. If the video data information and the telephony data were transmitted over one optical fiber line by an expensive broad band analog laser, economies may dictate that protection for telephony services may not be possible. Therefore, separation of such transmission is of importance.

Further with reference to FIG. 1, the video information is optically transmitted downstream via optical fiber line 40 to splitter 38 which splits the optical video signals for transmission on a plurality of optical fiber lines 42 to a plurality of optical distribution nodes 18. The telephony transmitter 14 associated with the HDT 12 transmits optical telephony signals via optical fiber feeder line 42 to the optical distribution nodes 18. The optical distribution nodes 18 convert the optical video signals and optical telephony signals for transmission as electrical outputs via the coaxial distribution portion of the hybrid fiber coax (HFC) distribution network 11 to a plurality of remote units 46. The electrical downstream video and telephony signals are distributed to ISUs via a plurality of coaxial legs 30 and coaxial taps 44 of the coaxial distribution portion of the HFC distribution network 11.

The remote units 46 have associated therewith an ISU 100, shown generally in FIG. 8, that includes means for transmitting upstream electrical data signals including telephony information, such as from telephones and data terminals, and in addition may include means for transmitting set top box information from set top boxes 45 as described further below. The upstream electrical data signals are provided by a plurality of ISUs 100 to an optical distribution node 18 connected thereto via the coaxial portion of the HFC distribution network 11. The optical distribution node 18 converts the upstream electrical data signals to an upstream optical data signal for transmission over an optical fiber feeder line 26 to the head end 32.

Figure 2:
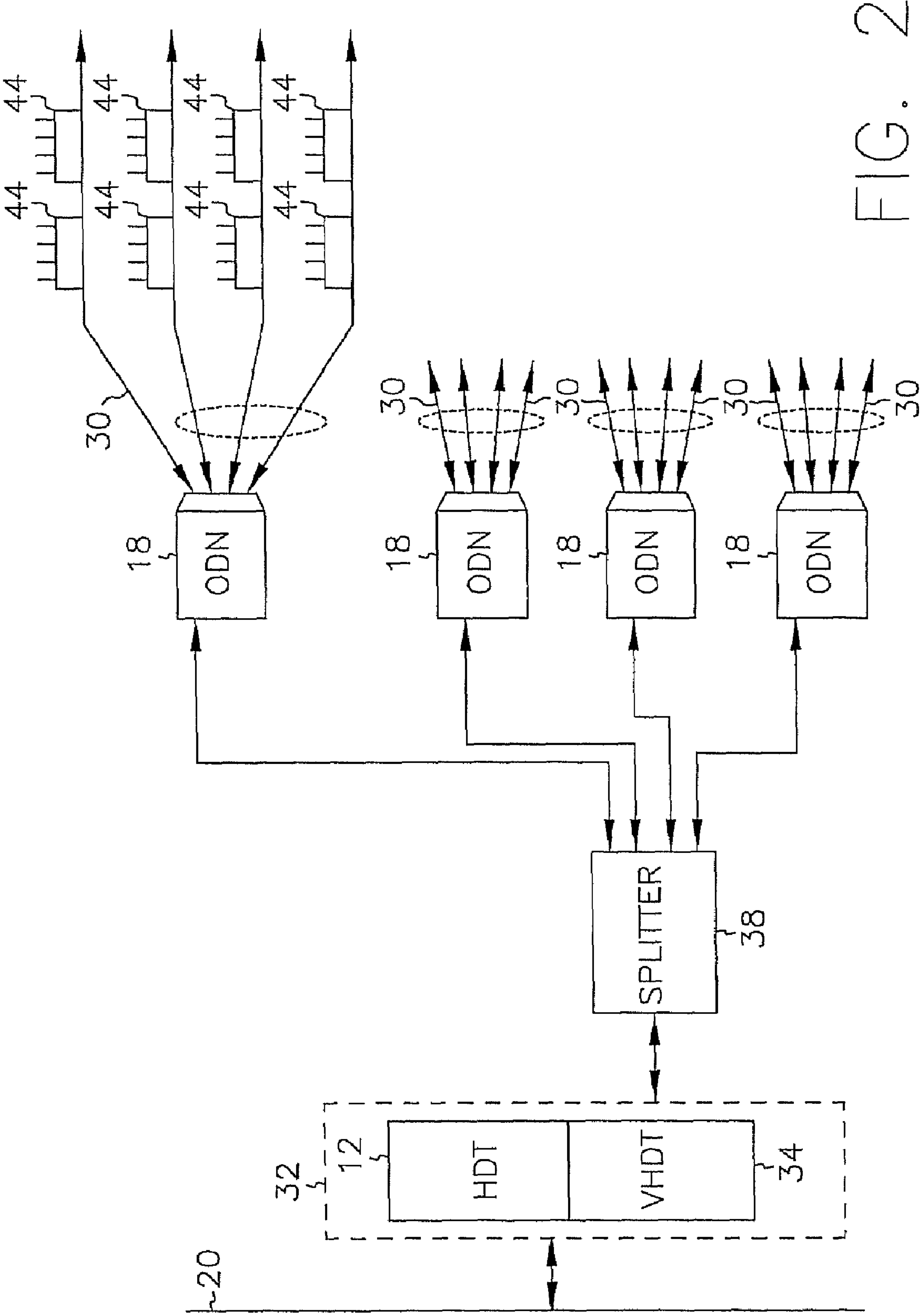
FIG. 2 is an alternate embodiment of the system of FIG. 1.

FIG. 2 generally shows an alternate embodiment for providing transmission of optical video and optical telephony signals to the optical distribution nodes 18 from head end 32, the HDT 12 and VHDT 34 in this embodiment utilize the same optical transmitter and the same optical fiber feeder line 36. The signals from HDT 12 and VHDT 34 are combined and transmitted optically from headend 32 to splitter 38. The combined signal is then split by splitter 38 and four split signals are provided to the optical distribution nodes 18 for distribution to the remote units by the coaxial distribution legs 30 and coaxial taps 44. Return optical telephony signals from the ODNs 18 would be combined at splitter 38 for provision to the headend. However, as described above, the optical transmitter utilized would be relatively expensive due to its broad band capabilities, lessening the probabilities of being able to afford protection for essential telephony services.

As one skilled in the art will recognize, the fiber feeder lines 24, 26, as shown in FIG. 1, may include four fibers, two for transmission downstream from downstream telephony transmitter 14 and two for transmission upstream to upstream telephony receiver 16. With the use of directional couplers, the number of such fibers may be cut in half. In addition, the number of protection transmitters and fibers utilized may vary as known to one skilled in the art and any listed number is not limiting to the present invention as described in the accompanying claims.

The present invention shall now be described in further detail. The first part of the description shall primarily deal with video transport. The remainder of the description shall primarily be with regard to telephony transport.

Video Transport

The communication system 10 includes the head end 32 which receives video and telephony information from video and telephony service providers via trunk line 20. Head end 32 includes a plurality of HDTs 12 and a VHDT 34. The HDT 12 includes a network interface for communicating telephony information, such as T1, ISDN, or other data services information, to and from telephony service providers, such communication also shown generally by trunk line 20. The VHDT 34 includes a video network interface for communicating video information, such as cable TV video information and interactive data of subscribers to and from video service providers, such communication also shown generally by trunk line 20.

The VHDT 34 transmits downstream optical signals to a splitter 38 via video optical fiber feeder line 40. The passive optical splitter 38 effectively makes four copies of the downstream high bandwidth optical video signals. The duplicated downstream optical video signals are distributed to the correspondingly connected optical distribution nodes 18. One skilled in the art will readily recognize that although four copies of the downstream video signals are created, any number of copies may be made by an appropriate splitter and that the present invention is not limited to any specific number.

The splitter is a passive means for splitting broad band optical signals without the need to employ expensive broad band optical to electrical conversion hardware. Optical signal splitters are commonly known to one skilled in the art and available from numerous fiber optic component manufacturers such as Gould, Inc. In the alternative, active splitters may also be utilized. In addition, a cascaded chain of passive or active splitters would further multiply the number of duplicated optical signals for application to an additional number of optical distribution nodes and therefore increase further the remote units serviceable by a single head end. Such alternatives are contemplated in accordance with the present invention as described by the accompanying claims.

The VHDT 34 can be located in a central office, cable TV head end, or a remote site and broadcast up to about 112 NTSC channels. The VHDT 34 includes a transmission system like that of a LITEAMP™ system available from American Lightwave Systems, Inc., currently a subsidiary of the assignee hereof. Video signals are transmitted optically by amplitude modulation of a 1300 nanometer laser source at the same frequency at which the signals are received (that is, the optical transmission is a terahertz optical carrier which is modulated with the RF video signals). The downstream video transmission bandwidth is about 54-725 MHz. One advantage in using the same frequency for optical transmission of the video signal as the frequency of the video signals when received is to provide high bandwidth transmission with reduced conversion expense. This same-frequency transmission approach means that the modulation downstream requires optical to electrical conversion or proportional conversion with a photodiode and perhaps amplification, but no frequency conversion. In addition, there is no sample data bandwidth reduction and little loss of resolution.

Figure 5:
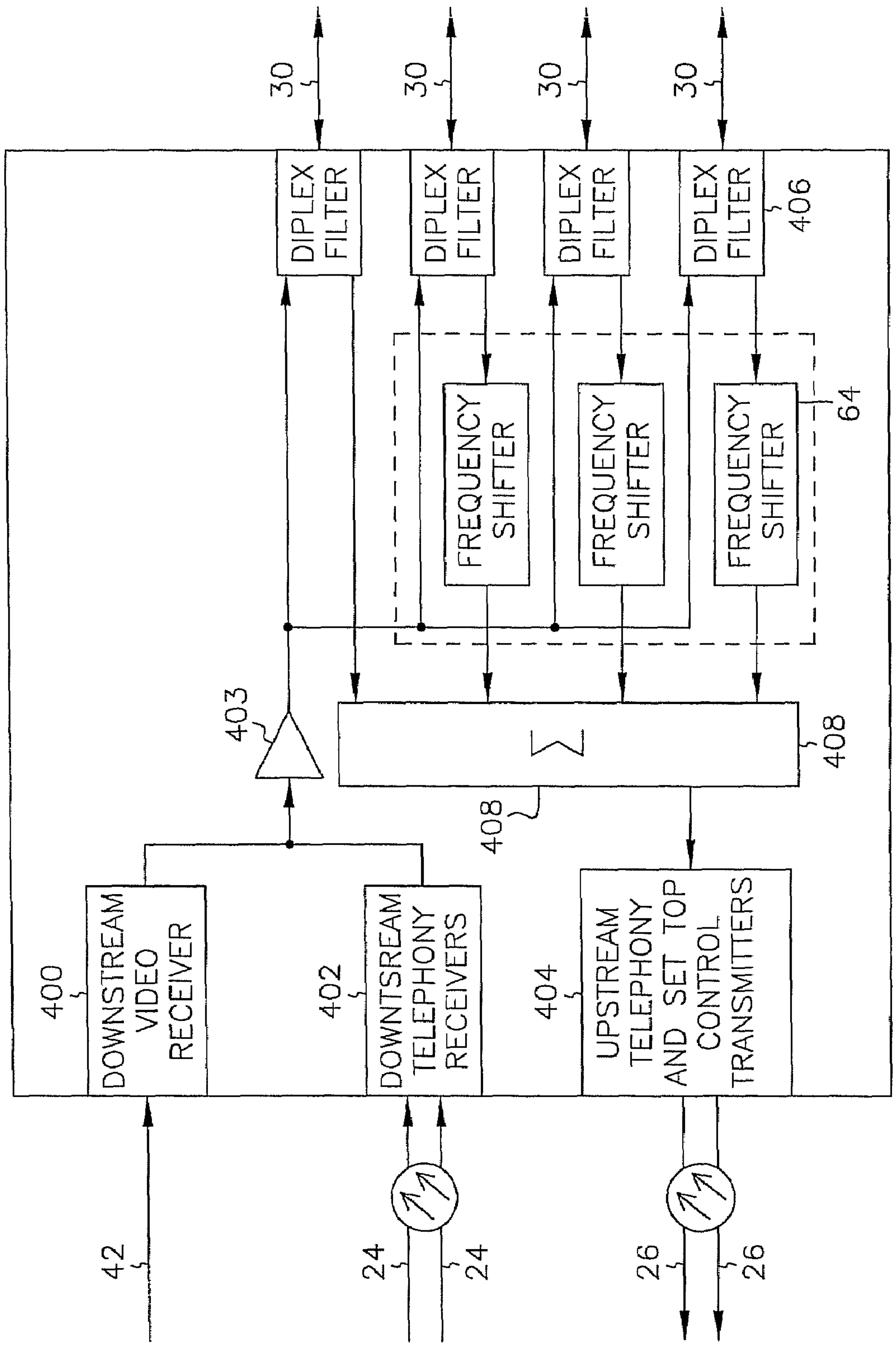
FIG. 5 is a block diagram of an optical distribution node of the system of FIG. 1.

An optical distribution node 18, shown in further detail in FIG. 5, receives the split downstream optical video signal from the splitter 38 on optical fiber feeder line 42. The downstream optical video signal is applied to a downstream video receiver 400 of the optical distribution node 18. The optical video receiver 400 utilized is like that available in the LITEAMP product line. The converted signal from video receiver 400, proportionally converted utilizing photodiodes, is applied to bridger amplifier 403 along with converted telephony signals from downstream telephony receiver 402. The bridger amplifier 403 simultaneously applies four downstream electrical telephony and video signals to diplex filters 406 which allow for full duplex operation by separating the transmit and receive functions when signals of two different frequency bandwidths are utilized for upstream and downstream transmission. There is no frequency conversion performed at the ODN 18 with respect to the video or the downstream telephony signals as the signals are passed through the ODNs to the remote units via the coaxial portion of the HFC distribution network 11 in the same frequency bandwidth as they are received at the ODNs 18.

After the ODN 18 has received the downstream optical video signals and such signals are converted to downstream electrical video signals, the four outputs of the ODN 18 are applied to four coaxial legs 30 of the coaxial portion of the HFC distribution network 11 for transmission of the downstream electrical video signals to the remote units 46. Such transmission for the electrical video signals occurs in about the 54-725 MHz bandwidth. Each ODN 18 provides for the transmission on a plurality of coaxial legs 30 and any number of outputs is contemplated in accordance with the present invention as described in the accompanying claims.

As shown in FIG. 1, each coaxial cable leg 30 can provide a significant number of remote units 46 with downstream electrical video and telephony signals through a plurality of coaxial taps 44. Coaxial taps are commonly known to one skilled in the art and act as passive bidirectional pickoffs of electrical signals. Each coaxial cable leg 30 may have a number of coaxial taps 44 connected in series. In addition, the coaxial portion of the HFC distribution network 11 may use any number of amplifiers to extend the distance data can be sent over the coaxial portion of such HFC distribution network 11.

Downstream video signals are provided from the coaxial taps 44 to the remote units 46. The video signal from the coaxial tap 44 is provided to an HISU 68 which is generally shown by the block diagram of ISU 100 in FIG. 8. The ISU 100 is provided with the downstream electrical video and telephony signal from tap 44 and it is applied to diplex filter 104. The downstream electrical video and telephony signal is passed through the diplex filter 104 to both an ingress filter 105 and ISU modem 101. The downstream video signal is passed by the ingress filter 105 to video equipment via an optional set top box 45. The downstream electrical telephony signal applied from the diplex filter 104 to the ISU modem 101 is processed as described in further detail below.

Ingress filter 105 provides the remote unit 46 with protection against interference of signals applied to the video equipment as opposed to those provided to other user equipment such as telephones or computer terminals. Ingress filter 105 passes the video signals; however, it blocks those frequencies not utilized by the video equipment. By blocking those frequencies not used by the video equipment, stray signals are eliminated that may interfere with the other services by the network to at least the same remote unit.

The set top box 45 is an optional element at the remote unit 46. Interactive video data from set top box 45 would be transmitted by an additional separate RF modem provided by the video service provider at a relatively low frequency in the bandwidth of about 5 to 40 MHz. Such frequency must not be one used for the transport of upstream and downstream telephony data and downstream video.

For an MISU 66, a separate coaxial line from coaxial tap 44 is utilized to provide transmission of video signals from the coaxial tap 44 to the set top box 45 and thus for providing downstream video signals to video equipment 47. The ingress filter 105 as shown in FIG. 8 is not a part of the MISU 66 as indicated by its dashed representation.

Alternative embodiments of the VHDT 34 may employ other modulation and mixing schemes or techniques to shift the video signals in frequency, and other encoding methods to transmit the information in a coded format. Such techniques and schemes for transmitting analog video data, in addition to those transmitting digital video data, are known to one skilled in the art and are contemplated in accordance with the spirit and scope of the present invention as described in the accompanying claims.

Telephony Transport

With reference to FIG. 3, telephony information and ISU operations and control data (hereinafter referred to as control data) modulated on carriers by MCC modem 82 is transmitted between the HDT 12 and the telephony downstream transmitter 14 via coaxial lines 22. Telephony information and control data modulated on carriers by ISUs 100 is received at telephony upstream receiver 16 and communicated to the MCC modem 82 via coaxial cable lines 28. The telephony downstream transmitter 14 and the telephony upstream receiver 16 transmit and receive, respectively, telephony information and control data via optical fiber feeder lines 24 and 26 to and from a corresponding optical distribution node 18. The control data may include all operations, administration, maintenance & provisioning (OAM&P) for providing the telephony services of the system 10 and any other control data necessary for providing transport of telephony information between the HDT 12 and the ISUs 100.

A block diagram of the HDT 12 is shown in FIG. 3. The HDT 12 includes the following modules: Eight DS1 Units (DS1U) (seven quad-DS1 units 48 plus one protection unit 50), one protection switch & test conversion unit 52 (PSTU), two clock & time slot interchange units 54 (CTSUs) (one active and one standby/protection unit), six coax master units 56 (CXMUs) (three active and three standby/protection units), two shelf control units 58 (SCNUS) (one active and one standby/protection unit), and two power supply units 60 (PWRUs) (two load-sharing units which provide the appropriate HDT voltages from a central office supply). The DS1U units can also be adapted to transfer data in the standard E1U format, if desired.

The HDT 12 comprises all the common equipment functions of the telephony transport of the communication system 10. The HDT 12 is normally located in a central office and directly interfaces to a local digital switch or digital network element equipment. The HDT provides the network interface 62 for all telephony information. Each HDT accommodates from 2 to 28 DSX-1 inputs at the network interface 62, representing a maximum of 672 DS0 channels. The HDT 12 also provides all synchronization for telephony transport in the system 10. The HDT 12 may operate in any one of three synchronization modes: external timing, line timing or internal timing. External timing refers to synchronization to a building integrated timing supply reference which is sourced from a central office in which the HDT 12 is located. Line timing is synchronized to the recovered clock from a DSX-1 signal normally derived from the local digital switch. Internal timing is a free-running or hold-over operation where the HDT maintains its own synchronization in the absence of any valid reference inputs.

The HDT 12 also provides quarter-DS0 grooming capabilities and implements a 4096×4096 full-access, non-blocking quarter-DS0 (16 kbps) cross-connect capability. This allows DS0s and quarter-DS0s (ISDN "D" channels) to be routed from any timeslot at the DSX-1 network interface 62 to any customer serviced by any ISU 100.

The HDT 12 further provides the RF modem functionality required for telephony transport over the HFC distribution network 11 including the MCC modem 82. The HDT 12 accommodates up to three active CXMUs 56 for providing the modem interface to the HFC distribution network 11 and also provides one-for-one protection for each active CXMU 56.

The HDT 12 coordinates the telephony transport system including control and communication of many ISUs of the multi-point to point communication system 10. Each HDT 12 module performs a function. The DS1U module 48 provides the interface to the digital network and DSX-1 termination. The PSTU 52 provides DS1U equipment protection by switching the protection DS1U 50 for a failed DS1U module 48. The CTSU 54 provides the quarter-DS0 timeslot grooming capability and all system synchronization functions. The CTSU 54 also coordinates all call processing in the system. The CXMU 56, described in further detail below, provides the modem functionality and interface for the OFDM telephony transport over the HFC distribution network 11 and the SCNU 58 supervises the operation of the entire communication system providing all OAM&P functions for telephony transport. Most processing of requests for provisioning is performed by the SCNU 58.

Downstream Telephony Transmitter

The downstream telephony transmitter 14, shown in FIG. 4, takes the coaxial RF outputs 22 from the active CXMUs 56 of the HDT 12 which carry telephony information and control data and combines the outputs 22 into a downstream telephony transmission signal. The electrical-to-optical conversion logic required for the optical transmission is implemented in a stand-alone downstream telephony transmitter 14 rather than in the HDT 12 to provide a more cost effective transport solution. By placing this function in a separate component, the expense of this function does not need to be replicated in each CXMU 56 of the HDT 12. This reduces the cost of the CXMU 56 function and allows the CXMU 56 to transmit and receive over coax instead of fiber. The downstream telephony transmitter 14 also provides for transmission on redundant downstream fiber feeder lines 24 to an ODN 18.

The downstream telephony transmitter 14 is co-located with the HDT 12 preferably within a distance of 100 feet or less. The downstream telephony transmitter 14 receives the coaxial RF outputs from the active CXMUs 56, each within a 6 MHz frequency band, and combines them at combiner 25 into a single RF signal. Each 6 MHz frequency band is separated by a guard band as is known to one skilled in the art. Downstream telephony information is then transmitted in about the 725-800 MHz frequency band. The telephony transmitter 14 passes the combined signal through a 1-to-2 splitter (not shown), thereby producing redundant downstream electrical signals. The two redundant signals are each delivered to redundant laser transmitters 501 for electrical-to-optical conversion and the redundant signals modulate an optical output such that the output of the downstream telephony transmitter 14 is on two optical feeder lines 24, each having an identical signal modulated thereon. This provides protection for the downstream telephony portion of the present system. Both Fabry-Perot lasers in the telephony transmitter 14 are active at all times. All protection functions are provided at the receive end of the optical transmission (located at the ODN 18) where one of two receivers is selected as "active"; therefore, the telephony transmitter 14 requires no protection switching capabilities.

Upstream Telephony Receiver

The upstream telephony receiver 16 performs the optical-to-electrical conversion on the upstream optical telephony signals on the upstream optical feeder lines 26 from the ODN 18. The upstream telephony receiver 16 is normally co-located in the central office with the HDT 12, and provides an electrical coaxial output to the HDT 12, and a coaxial output 23 to be provided to a video set-top controller (not shown). Upstream telephony information is routed via coax lines 28 from the upstream telephony receiver 16 to active CXMUs 56 of the HDT 12. The coaxial link 28 between the HDT 12 and the upstream telephony receiver 16 is preferably limited to a distance of 100 feet or less and is an intra-office link. Video set-top controller information, as described in the Video Transport section hereof, is located in a bandwidth of the RF spectrum of 5-40 MHz which is not utilized for upstream telephony transport such that it is transmitted along with the upstream telephony information.

The upstream telephony receiver 16 has dual receivers 502 for the dual upstream optical fiber feeders lines 26. These feeder lines 26 carry redundant signals from the ODN 18 which contain both telephony information and control data and also video set-top box information. The upstream telephony receiver 16 performs automatic protection switching on the upstream feeder lines 26 from the ODN. The receiver 502 selected as "active" by protection logic is split to feed the coaxial outputs 28 which drive the HDT 12 and output 23 is provided to the set-top controller (not shown).

Optical Distribution Node

Referring to FIG. 5, the ODN 18 provides the interface between the optical feeder lines 24 and 26 from the HDT 12 and the coaxial portion of the HFC distribution network 11 to the remote units 46. As such, the ODN 18 is essentially an optical-to-electrical and electrical-to-optical converter. The maximum distance over coax of any ISU 100 from an ODN 18 is preferably about 6 km and the maximum length of the combined optical feeder line/coaxial drop is preferably about 20 km. The optical feeder line side of the ODN 18 terminates six fibers although such number may vary. They include: a downstream video feeder line 42 (single fiber from video splitter 38), a downstream telephony feeder line 24 (from downstream telephony transmitter 14), a downstream telephony protection feeder line 24 (from downstream telephony transmitter 14), an upstream telephony feeder line 26 (to upstream telephony receiver 16), an upstream protection feeder line 26 (to upstream telephony receiver 16), and a spare fiber (not shown). The ODN 18 provides protection switching functionality on the receive optical feeder lines 24 from the downstream telephony transmitter. The ODN provides redundant transmission on the upstream optical feeder lines 26 to the upstream telephony receiver. Protection on the upstream optical feeder lines is controlled at the upstream telephony receiver 16. On the coaxial distribution side of ODN 18, the ODN 18 terminates up to four coaxial legs 30.

In the downstream direction, the ODN 18 includes downstream telephony receiver 402 for converting the optical downstream telephony signal into an electrical signal and a bridger amplifier 403 that combines it with the converted downstream video signal from downstream video receiver 400 terminated at the ODN 18 from the VHDT 34. This combined wide-band electrical telephony/video signal is then transported in the spectrum allocated for downstream transmission, for example, the 725-800 MHz band, on each of the four coaxial legs of the coaxial portion of the HFC distribution network 11. As such, this electrical telephony and video signal is carried over the coaxial legs 30 to the ISUs 100; the bridger amplifier 403 simultaneously applying four downstream electrical telephony and video signals to diplex filters 406. The diplex filters 406 allow for full duplex operation by separating the transmit and receive functions when signals at two different frequency bandwidths are utilized for upstream and downstream transmission. There is no frequency conversion available at the ODN 18 for downstream transport as the telephony and video signals are passed through the ODN 18 to the remote units 46 via the coaxial portion of HFC distribution network 11 in the same frequency bandwidth as they are received at the ODN 18. As shown in FIG. 1, each coaxial leg 30 can provide a significant number of remote units 46 with downstream electrical video and telephony signals through a plurality of coaxial taps 44. Coaxial taps 44 commonly known to one skilled in the art act as passive bidirectional pickoffs of electrical signals. Each coaxial leg 30 may have a number of coaxial taps connected in a series. In addition, the coaxial portion of the HFC distribution network 11 may use any number of amplifiers to extend the distance data can be sent over the coaxial portions of the system 10. The downstream electrical video and telephony signals are then provided to an ISU 100 (FIG. 8), which, more specifically, may be an HISU 68 or an MISU 66 as shown in FIG. 1.

In the upstream direction, telephony and set top box information is received by the ODN 18 at diplex filters 406 over the four coaxial legs 30 in the RF spectrum region from 5 to 40 MHz. The ODN 18 may include optional frequency shifters 64 equipped on up to three of four coaxial legs 30. These frequency shifters 64, if utilized, mix the upstream spectrum on a coaxial leg to a higher frequency prior to combining with the other three coaxial legs. Frequency shifters 64 are designed to shift the upstream spectrum in multiples of 50 MHz. For example, the frequency shifters 64 may be provisioned to mix the upstream information in the 5-40 MHz portion of the RF spectrum to any of the following ranges: 50 to 100 MHz, 100 to 150 MHz, or 150 to 200 MHz. This allows any coaxial leg 30 to use the same portion of the upstream RF spectrum as another leg without any spectrum contention when the upstream information is combined at the ODN 18. Provisioning of frequency shifters is optional on a coaxial leg 30. The ODN 18 includes combiner 408 which combines the electrical upstream telephony and set top box information from all the coaxial legs 30 (which may or may not be frequency shifted) to form one composite upstream signal having all upstream information present on each of the four coaxial legs 30. The composite electrical upstream signal is passively 1:2 split and each signal feeds an upstream Fabry-Perot laser transmitter which drives a corresponding upstream fiber feeder line 26 for transmission to the upstream telephony receiver 16.

Figure 7:
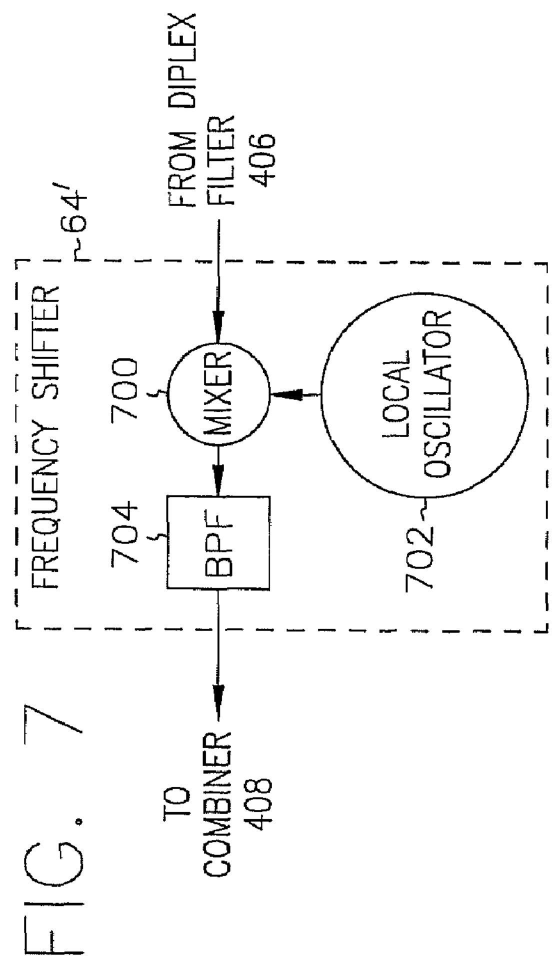

FIG. 7 illustrates an embodiment of a frequency shifter, indicated generally at 64', for use in ODN 18 of FIG. 5. Frequency shifter 64' comprises a mixer 700 that is coupled to receive and shift the frequency band of RF signals in the upstream direction from diplex filter 406 for a coaxial leg 30. An output of mixer 700 is coupled through a bandpass filter 704 to combiner 408. Local oscillator 702 is coupled to provide a signal to control the operation of mixer 700.

In operation, frequency shifter 64' shifts a block of RF signals from a first frequency range to a second frequency range. For example, as mentioned above, the RF signals provided to frequency shifter 64' may comprise RF signals in the range from 5 to 40 MHz. In one embodiment, ODN 18 comprises three frequency shifters 64'. In this embodiment, the local oscillators 702 of the three frequency shifters provide signals of 76 MHz, 149 MHz, and 222 MHz, respectively. Thus, frequency shifters 64' respectively shift the upstream RF signals approximately to the 50 to 100 MHZ, 125 to 175 MHZ and 200 to 250 MHZ ranges.

If the upstream telephony and set top box signals are upshifted at the ODN 18, the upstream telephony receiver 16 includes frequency shifters 31 to downshift the signals according to the upshifting done at the ODN 18. A combiner 33 then combines the downshifted signals for application of a combined signal to the HDT 12. Such downshifting and combining is only utilized if the signals are upshifted at the ODN 18.

Figure 6:
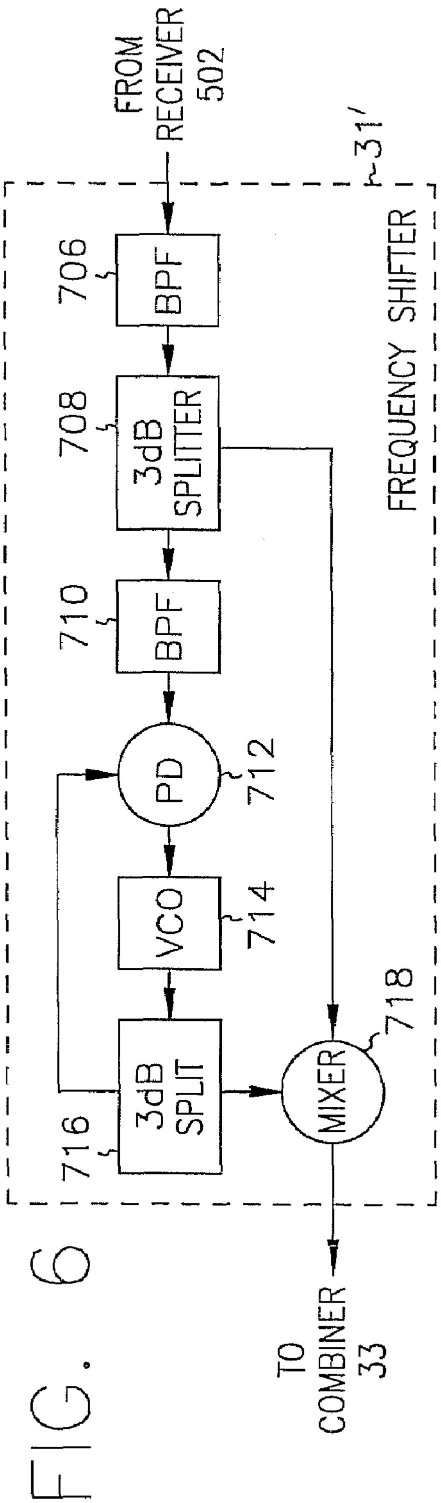
FIGS. 6, 7 are embodiments of frequency shifters for use in the optical distribution node of FIG. 5 and the telephony upstream receiver of FIG. 4, respectively.

FIG. 6 illustrates an embodiment of a frequency shifter, indicated generally at 31', for use in telephony upstream receiver 16 of FIG. 3. Frequency shifter 31' returns a block of RF signals shifted by frequency shifter 64' to original frequency range of the block. For example, frequency shifter 31' may return a block of RF signals to 5 to 40 MHz from 50 to 100 MHz.

As discussed in more detail below, the upstream telephony signals processed by frequency shifters 31' and 64' are typically OFDM signals. Thus, frequency shifters 64' must return the RF signals to the original frequency range without introducing adverse phase and frequency errors. To reduce the likelihood of this corruption of the OFDM signals, frequency shifter 31' locks its local oscillator to the local oscillator of a corresponding frequency shifter 64' using a pilot tone transmitted from ODN 18 to telephony upstream receiver 16.

Frequency shifter 31' includes a bandpass filter 706 that is coupled to receive an RF signal from ODN 18. Bandpass filter 706 is coupled to a splitter 708. Splitter 708 is coupled to provide the RF signal to an input of mixer 718. Further, splitter 708 provides a second output that is used to generate a local oscillator signal for mixer 718. This local oscillator signal is phase locked with a corresponding local oscillator 702 of frequency converter 64'. This second output of splitter 708 is coupled to phase detector 712 through bandpass filter 710. Phase detector 712 is coupled to provide a control signal to voltage controlled oscillator 714. Voltage controlled oscillator 714 is coupled through splitter 716 to provide the local oscillator signal to mixer 718. Splitter 716 further provides a feedback signal to phase detector 712.

In operation, phase detector 712 phase locks local oscillator signal of frequency shifter 31' with local oscillator 702 of a corresponding frequency shifter 64'. Phase detector 712 compares the pilot tone from ODN 18 with the feedback signal from voltage controlled oscillator 714 to generate the control signal for voltage controlled oscillator 714. Consequently, the local oscillator signal provided to mixer 718 is phase locked with the corresponding local oscillator 702 of frequency shifter 64'. Mixer 718 uses the local oscillator signal from splitter 716 and voltage controlled oscillator 714 to shift the block of RF signals received by frequency shifter 31' to the original frequency range of the block of RF signals. Advantageously, unacceptable modifications of the OFDM upstream signal by frequency shifters 64' and 31' are thus avoided.

Integrated Services Unit (ISUs)

Referring to FIG. 1, the ISUs 100, such as HISU 68 and MISU 66, provide the interface between the HFC distribution network 11 and the customer services for remote units 46. Two basic types of ISUs are shown, which provide service to specific customers. Multiple user integrated service unit 66 (MISUs) may be a multiple dwelling integrated service unit or a business integrated service unit. The multiple dwelling integrated service unit may be used for mixed residential and business environments, such as multi-tenant buildings, small businesses and clusters of homes. These customers require services such as plain old telephone service (POTS), data services, DS1 services, and standard TR-57 services. Business integrated service units are designed to service business environments. They may require more services, for example, data services, ISDN, DS1 services, higher bandwidth services, such as video conferencing, etc. Home integrated services units 68 (HISUs) are used for residential environments such as single-tenant buildings and duplexes, where the intended services are POTS and basic rate integrated digital services network (ISDN). Description for ISUs shall be limited to the HISUs and MISUs for simplicity purposes as multiple dwelling and business integrated service units have similar functionality as far as the present invention is concerned.

All ISUs 100 implement RF modem functionality and can be generically shown by ISU 100 of FIG. 8. ISU 100 includes ISU modem 101, coax slave controller unit (CXSU) 102, channel units 103 for providing customer service interface, and diplex filter/tap 104. In the downstream direction, the electrical downstream telephony and video signal is applied to diplex filter/tap 104 which passes telephony information to ISU modem 101 and video information to video equipment via an ingress filter 105 in the case of a HISU. When the ISU 100 is a MISU 66, the video information is rejected by the diplex filter. The ISU modem 101 demodulates the downstream telephony information utilizing a modem corresponding to the MCC modem 82 used for modulating such information on orthogonal multicarriers at HDT 12. ISU 100 demodulates downstream telephony information from a coaxial distribution leg 30 in a provisionable 6 MHz frequency band. Timing generation 107 of the ISU modem 101 provides clocking for CXSU 102 which provides processing and controls reception and transmission by ISU modem 101. The demodulated data from ISU modem 101 is passed to the applicable channel units 103 via CXSU 102 depending upon the service provided. For example, the channel units 103 may include line cards for POTS, DS1 services, ISDN, other data services, etc. Each ISU 100 provides access to a fixed subset of all channels available in a 6 MHz frequency band corresponding to one of the CXMUs of HDT 12. This subset of channels varies depending upon the type of ISU 100. An MISU 66 may provide access to many DS0 channels in a 6 MHz frequency band, while an HISU 68 may only provide access to a few DS0 channels.

The channel units 103 provide telephony information and control data to the CXSU 102, which provides such data to ISU modem 101 and controls ISU modem 101 for modulation of such telephony data and control data in a provisional 6 MHz frequency band for transmission onto the coaxial distribution leg 30 connected thereto. The upstream 6 MHz frequency band provisionable for transmission by the ISU 100 to the HDT 12 corresponds to one of the downstream 6 MHz bands utilized for transmission by the CXMUs 56 of HDT 12.

The CXSU 102 which applies demodulated data from the ISU modem 101 to the applicable channel units, performs data integrity checking on the downstream 10 bit DS0+ packets received from the ISU modem 101. Each ten bit DS0+ packet as described below includes a parity or data integrity bit. The CXSU 102 will check the parity of each downstream 10 bit DS0+ channel it receives. Further, the parity of each upstream DS0+ received from the channel units 103 is calculated and a parity bit inserted as the tenth bit of the upstream DS0+ for decoding and identification by the HDT 12 of an error in the upstream data. If an error is detected by CXSU 102 when checking the parity of a downstream 10 bit DS0+ channel it receives, the parity bit of the corresponding upstream channel will be intentionally inverted to inform the HDT 12 of a parity error in the downstream direction. Therefore, the upstream parity bit is indicative of errors in the downstream DS0+ channel and the corresponding upstream DS0+ channel. An example of such a parity bit generation process is described in U.S. patent application Ser. No. 08/074,913 entitled "Point-to Multipoint Performance Monitoring and Failure Isolation System" assigned to the assignee hereof and entirely incorporated herein by reference. This upstream parity bit is utilized in channel monitoring as described further below. As would be apparent to one skilled in the art, the parity checking and generation may be performed, at least in part, in other elements of the ISU or associated therewith such as the channel units.

Each ISU 100 recovers synchronization from downstream transmission, generates all clocks required for ISU data transport and locks these clocks to the associated HDT timing. The ISUs 100 also provide call processing functionality necessary to detect customer line seizure and line idle conditions and transmit these indications to the HDT 12. ISUs 100 terminate and receive control data from the HDT 12 and process the control data received therefrom. Included in this processing are messages to coordinate dynamic channel allocation in the communication system 10. Finally, ISUs 100 generate ISU operating voltages from a power signal received over the HFC distribution network 11 as shown by the power signal 109 taken from diplex filter/tap 104.

Data Path in HDT

Figure 9:
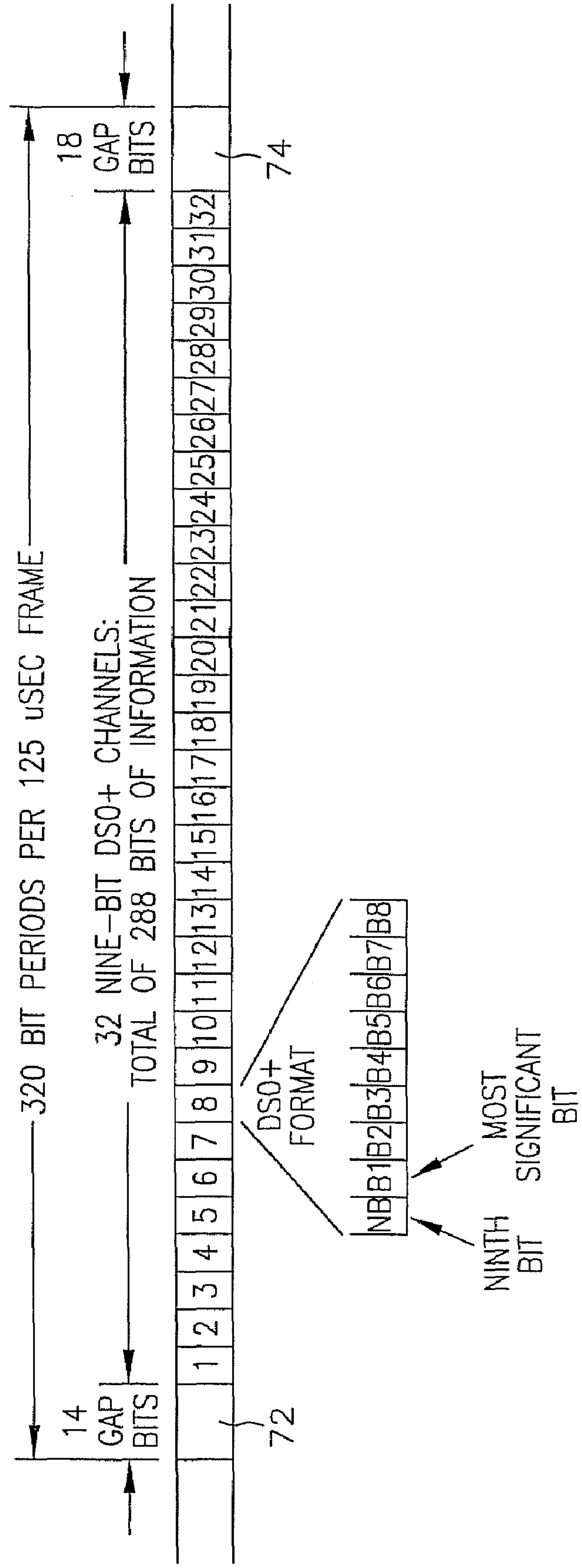
FIGS. 9, 10, 11 show data frame structures and frame signaling utilized in the HDT of FIG. 3.

The following is a detailed discussion of the data path in the host digital terminal (HDT) 12. Referring to FIG. 3, the data path between the network facility at the network interface 62 and the downstream telephony transmitter 14 proceeds through the DS1U 48, CTSU 54, and CXMU 56 modules of the HDT 12, respectively, in the downstream direction. Each DS1U 48 in the HDT 12 takes four DS1s from the network and formats this information into four 24-channel, 2.56 Mbps data streams of modified DS0 signals referred to as CTSU inputs 76. Each DS0 in the CTSU input has been modified by appending a ninth bit which can carry multiframe timing, signaling information and control/status messages (FIG. 9). This modified DS0 is referred to as a "DS0+." The ninth bit signal (NBS) carries a pattern which is updated each frame and repeats every 24 frames. This maps each 64 kbps DS0 from the network into a 72 kbps DS0+. Thus, the twenty-four DS0 channels available on each DS1 are formatted along with overhead information into twenty-four DS0+ channels on each of four CTSU input streams.

The ninth bit signaling (NBS) is a mechanism developed to carry the multiframe timing, out-of-band signaling bits and miscellaneous status and control information associated with each DS0 between the DS1U and the channel units. Its main functions are to carry the signaling bits to channel units 103 and to provide a multiframe clock to the channel units 103 so that they can insert upstream bit signaling into the DS0 in the correct frame of the multiframe. Because downstream DS0s may be coming from DS1s which do not share the same multiframe phase each DS0 must carry a multiframe clock or marker which indicates the signaling frames associated with the origination DS1. The NBS provides this capability. Ninth bit signaling is transparent to the OFDM modem transport of the communication system 10.

Up to eight DS1Us 48 may be equipped in a single HDT 12; including seven active DS1Us 48 and a protection DS1U module 50. Thus, 32 CTSU inputs are connected between the DS1Us and the CTSUs 54 but a maximum of 28 can be enabled to carry traffic at any one time. The four remaining CTSU inputs are from either the protection DS1U or a failed DS1U. The PSTU includes switch control for switching the protection DS1U 50 for a failed DS1U.

Figure 11:
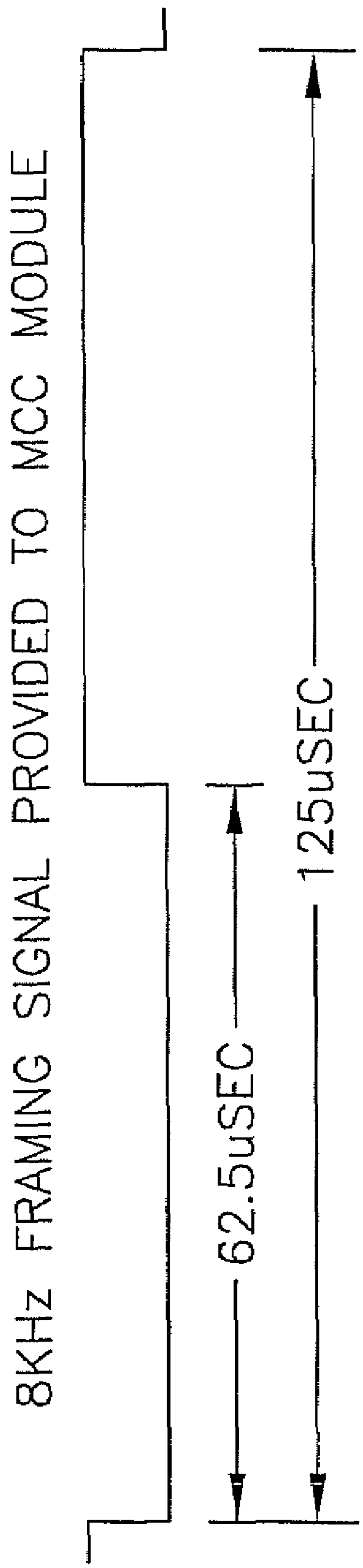

Each CTSU input is capable of carrying up to 32, 10-bit channels, the first 24 channels carry DS0+s and the remaining bandwidth is unused. Each CTSU input 76 is clocked at 2.56 Mbps and is synchronized to the 8 kHz internal frame signal (FIG. 11). This corresponds to 320 bits per 125 μs frame period. These 320 bits are framed as shown in FIG. 9. The fourteen gap bits 72 at the beginning of the frame carry only a single activity pulse in the 2nd bit position, the remaining 13 bits are not used. Of the following 288 bits, the first 216 bits normally carry twenty-four DS0+ channels where each DS0+ corresponds to a standard 64 kbps DS0 channel plus the additional 8 kbps signaling bit. Thus, each DS0+ has a bandwidth of 72 kbps (nine bits every 8 kHz frame). The remaining 72 bits are reserved for additional DS0+ payload channels. The final eighteen bits 74 of the frame are unused gap bits.

The clock and time slot interchange unit 54 (CTSU) of the HDT 12 takes information from up to 28 active CTSU input data streams 76 and cross-connects them to up to twenty-four 32-channel, 2.56 Mbps output data streams 78 which are input to the coax master units (CXMUs) 56 of the HDT 12. The format of the data streams between the CTSU 54 and the CXMUs 56 is referred to as a CTSU output. Each CTSU output can also carry up to 32, 10-bit channels like the CTSU input. The first 28 carry traffic and the remaining bandwidth is unused. Each CTSU output is clocked at 2.56 Mbps and is synchronized to the 8 kHz internal framing signal of the HDT 12 (FIG. 11). This corresponds to 320 bits per 125 μs frame period. The frame structure for the 320 bits are as described above for the CTSU input structure.

The HDT 12 has the capability of time and space manipulation of quarter-DS0 packets (16 kbps). This function is implemented with the time slot interchange logic that is part of CTSU 54. The CTSU implements a 4096×4096 quarter-DS0 cross-connect function, although not all time slots are utilized. In normal operation, the CTSU 54 combines and relocates up to 672 downstream DS0+ packets (or up to 2688 quarter-DS0 packets) arranged as 28 CTSU inputs of 24 DS0+s each, into 720 DS0+packets (or 2880 quarter-DS0 packets) arranged as 24 CTSU outputs of 32 DS0+s each.

The system has a maximum throughput of 672 DS0+ packets at the network interface so not all of the CTSU output bandwidth is usable. If more than the 672 channels are assigned on the "CTSU output" side of the CTSU, this implies concentration is being utilized. Concentration is discussed further below.

Figure 10:
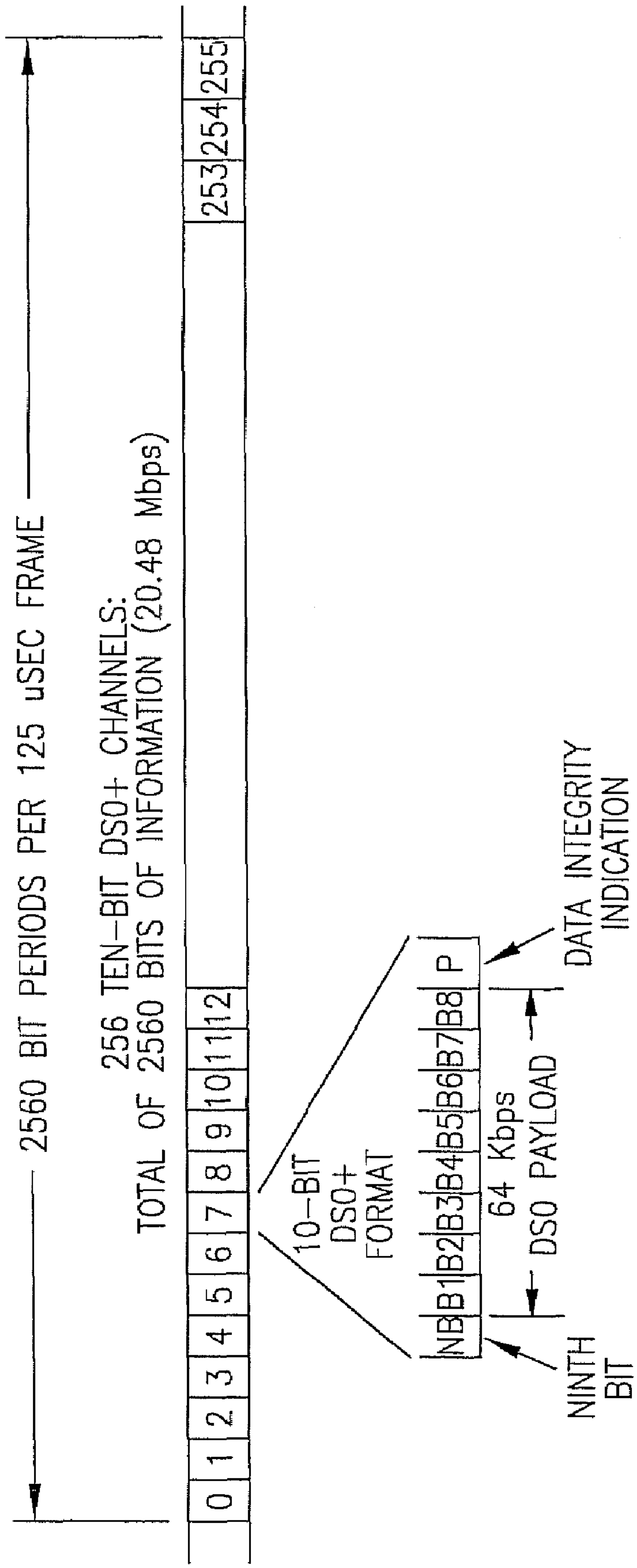

Each CXMU 56 is connected to receive eight active CTSU outputs 78 from the active CTSU 54. The eight CTSU outputs are clocked by a 2.56 MHz system clock and each carries up to 32 DS0+s as described above. The DS0+s are further processed by the CXMU 56 and a tenth parity bit is appended to each DS0+ resulting in a 10 bit DS0+. These 10 bit packets contain the DS0, the NBS (ninth bit signal) and the parity or data integrity bit (FIG. 10). The 10 bit packets are the data transmitted on the HFC distribution network 11 to the ISUs 100. The 10th bit or data integrity bit inserted in the downstream channels is decoded and checked at the ISU and utilized to calculate and generate a parity bit for corresponding channels in the upstream as described above. This upstream parity bit which may be representative of an error in the downstream or upstream channel is utilized to provide channel protection or monitoring as further described herein.

Figure 54:
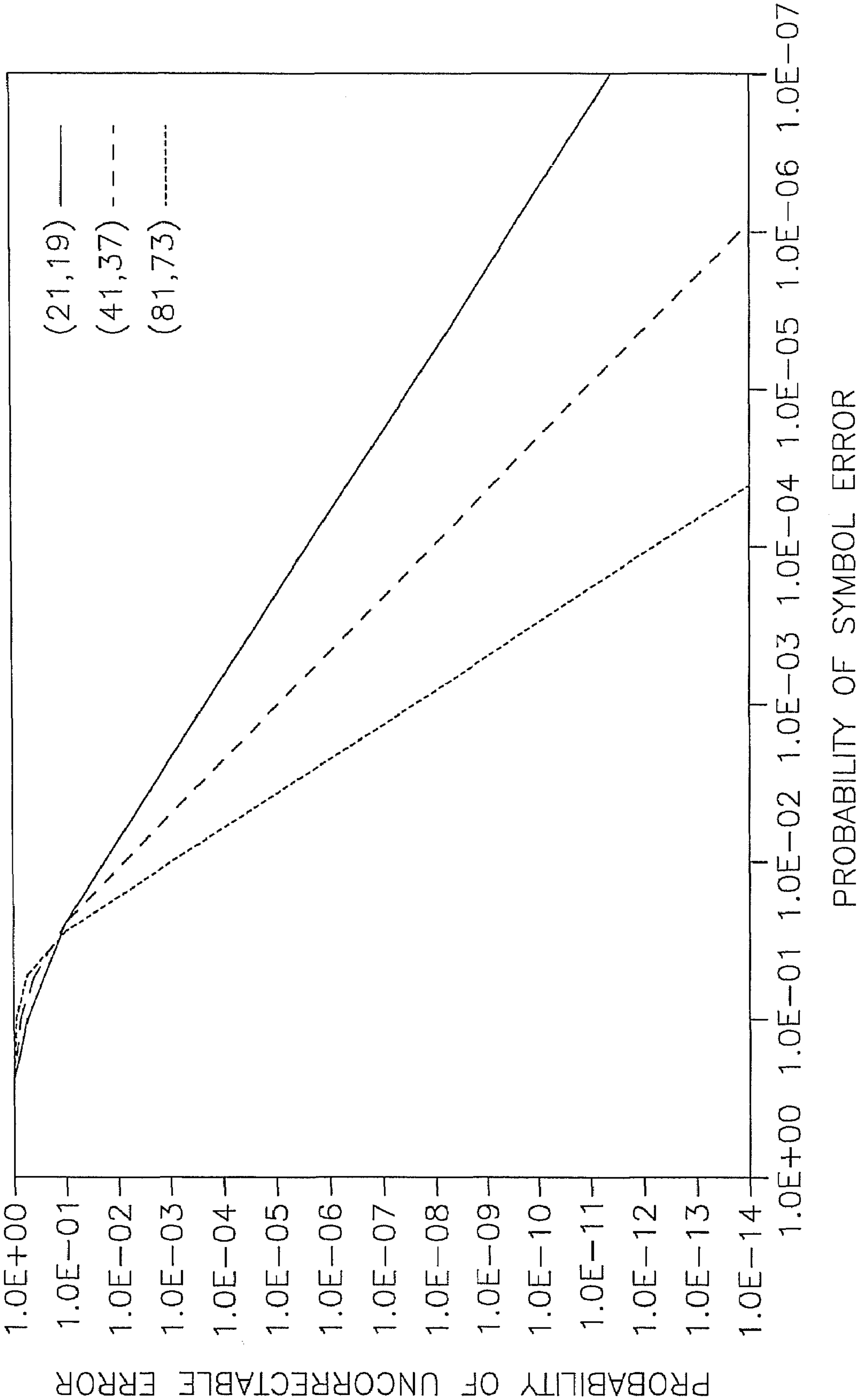

CTSU 54 is also capable of applying a conventional Reed-Soloman code to transmitted payload data for running error correction. Such codes carry an overhead which must be borne by the inclusion of error-correcting symbols in each block or message transmitted. Generally, two check symbols are required to correct one corrupted data symbol in a message. (The incorrect symbol may contain any number of errors in its 5 bits, as long as all bit errors are confined to the same symbol. But even a single incorrect bit in each of two symbols counts as two errors.) Short messages impose less computational overhead on a system, but can correct fewer errors in the message. Conversely, long messages require more computation and more latency before the corrections can be applied, but their error-correction ability is greater. FIG. 54 represents, for an example system, the probability of an uncorrectable error in a frame for various error probabilities in one individual symbol. The solid curve shows the error performance for a 21-frame message having 19 frames of data symbols and two frames of error-correction code; the dashed curve represents a 41-frame message having 37 data and four code frames; the dotted curve gives the best performance, with 73 data frames and eight code frames in an 81-frame message.

Figure 55:
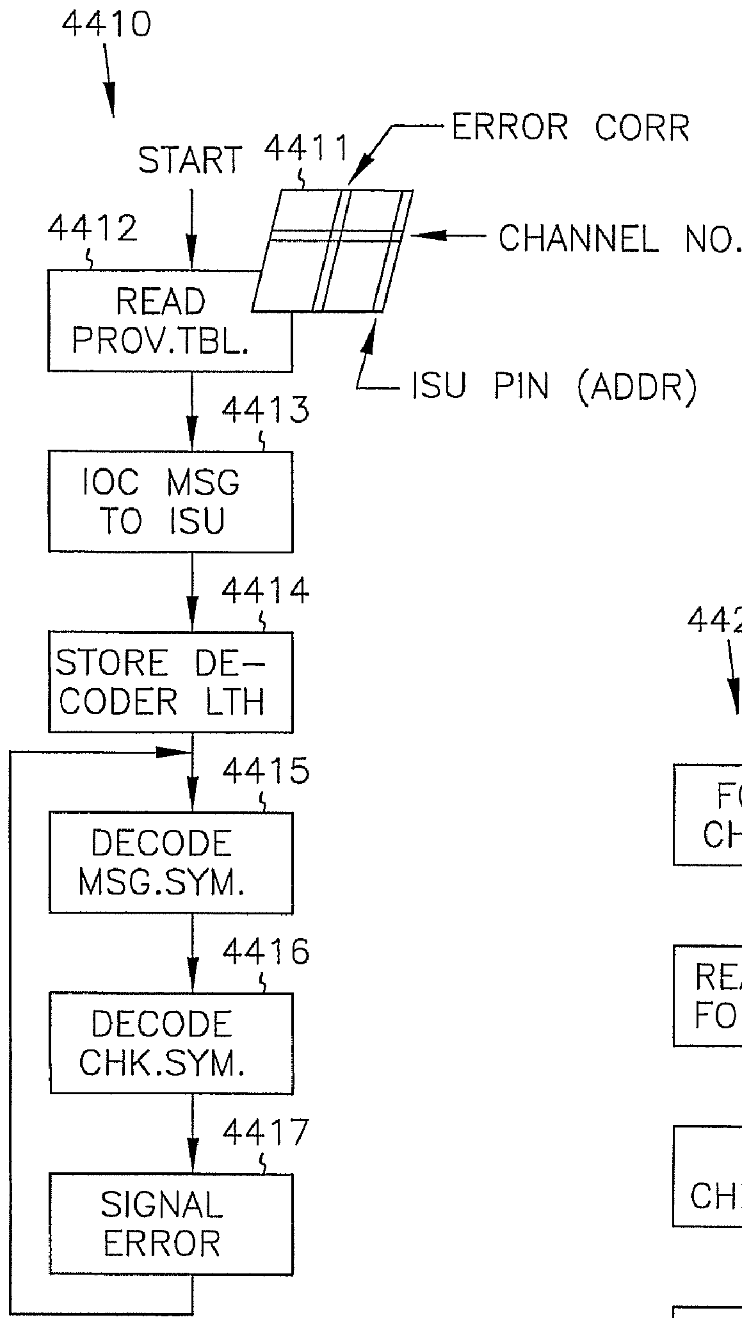

The present system allows a choice of different error-correction abilities for different types of data. For example, voice data is highly redundant, and needs little defense against errors. Financial transaction data, on the other hand, wants a large degree of data integrity. In addition, it may be desirable to allow a user to select, and pay for, whatever degree of error correction that he desires. CTSU 54, FIG. 3, includes a conventional "provisioning table," which specifies a number of parameters relating to particular payload channels. FIG. 55 shows a provisioning table 4411 having an added column containing indications for several different amounts of error protection. In method 4410, step 4412 reads the entry for a particular channel to be set up. In this implementation, the entry may specify message lengths of 21, 41, or 81 bits, respectively having the ability to correct 1, 2, or 4 symbols; the entry may also specify no correction, in which case message blocks do not apply. Step 4413 encodes the table entry in an IOC message and sends it to the ISU whose address appears in that row of table 4411. A general-purpose processor in CXSU 102 of the ISU stores the frame length in step 4414. As the CXSU receives data from modem 101, FIG. 8, it decodes the frames of an entire message, 4415, then decodes the check symbols for the message, 4416, and signals an error, 4417, if one exists in the message. Steps 4415-4417 repeat for subsequent messages. The ISU employs the same process to send frames upstream to the head end, using the frame length setting specified in step 4414.

Figure 12:
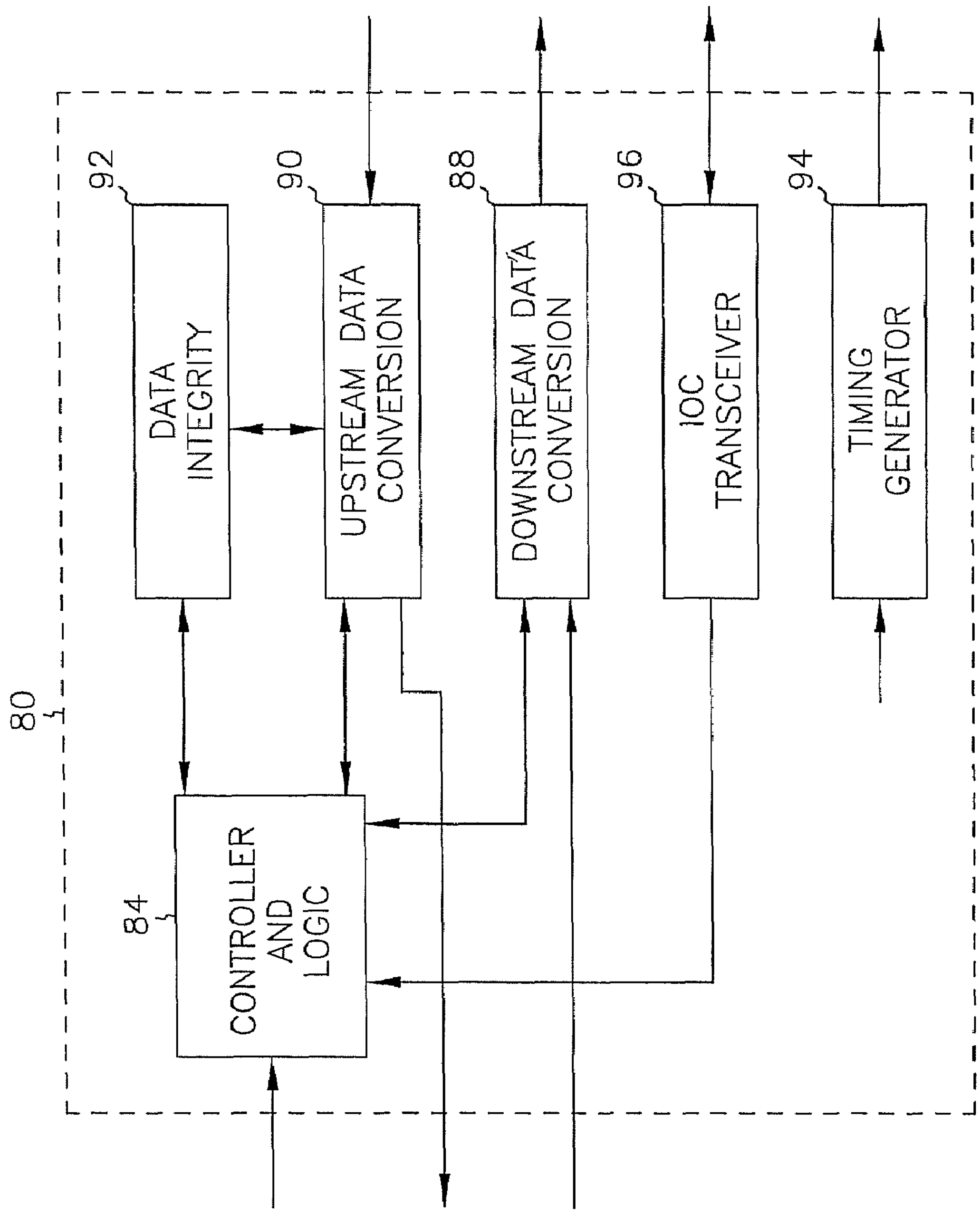
FIG. 12 is a general block diagram of a coax master card (CXMC) of a coax master unit (CXMU) of FIG. 3.

Within both CXSU 102 at the ISU and the CXMU, FIG. 12 at the HDT, a 21-frame message or block requires 19 symbol or frame times to decode the message, then has two frames of latency while its two check symbols are decoded. A 41-frame message uses four frames of time for computation of any errors from the four check symbols following its 37 data symbols. An 81-frame message presents any error indication 8 frame times after the end of its 73 data frames. (One extra frame of delay is imposed in the downstream direction due to remapping at the HDT.) If all messages were to start at the same time for all channels in an entire band, the computational load in the HDT would peak during the check-symbol frames, and would be lower at other times. Since the processor must be capable of handling the peak loads, its power is underutilized at other times.

Figure 16:
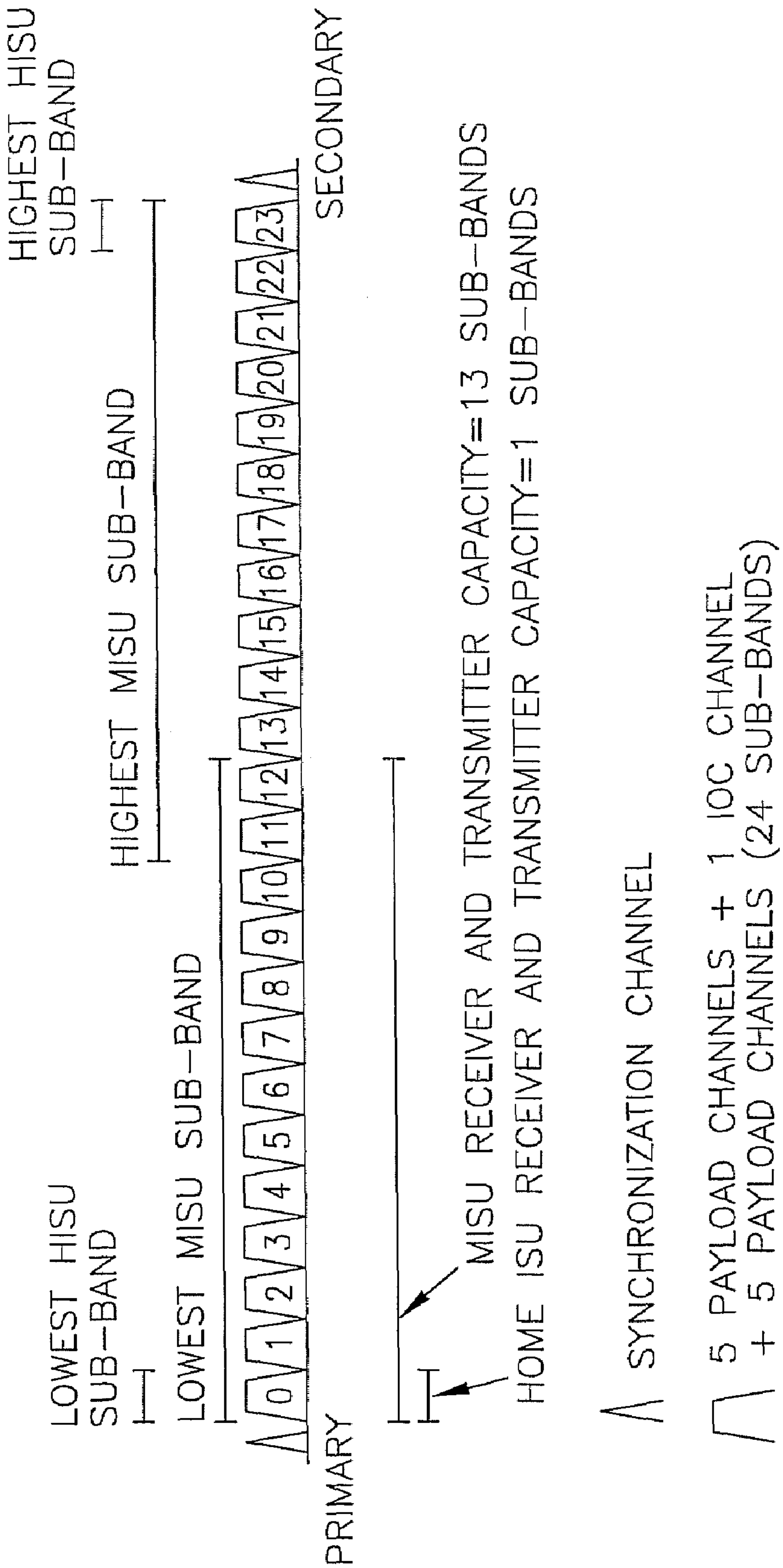
FIG. 16 shows a subband diagram for the spectral allocation of FIG. 13.

The present system allows a lower-capacity processor to handle error correction by staggering the beginning times of different messages in different subbands of channels, so that not all of them come due at the same time. That is, the start of a message in any channel of a subband is offset from the start of a message or "multiframe" signal, to be described, by a predetermined number of frame times of 125 μs each. The table below shows how the 24 subbands of FIG. 16 are offset, for each message length which can be selected.

TABLE 1

| Subband | 21 frames | 41 frames | 81 frames |
|---|---|---|---|
| 0 | 0 | 0 | 0 |
| 1 | 0 | 0 | 1 |
| 2 | 0 | 1 | 2 |
| 3 | 0 | 1 | 3 |
| 4 | 1 | 2 | 4 |
| 5 | 1 | 2 | 5 |
| 6 | 1 | 3 | 6 |
| 7 | 1 | 3 | 7 |
| 8 | 2 | 4 | 8 |
| 9 | 2 | 4 | 9 |
| 10 | 2 | 5 | 10 |
| 11 | 2 | 5 | 11 |
| 12 | 3 | 6 | 12 |

Only 13 subband settings are required, since no unit tunes more than 130 channels. Giving all 10 channels of each subband the same offset does not overload the processors of the remote units. However, the head end (HDT), which receives and transmits all channels, can enjoy significant relief from not having to encode or decode the check symbols for all channels at the same time.

Figure 56:
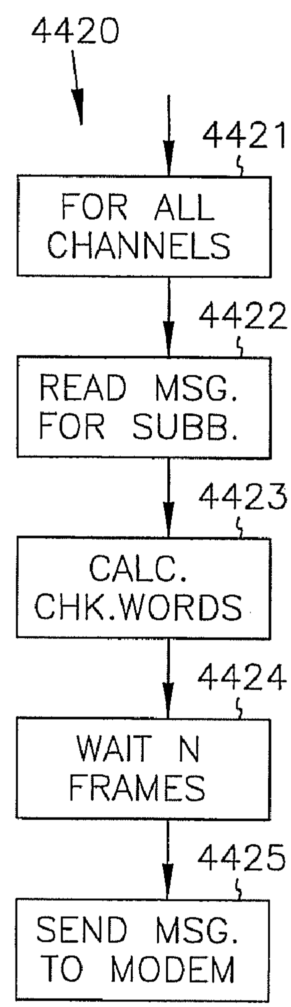

FIG. 56 shows steps 4420 for performing frame staggering. Step 4421 repeats method 4420 for all active payload channels. Step 4422 accesses the current messages for the channels in one subband. Step 4423 calculates the 1, 2, or 4 Reed-Soloman check words for the 21, 41, or 81 message data words. Step 4424 waits N frames past the start of a multiframe, whereupon step 4425 sends the message to modem 82, FIG. 3 for transmission.

At a remote ISU, CXSU performs the same steps 4420 for upstream messages. Step 4422 is required only in an MISU, because all channels in an HISU reside in the same subband. Method 4420 may be performed at both ends of the system, as described herein; it may also be performed only at one end, either HDT or ISU. Staggering from the ISU to the HDT is preferable if only one end is staggered, because the most critical processing load is the error-correction of all 240 channels in the upstream receiving modem, FIG. 26.

The use of error-correcting codes along with unencoded data raises problems in a real-time transport system. Data arrives from the trunk line 20, FIG. 1, at a constant rate. This data must be transmitted downstream in the same time duration, whether it is encoded along the way, or sent unencoded. Likewise, upstream data usually must be transmitted at the same rate whether or not it is encoded. That is, the use of error-correcting codes must be time-transparent at both ends of the system. But error-correcting codes require the transmission of check digits or symbols along with the data. The present system resolves this difficulty by packing the data words differently if they are encoded. As explained above, the basic unencoded word length for a DS0++ channel is ten bits: eight data bits, a signaling (NBS) bit, and a parity bit. When encoding is used, however, this format is changed to nine-bit words, with a single parity bit for the entire message. This is the reason for the choice of frame sizes for the encoded modes. A 21-frame message contains 19 data frames, which would ordinarily be transmitted as 10×19=190 bits. Those same data frames, packaged as nine-bit words along with two nine-bit check words, require (19+2)×9=189 bits; adding one more parity bit covering the entire message lock gives 190 bits, the same number as that required for the unencoded version of the same data. The 41-frame message has 37 frames of data, or 370 bits in unencoded 10-bit format. Encoded as 37 nine-bit words along with four check words, the same message requires (37+4)×9=369 bits; again, a single additional parity bit yield the 370 bits of the same data in unencoded form. The 81-frame format has 73 data words, 8 check words, and a parity bit, yielding the same number of bits as 73 data words in 10-bit form.

There are many other combinations of numbers which yield similar results. These can be found heuristically without a great deal of experimentation. The first step is to estimate rough numbers of large (parity-bearing) words in one or more message sizes, and the number of errors desired to be correctable for each size. The next step is to determine a number of smaller (non-parity) words that carry the same amount of data, but which form a total message the same size or slightly smaller than the total number of bits in the large-word format. Any excess bits then are assigned to parity over the block—or to any other function, for that matter. For example, if two bits are left over instead of one for each message, they could represent two parity bits over the message, two control or format-designation bits, etc. The use of check symbols, of course, greatly reduces the need for parity or other forms of error detection. In fact, while the present system uses the message-parity bit as parity in the downstream direction, the ISU deliberately sets the parity bit to an incorrect value in an upstream message if it was incorrect in the downstream message. This serves to signal the HDT that a bit error was encountered, when the HDT would not otherwise be aware of it; this in turn allows the HDT to keep more accurate statistics on channel quality for reallocating channels, or for other purposes.

Figure 57:
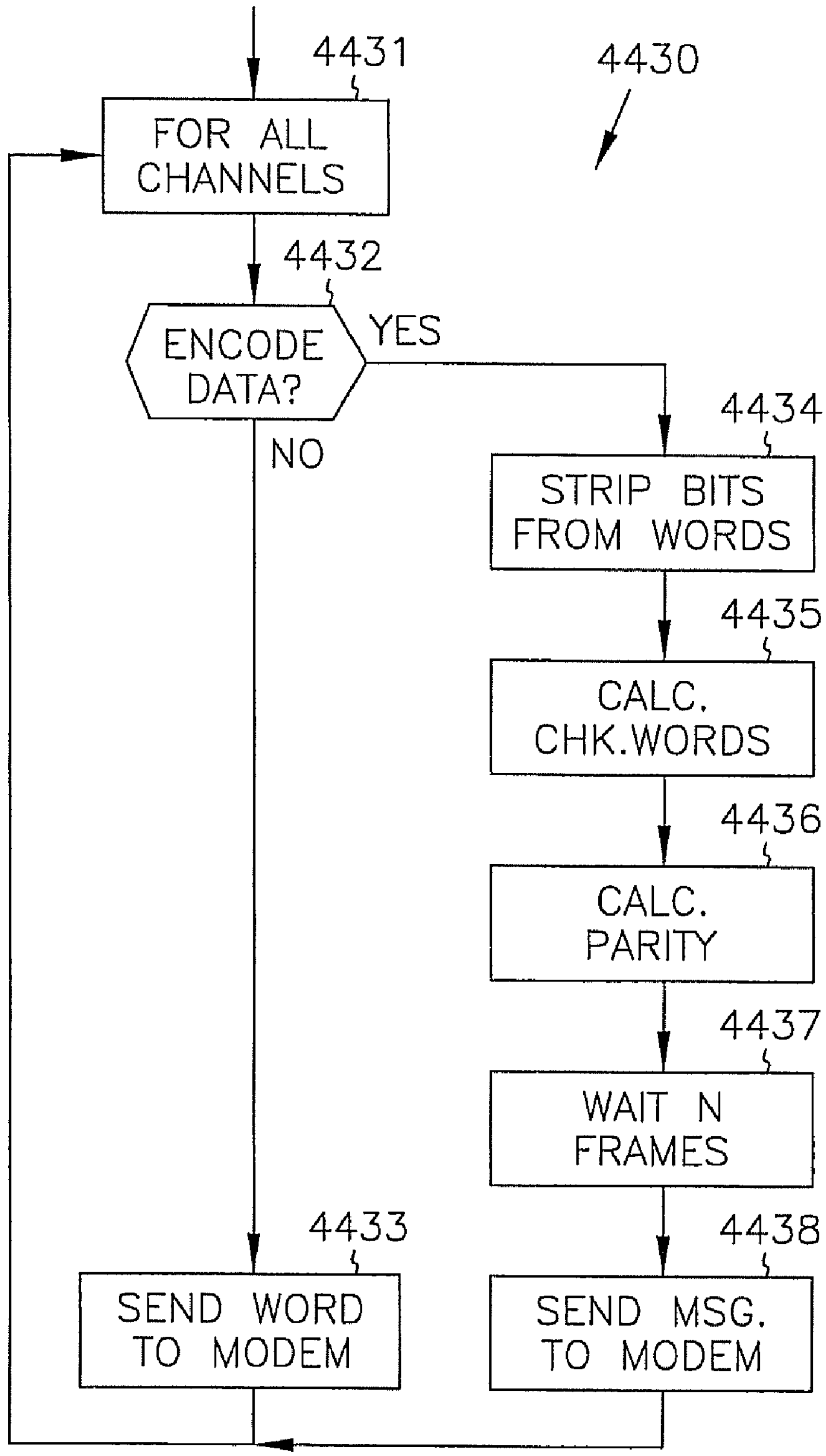

FIG. 57 shows a method 4430 for adding the "code packing" feature to the method 4420 of FIG. 56. Step 4431 repeats the steps for all channels. Step 4432 determines whither the data for the channel is to be encoded or not. If not, step 4433 merely transmits it word-by-word to the modem. If it is to be encoded, step 4434 strips the parity (or other) bit(s) from each word. After step 4435 has formed the check words, step 4436 calculates the message-wide parity, or other desired function. Thereafter, step 4437 waits the proper number of frame times (as specified by method 4420, and step 4338 sends the message to the modem as before. In the upstream direction, the reverse path through the HDT is substantially a mirror of the forward path through the HDT 12. For example, the tenth parity bit is processed at the CXMU 56 and the signal from the CXMU 56 to the CTSU 54 is in the format of FIG. 9.

The round trip delay of a DS0 is the same for every data path. The time delay over the path from the downstream CTSU output, through CXMU 56, over the HFC distribution network to the ISU 100 and then from the ISU 100, back over the HFC distribution network 11, through CXMU 56 and to CTSU 54 is controlled by upstream synchronization, as described in detail below. Generally, path delay is measured for each ISU and if it is not the correct number of frames long, the delay length is adjusted by adding delay to the path at the ISU 100.

Coax Master Unit (CXMU)

The coax master unit 56 (CXMU), shown in FIG. 3, includes the coax master card logic 80 (CXMC) and the master coax card (MCC) modem 82. As previously described, up to six CXMUs may be equipped in an HDT 12. The 6 CXMUs 56 include three pairs of CXMUs 56 with each pair providing for transmit in a 6 MHz bandwidth. Each pair of CXMUs 56 includes one active CXMU and a standby CXMU. Thus, one to one protection for each CXMU is provided. As shown in FIG. 3, both CXMUs of the pair are provided with upstream telephony data from the upstream telephony receiver 16 and are capable of transmitting via the coaxial line 22 to the downstream telephony transmitter 14. As such, only a control signal is required to provide for the one-to-one protection indicating which CXMU 56 of the pair is to be used for transmission or reception.

Coax Master Card Logic (CXMC)

The coax master card logic 80 (CXMC) of the CXMU 56 (FIG. 12), provides the interface between the data signals of the HDT 12, in particular of the CTSU 54, and the modem interface for transport of data over the HFC distribution network 11. The CXMC 80 interfaces directly to the MCC modem 82. The CXMC 80 also implements an ISU operations channel transceiver for multi-point to point operation between the HDT 12 and all ISUs 100 serviced in the 6 MHz bandwidth in which the CXMU 56 controls transport of data within. Referring to FIG. 12, the CXMC includes controller and logic 84, downstream data conversion 88, upstream data conversion 90, data integrity 92, IOC transceiver 96, and timing generator 94.

Downstream data conversion 88 performs the conversion from the nine-bit channel format from CTSU 54 (FIG. 9) to the ten-bit channel format (FIG. 10) and generates the data integrity bit in each downstream channel transported over the HFC distribution network 11. The data integrity bit represents odd parity. Downstream data conversion 88 is comprised of at least a FIFO buffer used to remove the 32 gap bits 72, 74 (FIG. 9) present in the downstream CTSU outputs and insert the tenth, data integrity bit, on each channel under control of controller and logic 84.

The upstream data conversion 90 includes at least a FIFO buffer which evaluates the tenth bit (data integrity) appended to each of the upstream channels and passes this information to the data integrity circuitry 92. The upstream data conversion 90 converts the data stream of ten-bit channels (FIG. 10) back to the nine-bit channel format (FIG. 9) for application to CTSU 54. Such conversion is performed under control of controller and logic 84.

The controller and logic 84 also manages call processing and channel allocation for the telephony transport over the HFC distribution network 11 and maintains traffic statistics over the HFC distribution network 11 in modes where dynamic time-slot allocation is utilized, such as for providing TR-303 services, concentration services commonly known to those skilled in the art. In addition, the controller 84 maintains error statistics for the channels in the 6 MHz band in which the CXMU transports data, provides software protocol for all ISU operations channel communications, and provides control for the corresponding MCC modem 82.

The data integrity 92 circuitry processes the output of the tenth bit evaluation of each upstream channel by the upstream conversion circuit 90. In the present system, parity is only guaranteed to be valid on a provisioned channel which has a call in progress. Because initialized and activated ISU transmitters may be powered down when the ISUs are idle, the parity evaluation performed by the CXMC is not always valid. A parity error detected indicates either a transmission error in an upstream channel or a transmission error in a downstream channel corresponding to the upstream channel.

The ISU operations channel (IOC) transceiver 96 of the CXMC 80 contains transmit buffers to hold messages or control data from the controller and logic 84 and loads these IOC control messages which are a fixed total of 8 bytes in length into a 64 kbps channel to be provided to the MCC modem 82 for transport on the HFC distribution network 11. In this implementation, all IOC channels carry the same information at all times. That is, the IOC messages are broadcast simultaneously over all the channels. This allows the use of inexpensive and rugged narrow-band modems in the ISUs, reserving the more expensive and critical wideband models for the HDT, which uses only one modem for an entire 6 MHz band, and which can be located centrally in a controlled environment. In the upstream direction, the IOC transceiver receives the 64 kbps channel via the MCC modem 82 which provides the controller and logic 84 with such messages.

The timing generator circuit 94 receives redundant system clock inputs from both the active and protection CTSUs 54 of the HDT 12. Such clocks include a 2 kHz HFC multiframe signal, which is generated by the CTSU 54 to synchronize the round trip delay on all the coaxial legs of the HFC distribution network. This signal indicates multiframe alignment on the ISU operations channel and is used to synchronize symbol timing and data reconstruction for the transport system. A 8 kHz frame signal is provided for indicating the first "gap" bit of a 2.56 MHz, 32 channel signal from the CTSU 54 to the CXMU 56. A 2.048 MHz clock is generated by the CTSU 54 to the SCNU 58 and the CXMU 56. The CXMU 56 uses this clock for ISU operations channel and modem communication between the CXMC 80 and the MCC modem 82. A 2.56 MHz bit clock is used for transfer of data signals between the DS1Us 48 and CTSUs 54 and the CTSUs 54 and CXMCs 56. A 20.48 MHz bit clock is utilized for transfer of the 10-bit data channels between the CXMC and the MCC.

Master Coax Card (MCC) Modem

The master coax card (MCC) modem 82 of the CXMU 56 interfaces on one side to the CXMC 80 and on the other side to the telephony transmitter 14 and receiver 16 for transmission on and reception from the HFC distribution network 11. The MCC modem 82 implements the modem functionality for OFDM transport of telephony data and control data. The block diagram of FIG. 3 identifies the associated interconnects of the MCC modem 82 for both upstream and downstream communication. The MCC modem 82 is not an independent module in the HDT 12, as it has no interface to the HDT 12 other than through the CXMC 80 of the CXMU 56. The MCC modem 82 represents the transport system logic of the HDT 12. As such, it is responsible for implementing all requirements associated with information transport over the HFC distribution network 11. Each MCC modem 82 of the CXMUs 56 of HDT 12 is allocated a maximum bandwidth of 6 MHz in the downstream spectrum for telephony data and control data transport. The exact location of the 6 MHz band is provisionable by the CXMC 80 over the communication interface via the IOC transceiver 96 between the CXMC 80 and MCC modem 82. The downstream transmission of telephony and control data is in the RF spectrum of about 725 to 800 MHz.

Each MCC modem 82 is allocated a maximum of 6 MHz in the upstream spectrum for receipt of control data and telephony data from the ISUs within the RF spectrum of about 5 to 40 MHz. Again, the exact location of the 6 MHz band is provisionable by the CXMC 80 over the communication interface between the CXMC 80 and the MCC modem 82.

The MCC modem 82 receives 256 DS0+ channels from the CXMC 80 in the form of a 20.48 MHz signal as described previously above. The MCC modem 82 transmits this information to all the ISUs 100 using the multicarrier modulation technique based on OFDM as previously discussed herein. The MCC modem 82 also recovers 256 DS0+ multicarrier channels in the upstream transmission over the HFC distribution network and converts this information into a 20.48 Mbps stream which is passed to CXMC 80. As described previously, the multicarrier modulation technique involves encoding the telephony and control data, such as by quadrature amplitude modulation, into symbols, and then performing an inverse FFT technique to modulate the telephony and control data on a set of orthogonal multicarriers.

Symbol alignment is a necessary requirement for the multicarrier modulation technique implemented by the MCC modem 82 and the ISU modems 101 in the ISUs 100. In the downstream direction of transmission, all information at an ISU 100 is generated by a single CXMU 56, so the symbols modulated on each multicarrier are automatically phase aligned. However, upstream symbol alignment at a receiver of the MCC modem 82 varies due to the multi-point to point nature of the HFC distribution network 11 and the unequal delay paths of the ISUs 100. In order to maximize receiver efficiency at the MCC modem 82, all upstream symbols must be aligned within a narrow phase margin. This is done by utilizing an adjustable delay parameter in each ISU 100 such that the symbol periods of all channels received upstream from the different ISUs 100 are aligned at the point they reach the HDT 12. This is part of the upstream synchronization process and shall be described further below. In addition, to maintain orthogonality of the multicarriers, the carrier frequencies used for the upstream transmission by the ISUs 100 must be frequency locked to the HDT 12.

Incoming downstream information from the CXMC 80 to the MCC modem 82 is frame aligned to the 2 kHz and 8 kHz clocks provided to the MCC modem 82. The 2 kHz multiframe signal is used by the MCC modem 82 to convey downstream symbol timing to the ISUs as described in further detail below. This multiframe clock conveys the channel correspondence and indicates the multi-carrier frame structure so that the telephony data may be correctly reassembled at the ISU 100. Two kHz represents the greatest common factor between 10 kHz (the modem symbol rate) and 8 kHz (the data frame rate).

All ISUs 100 will use the synchronization information inserted by the associated MCC modem 82 to recover all downstream timing required by the ISUs 100. This synchronization allows the ISUs 100 to demodulate the downstream information and modulate the upstream transmission in such a way that all ISU 100 transmissions received at the HDT 12 are synchronized to the same reference. Thus, the carrier frequencies used for all ISU 100 upstream transmission will be frequency locked to the HDT 12.

The symbol alignment is performed over synchronization channels in the downstream and upstream 6 MHz bandwidths under the responsibility of the MCC modem 82, in addition to providing path delay adjustment, initialization and activation, and provisioning over such synchronization channels until initialization and activation is complete as further described herein. These parameters are then tracked by use of the IOC channels. Because of their importance in the system, the IOC channel and synchronization channels may use a different modulation scheme for transport of control data between the MCC modem 82 and ISUs 100 which is more robust or of lesser order (less bits/sec/Hz or bits/symbol) than used for transport of telephony data. For example, the telephony data may be modulated using quadrature amplitude modulation, while the IOC channel and synchronization channel may be modulated utilizing BPSK modulation techniques. The MCC modem 82 also demodulates telephony and control data modulated on multicarriers by the ISUs 100. Such demodulation is described further below with respect to the various embodiments of the telephony transport system.

Functions with respect to the OFDM transport system for which the MCC modem 82 is responsible, include at least the following, which are further described with respect to the various embodiments in further detail. The MCC modem 82 detects a received amplitude/level of a synchronization pulse/pattern from an ISU 100 within a synchronization channel and passes an indication of this level to the CXMC 80 over the communication interface therebetween. The CXMC 80 then provides a command to the MCC modem 82 for transmission to the ISU 100 being leveled for adjustment of the amplitude level thereof. The MCC modem 82 also provides for symbol alignment of all the upstream multicarriers by correlating an upstream pattern modulated on a synchronization channel with respect to a known symbol boundary and passing a required symbol delay correction to the CXMC 80 over the communication interface therebetween. The CXMC 80 then transmits via the MCC modem 82 a message downstream to the ISU 100 to adjust the symbol delay of the ISU 100.

Likewise, with regard to synchronizing an ISU 100 for overall path delay adjustment, the MCC modem 82 correlates an upstream multiframe pattern modulated in the proper bandwidth by the ISU 100 on the IOC channel with respect to a known reference boundary, and passes a required path delay correction to the CXMC 80 over the modem interface therebetween. The CXMC 80 then transmits via the MCC modem 82 over the IOC channel a message downstream to adjust the overall path delay of an ISU 100.

Summary of Bidirectional Multi-Point to Point Telephony Transport

The following summarizes the transport of telephony and control information over the HFC distribution network 11. Each CXMU 56 of HDT 12 is provisioned with respect to its specific upstream and downstream operating frequencies. The bandwidth of both upstream and downstream transmission by the CXMU 56 are a maximum of 6 MHz, with the downstream transmission in a 6 MHz band of the RF spectrum of about 725-800 MHz.

In the downstream direction, each MCC modem 82 of the CXMU 56 provides electrical telephony and control data signals to the downstream telephony transmitter 14 via coaxial line 22 in its provisional 6 MHz bandwidth. The RF electrical telephony and control data signals from the MCC modems 82 of the HDT 12 are combined into a composite signal. The downstream telephony transmitter then passes the combined electrical signal to redundant electrical-to-optical converters for modulation onto a pair of protected downstream optical feeder lines 24.

The downstream optical feeder lines 24 carry the telephony information and control data to an ODN 18. At the ODN 18, the optical signal is converted back to electrical and combined with the downstream video information (from the video head-end feeder line 42) into an electrical downstream RF output signal. The electrical RF output signal including the telephony information and control data is then fed to the four coaxial distribution legs 30 by ODN 18. All telephony information and control data downstream is broadcast on each coaxial leg 30 and carried over the coaxial portion of the HFC distribution network 11. The electrical downstream output RF signal is tapped from the coax and terminated on the receiver modem 101 of an ISU 100 through diplex filter 104, shown in FIG. 8.

The RF electrical output signals include telephony information and control data modulated on orthogonal multicarriers by MCC modem 82 utilizing orthogonal frequency division multiplexing techniques; the telephony information and control data being mapped into symbol data and the symbols being modulated on a plurality of orthogonal carriers using FFT techniques. As the symbols are all modulated on carriers at a single point to be transmitted to multiple points in the system 10, orthogonality of the multicarriers and symbol alignment of the symbols modulated on the orthogonal multicarriers are automatically aligned for transport over the HFC distribution network 11 and the telephony information and control data is demodulated at the ISUs 100 by the modem 101. The ISU 100 receives the RF signal tapped from the coax of the coaxial portion of the HFC network 11. The RF modem 101 of the ISU 100 demodulates the signal and passes the telephony information and control data extracted to the CXSU controller 102 for provision to channel units 103 as appropriate. The ISU 100 represents the interface where the telephony information is converted for use by a subscriber or customer.

The CXMUs 56 of the HDT 12 and the ISUs 100 implement the bidirectional multi-point to point telephony transport system of the communication system 10. The CXMUs 56 and the ISUs, therefore, carry out the modem functionality. The transport system in accordance with the present invention may utilize three different modems to implement the modem functionality for the transport system. The first modem is the MCC modem 82 which is located in each CXMU 56 of the HDT 12. The HDT 12, for example, includes three active MCC modems 82 (FIG. 3) and is capable of supporting many ISUs 100, representing a multi-point to point transport network. The MCC modem 82 coordinates telephony information transport as well as control data transport for controlling the ISUs 100 by the HDT 12. For example, the control data may include call processing messages, dynamic allocation and assignment messages, ISU synchronization control messages, ISU modem control messages, channel unit provisioning, and any other ISU operation, administration, maintenance and provisioning (OAM&P) information. The second modem is a single family subscriber or HISU modem optimized to support a single dwelling residential unit. Therefore, it must be low in cost and low in power consumption. The third modem is the multiple subscriber or MISU modem, which is required to generally support both residential and business services.

The HISU modem and the MISU modem may take several forms. For example, the HISU modem and the MISU modem may, as described further in detail below with regard to the various embodiments of the present invention, extract only a small portion of the multicarriers transmitted from the HDT 12 or a larger portion of the multicarriers transmitted from the HDT 12. For example, the HISU may extract 20 multicarriers or 10 payload channels of telephony information transported from the HDT 12 and the MISU may extract information from 260 multicarriers or 130 payload channels transported from the HDT 12. Each of these modems may use a separate receiver portion for extracting the control data from the signal transported by the HDT 12 and an additional receiver portion of the HISU modem to extract the telephony information modulated on the multicarriers transported from the HDT 12. This shall be referred to hereinafter as an out of band ISU modem. The MCC modem 82 for use with an out of band ISU modem may modulate control information within the orthogonal carrier waveform or on carriers somewhat offset from such orthogonal carriers. In contrast to the out of band ISU modem, the HISU and MISU modems may utilize a single receiver for the ISU modem and extract both the telephony information and control data utilizing the single receiver of the modem. This shall be referred to hereinafter as an in-band ISU modem. In such a case, the control data is modulated on carriers within the orthogonal carrier waveform but may utilize different carrier modulation techniques. For example, BPSK for modulation of control data on the carriers as opposed to modulation of telephony data on payload carriers by QAM techniques. In addition, different modulation techniques may be used for upstream or downstream transmission for both control data and telephony data. For example, downstream telephony data may be modulated on the carriers utilizing 256 QAM and upstream telephony data may be modulated on the carriers utilizing 32 QAM. Whatever modulation technique is utilized for transmission dictates what demodulation approach would be used at the receiving end of the transport system. Demodulation of the downstream telephony information and control data transported by the HDT 12 shall be explained in further detail below with reference to block diagrams of different modem embodiments.

In the upstream direction, each ISU modem 101 at an ISU 100 transmits upstream on at least one orthogonal multicarrier in a 6 MHz bandwidth in the RF spectrum of about 5 to 40 MHz; the upstream 6 MHz band corresponding to the downstream 6 MHz band in which transmissions are received. The upstream electrical telephony and control data signals are transported by the ISU modems 101 to the respectively connected optical distribution node 18 as shown in FIG. 1 via the individual coaxial cable legs 30. At the ODN 18, the upstream signals from the various ISUs are combined and transmitted optically to the HDT 12 via optical feeder lines 26. As previously discussed, the upstream electrical signals from the various ISUs may, in part, be frequency shifted prior to being combined into a composite upstream optical signal. In such a case, the telephony receiver 16 would include corresponding downshifting circuitry.

Due to the multi-point to point nature of transport over the HFC distribution network 11 from multiple ISUs 100 to a single HDT 12, in order to utilize orthogonal frequency division multiplexing techniques, symbols modulated on each carrier by the ISUs 100 must be aligned within a certain phase margin. In addition, as discussed in further detail below, the round trip path delay from the network interface 62 of the HDT 12 to all ISUs 100 and back from the ISUs 100 to the network interface 62 in the communication system 10 must be equal. This is required so that signaling multiframe integrity is preserved throughout the system. In addition, a signal of proper amplitude must be received at the HDT 12 to perform any control functions with respect to the ISU 100. Likewise, with regard to OFDM transport from the ISUs 100, the ISUs 100 must be frequency locked to the HDT 12 such that the multicarriers transported over the HFC distribution network 11 are orthogonally aligned. The transport system implements a distributed loop technique for implementing this multi-point to point transport utilizing orthogonal frequency division multiplexing as further described below. When the HDT 12 receives the plurality of multicarriers which are orthogonally aligned and which have telephony and control data modulated thereon with symbols aligned, the MCC modems 82 of the CXMUs 56 demodulate the telephony information and control data from the plurality of multicarriers in their corresponding 6 MHz bandwidth and provide such telephony data to the CTSU 54 for delivery to the network interface 62 and the control data to the CXMC 80 for control of the telephony transport.

As one skilled in the art will recognize, the spectrum allocations, frequency assignments, data rates, channel numbers, types of services provided and any other parameters or characteristics of the system which may be a choice of design are to be taken as examples only. The invention as described in the accompanying claims contemplates such design choices and they therefore fall within the scope of such claims. In addition, many functions may be implemented by software or hardware and either implementation is contemplated in accordance with the scope of the claims even though reference may only be made to implementation by one or the other.

First Embodiment of Telephony Transport System

The first embodiment of the telephony transport system in accordance with the present invention shall be described with particular reference to FIGS. 13-35 which include block diagrams of MCC modems 82, and HISU modems and MISU modems shown generally as ISU modem 101 in FIG. 8. Such modems implement the upstream and downstream modem transport functionality. Following this description is a discussion on the theory of operation utilizing such modems.

Figure 13:
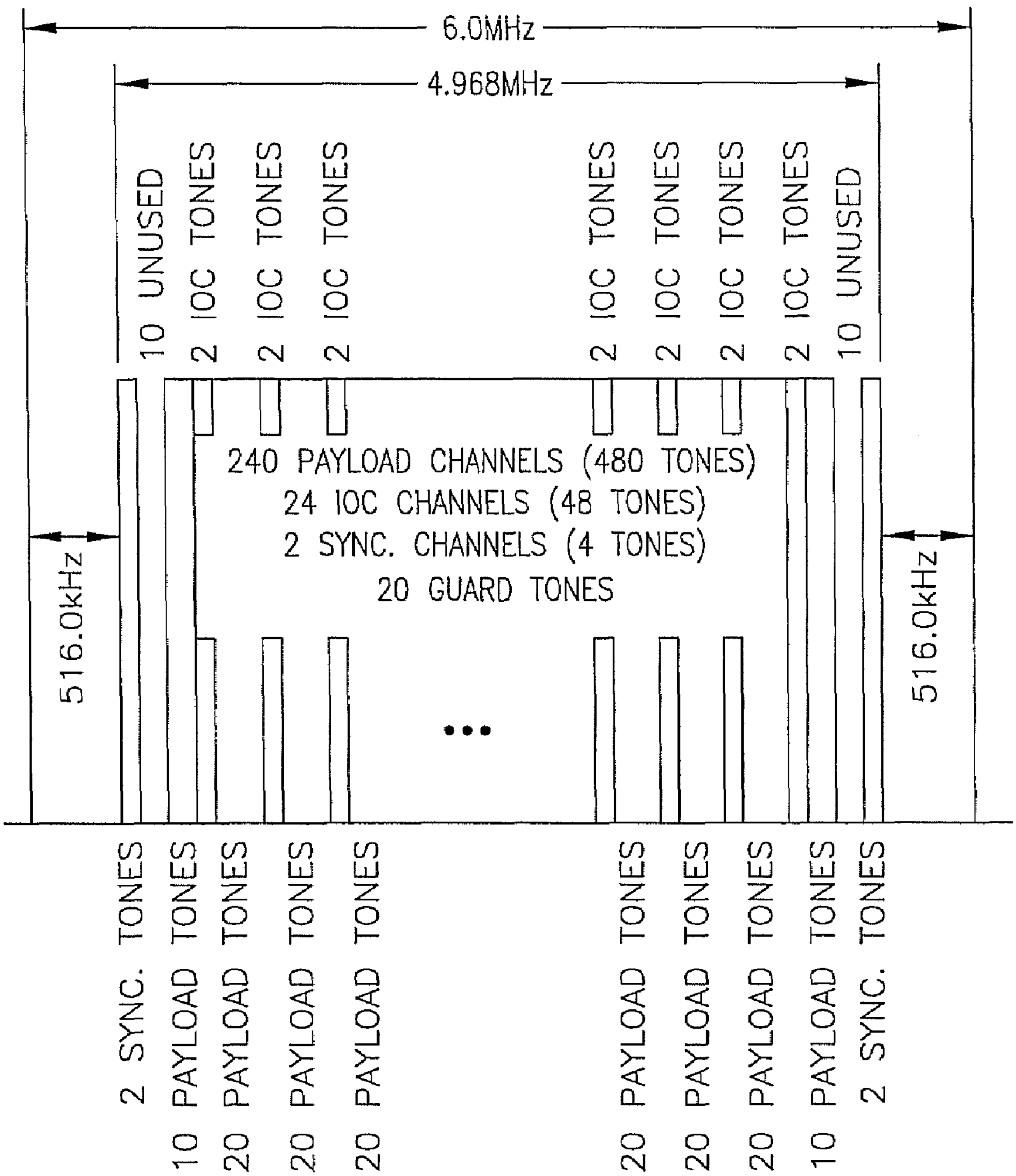
FIG. 13 shows a spectral allocation for a first transport embodiment for telephony transport in the system of FIG. 1.

Referring to FIG. 13, the spectrum allocation for one 6 MHz band for upstream and downstream transport of telephony information and control data utilizing OFDM techniques is shown. The waveform preferably has 240 payload channels or DS0+ channels which include 480 carriers or tones for accommodating a net data rate of 19.2 Mbps, 24 IOC channels including 46 carriers or tones, and 2 synchronization channels. Each synchronization channel includes two carriers or tones and is each offset from 24 IOC channels and 240 payload channels by 10 unused carriers or tones, utilized as guard tones. The total carriers or tones is 552. The synchronization tones utilized for synchronization functions as described further below are located at the ends of the 6 MHz spectrum and the plurality of orthogonal carriers in the 6 MHz band are separated from carriers of adjacent 6 MHz bands by guard bands (516.0 kHz) at each end of the 6 MHz spectrum. The guard bands are provided at each end of the 6 MHz band to allow for filter selectivity at the transmitter and receivers of the system. The synchronization carriers are offset from the telephony data or payload carriers such that if the synchronization carrier utilized for synchronization during initialization and activation is not orthogonal with the other tones or carriers within the 6 MHz band, the synchronization signal is prevented from destroying the structure of the orthogonally aligned waveform. The synchronization tones are, therefore, outside of the main body of payload carriers of the band and interspersed IOC channels, although the synchronization channel could be considered a special IOC channel.

To minimize the power requirement of the ISUs, the amount of bandwidth that an ISU processes is minimized. As such, the telephony payload channels and IOC channels of the 6 MHz band are interspersed in the telephony payload channels with an IOC channel located every 10 payload channels. With such a distributed technique, wherein subbands of payload channels greater than 10 include an IOC channel, the amount of bandwidth an ISU "sees" can be limited such that an IOC channel is available for the HDT 12 to communicate with the ISU 100. Such subband distribution for the spectral allocation shown in FIG. 13 is shown in FIG. 16. There are 24 subbands in the 6 MHz bandwidth with each subband including 10 payload channels with an IOC channel between the 5th and 6th payload channels. A benefit of distributing the IOC channels throughout the 6 MHz band is protection from narrow band ingress. If ingress destroys an IOC channel, there are other IOC channels available and the HDT 12 can re-tune an ISU 100 to a different portion of the 6 MHz band, where an IOC channel that is not corrupted is located. Preferably, the MISU 66 sees approximately 3 MHz of the 6 MHz bandwidth to receive up to 130 payload channels whose bandwidth also includes numerous IOC channels for communication from the HDT 12 to the MISU 66. The HISU 68 sees about 100 kHz of the 6 MHz bandwidth to receive 11 channels including at least one IOC channel for communication with the HDT 12.

The primary difference between the downstream and upstream paths are the support of downstream synchronization and upstream synchronization. In the downstream direction, all ISUs lock to information from the HDT (point to multi-point). The initialization and activation of ISUs are based on signals supplied in the upstream synchronization channel. During operation, ISUs track the synchronization via the IOC channels. In the upstream, the upstream synchronization process involves the distributed (multi-point to point) control of amplitude, frequency, and timing; although frequency control can also be provided utilizing only the downstream synchronization channel as described further below. The process of upstream synchronization occurs in one of the two upstream synchronization channels, the primary or the secondary synchronization channel.

Figure 21:
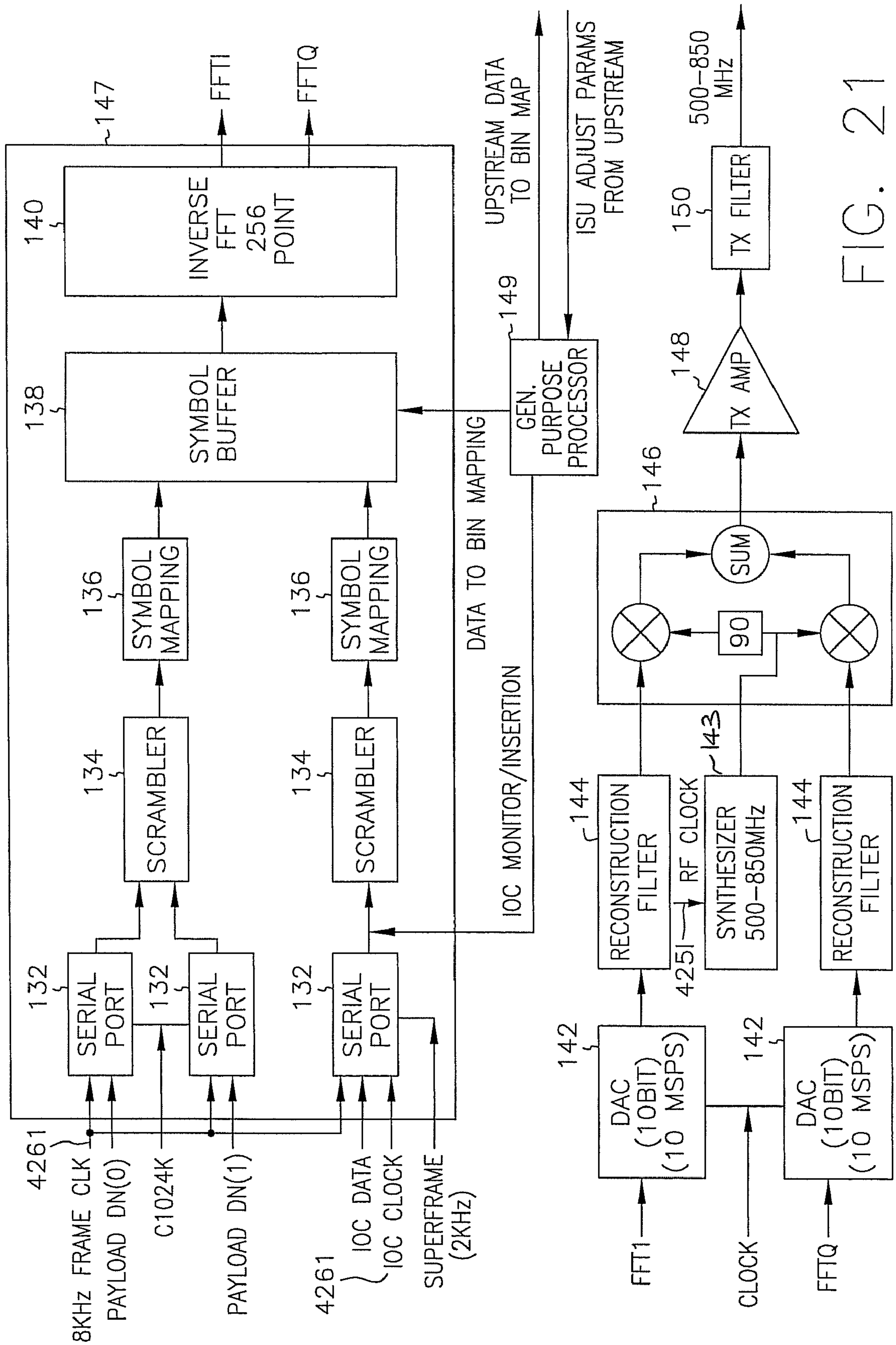
FIG. 21 is a block diagram of a master coax card (MCC) downstream transmission architecture of the CXMU for the first transport embodiment of the system of FIG. 1.

Referring to FIG. 21, the downstream transmission architecture of the MCC modem 82 is shown. Two serial data inputs, approximately 10 Mbps each, comprise the payload data from the CXMC 56 which is clocked by the 8 kHz frame clock input. The IOC control data input from the CXMC 56 is clocked by the IOC clock input, which is preferably a 2.0 kHz clock. The telephony payload data and the IOC control data enter through serial ports 132 and the data is scrambled as known to one skilled in the art by scrambler 134 to provide randomness in the waveform to be transmitted over the HFC distribution network 11. Without scrambling, very high peaks in the waveform may occur; however, if the waveform is scrambled the symbols generated by the MCC modem 82 become sufficiently random and such peaks are sufficiently limited.

Figure 22:
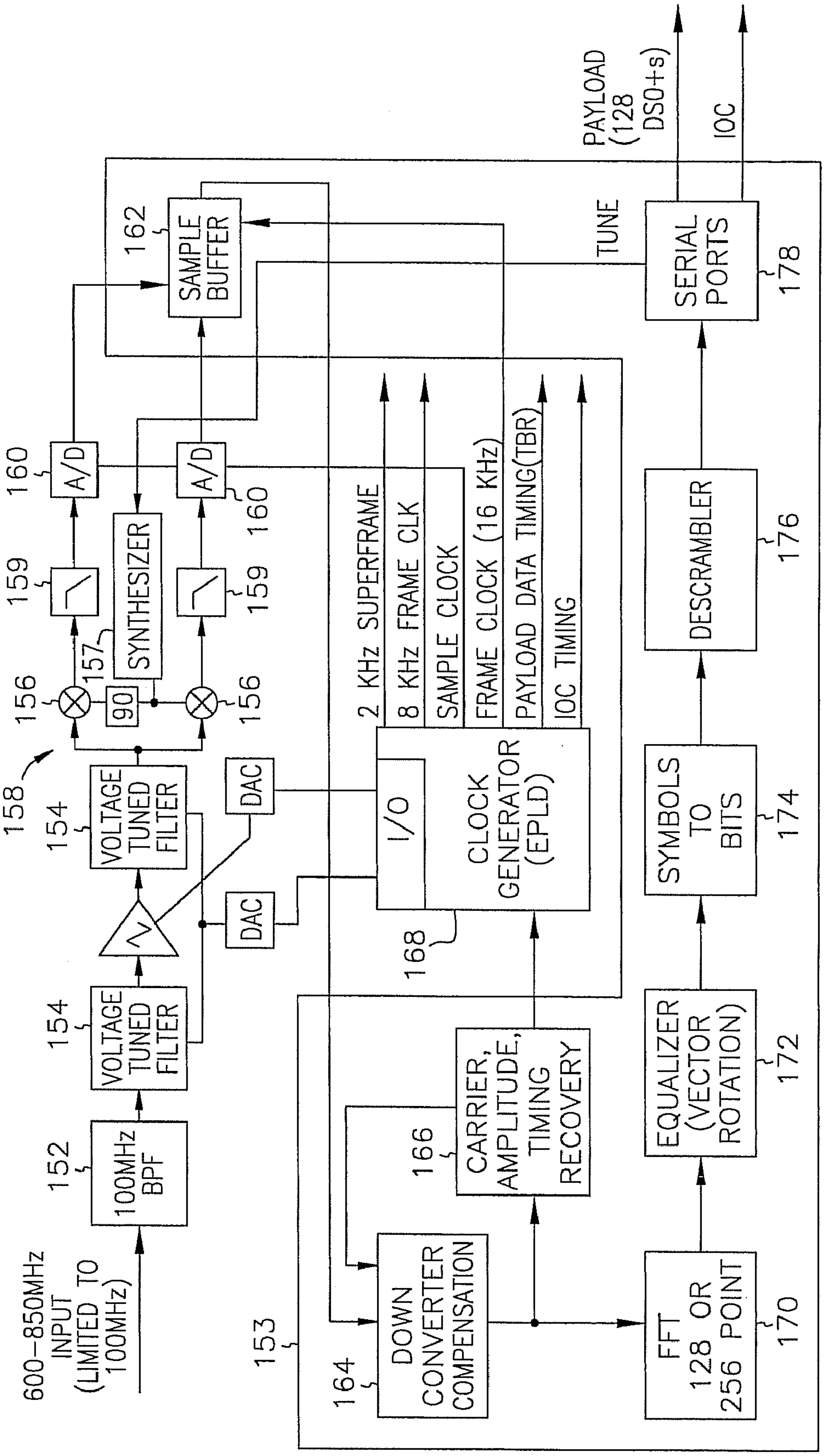
FIG. 22 is a block diagram of a coax transport unit (CXTU) downstream receiver architecture of an MISU for the first transport embodiment of the system of FIG. 1.
Figure 23:
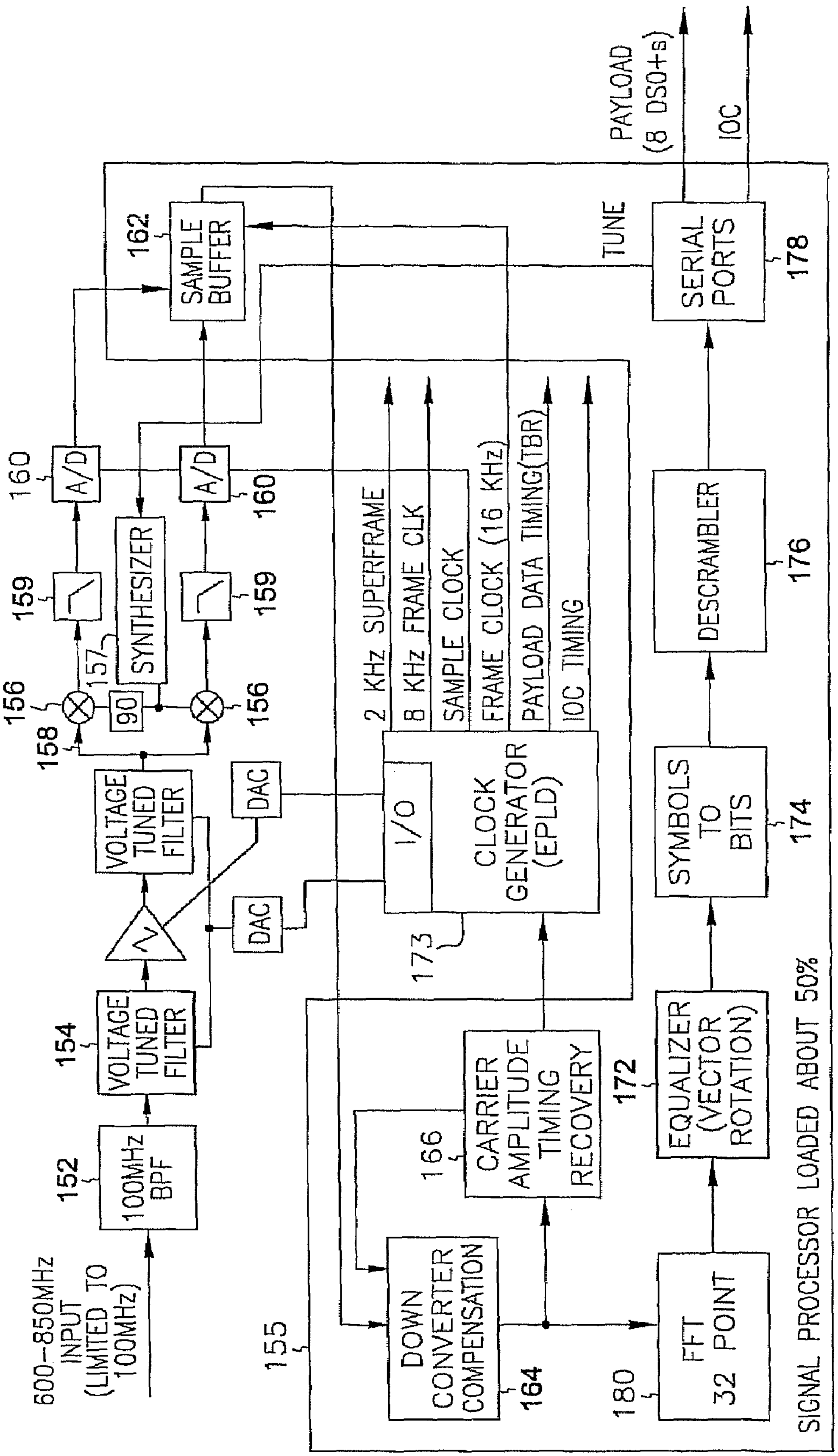
FIG. 23 is a block diagram of a coax home module (CXHM) downstream receiver architecture of an HISU for the first transport embodiment of the of the system of FIG. 1.

FIG. 58 details the operation of a typical scrambler, such as 134, FIG. 21. Symbol clock 4501 clocks a seed pattern through a linear-feedback shift register 4510 having nine stages, 4510-0 through 4510-8. With XOR gate 4511 positioned as shown, the generator polynomial is binary "100 010 000". The seed initially loaded into register 4510 at input 4502 is "111 001 110". Two identical translation tables 4520 and 4521 receive two-bit inputs from register 4510 at every symbol time. The high- and low-order bits of table 4520 proceed from the outputs of stages 4510-8 and 4510-7, respectively. High-order bit 4523 of table 4521 also receives output 4510-7, but as its high-order bit; stage output 4510-6 provides its low-order bit. Logic gate 4530 perform an XOR between the five-bit output of table 4520 and the upper five bits of a 10-bit DS0 word, while gate 4531 does the same for the five-bit output of table 4521 and the lower five bits of the same DS0 word. Outputs 4505 and 4506 carry the two 5-bit scrambled symbols for the DS0 word. Each descrambler such as 176, FIG. 22 or 23, is identical to its corresponding scrambler. It recovers the original bit pattern of each symbol by decoding it with the same polynomial and seed.

The polynomial and seed for register 4510 of the scramblers and descramblers selected by known techniques to yield a maximal-length pseudo-random sequence. Inversion of the order of the input bits as between table 4520 and table 4521 increases the scrambling of the two symbols of the DS0 word. To increase the randomness among different sequences even more, different scramblers in the system have different polynomials and seeds. Randomness could be further increased by using more than four different table entries; however, the added complexity overrode the gain, for this particular embodiment. Only the payload channels are scrambled; the IOC channels are not scrambled.

Figure 14:
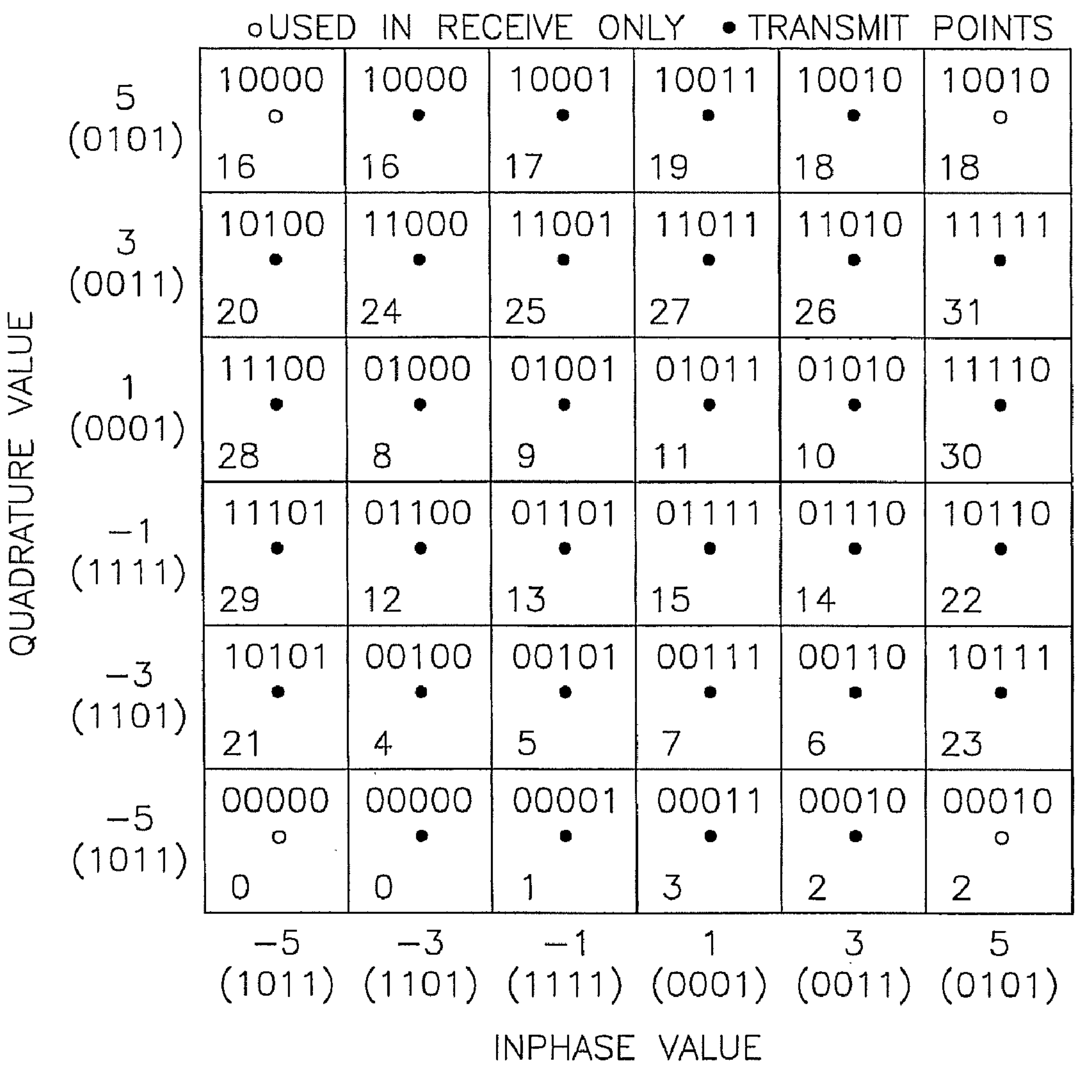
FIG. 14 shows a mapping diagram for QAM modulation.
Figure 15:
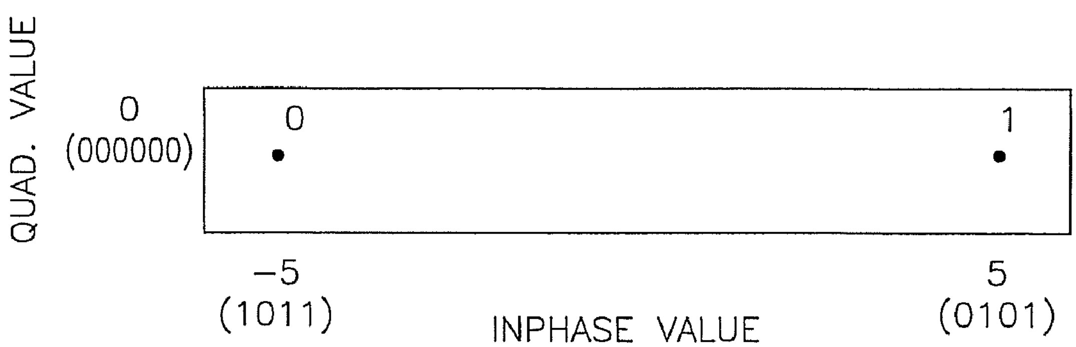
FIG. 15 shows a mapping diagram for BPSK modulation.

The scrambled signals are applied to a symbol mapping function 136 in FIG. 21. The symbol mapping function 136 takes the input bits and maps them into a complex constellation point. For example, if the input bits are mapped into a symbol for output of a BPSK signal, every bit would be mapped to a single symbol in the constellation as in the mapping diagram for BPSK of FIG. 15. Such mapping results in in-phase and quadrature values (I/Q values) for the data. BPSK is the modulation technique preferably used for the upstream and downstream IOC channels and the synchronization channels. BPSK encoding is preferred for the IOC control data so as to provide robustness in the system as previously discussed. For QPSK modulation, every two bits would map into one of four complex values that represent a constellation point. In the preferred embodiment, 32 QAM is utilized for telephony payload data, wherein every five bits of payload data is mapped into one of 32 constellation points as shown in FIG. 14. Such mapping also results in I/Q values. As such, one DS0+ signal (10 bits) is represented by two symbols and the two symbols are transmitted using two carriers. Thus, one DS0+ channel is transported over two carriers or tones of 6 MHz spectrum.

One skilled in the art will recognize that various mapping or encoding techniques may be utilized with different carriers. For example, telephony channels carrying ISDN may be encoded using QPSK as opposed to telephony channels carrying POTS data being encoded using 32 QAM. Therefore, different telephony channels carrying different services may be modulated differently to provide for more robust telephony channels for those services that require such quality. The architecture in accordance with the present invention provides the flexibility to encode and modulate any of the channels differently from the modulation technique used for a different channel.

Figure 17:
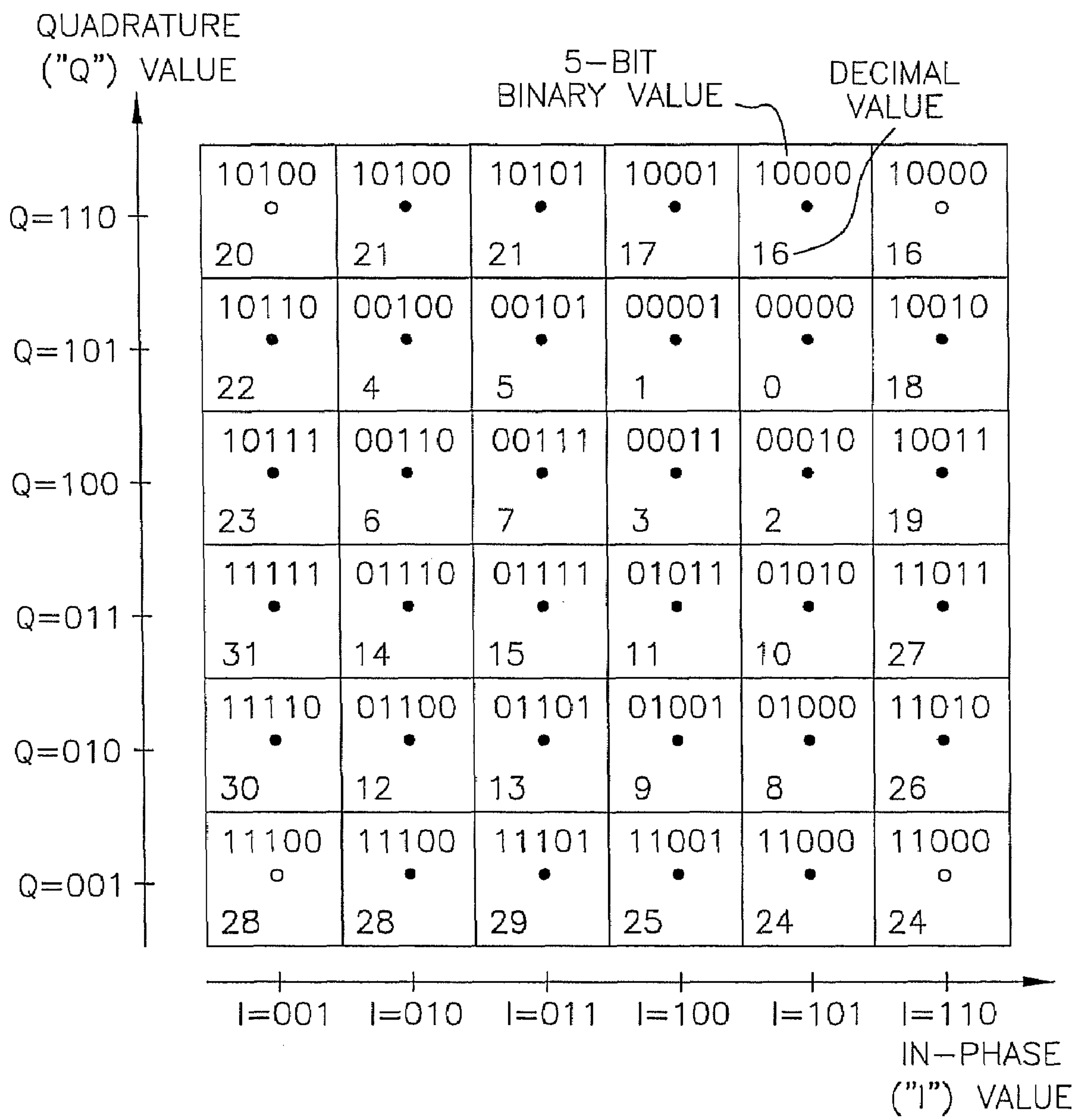
FIGS. 17, 18 show alternative mapping diagrams or constellations for QAM modulation.
Figure 18:
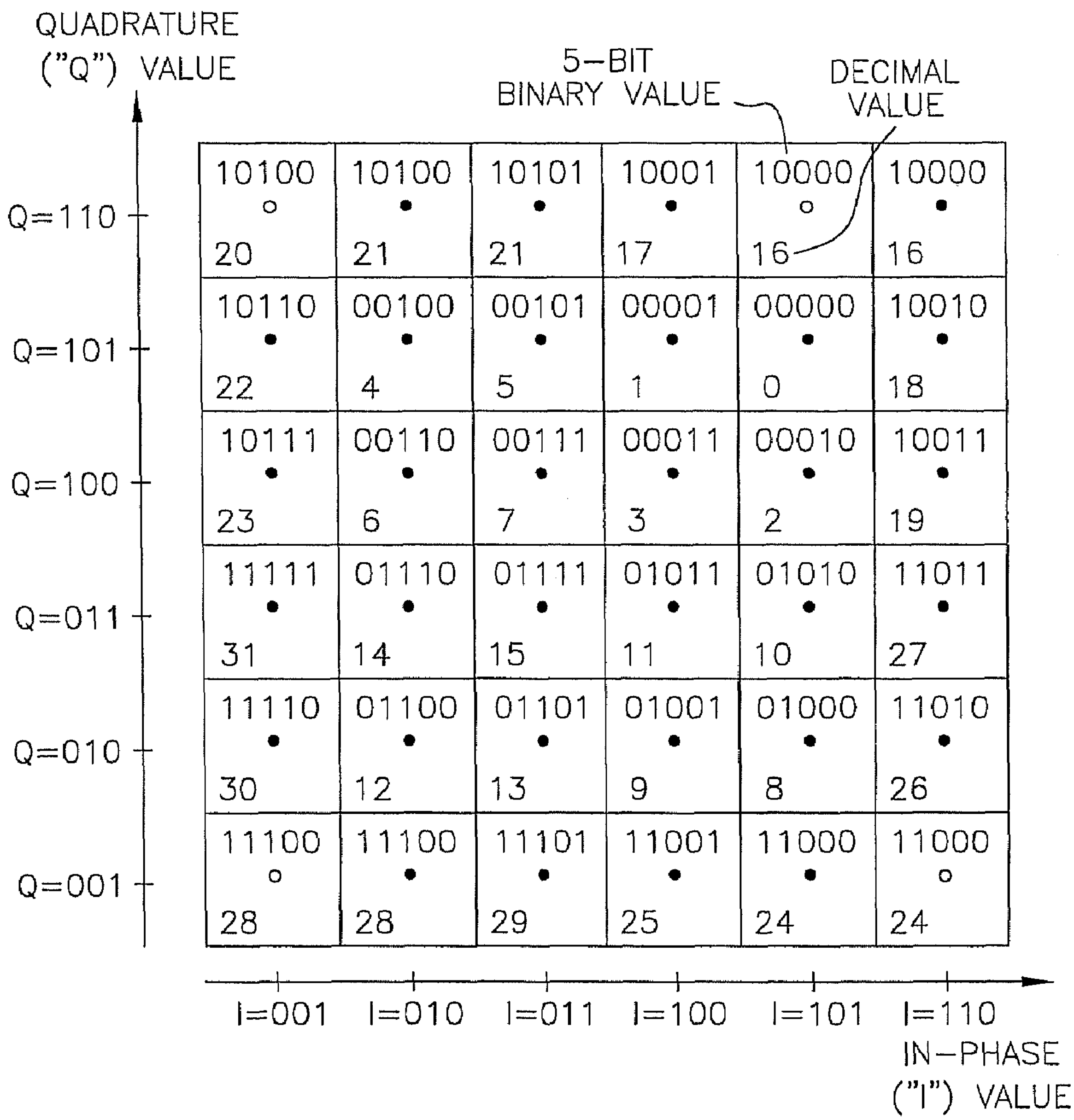

Within the framework of QAM32 modulation, FIG. 17 shows a constellation which has improved characteristics. Here, the in-phase and quadrature values are shown encoded by three bits each instead of the four shown in FIG. 14; analog values, however, remain in the ranges −5 to +5. The constellation of FIG. 17 approaches as closely as possible to an analogy to a Gray code scheme, in which a transition from one row to the next and from one column to the next result in only a single bit change in the 5-bit symbol code. (The exceptions are four transitions from the first column to the second, and from the fifth to the sixth, which have two transitions each. The corner cells have zero transitions between these columns, which do not detract from the advantages of the scheme.) If a symbol is received incorrectly after transmission, the most likely error is a slight change in either amplitude or phase. If the bit strings represented by the symbols have as few bit transitions as possible for single-value phase and amplitude changes, then a reception error will create fewer bit errors on the final digital output. That is, small (symbol) errors in produce small (bit) errors out.

The constellations shown in FIGS. 14 and 17 use all points of a six-cell square except the four corners. Hence, they have two axes of symmetry, and appear identical when rotated by 90°, 180°, and 270°. If a phase error ever exceeds 45°, an attempted correction may pull the phase to an incorrect orientation. This is called four-fold phase ambiguity. However, deliberately using one and only one of the corner points as a valid symbol provides a key for identifying the correct phase for errors as great as a full 180°. For example, designating the symbol for "16" as I=010 (+5) and Q=010 (+5) instead of the I=001, Q=010 (+3, +5) in FIG. 17 introduces a symbol at this corner point whenever a "16" is sent upstream or downstream. Because only one corner is used, any received value having both I and Q values ±5 requires phase rotation until I=+5 and Q=+5. This assignment also preserves the nearly Gray-code structure of the constellation. Any other symbol assignment which breaks the symmetry of the constellation would produce the same effect. Even a constellation retaining only one axis of symmetry would allow twice the phase-correction range of the constellation of FIG. 17. For example, using both the upper left and lower right corners as valid symbols allows correction of phase errors up to 90°.

Each symbol that gets represented by the I/Q values is mapped into a FFT bin of symbol buffer 138 in FIG. 21. For example, for a DS0+, running at 8 kHz frame rate, five bits are mapped into one FFT bin and five bits into another bin. Each bin or memory location of the symbol buffer 138 represents the payload data and control data in the frequency domain as I/Q values. One set of FFT bins gets mapped into the time domain through the inverse FFT 140, as is known to one skilled in the art. The inverse FFT 140 maps the complex I/Q values into time domain samples corresponding to the number of points in the FFT. Both the payload data and IOC data are mapped into the buffer 138 and transformed into time domain samples by the inverse FFT 140. The number of points in the inverse FFT 140 may vary, but in the preferred embodiment the number of points is 256. The output of the inverse FFT 140, for a 256 point FFT, is 256 time domain samples of the waveform.

In conventional practice, buffer 138 clocks symbols into inverse FFT 140 at exactly the same rate that inverse FFT 140 clocks out the in-phase and quadrature values FFT I and FFT Q in FIG. 21. To put the matter another way, the 256 digital waveform samples from buffer 138 represent 360°, or $2\pi$ radians, of a QAM 32 waveform having the amplitude and phase of the 5 bits of its symbol, as determined by mapping unit 136. The FFT I and Q outputs represent 256 samples of a frequency spectrum corresponding to the same time period. At the receiving end, however, any misalignment at all in the phase synchronization causes FFT 170, FIG. 22, or 180, FIG. 23, to decode a portion of a previous or subsequent symbol's waveform along with somewhat less than the full cycle of the desired symbol; this inter-symbol interference can cause misreading the symbol as a different valid symbol, resulting in as many as five bit errors.

Figure 52:
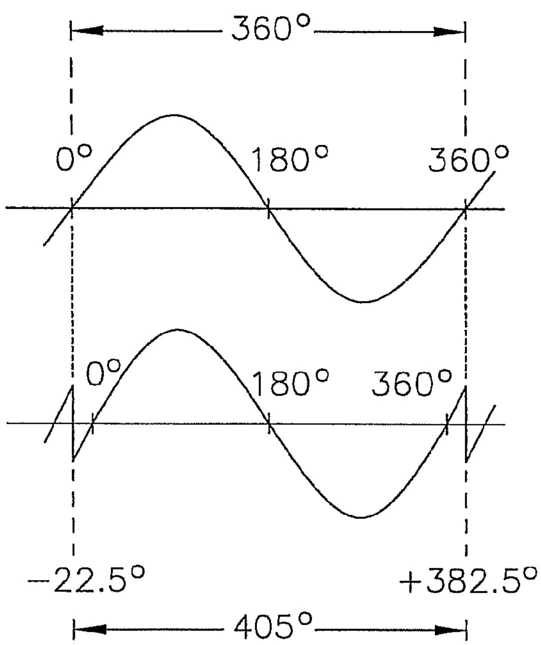
FIGS. 52, 53 depict phase diagrams of symbol waveforms.
Figure 53:
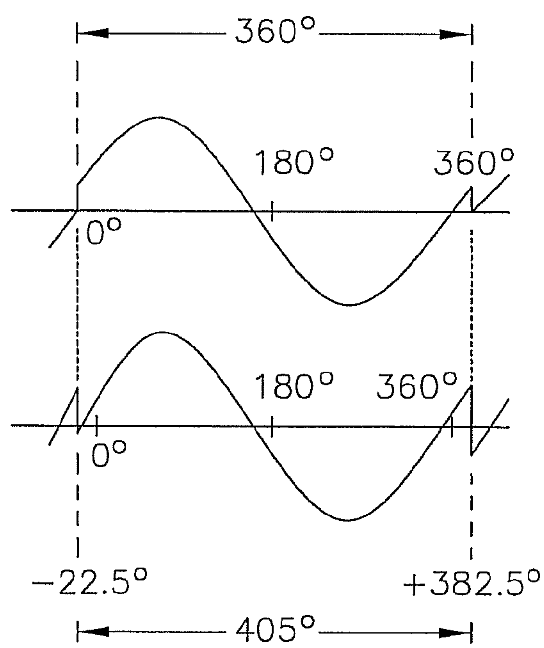

In a presently preferred embodiment, the 256 samples clocked into inverse FFT 140 represent an extra 45° ($\pi/4$ radians) above a complete cycle. Another way to think of this is that the symbols are clocked into the FFT at an effective 9 kHz rate, and clocked out at the nominal 8 kHz symbol rate. FIG. 52 shows an unmodulated sine wave (that is, one having I=0, Q=0 in the units used herein). The upper portion shows one cycle, 0-360°, at the nominal 8 kHz frame rate. The lower portion shows the same wave at a 9 kHz rate, so that the amount of time previously occupied by 360° now takes up 405° of phase, from −22.5° to +382.5°. Obviously, there are phase discontinuities between successive cycles of the wave. FIG. 53 shows a typical QAM 32 wave modulated at a different amplitude and a slightly different phase from those of FIG. 52. These might correspond to, say, I=−1, Q=+1 in the scheme used herein. The small portions at the ends of this wave represent un-modulated cycles, as in FIG. 52. The phase of this wave is advanced from the corresponding wave of the lower portion of FIG. 52; it does not cross the zero axis at 0° and 180° of its proper cycle. It does, however, include the extra 22.5° of excess phase at each end, for 45° extra over an 8 kHz cycle. Again, phase discontinuities exist at the ends of the total 405° phase degrees of this wave. In fact, this characteristic gives the excess-phase improvement an advantage over its primary function of providing a guard band for the symbol decoder, for reducing inter-symbol interference.

In FIG. 52, successive cycles of a wave modulated with the same symbol (or with no symbol), produce a continuous waveform with no breaks or other features to distinguish the beginnings and endings of individual cycles. The lower part of this diagram demonstrates that even an un-modulated excess-phase waveform contains discontinuity features serving as markers at the ends of each cycle. A repeating string of idle symbols, or any other symbols, likewise produces these markers. In the frequency- and phase-acquisition and tracking aspects discussed below, such markers therefore provide definite waveform features for synchronizing purposes, without having to guarantee the transmission of any special string of varying characters strictly for synchronization. This saves the overhead of interrupting the payload and/or IOC channels to provide such a string, and the complexity of storing or diverting payload information while the sync string is present. It also allows sync to take place at times when, because of the above factors, it would not be feasible otherwise.

At the receiving end, FFT 170 (in an MISU) or 180 (HISU) decodes the 256 time slots for one frame time as 405° of a cycle to symbol decoder 174, which matches the cycle to the nearest 5-bit string of bits. Because any phase difference up to ±22.5° will never conflate the proper wave with that for another symbol, no inter-symbol interference at all occurs within this margin of error in phase tracking. This provides a form of guard band for each symbol. In the upstream direction, units 186, 188, and 190 or 191 provide excess phase in the transmitting MISU and HISU modems of FIGS. 24 and 25; and the head-end receiving modem of FIG. 26 decodes and tracks this phase as described above.

The inverse FFT 140 has separate serial outputs for in-phase and quadrature (I/Q) components, FFT1 and FFT0. Digital to analog converters 142 take the in-phase and quadrature components, which is a numeric representation of baseband modulated signal and convert it to a discrete waveform. The signal then passes through reconstruction filters 144 to remove harmonic content. This reconstruction is needed to avoid problems arising from multiple mixing schemes and other filtering problems. The signal is summed in a signal conversion transmitter 146 for up-converting the I/Q components utilizing a synthesized waveform that is digitally tunable with the in-phase and quadrature components for mixing to the applicable transmit frequency. For example, if the synthesizer is at 600 MHz, the output frequency will be at 600 MHz. The components are summed by the signal conversion transmitter 146 and the waveform including a plurality of orthogonal carriers is then amplified by transmitter amplifier 148 and filtered by transmitter filter 150 before being coupled onto the optical fiber by way of telephony transmitter 14.

Such functions are performed under control of general purpose processor 149 and other processing circuitry of block 147 necessary to perform such modulation. The general purpose processor also receives ISU adjustment parameters from carrier, amplitude, timing recovery block 222 (FIG. 26) for carrying out distributed loop symbol alignment, frequency locking, amplitude adjustment, and path delay functions as described further below.

Figure 51:
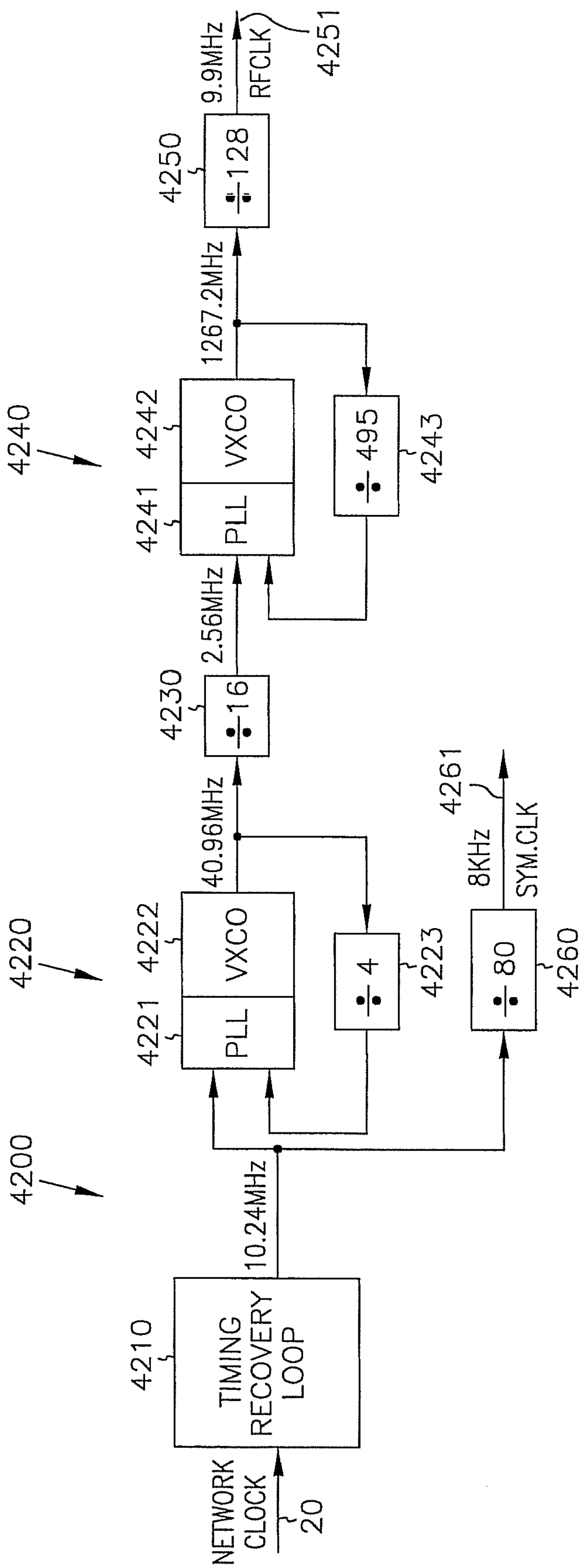
FIG. 51 is a block diagram showing the locking of all clocks within a system.

In conventional practice, the relationship between the frequency of a carrier and the frequency and timing of data symbols modulated onto that carrier is arbitrary and unimportant. In the present system, however, it has been found that even very small frequency drifts between the 8 kHz symbol or frame clock and the frequencies of the tones upon which they ride can produce significant inter-symbol interference and distortion at the receiving end. Such drifts tend to destroy the orthogonality of the channel signals produced by inverse FFT 140 in FIG. 21. The present system also, however, provides a simple, inexpensive way to overcome this problem. FIG. 51 shows a portion 4200 of the HDT clock/sync logic in CTSU 54, FIG. 3. Timing recovery loop 4210 produces a single master reference clock output at 10.24 MHz. Although loop 4210 could be a free-running oscillator, it is in fact slaved to the network 10, FIG. 1. With which the entire system communicates. This connection is convenient in eliminating gross or unpredictable differences between the data speeds of the network and the system.

Smoothing loop 4220 evens out short-term variations in the signal from loop 4210. Phase comparator 4221 controls a voltage-controlled crystal oscillator at 40.96 MHz; divider 4223 provides feedback at the proper frequency. Comparator 4221 includes a low-pass integrator which gives phase-lock loop 4220 a bandwidth of about 130 Hz. Divider 4230 reduces the frequency of VCXO 4222 to 2.56 MHz. A second phase-lock loop 4240 has a phase comparator 4241, again with low-pass characteristics, feeding a voltage-controlled oscillator running at 1267.2 MHz; divider provides feedback at the proper frequency. Divider 4250 produces the final RF clock frequency, 9.9 MHz, at output 4251. The network clock is sufficiently accurate over long periods of time, but it is subject to significant amounts of short-period jitter. The large amount of smoothing provided by loops 4220 and 4240 overcome the intolerance of analog RF components for short-term variations. Meanwhile, digital divider 4260 divides the master 10.24 MHz clock by a factor of 80 to produce an 8 kHz symbol or frame clock output 4261. Output 4261 does not require the smoothing, because it clocks only digital circuits, which are relatively insensitive to short-term frequency changes.

RF master clock 4251 proceeds to RF synthesizer 143 in HDT transmitting modem 82, as shown in FIG. 21, where it directly controls the frequency of the tunable 500-850 MHz RF carrier for the entire band carrying all of the channels shown in FIGS. 13 and 16. Symbol clock 4261 proceeds to the frame-clock inputs in FIG. 21, where it controls the symbol timing, and, because it also controls the FFT speed, the frequencies of the channels in the entire band. Clock lock 4200 thus provides a solid link which inherently preserves the orthogonality of the band signals in a multicarrier system, by deriving the RF carrier clock and the symbol or frame clock from the same source. At the same time, it provides a small amount of gradual variation for satisfying the demands of the analog RF components.

The overall purpose of locking the two clocks together at the HDT is to lock the carrier clocks and the symbol (frame) clocks throughout the system; and the purpose of this in turn is to preserve the orthogonality of the signals in a multicarrier system which is capable of bidirectional operation (that is, as a multipoint-to-point-configuration as well as in the usual point-to-multipoint "broadcast" direction). Clock generator 166, FIGS. 22 and 23, of timing generator 107, FIG. 8 locks to the frequencies of the incoming signals to provide the clocks used in the remote ISU modules. Therefore, the carrier and frame clocks in each upstream transmitter portion, FIG. 24, of remote modem 108, FIG. 8, are also locked to each other, by virtue of being locked to the incoming signal from the HDT.

At the downstream receiving end, either an MISU or an HISU provides for extracting telephony information and control data from the downstream transmission in one of the 6 MHz bandwidths. With respect to the MISU 66 (FIG. 1), the MISU downstream receiver architecture is shown in FIG. 22. It includes a 100 MHz bandpass filter 152 to reduce the frequency band of the received 600 to 850 MHz total band broadcast downstream. The filtered signal then passes through voltage tuned filters 154 to remove out of band interference and further reduce the bandwidth. The signal is down converted to baseband frequency via quadrature and in-phase down converter 158 where the signal is mixed at complex mixers 156 utilizing synthesizer 157 which is controlled from an output of serial ports 178. The down converted I/Q components are passed through filters 159 and converted to digital format at analog to digital converters 160. The time domain samples of the I/Q components are placed in a sample buffer 162 and a set of samples are input to down converter compensation unit 164. The compensation unit 164 attempts to mitigate errors such as DC offsets from the mixers and differential phase delays that occur in the down conversion.

Figure 33:
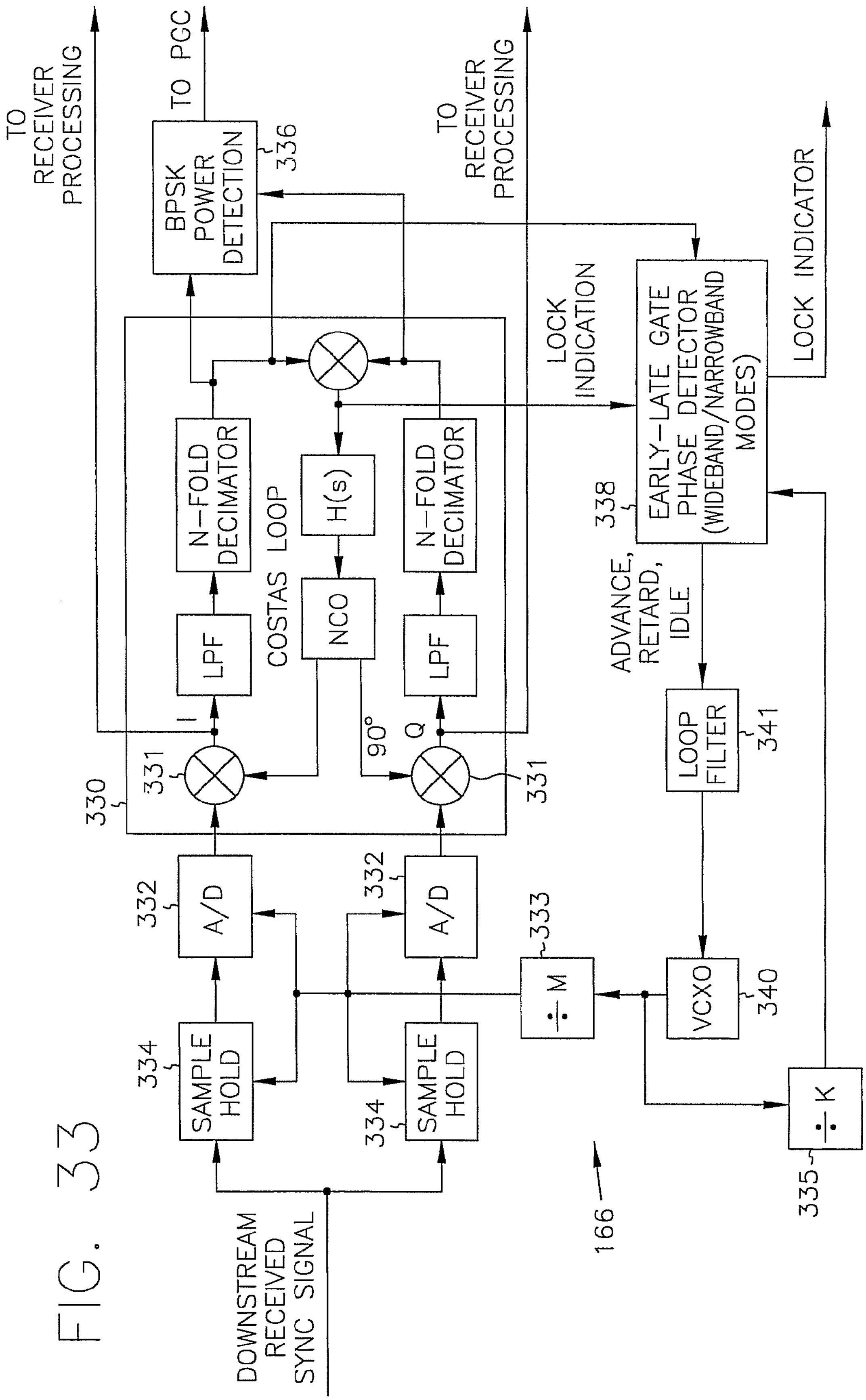
FIG. 33 is a block diagram of a carrier, amplitude, timing recovery block of the downstream receiver architectures of the first transport embodiment.

Carrier, amplitude and timing signaling are extracted from the compensated signal, by the carrier, amplitude, and timing recovery block 166 by extracting control data from the synchronization channels during initialization and activation of the ISU and the IOC channels during tracking as further described below with reference to FIG. 33. The compensated signal in parallel form is provided to FFT 170 to be converted into a vector of frequency domain elements which are essentially the complex constellation points with I/Q components originally created upstream at the MCC modem 82 for the DS0+ channels which the MISU sees. Due to inaccuracies in channel filtering, an equalizer 172 removes dynamic errors that occur during transmission and reception. Equalization in the upstream receiver and the downstream receiver architectures shall be explained in further detail below with reference to FIG. 35. From the equalizer 172, the complex constellation points are converted to bits by symbol to bit converter 174, descrambled at descrambler 176 which is a mirror element of scrambler 134, and the payload telephony information and IOC control data are output by the serial ports 178 to the CXSU 102 as shown in FIG. 8. Block 153 includes the processing capabilities for carrying out the various functions as shown therein.

Referring to FIG. 23, the HISU 68 downstream receiver architecture is shown. The primary difference between the HISU downstream receiver architecture (FIG. 23) and the MISU downstream receiver architecture (FIG. 22) is the amount of bandwidth being processed. The front ends of the receivers up to the FFT processing are substantially the same, except during the down conversion, the analog to digital converters 160 can be operated at a much slower rate. For instance, if the bandwidth of the signal being processed is 100 kHz, the sample rate can be approximately 200 kHz. In an MISU processing a 3 MHz signal, the sample rate is about 6 MHz. Since the HISU is limited to receiving a maximum of 10 DS0+s, the FFT 180 can be of a smaller size. A 32 point FFT 180 is preferably used in the HISU and can be implemented more efficiently, compared to a 128 or 256 point FFT utilized in the MISU. Therefore, the major difference between these architectures is that the HISU receiver architecture requires substantially less signal processing capability than the MISU receiver and as such has less power consumption. Thus, to provide a system wherein power consumption at the remote units is minimized, the smaller band of frequencies seen by the HISU allows for such low consumption. One reason the HISU is allowed to see such a small band of carriers is that the IOC channels are interspersed throughout the 6 MHz spectrum.

Figure 24:
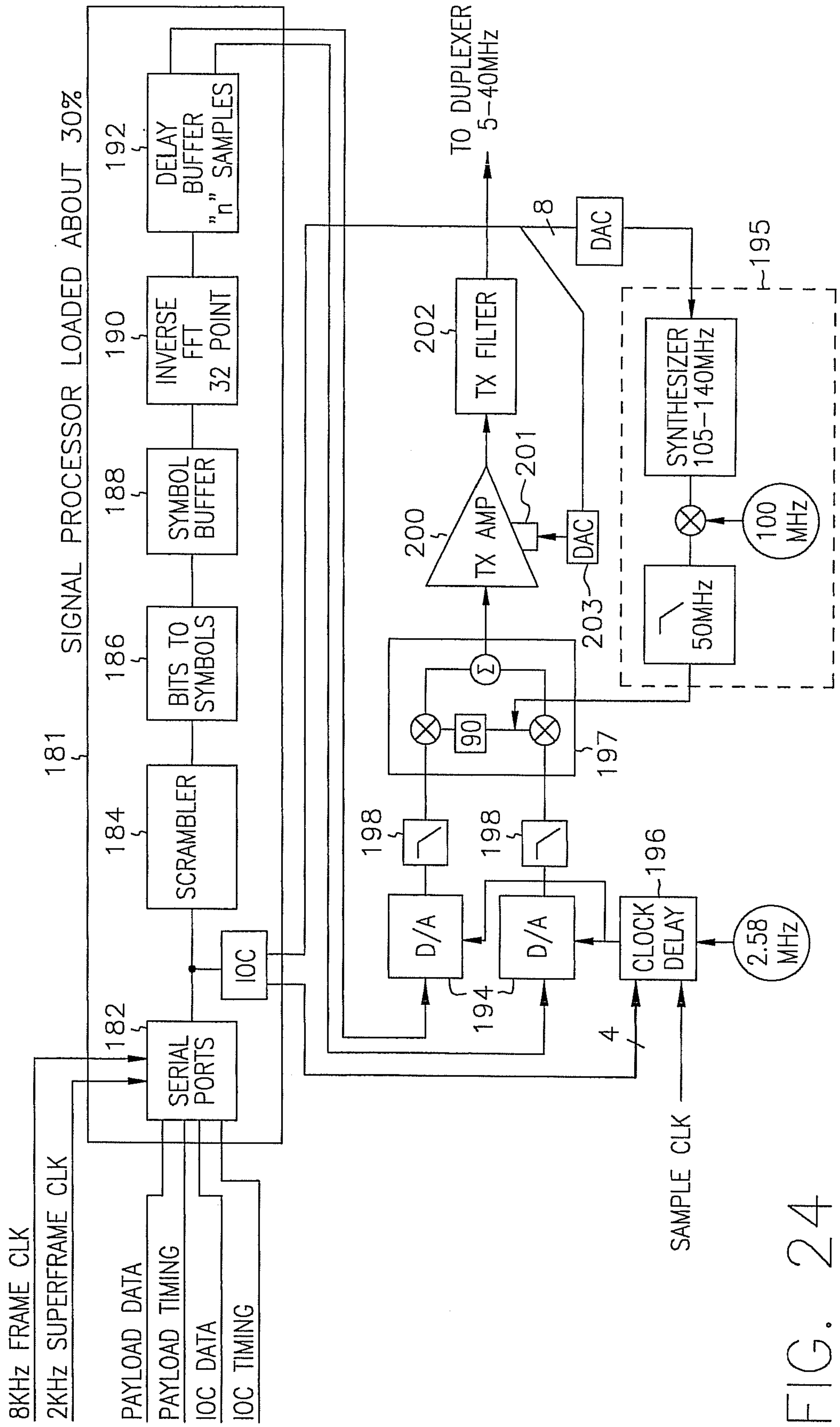
FIG. 24 is a block diagram of a CXHM upstream transmission architecture associated with the CXHM downstream receiver architecture of FIG. 23.

Referring to FIG. 24, the upstream transmission architecture for the HISU 68 (FIG. 1) is shown. The IOC control data and the telephony payload data from the CXSU 102 (FIG. 8) is provided to serial ports 182 at a much slower rate in the HISU than in the MISU or HDT transmission architectures, because the HISU supports only 10 DS0+ channels. The HISU upstream transmission architecture implements three important operations. It adjusts the amplitude of the signal transmitted, the timing delay (both symbol and path delay) of the signal transmitted, and the carrier frequency of the signal transmitted. The telephony data and IOC control data enters through the serial ports 182 under control of clocking signals generated by the clock generator 173 of the HISU downstream receiver architecture, and is scrambled by scrambler 184 for the reasons stated above with regard to the MCC downstream transmission architecture. The incoming bits are mapped into symbols, or complex constellation points, including I/Q components in the frequency domain, by bits to symbol converter 186. The constellation points are then placed in symbol buffer 188. Following the buffer 188, an inverse FFT 190 is applied to the symbols to create time domain samples; 32 samples corresponding to the 32 point FFT. A delay buffer 192 is placed on the output of the inverse FFT 190 to provide multi-frame alignment at MCC modem upstream receiver architecture as a function of the upstream synchronization process controlled by the HDT 12. The delay buffer 192, therefore, provides a path delay adjustment prior to digital to analog conversion by the digital to analog converters 194 of the in-phase and quadrature components of the output of the inverse FFT 190. Clock delay 196 provides a fine tune adjustment for the symbol alignment at the request of IOC control data output obtained by extracting control data from the serial stream of data prior to being scrambled. After conversion to analog components by digital to analog converters 194, the analog components therefrom are reconstructed into a smooth analog waveform by the reconstruction filters 198. The upstream signal is then directly up converted by direct converter 197 to the appropriate transmit frequency under control of synthesizer block 195. Synthesizer block 195 is operated under control of commands from an IOC control channel which provides carrier frequency adjustment commands thereto as extracted in the HISU downstream receiver architecture. The up converted signal is then amplified by transmitter amplifier 200, filtered by transmitter filter 202 and transmitted upstream to be combined with other signals transmitted by other ISUs 100. The block 181 includes processing circuitry for carrying out the functions thereof.

Figure 27:
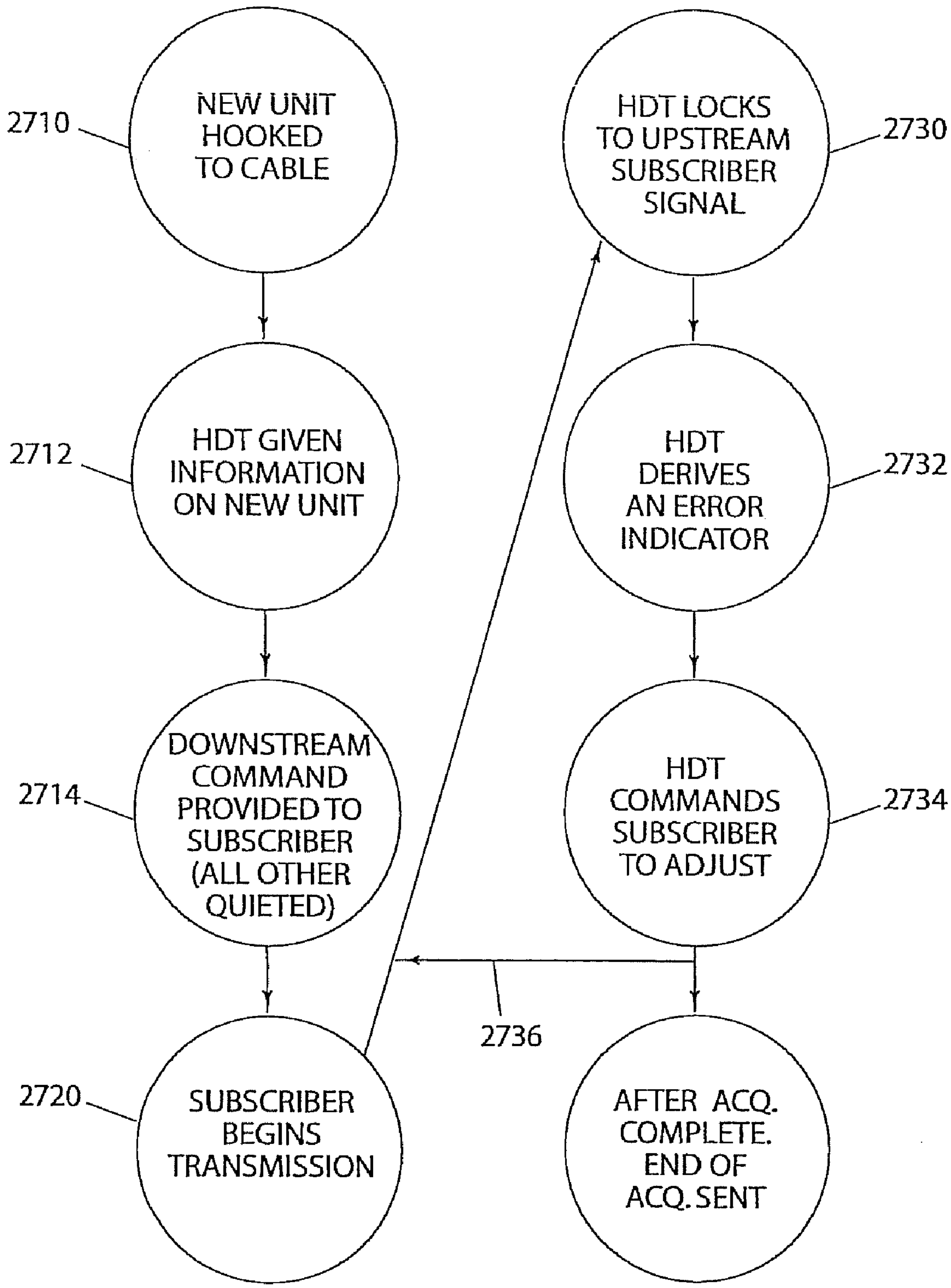
FIG. 27 is a flow diagram of a acquisition distributed loop routine for use with the system of FIG. 1.

Referring to FIG. 27, the upstream transmitter architecture for the MISU 66 is shown and is substantially the same as the upstream transmitter architecture of HISU 68. However, the MISU 66 handles more channels and cannot perform the operation on a single processor as can the HISU 68. Therefore, both a processor of block 181 providing the functions of block 181 including the inverse FFT 190 and a general purpose processor 206 to support the architecture are needed to handle the increased channel capacity.

Figure 26:
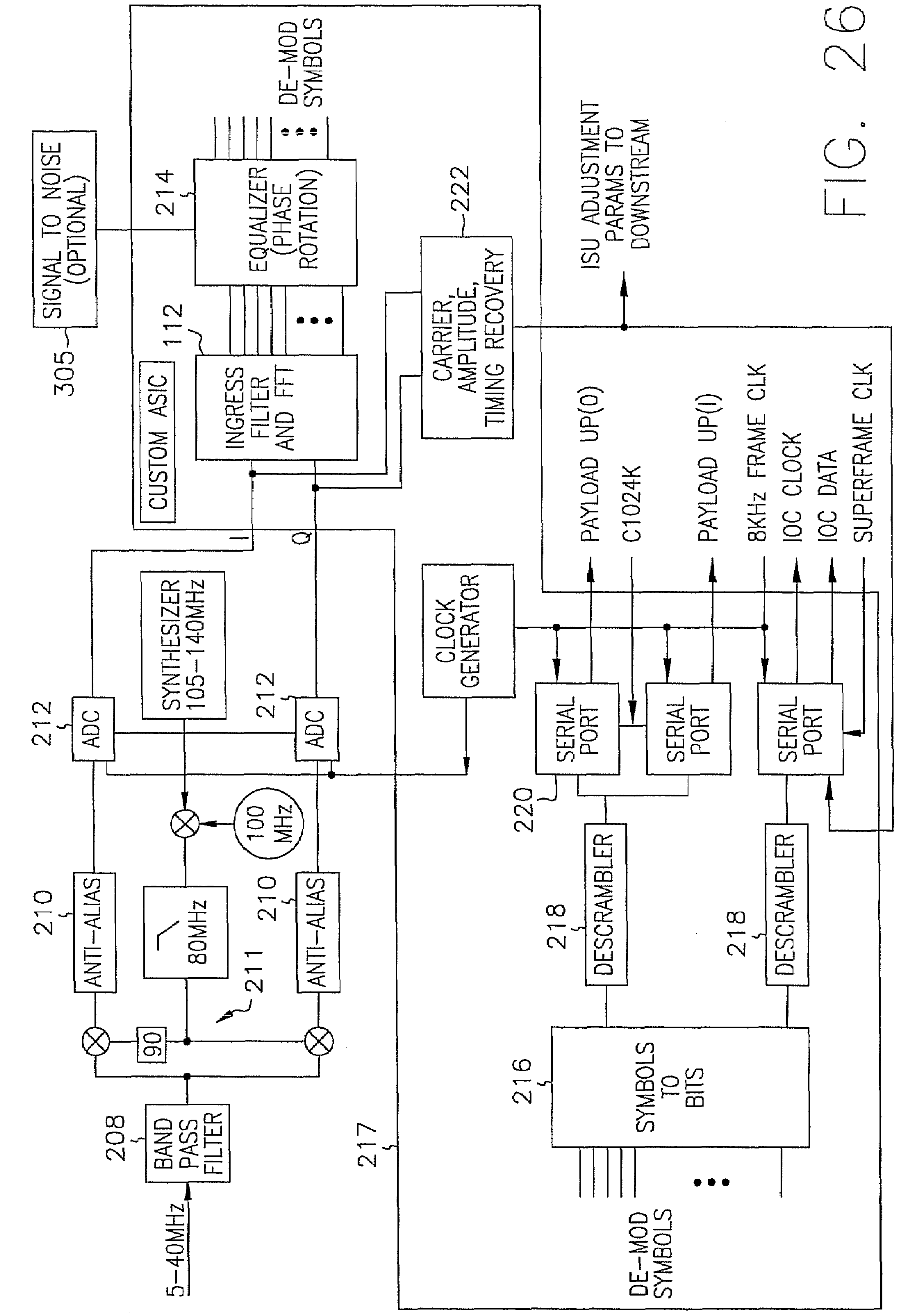
FIG. 26 is a block diagram of an MCC upstream receiver architecture associated with the MCC downstream transmission architecture of FIG. 21.

Referring to FIG. 26, the MCC upstream receiver architecture of each CXMU 56 at the HDT 12 is shown. A 5 to 40 MHz band pass filter 208 filters the upstream signal which is then subjected to a direct down conversion to baseband by mixer and synthesizer circuitry 211. The outputs of the down conversion is applied to anti-alias filters 210 for conditioning thereof and the output signal is converted to digital format by analog to digital converters 212 to provide a time domain sampling of the in-phase and quadrature components of the signal to narrow band ingress filter and FFT 112. The narrow band ingress filter and FFT 112, as described below, provides protection against narrow band interference that may affect the upstream transmission.

The ingress filter and FFT 112 protects ten channels at a time, therefore, if ingress affects one of the available 240 DS0+s in the 6 MHz spectrum received by MCC modem 82, a maximum of ten channels will be destroyed from the ingress. The ingress filter and FFT 112 includes a polyphase structure, as will be recognized by one skilled in the art as a common filter technique. It will be further recognized by one skilled in the art that the number of channels protected by the polyphase filter can be varied. The output of the ingress filter and FFT 112 is coupled to an equalizer 214 which provides correction for inaccuracies that occur in the channel, such as those due to noise from reference oscillators or synthesizers. The output symbols of the equalizer 214, are applied to a symbols to bits converter 216 where the symbols are mapped into bits. The bits are provided to descramblers 218, which are a mirror of the scramblers of the ISUs 100 and the output of the descramblers are provided to serial ports 220. The output of the serial ports is broken into two payload streams and one IOC control data stream just as is provided to the MCC downstream transmitter architecture in the downstream direction. Block 217 includes the necessary processing circuitry for carrying out the functions therein.

In order to detect the downstream information, the amplitude, frequency, and timing of the arriving signal must be acquired using the downstream synchronization process. Since the downstream signal constitutes a point to multi-point node topology, the OFDM waveform arrives via a single path in an inherently synchronous manner, in contrast to the upstream signal. Acquisition of the waveform parameters is initially performed on the downstream synchronization channels in the downstream synchronization bands located at the ends of the 6 MHz spectrum. These synchronization bands include a single synchronization carrier or tone which is BPSK modulated by a 2 kHz framing clock. This tone is used to derive initial amplitude, frequency, and timing at the ISU. The synchronization carrier may be located in the center of the receive band and could be considered a special case of an IOC. After the signal is received and the receiver architecture is tuned to a typical IOC channel, the same circuitry is used to track the synchronization parameters using the IOC channel. The process used to acquire the necessary signal parameters utilizes carrier, amplitude and timing recovery block 166 of the ISU receiver architecture (FIG. 22), which is shown in more detail in block diagram form in FIG. 33. The carrier, amplitude and timing recovery block 166 includes a Costas loop 330 which is used to acquire the frequency lock for the received waveform. After the signal is received from the compensation unit 164 (FIG. 22), a sample and hold 334 and analog to digital conversion 332 is applied to the signal with the resulting samples from the converters 332 applied to the Costas loop 330. The sampling is performed under control of voltage controlled oscillator 340 as divided by divider 333 which divides by the number of points of the FFT utilized in the receiver architecture, M. The mixers 331 of the Costas loop 330 are fed by the arriving signal and the feedback path, and serve as the loop phase detectors. The output of the mixers 331 are filtered and decimated to reduce the processing requirements of subsequent hardware. Given that the received signal is band-limited, less samples are required to represent the synchronization signal. If orthogonality is not preserved in the receiver, the filter will eliminate undesired signal components from the recovery process. Under conditions of orthogonality, the LPF 337 will completely remove effects from adjacent OFDM carriers. When carrier frequency lock is achieved, the process will reveal the desired BPSK waveform in the in-phase arm of the loop. The output of the decimators are fed through another mixer, then processed through the loop filter with filter function H(s) and numerically controlled oscillator (NCO), completing the feedback path to correct for frequency error. When the error is at a "small" level, the loop is locked. In order to achieve fast acquisition and minimal jitter during tracking, it will be necessary to employ dual loop bandwidths. System operation will require that frequency lock is achieved and maintained within about ±4% of the OFDM channel spacing (360 Hz). The amplitude of the signal is measured at the output of the frequency recovery loop at BPSK power detector 336. The total signal power will be measured, and can be used to adjust a numerically controllable analog gain circuit (not shown). The gain circuit is intended to normalize the signal so that the analog to digital converters are used in an optimal operating region.

Timing recovery is performed using an early-late gate type algorithm of early-late gate phase detector 338 to derive timing error, and by adjusting the sample clock or oscillator 340 in response to the error signal. The early-late gate detector results in an advance/retard command during an update interval. This command will be applied to the sample clock or oscillator 340 through filter 341. This loop is held off until frequency lock and amplitude lock have been achieved. When the timing loop is locked, it generates a lock indicator signal. The same clocks are also used for the upstream transmission. The carrier, timing and amplitude recovery block 166 provides a reference for the clock generator 168. The clock generator 168 provides all of the clocks needed by the MISU, for example, the 8 kHz frame clock and the sample clock.

Figure 34:
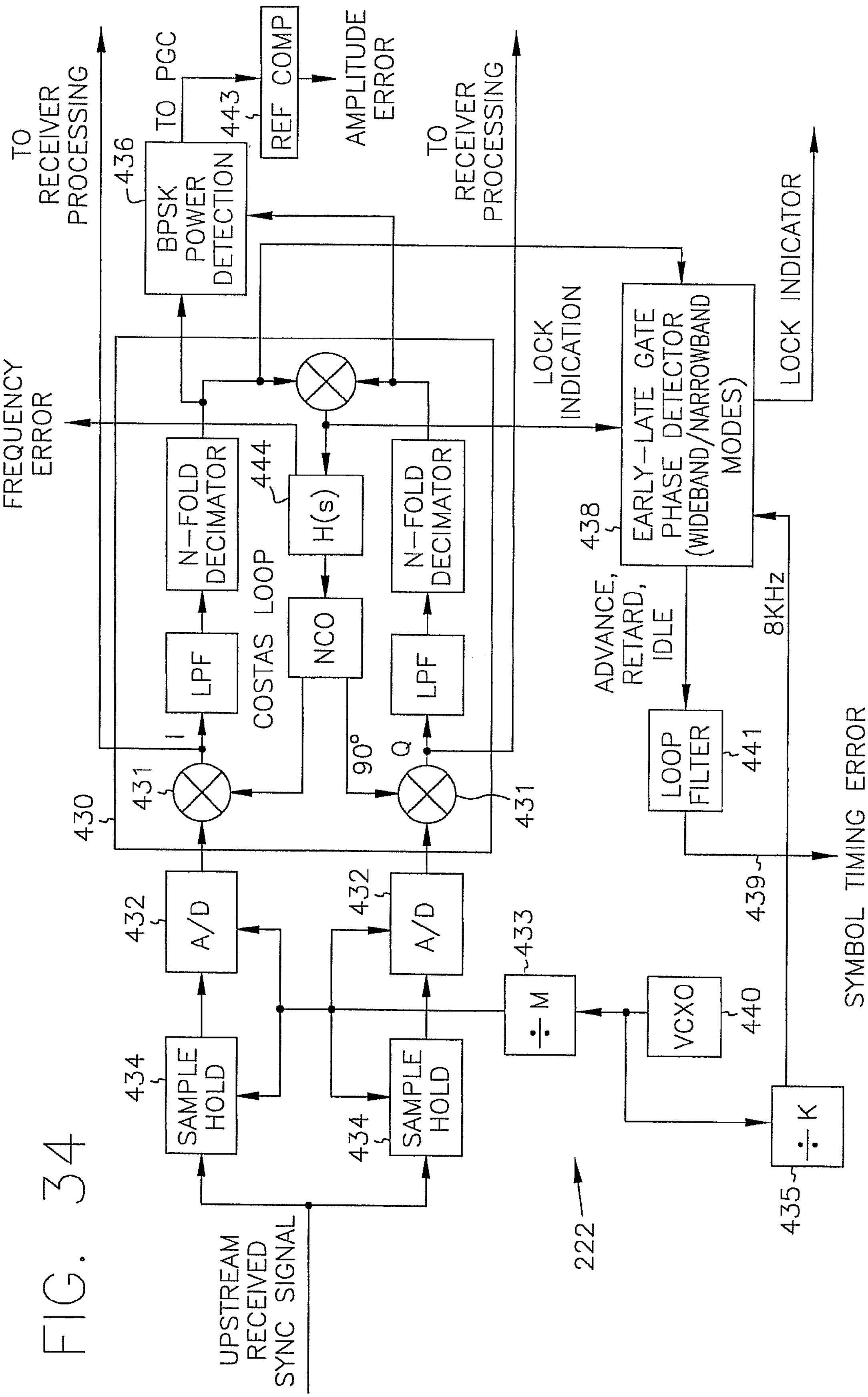
FIG. 34 is a block diagram of a carrier, amplitude, timing recovery block of the MCC upstream receiver architecture of the first transport embodiment.

Carrier, amplitude, and timing recovery block 222 of the MCC modem upstream receiver architecture (FIG. 26), is shown by the synchronization loop diagram of FIG. 34. It performs detection for upstream synchronization on signals on the upstream synchronization channel. For initialization and activation of an ISU, upstream synchronization is performed by the HDT commanding one of the ISUs via the downstream IOC control channels to send a reference signal upstream on a synchronization channel. The carrier, amplitude, and timing recovery block 222 measures the parameters of data from the ISU 100 that responds on the synchronization channel and estimates the frequency error, the amplitude error, and the timing error compared to references at the HDT 12. The output of the carrier, amplitude, and timing recovery block 222 is turned into adjustment commands by the HDT 12 and sent to the ISU being initialized and activated in the downstream direction on an IOC control channel by the MCC downstream transmitter architecture.

The purpose of the upstream synchronization process is to initialize and activate ISUs such that the waveform from distinct ISUs combine to a unified waveform at the HDT 12. The parameters that are estimated at the HDT 12 by carrier, amplitude, and timing recovery block 222 and adjusted by the ISUs are amplitude, timing, and frequency. The amplitude of an ISUs signal is normalized so that DS0+s are apportioned an equal amount of power, and achieves a desired signal to noise ratio at the HDT 12. In addition, adjacent ISUs must be received at the correct relative level or else weaker DS0+ channels will be adversely impacted by the transient behavior of the stronger DS0+ channels. If a payload channel is transmitted adjacent to another payload channel with sufficient frequency error, orthogonality in the OFDM waveform deteriorates and error rate performance is compromised. Therefore, the frequency of the ISU must be adjusted to close tolerances. Timing of the recovered signal also impacts orthogonality. A symbol which is not aligned in time with adjacent symbols can produce transitions within the part of the symbol that is subjected to the FFT process. If the transitions of all symbols don't fall within the guard interval at the HDT, approximately ±16 tones (8 DS0+s) relative to the non-orthogonal channel will be unrecoverable.

During upstream synchronization, the ISUs will be commanded to send a signal, for example a square wave signal, to establish amplitude and frequency accuracy and to align symbols. The pattern signal may be any signal which allows for detection of the parameters by carrier, amplitude and timing recovery block 222 and such signal may be different for detecting different parameters. For example, the signal may be a continuous sinusoid for amplitude and frequency detection and correction and a square wave for symbol timing. The carrier, amplitude and timing recovery block 222 estimates the three distributed loop parameters. In all three loops, the resulting error signal will be converted to a command by the CXMC 80 and sent via the MCC modem 82 over an IOC channel and the CXSU will receive the command and control the adjustment made by the ISU.

As shown in FIG. 34, the upstream synchronization from the ISU is sampled and held 434 and analog to digital converted 432 under control of voltage controlled oscillator 440. Voltage controlled oscillator is a local reference oscillator which is divided by M, the points of the FFT in the receiver architecture, for control of sample and hold 434 and analog to digital converter 432 and divided by k to apply an 8 kHz signal to phase detector 438.

Frequency error may be estimated utilizing the Costas loop 430. The Costas loop 430 attempts to establish phase lock with the locally generated frequency reference. After some period of time, loop adaptation will be disabled and phase difference with respect to the time will be used to estimate the frequency error. The frequency error is generated by filter function H(s) 444 and provided to the CXMC 80 for processing to send a frequency adjustment command to the ISU via an IOC control channel. The frequency error is also applied to the numerically controlled oscillator (NCO) to complete the frequency loop to correct for frequency error.

The amplitude error is computed based on the magnitude of the carrier during the upstream synchronization by detecting the carrier amplitude of the in-phase arm of the Costas loop 430 by power detector 436. The amplitude is compared with a desired reference value at reference comparator 443 and the error will be sent to the CXMC 80 for processing to send an amplitude adjustment command to the ISU via an IOC control channel.

When the local reference in the HDT has achieved phase lock, the BPSK signal on the synchronization channel arriving from the ISU is available for processing. The square wave is obtained on the in-phase arm of the Costas loop 430 and applied to early-late gate phase detector 438 for comparison to the locally generated 8 kHz signal from divider 435. The phase detector 438 generates a phase or symbol timing error applied to loop filter 441 and output via line 439. The phase or symbol timing error is then provided to the CXMC 80 for processing to send a symbol timing adjustment command to the ISU via an IOC control channel.

The mechanisms in the ISU which adjust the parameters for upstream synchronization include implementing an amplitude change with a scalar multiplication of the time domain waveform as it is being collected from the digital processing algorithm, such as inverse FFT 190, by the digital to analog converters 194 (FIG. 24). Similarly, a complex mixing signal could be created and implemented as a complex multiply applied to the input to the digital to analog converters 194. Frequency accuracy of both the downstream sample clock and upstream sample clock, in the ISU, is established by phase locking an oscillator to the downstream synchronization and IOC information. Upstream transmission frequency is adjusted, for example, at synthesizer block 195 as commanded by the HDT 12.

Symbol timing corrections are implemented as a delay function. Symbol timing alignment in the ISU upstream direction is therefore established as a delay in the sample timing accomplished by either blanking a sample interval (two of the same samples to go out simultaneously) or by putting in an extra clock edge (one sample is clocked out and lost) via clock delay 196 (FIG. 24). In this manner, a delay function can be controlled without data storage overhead beyond that already required.

After the ISU is initialized and activated into the system, ready for transmission, the ISU will maintain required upstream synchronization system parameters using the carrier, amplitude, frequency recovery block 222. An unused but initialized and activated ISU will be commanded to transmit on an IOC and the block 222 will estimate the parameters therefrom as explained above.

In both the upstream transmitter architectures for the MISU 66 (FIG. 24) and the HISU 68 (FIG. 25), frequency offset or correction to achieve orthogonality of the carriers at HDT 12 can be determined on the ISU as opposed to the frequency offset being determined at the HDT during synchronization by carrier, amplitude and timing recovery block 222 (FIG. 26) and then frequency offset adjustment commands being transmitted to the ISU for adjustment of carrier frequency via the synthesizer blocks 195 and 199 of the HISU 68 and MISU 66, respectively. Thus, frequency error would no longer be detected by carrier, amplitude and timing recovery block 222 as described above. Rather, in such a direct ISU implementation, the ISU, whether an HISU 68 or MISU 66, estimates a frequency error digitally from the downstream signal and a correction is applied to the upstream data being transmitted.

The HDT 12 derives all transmit and receive frequencies from the same fundamental oscillator. Therefore, all mixing signals are frequency locked in the HDT. Similarly, the ISU, whether an HISU 68 or MISU 66, derives all transmit and receive frequencies from the same fundamental oscillator; therefore, all the mixing signals on the ISU are also frequency locked. There is, however, a frequency offset present in the ISU oscillators relative to the HDT oscillators. The amount of frequency error (viewed from the ISU) will be a fixed percentage of the mixing frequency. For example, if the ISU oscillator is 10 PPM off in frequency from the HDT oscillators, and the downstream ISU receiver mix frequency was 100 MHz and the ISU upstream transmit mixing frequency were 10 MHz, the ISU would have to correct for 1 kHz on the downstream receiver and create a signal with a 100 Hz offset on the upstream transmitter. As such, with the ISU direct implementation, the frequency offset is estimated from the downstream signal.

The estimation is performed with digital circuitry performing numeric calculations (that is, a processor). Samples of the synchronization channel or IOC channel are collected in hardware during operation of the system. A tracking loop drives a digital numeric oscillator which is digitally mixed against the received signal. This process derives a signal internally that is essentially locked to the HDT. The internal numerical mix accounts for the frequency offset. During the process of locking to the downstream signal in the ISU, the estimate of frequency error is derived and with the downstream frequency being known, a fractional frequency error can be computed. Based on the knowledge of the mixing frequency at the HDT that will be used to down convert the upstream receive signal, an offset to the ISU transmit frequency is computed. This frequency offset is digitally applied to the ISU transmitted signal prior to converting the signal to the analog domain, such as by converters 194 of FIG. 24. Therefore, the frequency correction can be performed directly on the ISU.

Figure 31:
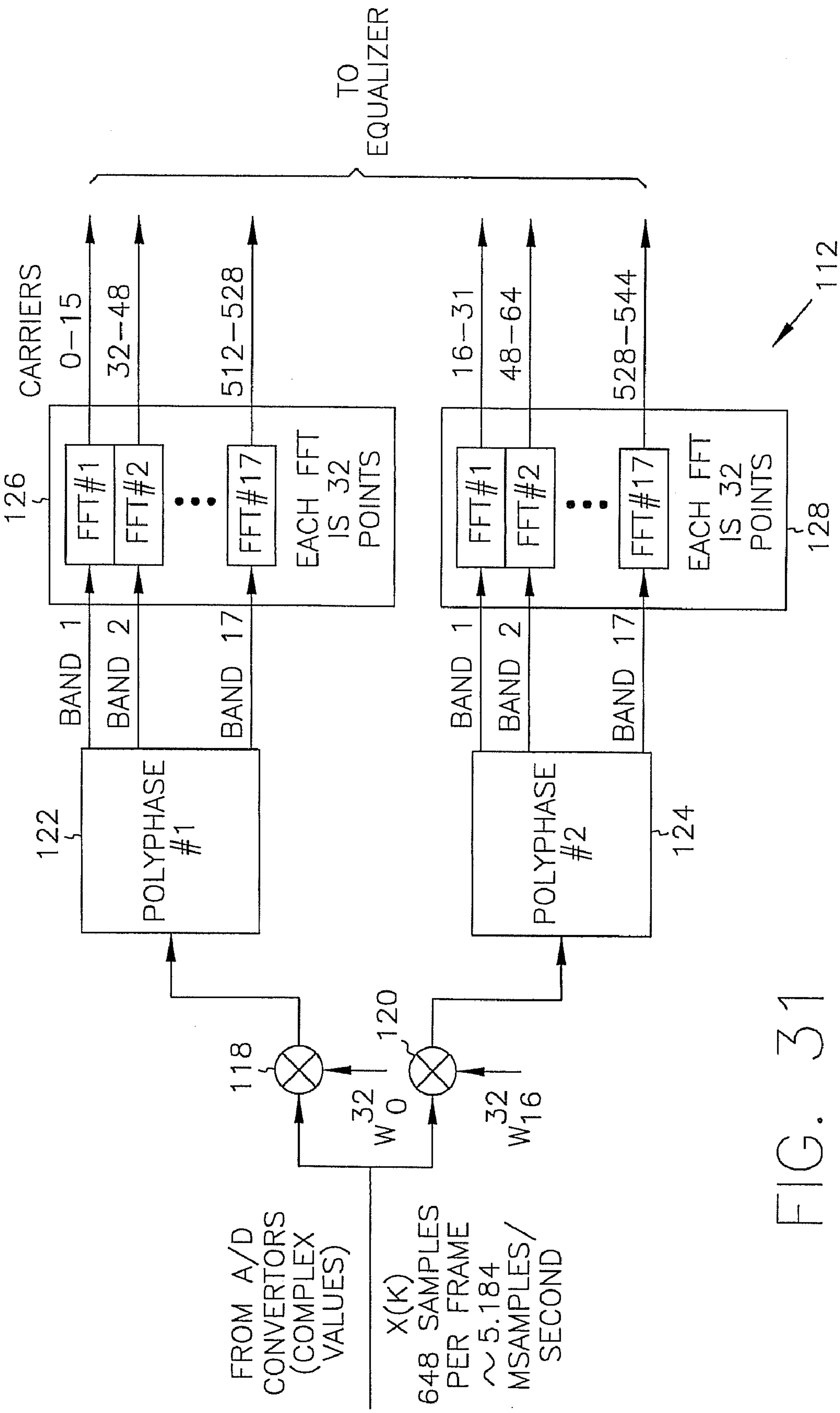
FIG. 31 is a block diagram of an ingress filter structure and FFT of the MCC upstream receiver architecture of FIG. 26.
Figure 32:
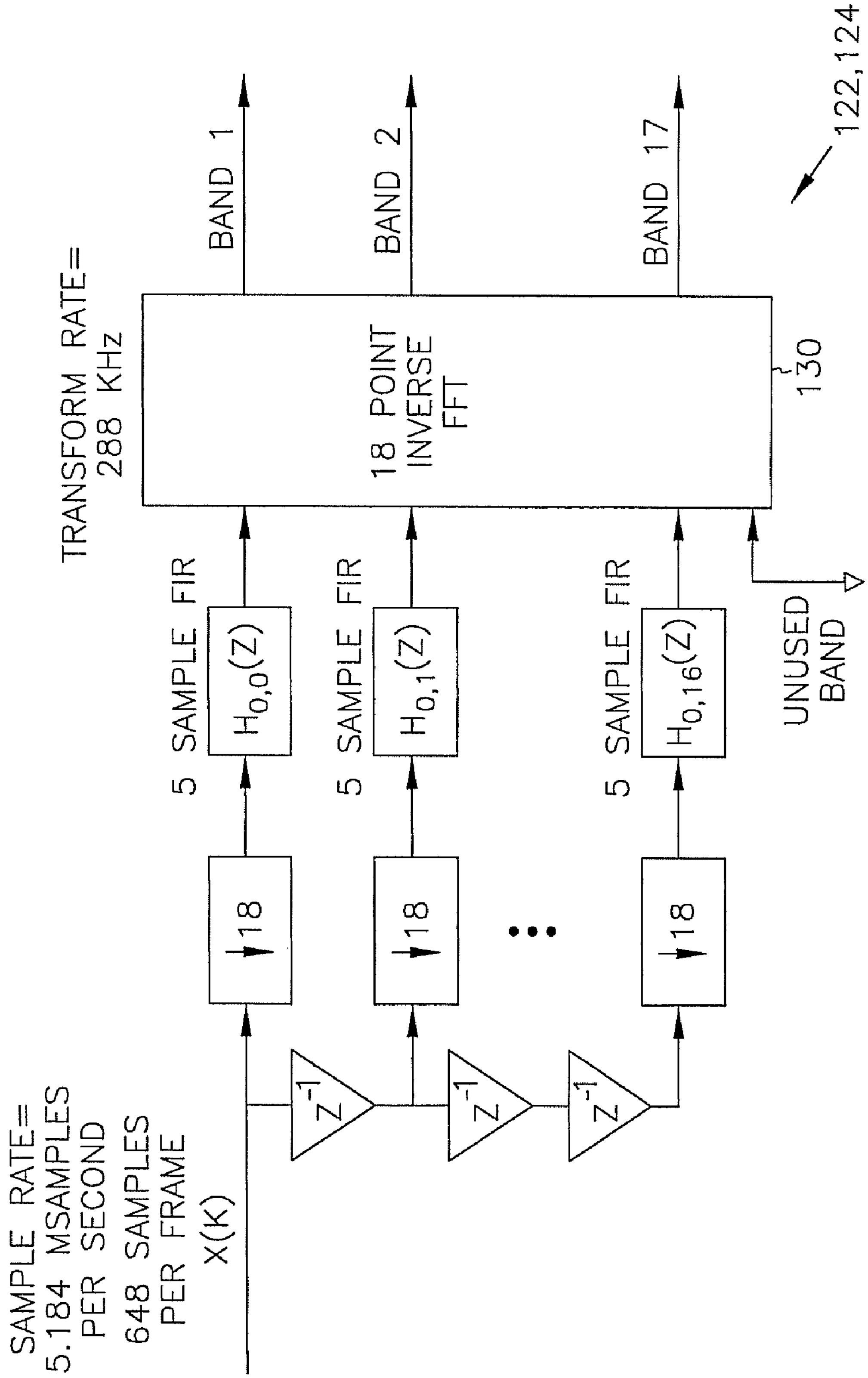
FIG. 32 is a block diagram of a polyphase filter structure of the ingress filter structure and FFT of FIG. 31.

Referring to FIGS. 31 and 32, the narrow band ingress filter and FFT 112 of the MCC upstream receiver architecture, including a polyphase filter structure, will be described in further detail. Generally, the polyphase filter structure includes polyphase filters 122 and 124 and provides protection against ingress. The 6 MHz band of upstream OFDM carriers from the ISUs 100 is broken into subbands through the polyphase filters which provide filtering for small groups of carriers or tones, and if an ingress affects carriers within a group of carriers, only that group of carriers is affected and the other groups of carriers are protected by such filtering characteristics.

Figure 29:
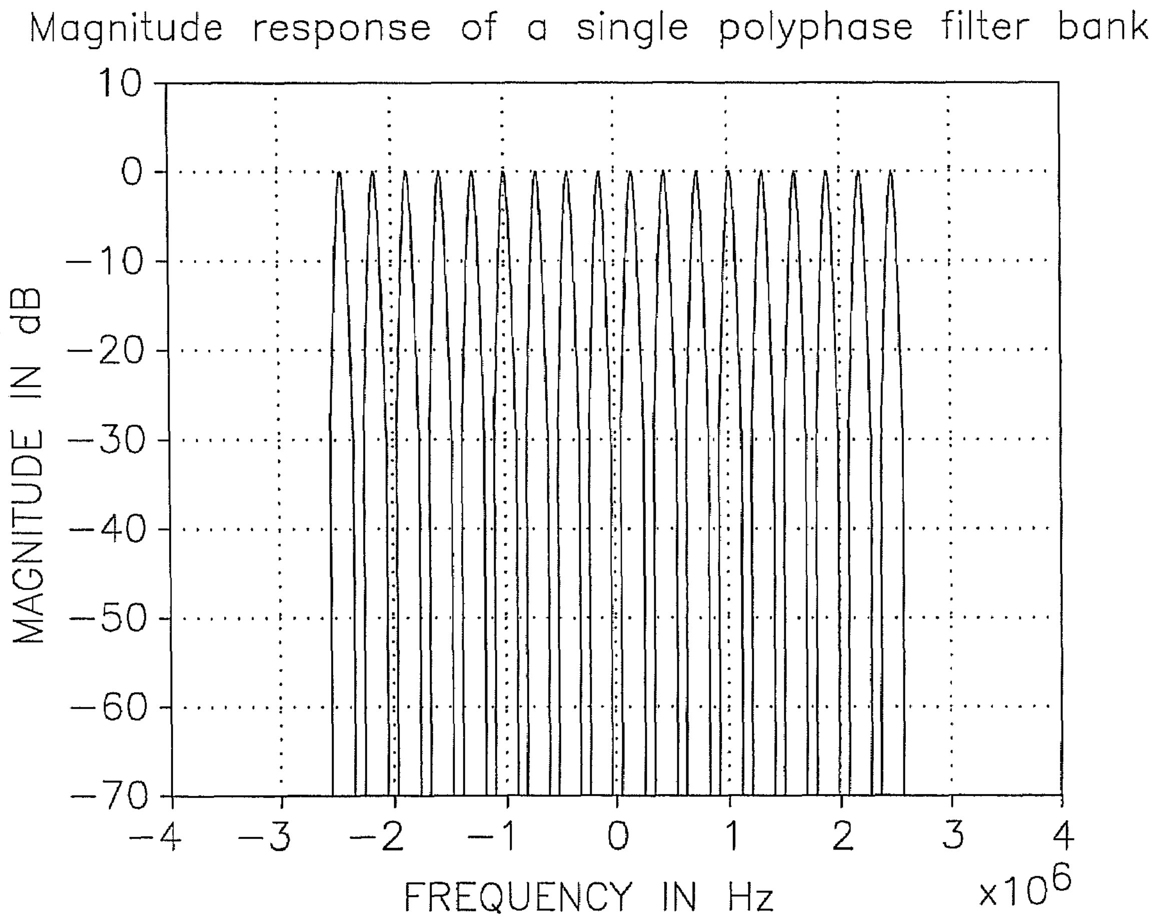
FIG. 29 shows a magnitude response of a polyphase filter bank of the MCC upstream receiver architecture of FIG. 26.
Figure 30:
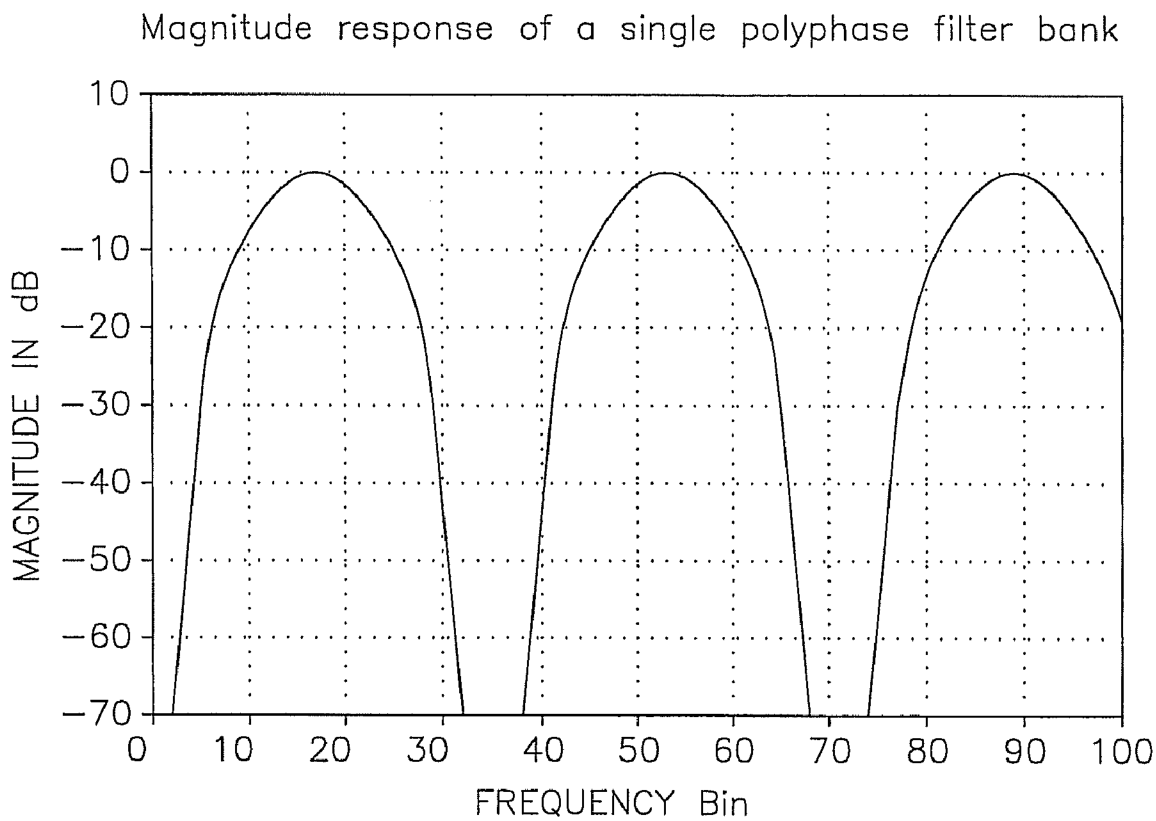
FIG. 30 is an enlarged view of part of the magnitude response of FIG. 29.

The ingress filter structure has two parallel banks 122, 124 of polyphase filters. One bank has approximately 17 different non-overlapping bands with channel spaces between the bands. A magnitude response of a single polyphase filter bank is shown in FIG. 29. The second bank is offset from the first bank by an amount so that the channels that are not filtered by the first bank are filtered by the second bank. Therefore, as shown in the closeup magnitude response of a single polyphase filter bank in FIG. 30, one band of channels filtered may include those in frequency bins 38-68 with the center carriers corresponding to bins 45-61 being passed by the filter. The overlapping filter provides for filtering carriers in the spaces between the bands and the carriers not passed by the other filter bank. For example, the overlapping filter may pass 28-44. The two channel banks are offset by 16 frequency bins so that the combination of the two filter banks receives every one of the 544 channels.

Referring to FIG. 31, the ingress filter structure receives the sampled waveform x(k) from the analog to digital converters 212 and then complex mixers 118 and 120 provide the stagger for application to the polyphase filters 122, 124. The mixer 118 uses a constant value and the mixer 120 uses a value to achieve such offset. The outputs of each mixer enters one of the polyphase filters 122, 124. The output of each polyphase filter bank comprises 18 bands, each of which contain 16 usable FFT bins or each band supports sixteen carriers at the 8 kHz rate, or 8 DS0+'s. One band is not utilized.

Each band output of the polyphase filters 122, 124 has 36 samples per 8 kHz frame including 4 guard samples and enters a FFT block 126, 128. The first operation performed by the FFT blocks 126, 128 is to remove the four guard samples, thereby leaving 32 time domain points. The output of each FFT in the blocks is 32 frequency bins, 16 of which are used with the other bins providing filtering. The output of the FFTs are staggered to provide overlap. As seen in FIG. 31, carriers 0-15 are output by FFT #1 of the top bank, carriers 16-31 are output by FFT #1 of the bottom bank, carriers 32-48 are output by FFT #2 of the top bank and so on.

The polyphase filters 122, 124 are each standard polyphase filter construction as is known to one skilled in the art and each is shown by the structure of FIG. 32. The input signal is sampled at a 5.184 mega-sample per second rate, or 648 samples per frame. The input is then decimated by a factor of 18 (1 of 18 samples are kept) to give an effective sample rate of 288 kHz. This signal is subjected to the finite impulse response (FIR) filters, labeled $H_{0,0}(Z)$ through $H_{0,16}(Z)$, which include a number of taps, preferably 5 taps per filter. As one skilled in the art will recognize the number of taps can vary and is not intended to limit the scope of the invention. The outputs from the filters enter an 18 point inverse FFT 130. The output of the transform is 36 samples for an 8 kHz frame including 4 guard samples and is provided to FFT blocks 126 and 128 for processing as described above. The FFT tones are preferably spaced at 9 kHz, and the information rate is 8 kilo-symbols per second with four guard samples per symbol allotted. The 17 bands from each polyphase filter are applied to the FFT blocks 126, 128 for processing and output of the 544 carriers as indicated above. One band, the 18th band, as indicated above, is not used.

Figure 35:
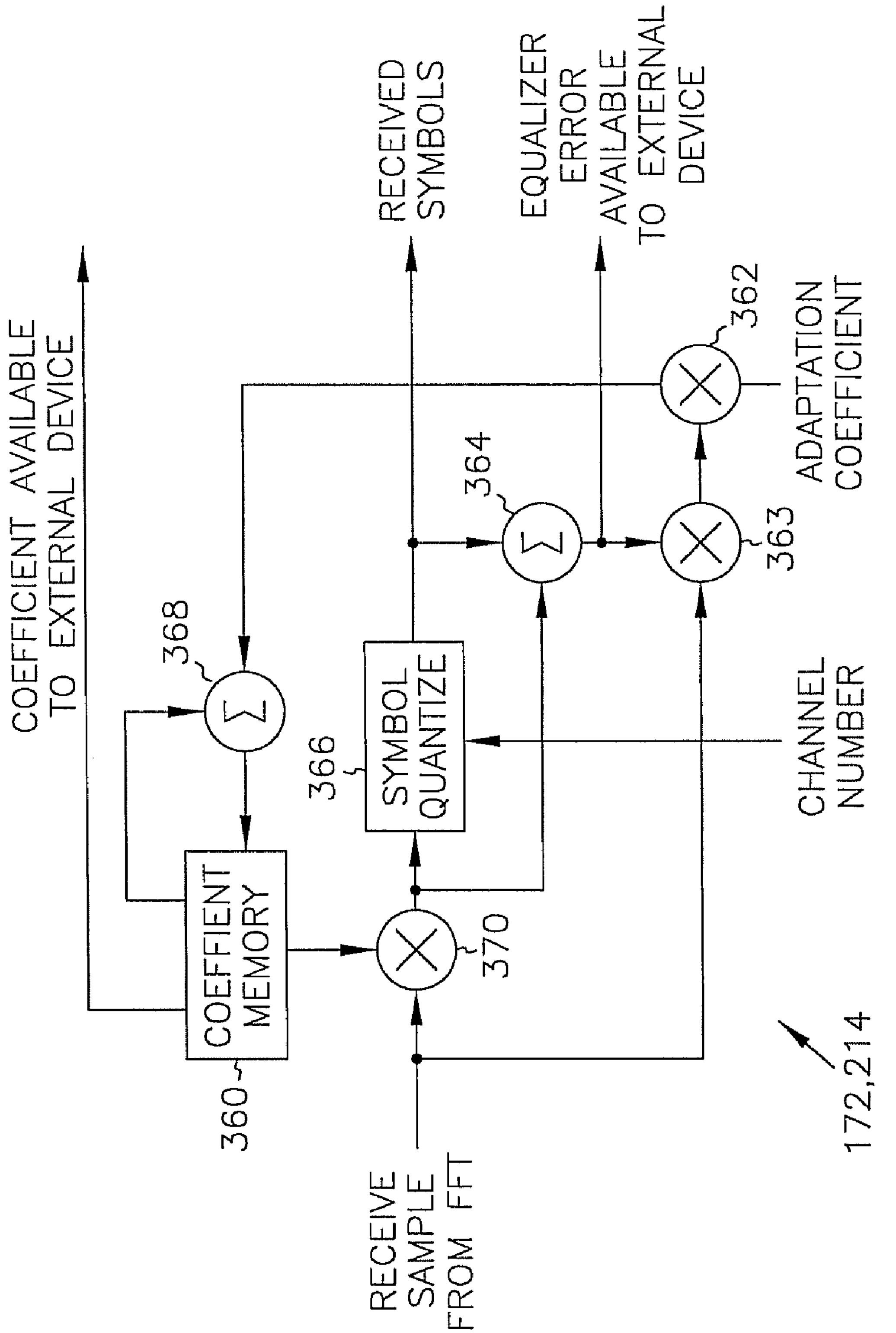
FIG. 35 is a block diagram of internal equalizer operation for the receiver architectures of the first transport embodiment.

The equalizer 214 (FIG. 26) and 172 (FIG. 22), in both upstream and downstream receiver architectures, is supplied to account for changes in group delay across the cable plant. The equalizer tracks out phase and gain or amplitude variations due to environmental changes and can therefore adapt slowly while maintaining sufficiently accurate tracking. The coefficients 360 of the equalizer 172, 214, for which the internal equalizer operation is generally shown in FIG. 35, represent the inverse of the channel frequency response to the resolution of the FFT 112, 170. The downstream coefficients will be highly correlated since every channel will progress through the same signal path as opposed to the upstream coefficients which may be uncorrelated due to the variant channels that individual DS0+s may encounter in the multi-point to point topology. While the channel characteristics are diverse, the equalizer will operate the same for either upstream or downstream receivers. The downstream equalizer will track on only the IOC channels, thus reducing the computational requirements at the ISUs and removing the requirement for a preamble in the payload channels, as described further below, since the IOC channels are always transmitted. The upstream, however, will require equalization on a per DS0+ and IOC channel basis.

The algorithm used to update the equalizer coefficients contains several local minima when operating on a 32 QAM constellation and suffers from a four-fold phase ambiguity. Furthermore, each DS0+ in the upstream can emanate from a separate ISU, and can therefore have an independent phase shift. To mitigate this problem, each communication onset will be required to post a fixed symbol preamble prior to data transmission. Note that the IOC channels are excluded from this requirement since they are not equalized and that the preamble cannot be scrambled. It is known that at the time of transmission, the HDT 12 will still have accurate frequency lock and symbol timing as established during initialization and activation of the ISU and will maintain synchronization on the continuously available downstream IOC channel.

The introduction of the preamble requires that the equalizer have knowledge of its process state. Three states are introduced which include: search, acquisition, and tracking mode. Search mode is based on the amount of power present on a channel. Transmitter algorithms will place a zero value in unused FFT bins, resulting in no power being transmitted on that particular frequency. At the receiver, the equalizer will determine that it is in search mode based on the absence of power in the FFT bin.

When transmission begins for an initialized and activated ISU, the equalizer detects the presence of signal and enters the acquisition mode. The length of the preamble may be about 15 symbols. The equalizer will vary the equalization process based on the preamble. The initial phase and amplitude correction will be large but subsequent updates of the coefficients will be less significant. In order to differentiate the training pattern from any other data sequence, when the HDT informs an ISU to connect a new payload channel, the ISU transmits 16 consecutive symbols having I=0 and Q=0, which is not a valid data symbol in the constellations of FIG. 14 or 17. The ISU then transmits 8 valid data symbols, allowing the equalizer for that channel to set its coefficient properly to adjust for amplitude and phase of the incoming signal.

After acquisition, the equalizer will enter a tracking mode with the update rate being reduced to a minimal level. The tracking mode will continue until a loss of power is detected on the channel for a period of time. The channel is then in the unused but initialized and activated state. The equalizer will not train or track when the receiver is being tuned and the coefficients will not be updated. The coefficients may be accessed and used such as by signal to noise detector 305 (FIG. 26) for channel monitoring as discussed further below.

For the equalization process, the I/Q components are loaded into a buffer at the output of the FFT, such as FFT 112, 180. As will be apparent to one skilled in the art, the following description of the equalizer structure is with regard to the upstream receiver equalizer 214 but is equally applicable to the downstream receiver equalizer 172. The equalizer 214 extracts time domain samples from the buffer and processes one complex sample at a time. The processed information is then output therefrom. FIG. 35 shows the basic structure of the equalizer algorithm less the state control algorithm which should be apparent to one skilled in the art. The primary equalization path performs a complex multiply at multiplier 370 with the value from the selected FFT bin. The output is then quantized at symbol quantize block 366 to the nearest symbol value from a storage table. The quantized value (hard decision) is passed out to be decoded into bits by symbols to bits converter 216. The remainder of the circuitry is used to update the equalizer coefficients. An error is calculated between the quantized symbol value and the equalized sample at summer 364. This complex error is multiplied with the received sample at multiplier 363 and the result is scaled by the adaptation coefficient by multiplier 362 to form an update value. The update value is summed at summer 368 with the original coefficient to result in a new coefficient value.

Operation of First Embodiment

In the preferred embodiment, the 6 MHz frequency band for each MCC modem 82 of HDT 12 is allocated as shown in FIG. 13. Although the MCC modem 82 transmits and receives the entire 6 MHz band, the ISU modems 100 (FIG. 8) are optimized for the specific application for which they are designed and may terminate/generate fewer than the total number of carriers or tones allocated in the 6 MHz band. The upstream and downstream band allocations are preferably symmetric. The upstream 6 MHz bands from the MCC modems 82 lie in the 5-40 MHz spectrum and the downstream 6 MHz bands lie in the 725-760 MHz spectrum. One skilled in the art will recognize that if different transmission media are utilized for upstream and downstream transmission, the frequencies for transmission may be the same or overlap but still be non-interfering.

There are three regions in each 6 MHz frequency band to support specific operations, such as transport of telephony payload data, transport of ISU system operations and control data (IOC control data), and upstream and downstream synchronization. Each carrier or tone in the OFDM frequency band consists of a sinusoid which is modulated in amplitude and phase to form a complex constellation point as previously described. The fundamental symbol rate of the OFDM waveform is 8 kHz, and there are a total of 552 tones in the 6 MHz band. The following Table 2 summarizes the preferable modulation type and bandwidth allocation for the various tone classifications.

TABLE 2

| Band Allocation | Number of Tones or Carriers | Modulation | Capacity | Bandwidth |
|---|---|---|---|---|
| Synch Band | 24 tones (2 synch tones at each end and 10 guard tones at each end) | BPSK | n/a | 216 kHz |
| Payload Data | 480 (240 DS0+ channels) | 32 QAM | 19.2 MBPS | 4.32 MHz |
| IOC | 48 (2 every 20 data channels or 24 IOC channels) | BPSK | 384 kbps | 432 kHz |
| Intra-band guard | Remainder on each end | n/a | n/a | 1.032 MHz (516 kHz at each end) |
| Composite Signal | 552 | n/a | n/a | 6.0 MHz |

Guard bands are provided at each end of the spectrum to allow for selectivity filtering after transmission and prior to reception. A total of 240 telephony data channels are included throughout the band, which accommodates a net data rate of 19.2 Mbps. This capacity was designed to account for additive ingress, thereby retaining enough support to achieve concentration of users to the central office. The IOC channels are interspersed throughout the band to provide redundancy and communication support to narrowband receivers located in the HISUs. The IOC data rate is 16 kbps (two BPSK tones at the symbol rate of 8 kHz frames per second). Effectively, an IOC is provided for every 10 payload data channels. An ISU, such as an HISU, that can only see a single IOC channel would be forced to retune if the IOC channel is corrupted. However, an ISU which can see multiple IOC channels can select an alternate IOC channel in the event that the primary choice is corrupt, such as for an MISU.

The synchronization channels are duplicated at the ends of the band for redundancy, and are offset from the main body of usable carriers to guarantee that the synchronization channels do not interfere with the other used channels. The synchronization channels were previously described and will be further described below. The synchronization channels are operated at a lower power level than the telephony payload channels to also reduce the effect of any interference to such channels. This power reduction also allows for a smaller guard band to be used between the synchronization channels and the payload telephony channels. One synchronization or redundant synchronization channels may also be implemented within the telephony channels as opposed to being offset therefrom. In order to keep them from interfering with the telephony channels, the synchronization channels may be implemented using a lower symbol rate. For example, if the telephony channels are implemented at an 8 kHz symbol rate, the synchronization channels could be implemented at a 2 kHz symbol rate and also may be at a lower power level.

The ISUs 100 are designed to receive a subband, as shown in FIG. 16, of the total aggregate 6 MHz spectrum. As an example, the HISU 68 will preferably detect only 22 of the available 552 channels. This implementation is primarily a cost/power savings technique. By reducing the number of channels being received, the sample rate and associated processing requirements are dramatically reduced and can be achievable with common conversion parts on the market today.

A given HISU 68 is limited to receiving a maximum of 10 DS0s out of the payload data channels in the HISU receiver's frequency view. The remaining channels will be used as a guard interval. Furthermore, in order to reduce the power/cost requirements, synthesizing frequency steps will be limited to 198 kHz. An IOC channel is provided for as shown in FIG. 16 so that every HISU 68 will always see an IOC channel for control of the HISU 68 via HDT 12. The MISU 66 is designed to receive 13 subbands, as shown in FIG. 16, or 130 of the 240 available DS0s. Again, the tuning steps will be limited to 198 kHz to realize an efficient synthesizer implementation. These are preferred values for the HISU 68 and MISU 66, and it will be noted by one skilled in the art that many of the values specified herein can be varied without changing the scope or spirit of the invention as defined by the accompanying claims.

As known to one skilled in the art, there may be need to support operation over channels in a bandwidth of less than 6 MHz. With appropriate software and hardware modifications of the system, such reconfiguration is possible as would be apparent to one skilled in the art. For example, for a 2 MHz system, in the downstream, the HDT 12 would generate the channels over a subset of the total band. The HISUs are inherently narrowband and would be able to tune into the 2 MHz band. The MISUs supporting 130 channels, would receive signals beyond the 2 MHz band. They would require reduction in filter selectivity by way of a hardware modification. An eighty (80) channel MISU would be able to operate with the constraints of the 2 MHz. system. In the upstream, the HISUs would generate signals within the 2 MHz band and the MISUs transmit section would restrict the information generated to the narrower band. At the HDT, the ingress filtering would provide sufficient selectivity against out of band signal energy. The narrowband system would require synchronization bands at the edges of the 2 MHz band.

As previously described, acquisition of signal parameters for initializing the system for detection of the downstream information is performed using the downstream synchronization channels. The ISUs use the carrier, amplitude, timing recovery block 166 to establish the downstream synchronization of frequency, amplitude and timing for such detection of downstream information. The downstream signal constitutes a point to multi-point topology and the OFDM waveform arrives at the ISUs via a single path in an inherently synchronous manner. In the upstream direction, each ISU 100 must be initialized and activated through a process of upstream synchronization before an HDT 12 can enable the ISU 100 for transmission. The process of upstream synchronization for the ISUs is utilized so that the waveform from distinct ISUs combine to a unified waveform at the HDT. The upstream synchronization process, portions of which were previously described, involves various steps. They include: ISU transmission level adjustment, upstream multicarrier symbol alignment, carrier frequency adjustment, and round trip path delay adjustment. Such synchronization is performed after acquisition of a 6 MHz band of operation.

Generally, with respect to level adjustment, the HDT 12 calibrates the measured signal strength of the upstream transmission received from an ISU 100 and adjusts the ISU 100 transmit level so that all ISUs are within acceptable threshold. Level adjustment is performed prior to symbol alignment and path delay adjustment to maximize the accuracy of these measurements.

Generally, symbol alignment is a necessary requirement for the multicarrier modulation approach implemented by the MCC modems 82 and the ISU modems 101. In the downstream direction of transmission, all information received at the ISU 100 is generated by a single CXMU 56, so the symbols modulated on each multicarrier are automatically phase aligned. However, upstream symbol alignment at the MCC modem 82 receiver architecture varies due to the multipoint to point nature of the HFC distribution network 11 and the unequal delay paths of the ISUs 100. In order to have maximum receiver efficiency, all upstream symbols must be aligned within a narrow phase margin. This is done by providing an adjustable delay path parameter in each ISU 100 such that the symbol periods of all channels received upstream from the different ISUs are aligned at the point they reach the HDT 12.

Generally, round trip path delay adjustment is performed such that the round trip delay from the HDT network interface 62 to all ISUs 100 and back to the network interface 62 from all the ISUs 100 in a system must be equal. This is required so that signaling multiframe integrity is preserved throughout the system. All round trip processing for the telephony transport section has a predictable delay with the exception of the physical delay associated with signal propagation across the HFC distribution network 11 itself. ISUs 100 located at close physical distance from the HDT 12 will have less round trip delay than ISUs located at the maximum distance from the HDT 12. Path delay adjustment is implemented to force the transport system of all ISUs to have equal round trip propagation delay. This also maintains DS1 multiframe alignment for DS1 channels transported through the system, maintaining in-band channel signaling or robbed-bit signaling with the same alignment for voice services associated with the same DS1.

Generally, carrier frequency adjustment must be performed such that the spacing between carrier frequencies is such as to maintain orthogonality of the carriers. If the multicarriers are not received at the MCC modem 82 in orthogonal alignment, interference between the multicarriers may occur. Such carrier frequency adjustment can be performed in a manner like that of symbol timing or amplitude adjustment or may be implemented on the ISU as described previously above.

In the initialization process, when the ISU has just been powered up 2710, the ISU 100 has no knowledge of which downstream 6 MHz frequency band it should be receiving in. This results in the need for the acquisition of 6 MHz band in the initialization process. Until an ISU 100 has successfully acquired a 6 MHz band for operation, it implements a "scanning" approach to locate its downstream frequency band. Generally, a local processor of the CXSU controller 102 of ISU 100 starts with a default 6 MHz receive frequency band somewhere in the range from 625 to 850 MHz. The ISU 100 waits for a period of time, for example 100 milliseconds, in each 6 MHz band to look for a valid 6 MHz acquisition command which matches a unique identification number for the ISU 100 after obtaining a valid synchronization signal; which unique identifier may take the form of or be based on a serial number of the ISU equipment. If a valid 6 MHz acquisition command or valid synchronization command is not found in that 6 MHz band, the CXSU controller 102 looks at the next 6 MHz band and the process is repeated. In this manner, as explained further below, the HDT 12 can tell the ISU 100 which 6 MHz band it should use for frequency reception and later which band for frequency transmission upstream.

The process of initialization and activation of ISUs, as generally described above, and tracking or follow-up synchronization is further described below. This description is written using an MISU 66 in conjunction with a CXSU controller 102 but is equally applicable to any ISU 100 implemented with an equivalent controller logic. The coax master card logic (CXMC) 80 is instructed by the shelf controller unit (SCNU) 58 to initialize and activate a particular ISU 100. The SCNU uses an ISU designation number to address the ISU 100. The CXMC 80 correlates the ISU designation number with an equipment serial number, or unique identifier, for the equipment. No two ISU equipments shipped from the factory possess the same unique identifier. If the ISU 100 has never before been initialized and activated in the current system database, the CXMC 80 chooses a personal identification number (PIN) code for the ISU 100 being initialized and activated. This PIN code is then stored in the CXMC 80 and effectively represents the "address" for all communications with that ISU 100 which will follow. The CXMC 80 maintains a lookup table between each ISU designation number, the unique identifier for the ISU equipment, and the PIN code. Each ISU 100 associated with the CXMU 56 has a unique PIN address code assignment. One PIN address code will be reserved for a broadcast feature to all ISUs, which allows for the HDT to send messages to all initialized and activated ISUs 100.

The CXMC 80 sends an initialization and activation enabling message to the MCC modem 82 which notifies the MCC modem 82 that the process is beginning and the associated detection functionality in the MCC modem 82 should be enabled. Such functionality is performed at least in part by carrier, amplitude, timing recovery block 222 as shown in the MCC upstream receiver architecture of FIG. 26 and as previously discussed.

Figure 19:
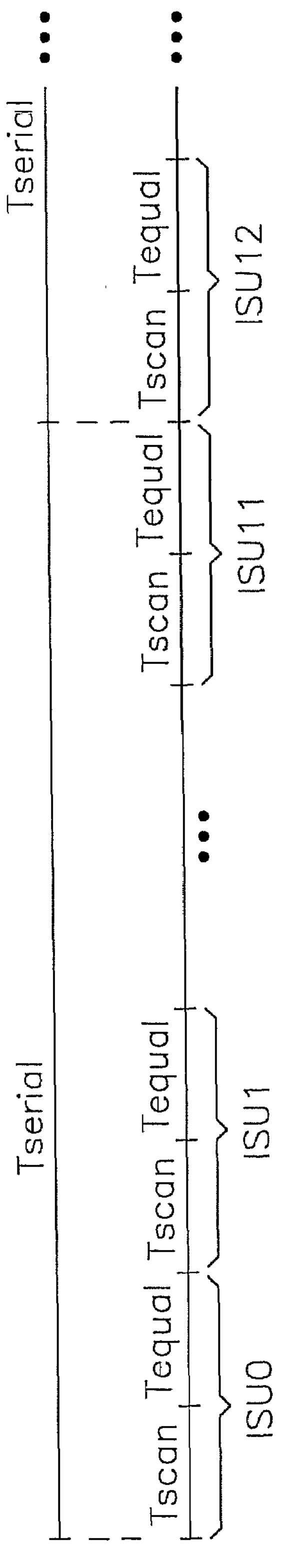
FIG. 19 shows a timing diagram of an identification and synchronization process.

The CXMC 80 transmits an identification message by the MCC modem 82 over all IOC channels of the 6 MHz band in which it transmits. The message includes a PIN address code to be assigned to the ISU being initialized and activated, a command indicating that ISU initialization and activation should be enabled at the ISU 100, the unique identifier for the ISU equipment, such as the equipment serial number, and cyclical redundancy checksum (CRC). The messages are sent periodically for a certain period of time, $T_{SCAN}$, which is shown as 6.16 seconds in FIG. 20 and which is also shown in FIG. 19. This period of time is the maximum time which an ISU can scan all downstream 6 MHz bands, synchronize, and listen for a valid identification message. The periodic rate, for example 50 ms, affects how quickly the ISU learns its identity. The CXMC 80 will never attempt to synchronize more than one ISU at a time, but will attempt to identify several ISUs during burst identification as described further below. A software timeout is implemented if an ISU does not respond after some maximum time limit is exceeded. This timeout must be beyond the maximum time limit required for an ISU to obtain synchronization functions.

During periodic transmission by CXMC 80, the ISU implements the scanning approach to locate its downstream frequency band. The local processor of the CXSU starts with a default 6 MHz receive frequency band somewhere in the range from 625 to 850 MHz. The ISU 100 selects the primary synchronization channel of the 6 MHz band and then tests for loss of synchronization after a period of time. If loss of synchronization is still present, the secondary synchronization channel is selected and tested for loss of synchronization after a period of time. If loss of synchronization is still present, then the ISU restarts selection of the synchronization channels on the next 6 MHz band which may be 1 MHz away but still 6 MHz in width. When loss of synchronization is not present on a synchronization channel then the ISU selects the first subband including the IOC and listens for a correct identification message. If a correct identification message is found which matches its unique identifier then the PIN address code is latched into an appropriate register. If a correct identification message is not found in the first subband on that IOC then a middle subband and IOC is selected, such as the 11th subband, and the ISU again listens for the correct identification message. If the message again is not correctly detected, then the ISU restarts on another 6 MHz band. The ISU listens for the correct identification message in a subband for a period of time equal to at least two times the CXMU transmission time, for example 100 ms when transmission time is 50 ms as described above. The identification command is a unique command in the ISU 100, as the ISU 100 will not require a PIN address code match to respond to such commands, but only a valid unique identifier and CRC match. If an un-initialized and un-activated ISU 100 receives an identification command from the CXMC 80 via the MCC modem 82 on an IOC channel, data which matches the unique identifier and a valid CRC, the CXSU 102 of the ISU 100 will store the PIN address code transmitted with the command and unique identifier. From this point on, the ISU 100 will only respond to commands which address it by its correct PIN address code, or a broadcast address code; unless, of course, the ISU is re-activated again and given a new PIN address code.

After the ISU 100 has received a match to its unique identifier, the ISU will receive the upstream frequency band command with a valid PIN address code that tells the ISU 100 which 6 MHz band to use for upstream transmission and the carrier or tone designations for the upstream IOC channel to be used by the ISU 100. The CXSU controller 102 interprets the command and correctly activates the ISU modem 101 of the ISU 100 for the correct upstream frequency band to respond in. Once the ISU modem 101 has acquired the correct 6 MHz band, the CXSU controller 102 sends a message command to the ISU modem 101 to enable upstream transmission. Distributed loops utilizing the carrier, amplitude, and timing recovery block 222 of the MCC modem upstream receiver architecture of the HDT 12 is used to lock the various ISU parameters for upstream transmission, including amplitude, carrier frequency, symbol alignment, and path delay.

The HDT is then given information on the new ISU 2712 and provides downstream commands 2714 for the various parameters to the subscriber ISU unit. The ISU begins transmission in the upstream 2720 and the HDT 12 locks to the upstream signal 2730. The HDT 12 derives an error indicator 2732 with regard to the parameter being adjusted and commands 2734 the subscriber ISU to adjust such parameter. The adjustment of error is repeated 2736 in the process until the parameter for ISU transmission is locked to the HDT 12.

More specifically, after the ISU 100 has acquired the 6 MHz band for operation, the CXSU 102 sends a message command to the ISU modem 101 and the ISU modem 101 transmits a synchronization pattern on a synchronization channel in the primary synchronization band of the spectral allocation as shown in FIGS. 13-18. The upstream synchronization channels which are offset from the payload data channels as allocated in FIGS. 13-18 include both a primary and a redundant synchronization channel such that upstream synchronization can still be accomplished if one of the synchronization channels is corrupted. The HDT monitors one channel for every ISU.

The MCC modem 82 detects a valid signal and performs an amplitude level measurement on a received signal from the ISU. The synchronization pattern indicates to the CXMC 80 that the ISU 100 has received the activation and initialization and frequency band commands and is ready to proceed with upstream synchronization. The amplitude level is compared to a desired reference level. The CXMC 80 determines whether or not the transmit level of the ISU 100 should be adjusted and the amount of such adjustment. If level adjustment is required, the CXMC 80 transmits a message on the downstream IOC channel instructing the CXSU 102 of the ISU 100 to adjust the power level of the transmitter of the ISU modem 101. The CXMC 80 continues to check the receive power level from the ISU 100 and provides adjustment commands to the ISU 100 until the level transmitted by the ISU 100 is acceptable. The amplitude is adjusted at the ISU as previously discussed. If amplitude equilibrium is not reached within a certain number of iterations of amplitude adjustment or if a signal presence is never detected utilizing the primary synchronization channel then the same process is used on the redundant synchronization channel. If amplitude equilibrium is not reached within a certain number of iterations of amplitude adjustment or if a signal presence is never detected utilizing the primary or redundant synchronization channels then the ISU is reset.

Figure 25:
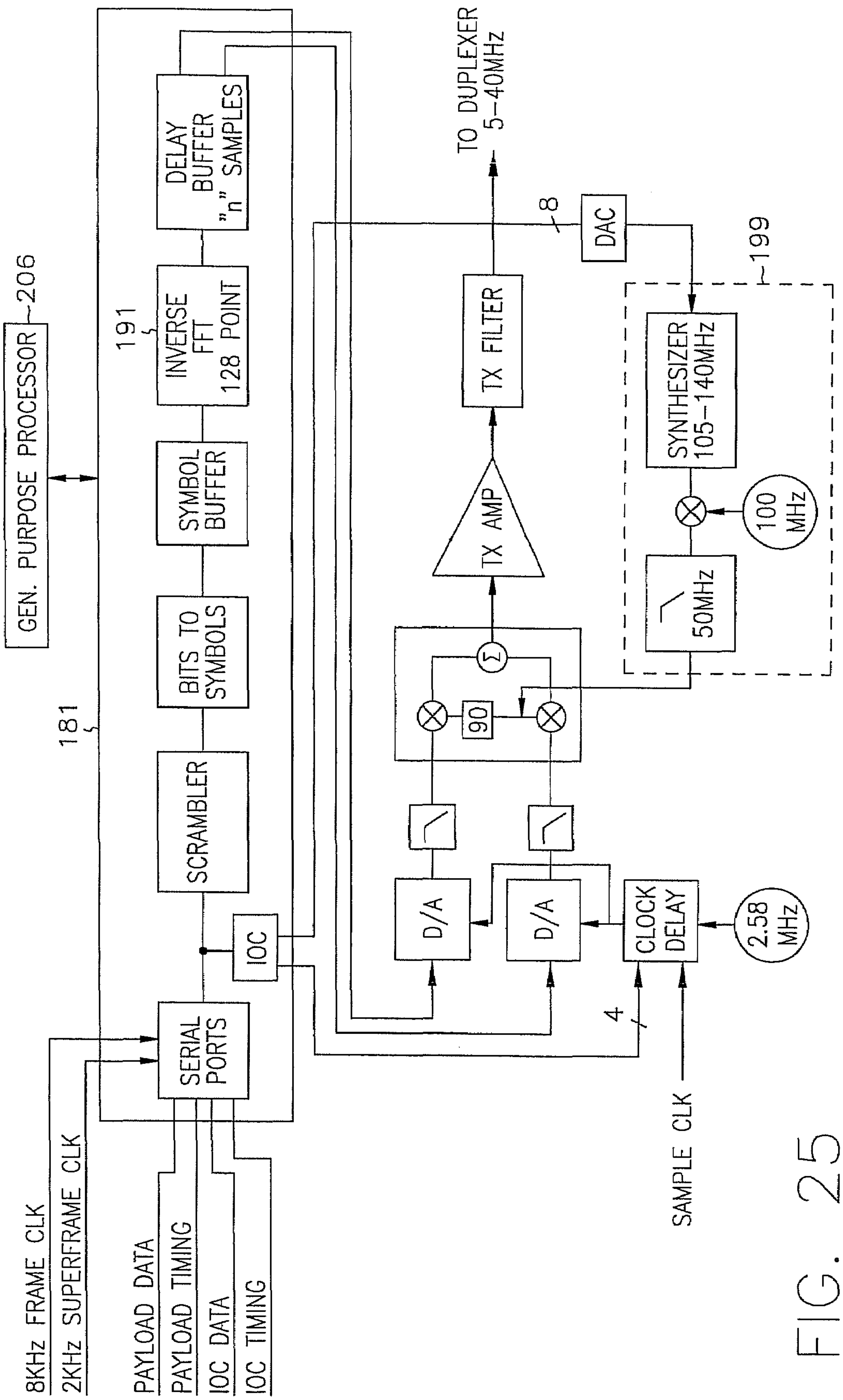
FIG. 25 is a block diagram of a CXTU upstream transmission architecture associated with the CXTU downstream receiver architecture of FIG. 22.

Once transmission level adjustment of the ISU 100 is completed and has been stabilized, the CXMC 80 and MCC modem 82 perform carrier frequency locking. The MCC modem 82 detects the carrier frequency as transmitted by the ISU 100 and performs a correlation on the received transmission from the ISU to calculate a carrier frequency error correction necessary to orthogonally align the multicarriers of all the upstream transmissions from the ISUs. The MCC modem 82 returns a message to the CXMC 80 indicating the amount of carrier frequency error adjustment required to perform frequency alignment for the ISU. The CXMC 80 transmits a message on a downstream IOC channel via the MCC modem 82 instructing the CXSU 102 to adjust the transmit frequency of the ISU modem 101 and the process is repeated until the frequency has been established to within a certain tolerance for the OFDM channel spacing. Such adjustment would be made via at least the synthesizer block 195 (FIGS. 24 and 25).

If frequency locking and adjustment is accomplished on the ISU as previously described, then this frequency adjustment method is not utilized.

To establish orthogonality, the CXMC 80 and MCC modem 82 perform symbol alignment. The MCC modem 82 detects the synchronization channel modulated at a 8 kHz frame rate transmitted by the ISU modem 101 and performs a hardware correlation on the receive signal to calculate the delay correction necessary to symbol align the upstream ISU transmission from all the distinct ISUs 100. The MCC modem 82 returns a message to the CXMC 80 indicating the amount of delay adjustment required to symbol align the ISU 100 such that all the symbols are received at the HDT 12 simultaneously. The CXMC 80 transmits a message in a downstream IOC channel by the MCC modem 82 instructing the CXSU controller 102 to adjust the delay of the ISU modem 101 transmission and the process repeats until ISU symbol alignment is achieved. Such symbol alignment would be adjusted via at least the clock delay 196 (FIGS. 24 and 25). Numerous iterations may be necessary to reach symbol alignment equilibrium and if it is not reached within a predetermined number of iterations, then the ISU may again be reset.

Simultaneously with symbol alignment, the CXMC 80 transmits a message to the MCC modem 82 to perform path delay adjustment. The CXMC 80 sends a message on a downstream IOC channel via the MCC modem 82 instructing the CXSU controller 102 to enable the ISU modem 101 to transmit another signal on a synchronization channel which indicates the multiframe (2 kHz) alignment of the ISU 100. The MCC modem 82 detects this multiframe alignment pattern and performs a hardware correlation on the pattern. From this correlation, the modem 82 calculates the additional symbol periods required to meet the round trip path delay of the communication system. The MCC modem 82 then returns a message to the CXMC 80 indicating the additional amount of delay which must be added to meet the overall path delay requirements and the CXMC then transmits a message on a downstream IOC channel via the MCC modem 82 instructing the CXSU controller 102 to relay a message to the ISU modem 101 containing the path delay adjustment value. Numerous iterations may be necessary to reach path delay equilibrium and if it is not reached within a predetermined number of iterations, then the ISU may again be reset. Such adjustment is made in the ISU transmitter as can be seen in the display delay buffer "n" samples 192 of the upstream transmitter architectures of FIGS. 24 and 25. Path delay and symbol alignment may be performed at the same time, separately or together using the same or different signals sent on the synchronization channel.

Until the ISU is initialized and activated, the ISU 100 has no capability of transmitting telephony data information on any of the 480 tones or carriers. After such initialization and activation has been completed, the ISUs are within tolerance required for transmission within the OFDM waveform and the ISU is informed that transmission is possible and upstream synchronization is complete.

Figure 28:
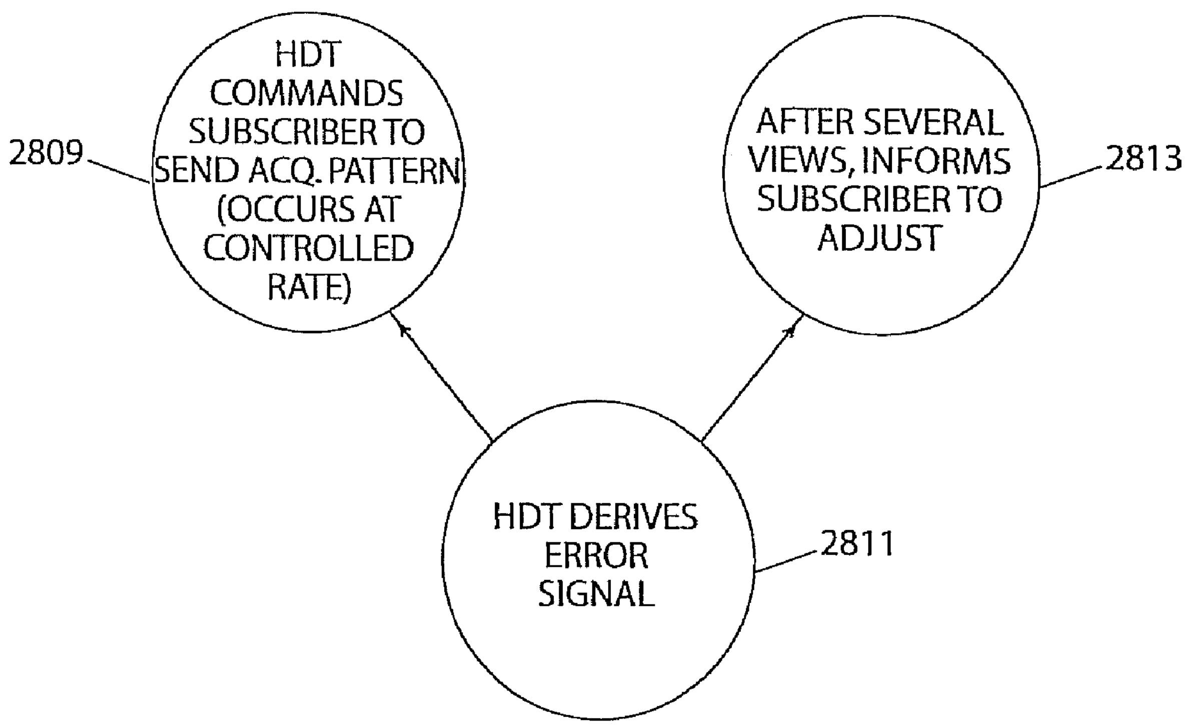
FIG. 28 is a flow diagram of a tracking distributed loop architecture routine for use with the system of FIG. 1.

After an ISU 100 is initialized and activated for the system, follow-up synchronization or tracking may be performed periodically to keep the ISUs calibrated within the required tolerance of the OFDM transport requirements. The follow-up process is implemented to account for drift of component values with temperature. If an ISU 100 is inactive for extreme periods of time, the ISU can be tuned to the synchronization channels and requested to update upstream synchronization parameters in accordance with the upstream synchronization process described above. Alternatively, if an ISU has been used recently, the follow-up synchronization or tracking can proceed over an IOC channel. Under this scenario, as generally shown in FIG. 28, the ISU 100 is requested to provide a signal over an IOC channel by the HDT 12, 2800. The HDT 12 then acquires and verifies that the signal is within the tolerance required for a channel within the OFDM waveform 2811. If not, then the ISU is requested to adjust such errored parameters 2813. In addition, during long periods of use, ISUs can also be requested by the HDT 12 to send a signal on an IOC channel or a synchronization channel for the purpose of updating the upstream synchronization parameters.

In the downstream direction, the IOC channels transport control information to the ISUs 100. The modulation format is preferably differentially encoded BPSK, although the differential aspect of the downstream modulation is not required. In the upstream direction, the IOC channels transport control information to the HDT 12. The IOC channels are differentially BPSK modulated to mitigate the transient time associated with the equalizer when sending data in the upstream direction. Control data is slotted on a byte boundary (500 μs frame). Data from any ISU can be transmitted on an IOC channel asynchronously; therefore, there is the potential for collisions to occur. As there is potential for collisions, detection of collisions on the upstream IOC channels is accomplished at a data protocol level. The protocol for handling such collisions may, for example, include exponential back-off by the ISUs. As such, when the HDT 12 detects an error in transmission, a retransmission command is broadcast to all the ISUs such that the ISUs retransmit the upstream signal on the IOC channel after waiting a particular time; the wait time period being based on an exponential function.

One skilled in the art will recognize that upstream synchronization can be implemented allowing for multi-point to point transmission using only the symbol timing loop for adjustment of symbol timing by the ISUs as commanded by the HDT. The frequency loop for upstream synchronization can be eliminated with use of high quality local free running oscillators in the ISUs that are not locked to the HDT. In addition, the local oscillators at the ISUs could be locked to an outside reference. The amplitude loop is not essential to achieve symbol alignment at the HDT.

In the process described above with respect to initialization and activation, including upstream synchronization, if for some reason communication is lost between a large number of ISUs 100 and the HDT 12, after a period of time these ISUs 100 will require initialization and activation once again. Such a case may arise when a fiber is cut and users of multiple ISUs 100 are left without service. As initialization and activation is described above, only one ISU 100 would be initialized and activated at one time. The time frame for initialization and activation of multiple ISUs 100 in this manner is shown in FIG. 19.

In FIG. 19, each ISU 100 is initialized, as previously described, by identification of the ISU and acquisition by the ISU of the 6 MHz band for downstream transmission during a scanning period $T_{SCAN}$, which is the time period needed for the ISU to scan all of the downstream bands listening for a matching identification message. In one embodiment, $T_{SCAN}$ is equal to 6.16 seconds. Of course this time period is going to be dependant on the number of bands scanned, the time period necessary for synchronizing on the downstream synchronization channels, and the time required to acquire an IOC channel within the band.

Further, as shown in FIG. 19, after each ISU has acquired a downstream and upstream 6 MHz band, upstream synchronization is then performed during a time period $T_{EQUAL}$. $T_{EQUAL}$ may be defined as the period in which an ISU should have received all messages from the CXMC 80 finishing the upstream synchronization process as described above, with a reasonable amount of iterations to accomplish such synchronization. At the very least, this time period is the time period necessary to accomplish symbol timing such that symbols received from various ISUs 100 at the HDT 12 are orthogonal. This time period would be increased if amplitude, frequency and path delay synchronization is also performed as described above. Therefore, the time period necessary to serially initialize and activate twelve ISUs, $T_{SERIAL}$, as shown in FIG. 19 would be equal to $12T_{SCAN}+12T_{EQUAL}$.

Figure 20:
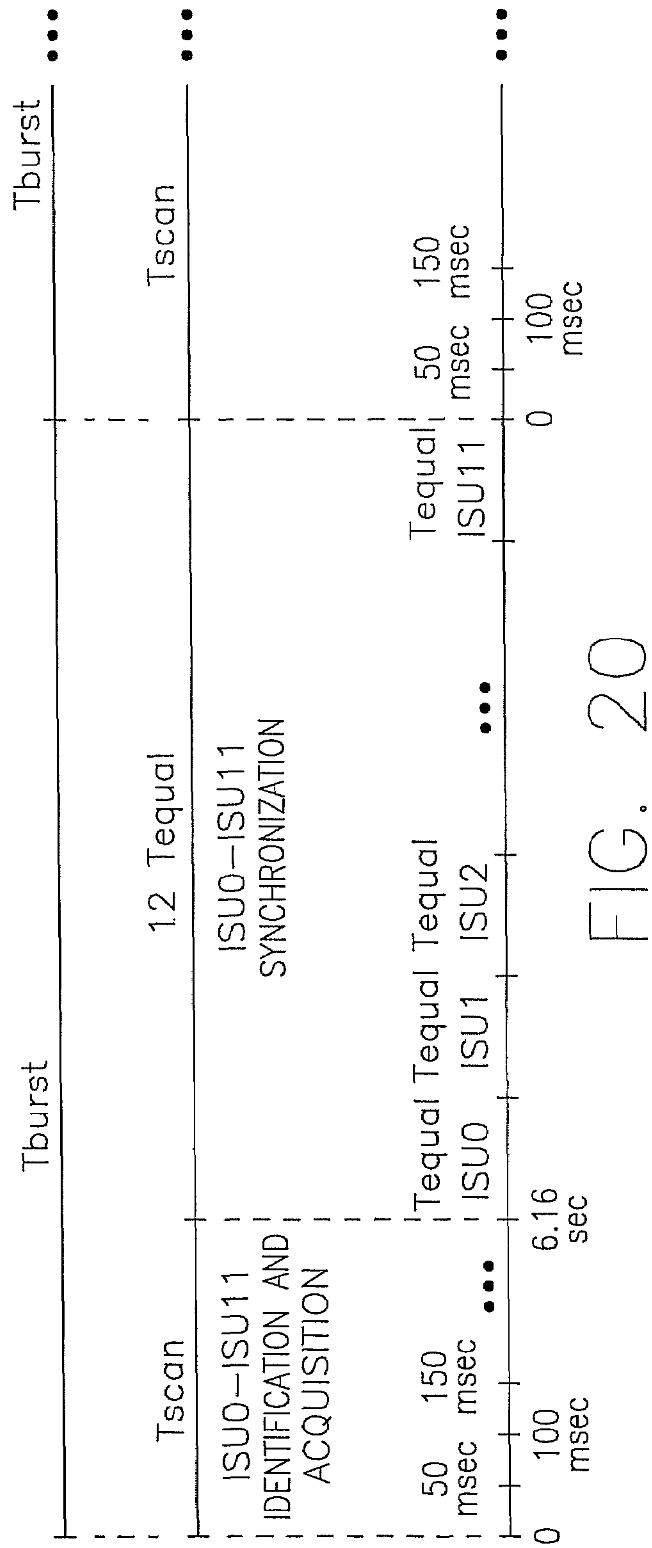
FIG. 20 shows a timing diagram of a burst identification and synchronization process.

With a burst identification process as shall be described with respect to FIG. 20, the time period for initializing and activating twelve ISUs 100 can be substantially reduced. This results in more ISUs 100 being activated more quickly and more users once again serviced in a shorter period of time. In the process of burst identification as shown by the timing diagram of FIG. 20, the identification and acquisition of multiple ISUs 100 is performed in parallel instead of being performed serially as described above.

The periodicity of the identification messages sent by the CXMC 80 during initialization and acquisition, when performed during normal operating conditions when ISUs 100 are serially initialized, is designed to present a light load of traffic on the IOC channel but yet to allow a reasonable identification duration. This periodicity duration is, for example, 50 milliseconds. For the system to be able to handle both situations, serial identification and burst identification, this periodicity is kept the same. However, in burst identification, the IOC channel traffic load is not important because the service of all the ISUs 100 receiving communication via one of the CXMCs 80 utilizing the IOC channels has been terminated such as by the cut fiber. Therefore, during burst identification the IOC channels can be loaded more heavily and identification messages for multiple ISUs 100 utilizing such IOC channels are transmitted on the IOC channels at the same periodicity as during serial identification, but the phase for the identification messages is different for each ISU.

Due to the period, and utilization of the IOC channels for the identification messages during burst identification, there is a limit on the number of identification messages which may be transmitted during one $T_{SCAN}$ period. If the periodicity is 50 milliseconds and the use of the IOC channel for a single identification message is 4 milliseconds, only twelve ISUs 100 may be identified during one $T_{SCAN}$ period during burst identification. As described below with further reference to FIG. 20, if the number of ISUs 100 desired to be burst identified is greater than twelve, then multiple groups of burst identifications are serially performed.

One skilled in the art will recognize that the specified numbers for time periods are for illustration only and that the present invention is not limited to such specified time periods. For example, the periodicity may be 100 ms and the number of ISUs identified during burst identification may be 24. Many different time periods may be specified with corresponding changes made to the other times periods specified. Further, burst identification may be accomplished having a periodicity different than that for serial identification.

As shown by the timing diagram of FIG. 19, a single burst initialization and activation of twelve inactive ISUs 100 can be accomplished in the time period $T_{BURST}$ which is equal to $T_{SCAN}+12T_{EQUAL}$. This is an $11T_{SCAN}$ difference from the process carried out serially. During the $T_{SCAN}$ period, identification messages for all twelve ISUs 100 being initialized are transmitted on the IOC channels for a CXMC 80. The twelve identification messages are each sent once during each 50 millisecond period. The phase of each message is however different. For example, identification message for ISU0 may be sent at time 0 and then again at 50 ms, whereas the identification message for ISU1 may be sent at time 4 milliseconds and then again at 54 milliseconds and so forth.

After the ISUs 100 being initialized have been identified and acquisition of the downstream 6 MHz band has occurred during $T_{SCAN}$, then upstream synchronization is performed in a serial manner with respect to each ISU identified during $T_{SCAN}$. The upstream synchronization for the ISUs is performed during the time period equal to $12T_{EQUAL}$. The CXMC 80 would start the upstream synchronization process in the same manner as described above for each ISU identified in a serial manner. The CXMC 80 sends to the ISU the upstream transmission band in which the ISU being synchronized is to transmit within and enables the upstream synchronization process to begin. The upstream synchronization process for an ISU has been described in detail above. If an upstream transmission band is not received and upstream synchronization is not enabled for an ISU during the $12T_{EQUAL}$ time period, then the ISU is reset at the end of the 12 $T_{EQUAL}$ period by a period of time equal to $T_{SCAN}+12$ $T_{EQUAL}$ to possibly perform upstream synchronization in the next 12 $T_{EQUAL}$ period. Once a burst identification period, $T_{BURST}$, is completed, the process may be started over again in a second $T_{BURST}$ period as shown in FIG. 20 if additional ISUs 100 are to be initialized and activated.

Figure 47:
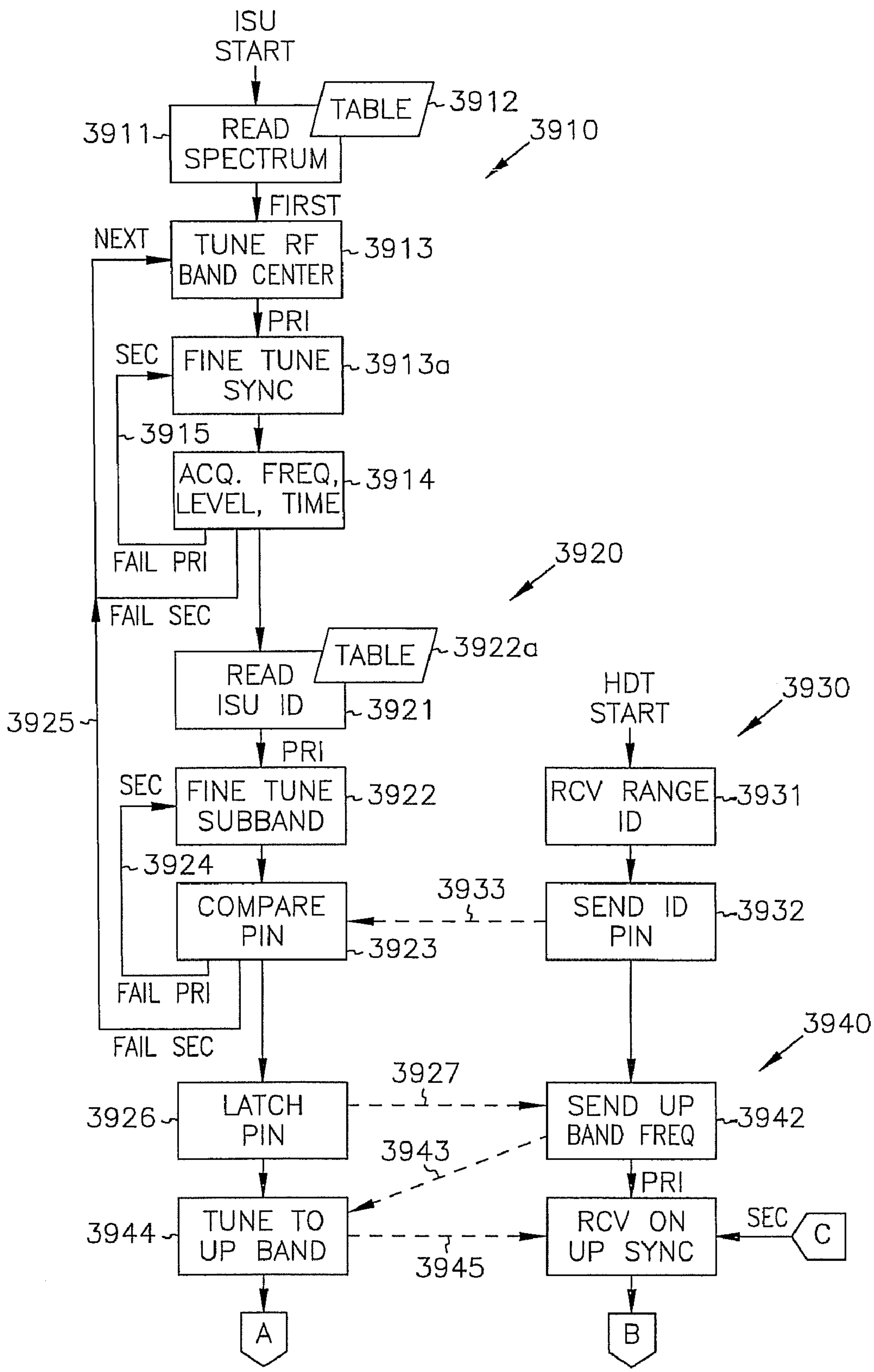
FIGS. 47, 48 are flow diagrams of an acquisition distributed loop routine for use with another embodiment of the system of FIG. 1.
Figure 48:
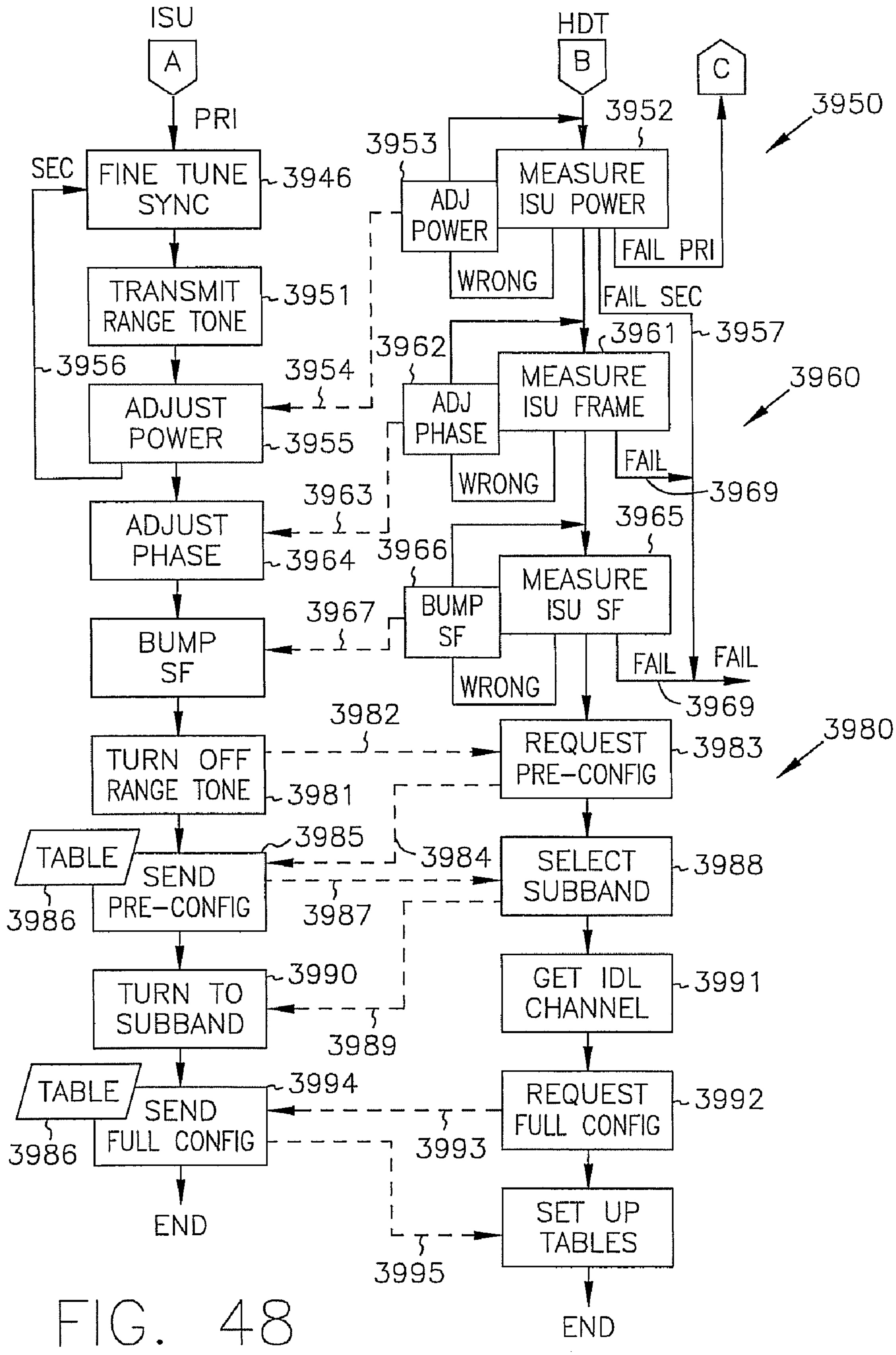

FIGS. 47 and 48 describe a control loop distributed through the system for acquiring and tracking an ISU, according to another embodiment of the invention. Loop 3900 shows steps executed by the ISU 66 or 68 at the left, and those executed by HDT 12 at the right. Messages between these two units are shown as horizontal dashed lines; the IOC channels carry these messages. Steps 3910 prepare the ISU to communicate with the HDT. Step 3911 reads a pre-stored internal table 3912 indicating frequencies of the valid RF downstream bands, along with other information. Next, step 3913 tunes the ISUs' narrow-band receive modem to the center of the first 6 MHz band in table 3912. Step 3913*a* then fine-tunes it to one of the two sync channels in that band; assume that this "primary" channel is the one at the lower end of the downstream part of the band shown in FIG. 13. Step 3914 acquires the amplitude and frequency of this sync tone. Briefly, equalizer 172, FIG. 22 or 23, is adjusted to bring the out put of the FFT to about 12 dB below its upper limit. Recovery block 166 measures the time for ten frames of the sync tone, and compares it to the 1.25 ms correct time interval; the frequency of synthesizer 157 is then adjusted accordingly. Rough timing is satisfactory at this point, because the control messages used below are simple low-frequency binary-keyed signals. If sync cannot be acquired, exit 3915 causes block 3913*a* to retune to a secondary sync tone of the same 6 MHz band, the upper downstream tone of FIG. 13. If the ISU also fails to synchronize to the secondary tone, exit 3916 causes block 3913 to tune to the center of the next 6 MHz band in table 3912 and attempt synchronization again. If all bands have been tried, block 3913 continues to cycle through the bands again. When step 3914 has acquired a lock, steps 3920 listen for messages from the HDT. Step 3921 reads an internal predetermined manufacturer's serial number which uniquely identifies that ISU, and compresses it into a shorter, more convenient format. Step 3922 fine-tunes the ISU modem to a designated primary subband, such as subband 0 in FIG. 16.

Concurrently, steps 3930 begin a search for the new ISU. Step 3931 receives an operator "ranging" command to connect an ISU having a particular serial number. Step 3932 then continuously broadcasts a "PIN message" 3933 on all IOC channels; this message contains the compressed form of the ISU serial number and a shorter personal identification number (PIN) by which that ISU will be known. Step 3923 in the ISU continuously receives all PIN messages, and attempts to match the transmitted compressed serial number with the number from table 3922*a*. If it fails to do so after a period of time, exit 3924 caused step 3922 to retune to another designated subband, such as subband 23 in FIG. 13, and try again. If no appropriate PIN message is received on the secondary subband, exit 3925 returns to step 3913 to switch to another 6 MHz band. When step 3923 receives the correct PIN message, step 3926 latches the PIN into the ISU to serve henceforth as its address within the system. In some implementations, the full serial number or other unique identifier of the physical ISU could serve directly as an address. However, this number occupies many bytes; it would be wasteful to transmit it every time a message is addressed to the ISU, or even to use it for ranging. Its compressed form, two bytes long, serves as a hash code which is practical to transmit in the continuous messages 3933. The PIN is only one byte long, since addresses need be unique only within each 6 MHz band, and are practical to use for identifying the ISU whenever the HDT needs to communicate with it. Message 3927 informs the HDT that the ISU will respond to its PIN.

Steps 3940 set up the upstream communications from the ISU to the HDT. After 3941 receives PIN confirmation 3927, step 3942 sends a designation of the upstream frequency band to the ISU as an IOC message 3943. This frequency may have been specified by the operator in step 3931, or may have been generated by the HDT itself. Step 3944 tunes the ISU modem to this 6 Mhz band, and returns a confirmation 3945. Step 3946 then fine-tunes to the primary upstream sync channel of that band, such as the lower one in FIG. 13. Step 3947 enables an HDT receiver on the designated band. Steps 3950 adjust the transmitted power of the ISU in the upstream direction; in a multipoint-to-point-system, the power levels of all ISUs must track each other in order to ensure orthogonality of the entire signal received by the modem of FIG. 26. Step 3951 transmits a ranging tone at an initial power level from the ISU on this sync channel, which is sometimes called a ranging channel. At the HDT, step 3952 measures the received power level, and block 3953 sends an IOC message 3954, causing step 3955 at the ISU to adjust the power of its transmitter 200, FIG. 24, if necessary. If this cannot be done, message 3956 causes step 3946 to retune to a secondary ranging channel, such as the higher upstream sync tone of FIG. 13, and causes the step 3947 to enable the secondary channel at the HDT. If this loop also fails, exit 3957 reports a hard failure to the system logic.

Blocks 3960 align the symbol or frame timing between the ISU and the HDT. Step 3961 measures the phase of the ISUs' ranging tone with respect to the sync tone that the HDT is sending to all ISUs at all times. FIG. 11 shows this signal, labeled "8 kHz frame clk" in FIG. 24. Step 3962 sends messages 3963 as necessary to cause the ISU modem to adjust the timing of its ranging tone, in step 3964. When this has completed, block 3965 detects whether or not groups of four frames are aligned correctly as between HDT and ISU; this grouping delineates boundaries of IOC messages, which are four frames long. The sync tones continually repeat a differential BPSK pattern of 1010 0101 0101 0101 over a period of 16 frames; that is, each bit occupies 125 microseconds, the duration of one frame. Thus, the space between the fourth and fifth bit, and between the sixteenth and first, can mark the multiframe boundaries. If alignment is incorrect, step 3966 sends message 3967, causing the ISU to bump the phase of its "2 kHz superframe clk," FIG. 24. If step 3961 or step 3965 cannot reach the correct phase after a certain number of steps, fail exits 3969 report a hard failure.

Steps 3980 complete the induction of the new ISU into the system. Step 3981 turns off the ranging tone at the ISU, tells the HDT at 3982 that it is locked in, and returns to the subband at which it was operating in step 3944. Step 3983 requests preliminary configuration or capability data from the ISU, in message 3984, whereupon step 3985 reads an internal table 3986 containing parameters indicating capabilities such as whether the ISU can tune only odd or even channel numbers, and other physical limitations of that particular modem. When message 3987 has communicated these parameters, step 3988 selects a particular subband of 10 or 130 payload channels (for an HISU or an MISU respectively). Message 3989 causes step 3990 to tune the ISU to the proper subband. Meanwhile, the HDT is acquiring an IOC data-link (IDL) channel, as described hereinbelow, at step 3991. Step 3992 then sends message 3993 to the ISU, which reads the rest of the modem configuration and specifications from table 3986 at step 3994, and transmits them over the IDL channel at 3995. The HDT stores pertinent information concerning that ISU for future reference. The purpose of sending ISU data to the HDT is to accommodate various ISU models having greatly differing capabilities, and to allow continued use of legacy ISU equipment when the HDT has been upgraded to include additional capabilities.

During and after the process of FIGS. 47 and 48, the ISU receiving modem, FIG. 22 or 23, must track the acquired frequency and symbol timing of the HDT transmitting modem of FIG. 21. The practicalities of a multicarrier (MC) system impose requirements which are not obvious from experience with TDMA (time division multiple-access) and other conventional forms of bidirectional multipoint networks and systems, nor in point-to-multipoint ("broadcast") multicarrier networks. In TDMA and similar systems, slight errors in frequency and timing, and larger errors in amplitude, can be compensated by tracking the received signal. In a broadcast MC system, all carriers are synchronized at the head end, and can again be tracked at the receiver. In a bidirectional multipoint-to-point multicarrier system, however, the HDT receiver must see all channels as though they had been generated by a single source, because the HDT decodes all channels in an entire 6 MHz band as a single entity, with a single FFT. Even slight errors among the individual ISUs in their 10-channel and 130-channel subbands causes severe distortion and inter-symbol interference when the HDT FFT inverts the channels back into symbol strings for multiple DS0 channels. The errors to be controlled are frequency, symbol timing, and signal amplitude. Amplitude (power level) in particular has been found to be much more stringent than in previous systems.

Figure 49:
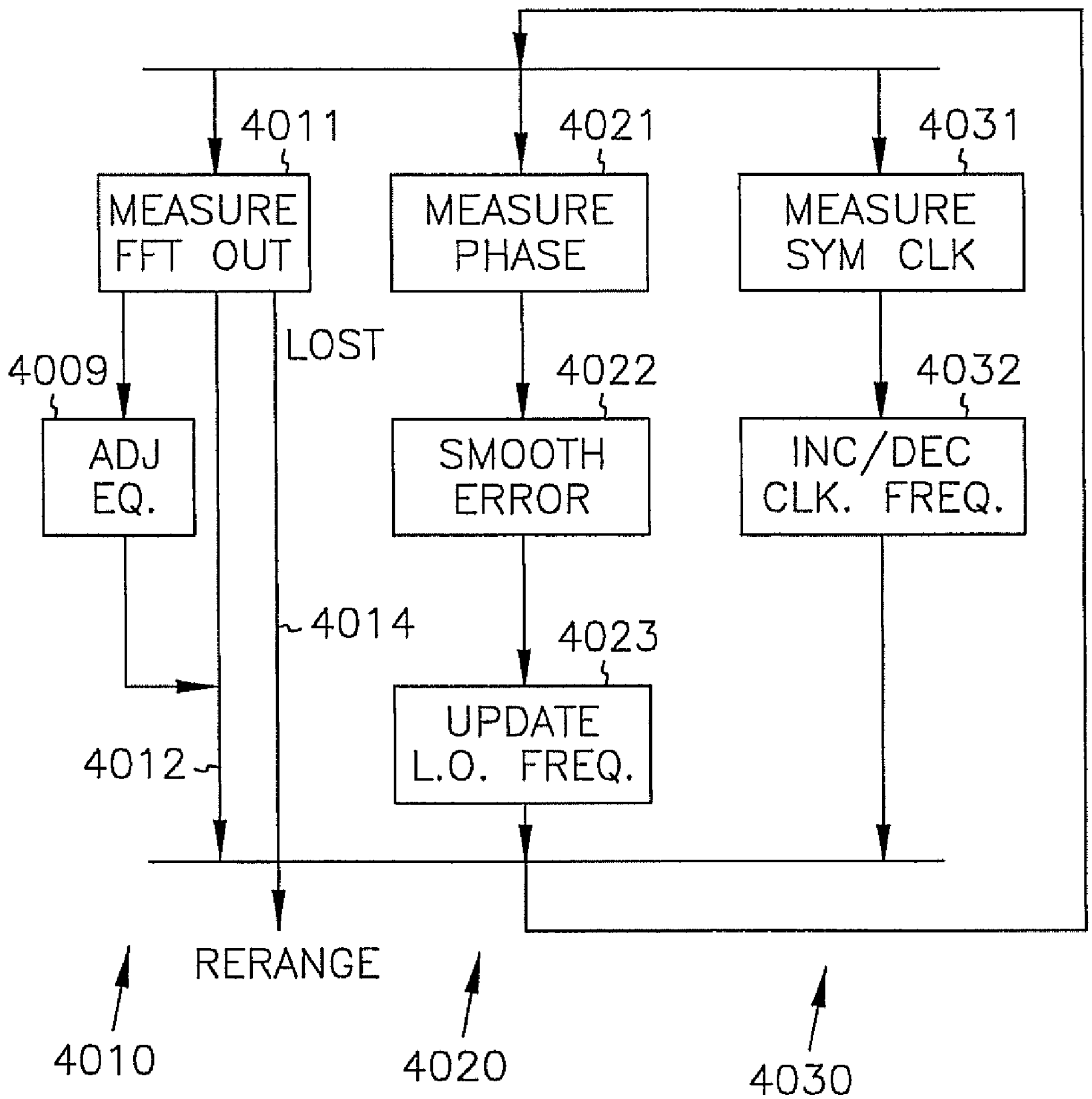
FIG. 49 is a flow diagram of a downstream tracking loop for use with the embodiment of FIGS. 47 and 48.

At all times after the ISU receiving modem FIG. 22 or 23 has acquired the signal of HDT transmitting modem FIG. 21, it must track gradual changes in frequency, phase, and symbol timing caused by drift and other changes in the plant. FIG. 49 shows a method 4000 for tracking these changes. Steps 4010, executed by unit 153, FIG. 22 or 155, FIG. 23, track the downstream power level to compensate for slow gain changes in the plant. Step 4011 measures an average signal level by known methods from the output of FFT 170 or 180. If it is correct, exit 4012 takes no action. If the error is wrong but within a predetermined threshold of the correct value, block 4013 adjusts a coefficient of equalizer 172 to return the signal level to its nominal value. If the signal level changes more than a certain amount, or if it changes rapidly enough, the signal has probably been lost entirely. In that case, exit 4014 exits tracking mode; it may reenter the ranging procedure of FIGS. 47 and 48, or it may merely signal an error to the HDT.

Steps 4020 track carrier frequency in unit 166, FIG. 22 or 23. An HISU modem of FIG. 23 receives a subband having ten payload channels and one IOC at the center, as shown in FIG. 16. When this narrowband modem is tuned to the subband, the sync tones are no longer within its frequency range. Therefore, step 4021 measures the phase of the IOC channel within the currently tuned subband, rather than the sync tone used in FIGS. 47 and 48. Step 4022 smoothes any phase error between the received carrier and the locally generated signal from generator 168, FIG. 22, to prevent jitter. The frame clocks of both the receiving modem FIG. 23 and the upstream transmitter FIG. 24 use this clock; that is, the clocks are locked together within the HISU modem. Step 4023 updates the frequency of a local oscillator in RF synthesizer 157. It should be noted here that the location of the IOC in the middle of the subband eliminates any offset phase error which otherwise must be compensated for. Steps 4020 may be the same for an MISU modem, FIG. 22; this modem has a 130-channel bandwidth, as shown in FIG. 16. The wider bandwidth of this modem includes multiple IOC tones for tracking. The modem may use one of them, preferably near the middle, or pairs of tones offset from the center of the subband.

Step 4030 tracks symbol timing. Step 4031 samples the frequency error between the received symbols and the local 8 kHz symbol sampling clock. If the sampling frequencies differ by more than about 2 ppm between the HDT and the ISU, the synthesized tones progressively depart from their bins at the receiving FFT until the equalizer can no longer track them. Step 4032 receives the sign of the sampling error from step 4031, and applies a small 0.5 ppm correction to the frame frequency. Process 4000 takes places in real time, in parallel with other processes.

After the upstream transmitting modem 101 portion shown in FIG. 24 has tuned to a subband in FIGS. 47 and 48, it and the upstream receiving modem 82 portion of FIG. 26 must continue to track in amplitude, frequency, and timing. The use of multicarrier (MC) technology imposes some requirements which are not obvious from experience with TDMA (time-division multiple access) or other bidirectional multipoint technologies, nor from point-to-multipoint (broadcast) MC networks and systems. In TDMA and similar systems, slight errors in frequency and timing, and larger errors in signal amplitude, can be compensated by tracking the signal at the receiver. In broadcast MC systems, all carriers are inherently synchronized at the head end, and can be tracked adequately at each receiver separately. In a bidirectional multipoint-to-point multicarrier plant, however, the head-end receiver sees all channels as though they had been generated by a single source, because the HDT decodes all channels in an entire 6 MHz band as a single orthogonal waveform, with a single FFT converter. Even slight errors among the various ISUs in their 10-channel and 130-channel subbands can cause severe distortion and inter-symbol interference when the FFT in modem 82 portion of FIG. 26 converts the channels back into bit strings for multiple DS0 channels. The parameters to be controlled are frequency, symbol timing, and signal amplitude or power level. Frequency and timing can be tracked in a manner similar to steps 4020 and 4030 of FIGS. 47 and 48. Amplitude, however, has been found to be more critical than in previous systems.

Figure 50:
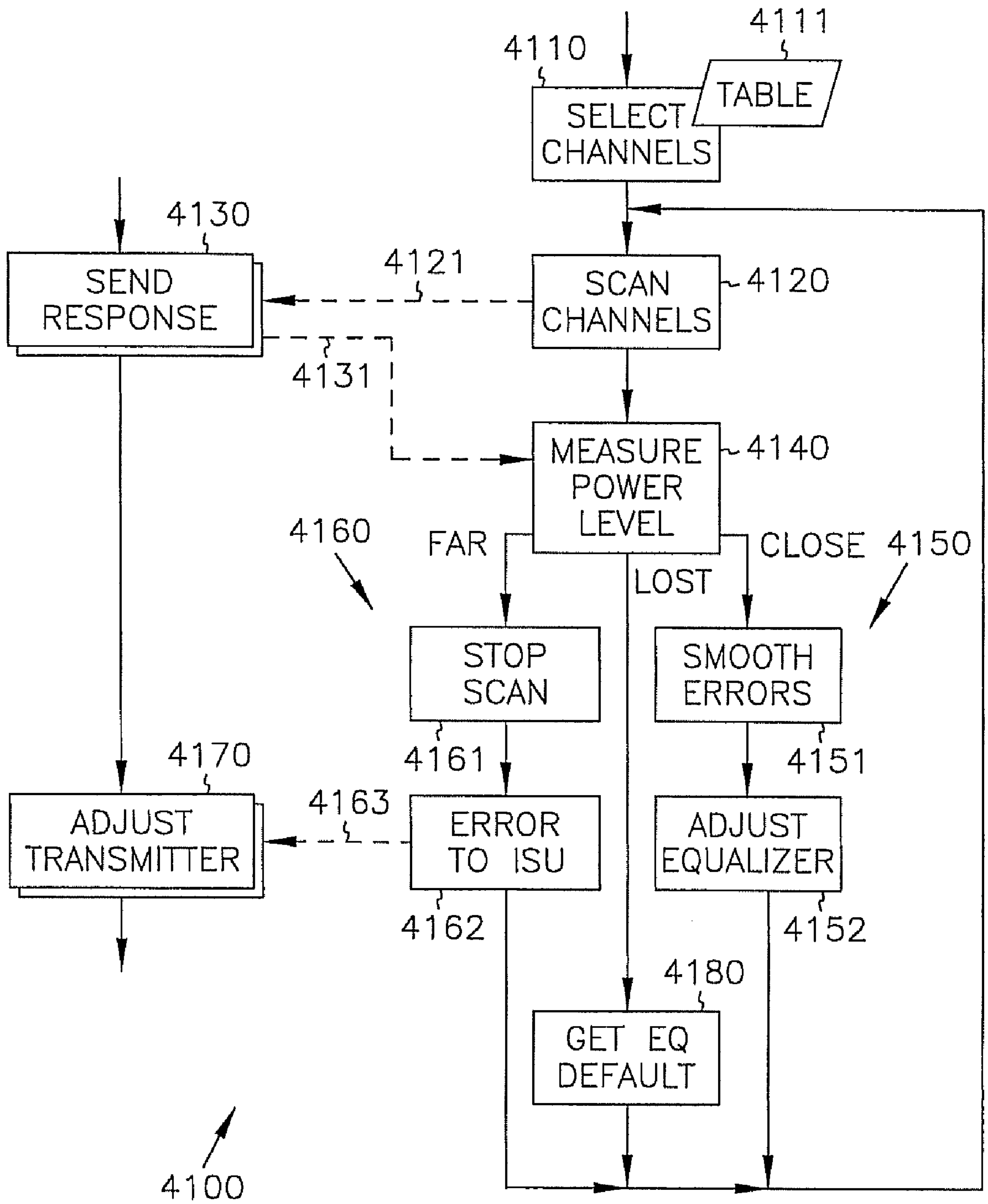
FIG. 50 is a flow diagram of an upstream tracking loop for use with the embodiment of FIGS. 47 and 48.

FIG. 50 depicts a method 4100 for tracking changes in the upstream channel signal amplitude. After FIGS. 47 and 48 have brought the ISU transmitting modem of FIG. 24 on line, its amplitude must be balanced with that of all other ISUs in the system. Again, if different upstream subbands were received by different hardware, or in a TDMA fashion, where amplitude tracking could be particularized in frequency and/or time, a conventional AGC circuit could track amplitude variations adequately. In the embodiment described, power variations greater than about 0.25 dB from one subband to another cause a significant amount of distortion and inter-symbol interference. In a physical system of, say, a 20 km radius, variations in the upstream signal level at the head end may vary by 20 dB or more for different ISU locations, and may additionally vary significantly over time because of temperature differences, channel loading, component aging, and many other factors. Conventional methods cannot achieve both the wide dynamic range and the high resolution required for an MC bidirectional multipoint-to-point system.

The steps in the left column of FIG. 50 are performed within each ISU; the HDT performs the steps on the right. Step 4110 selects a number of payload channels for monitoring from table 4111. The channels must include one channel from each separate ISU, but need not include more than one. An MISU thus needs time in only one of its 130 payload channels, a very low overhead. A 10-channel HISU subband, however, may require time in more than one of its 10 payload channels, because multiple HISUs can share the same subband. Of course, a powered-down ISU, or one having no upstream payload channels provisioned to it, need not participate in blocks 3940 of FIG. 47, because it does not transmit upstream at all. (It is alternatively possible to employ IOC channels instead of payload channels for this purpose. Although requiring less overhead, such use is generally much more complex to implement.)

After ranging procedure 3900 has acquired a correct initial power level, step 4120 performs a scan every 30 msec. for all the selected payload channels, as indicated by arrow 4121. Each ISU responds at 4130 by sending a message 4131 on its selected upstream channel when the scan reaches that channel. In step 4140, the HDT measures the received power level from each ISU separately. If the signal amplitude is within a certain range of its previous value, then steps 4150 compensate for the variation at the HDT. Step 4151 smoothes the errors over several scans, to prevent sudden jumps from a single glitch. Step 4152 then adjusts the coefficients of equalizer 214 in the upstream receiving portion, FIG. 26, of modem 82, FIG. 3, to compensate for the variation. This sequence compensates for small, slow variations at a high resolution; the equalizer steps are small and very linear.

Step 4140 may detect that the HDT equalizer is far from nominal, near the end of its range, say, 4 dB up or down from nominal, for an equalizer having a ±5 dB range of 0.25 dB steps. This condition might occur for a large number of accumulated small errors, or it could be caused by a sudden, major change in the system, such as a break in an optical fiber followed by an automatic switch to another fiber having a different length. Steps 4160 compensate for this condition at the transmitting (ISU) end, rather than at the receiving (HDT) end. The HDT then stops the channel scan at step 4161, and step 4162 sends an amplitude-error message 4163 over an IOC channel, addressed to the offending ISU. The message specifies the amount and direction of the compensation to be applied. The ISU applies this correction at step 4170 to vary the power output of its transmitter 200, FIG. 24. Conventional transmitter power controls, such as a PIN attenuator diode 201 in power amplifier 200, are typically relatively coarse and nonlinear, but they do possess a wide range of adjustment. DAC 203 receives IOC messages to control attenuator 201. To allow the head-end equalizer to track the changing power more easily, step 4162 applies the correction over a long period of time, for example, 4-5 sec/dB; but, if the monitored channel is the only channel connected to that ISU, the entire correction can be made in a single large step. Instead of controlling adjustment speed at the ISU, the head end may send individual timed IOC messages for multiple partial corrections; the downside is increased message traffic on the IOC channels. ISUs may come online and be powered down at odd times. To prevent a feckless attempt at correction when an ISU is powered down, or its signal has been lost for some other reason, step 4140 further detects a condition of substantially zero power received from the ISU. In that event, step 4180 sets the head-end equalizer to its default value and keeps it there.

Thus, power-leveling blocks 3950 take advantage of the characteristics of the system to adjust both ends in a way which achieves both high resolution and wide dynamic range. The digital control available in the head-end equalizer provides precision and linearity in tracking slow changes, and the analog control at the ISU provides a wide range, and still allows the head end to track out inaccuracies caused by its coarse and nonlinear nature.

Call processing in the communication system 10 entails the manner in which a subscriber is allocated channels of the system for telephony transport from the HDT 12 to the ISUs 100. The present communication system in accordance with the present invention is capable of supporting both call processing techniques not involving concentration, for example, TR-8 services, and those involving concentration, such as TR-303 services. Concentration occurs when there are more ISU terminations requiring service than there are channels to service such ISUs. For example, there may be 1,000 customer line terminations for the system, with only 240 payload channels which can be allocated to provide service to such customers. Where no concentration is required, such as for TR-8 operation, channels within the 6 MHz spectrum are statically allocated. Therefore, only reallocation of channels shall be discussed further below with regard to channel monitoring.

On the other hand, for dynamically allocated channels to provide concentration, such as for providing TR-303 services, the HDT 12 supports on-demand allocation of channels for transport of telephony data over the HFC distribution network 11. Such dynamic allocation of channels is accomplished utilizing the IOC channels for communication between the HDT 12 and the ISUs 100. Channels are dynamically allocated for calls being received by a customer at an ISU 100, or for calls originated by a customer at an ISU 100. The CXMU 56 of HDT 12, as previously discussed, implements IOC channels which carry the call processing information between the HDT 12 and the ISUs 100. In particular, the following call processing messages exist on the IOC channels. They include at least a line seizure or off-hook message from the ISU to the HDT; line idle or on-hook message from the ISU to the HDT; enable and disable line idle detection messages between the HDT and the ISUs.

Call processing in the communication system 10 entails the manner in which a subscriber is allocated channels of the system for telephony transport from the HDT 12 to the ISUs 100. The present communication system in accordance with the present invention is capable of supporting both call processing techniques not involving concentration, for example, TR-8 services, and those involving concentration, such as TR-303 services. Concentration occurs when there are more ISU terminations requiring service than there are channels to service such ISUs. For example, there may be 1,000 customer line terminations for the system, with only 240 payload channels which can be allocated to provide service to such customers. Where no concentration is required, such as for TR-8 operation, channels within the 6 MHz spectrum are statically allocated. Therefore, only reallocation of channels shall be discussed further below with regard to channel monitoring.

On the other hand, for dynamically allocated channels to provide concentration, such as for providing TR-303 services, the HDT 12 supports on-demand allocation of channels for transport of telephony data over the HFC distribution network 11. Such dynamic allocation of channels is accomplished utilizing the IOC channels for communication between the HDT 12 and the ISUs 100. Channels are dynamically allocated for calls being received by a customer at an ISU 100, or for calls originated by a customer at an ISU 100. The CXMU 56 of HDT 12, as previously discussed, implements IOC channels which carry the call processing information between the HDT 12 and the ISUs 100. In particular, the following call processing messages exist on the IOC channels. They include at least a line seizure or off-hook message from the ISU to the HDT; line idle or on-hook message from the ISU to the HDT; enable and disable line idle detection messages between the HDT and the ISUs.

For a call to a subscriber on the HFC distribution network 11, the CTSU 54 sends a message to the CXMU 56 associated with the subscriber line termination and instructs the CXMU 56 to allocate a channel for transport of the call over the HFC distribution network 11. The CXMU 56 then inserts a command on the IOC channel to be received by the ISU 100 to which the call is intended; the command providing the proper information to the CXSU 102 to alert the ISU 100 as to the allocated channel. When a call is originated by a subscriber at the ISU side, each ISU 100 is responsible for monitoring the channel units for line seizure. When line seizure is detected, the ISU 100 must communicate this change along with the PIN address code for the originating line to the CXMU 56 of the HDT 12 using the upstream IOC operation channel. Once the CXMU 56 correctly receives the line seizure message, the CXMU 56 forwards this indication to the CTSU 54 which, in turn, provides the necessary information to the switching network to set up the call. The CTSU 54 checks the availability of channels and allocates a channel for the call originated at the ISU 100. Once a channel is identified for completing the call from the ISU 100, the CXMU 56 allocates the channel over the downstream IOC channel to the ISU 100 requesting line seizure. When a subscriber returns on hook, an appropriate line idle message is sent upstream to the HDT 12 which provides such information to the CTSU 54 such that the channel can then be allocated again to support TR-303 services.

Idle channel detection can further be accomplished in the modem utilizing another technique. After a subscriber at the ISU 100 has terminated use of a data payload channel, the MCC modem 82 can make a determination that the previously allocated channel is idle. Idle detection may be performed by utilizing the equalization process by equalizer 214 (FIG. 26) which examines the results of the FFT which outputs a complex (I and Q component) symbol value. An error is calculated, as previously described herein with respect to equalization, which is used to update the equalizer coefficients. Typically, when the equalizer has acquired the signal and valid data is being detected, the error will be small. In the event that the signal is terminated, the error signal will increase, and this can be monitored by signal to noise monitor 305 to determine the termination of the payload data channel used or channel idle status. This information can then be utilized for allocating idle channels when such operation of the system supports concentration. The equalization process can also be utilized to determine whether an unallocated or allocated channel is being corrupted by ingress as shall be explained in further detail below with respect to channel monitoring.

The telephony transport system may provide for channel protection from ingress in several manners. Narrowband ingress is a narrowband signal that is coupled into the transmission from an external source. The ingress signal which is located within the OFDM waveform can potentially take the entire band offline. An ingress signal is (most likely) not orthogonal to the OFDM carriers, and under worst case conditions can inject interference into every OFDM carrier signal at a sufficient level to corrupt almost every DS0+ to an extent that performance is degraded below a minimum bit error rate.

One method provides a digitally tunable notch filter which includes an interference sensing algorithm for identifying the ingress location on the frequency band. Once located, the filtering is updated to provide an arbitrary filter response to notch the ingress from the OFDM waveform. The filter would not be part of the basic modem operation but requires the identification of channels that are degraded in order to "tune" them out. The amount of channels lost as a result of the filtering would be determined in response to the bit error rate characteristics in a frequency region to determine how many channels the ingress actually corrupted.

Another approach as previously discussed with respect to the ingress filter and FFT 112 of the MCC upstream receiver architecture of FIG. 26 is the polyphase filter structure. The cost and power associated with the filter are absorbed at the HDT 12, while supplying sufficient ingress protection for the system. Thus, power consumption at the ISUs 100 is not increased. The preferred filter structure involves two staggered polyphase filters as previously discussed with respect to FIGS. 31 and 32 although use of one filter is clearly contemplated with loss of some channels. The filter/transform pair combines the filter and demodulation process into a single step. Some of the features provided by polyphase filtering include the ability to protect the receive band against narrowband ingress and allow for scalable bandwidth usage in the upstream transmission. With these approaches, if ingress renders some channels unusable, the HDT 12 can command the ISUs to transmit upstream on a different carrier frequency to avoid such ingress.

The above approaches for ingress protection, including at least the use of digital tunable notch filters and polyphase filters, are equally applicable to point to point systems utilizing multicarrier transport. For example, a single MISU transporting to a single HDT may use such techniques. In addition, unidirectional multi-point to point transport may also utilize such techniques for ingress protection.

In addition, channel monitoring and allocation or reallocation based thereon may also be used to avoid ingress. External variables can adversely affect the quality of a given channel. These variables are numerous, and can range from electromagnet interference to a physical break in an optical fiber. A physical break in an optical fiber severs the communication link and cannot be avoided by switching channels, however, a channel which is electrically interfered with can be avoided until the interference is gone. After the interference is gone the channel could be used again.

Figure 40:
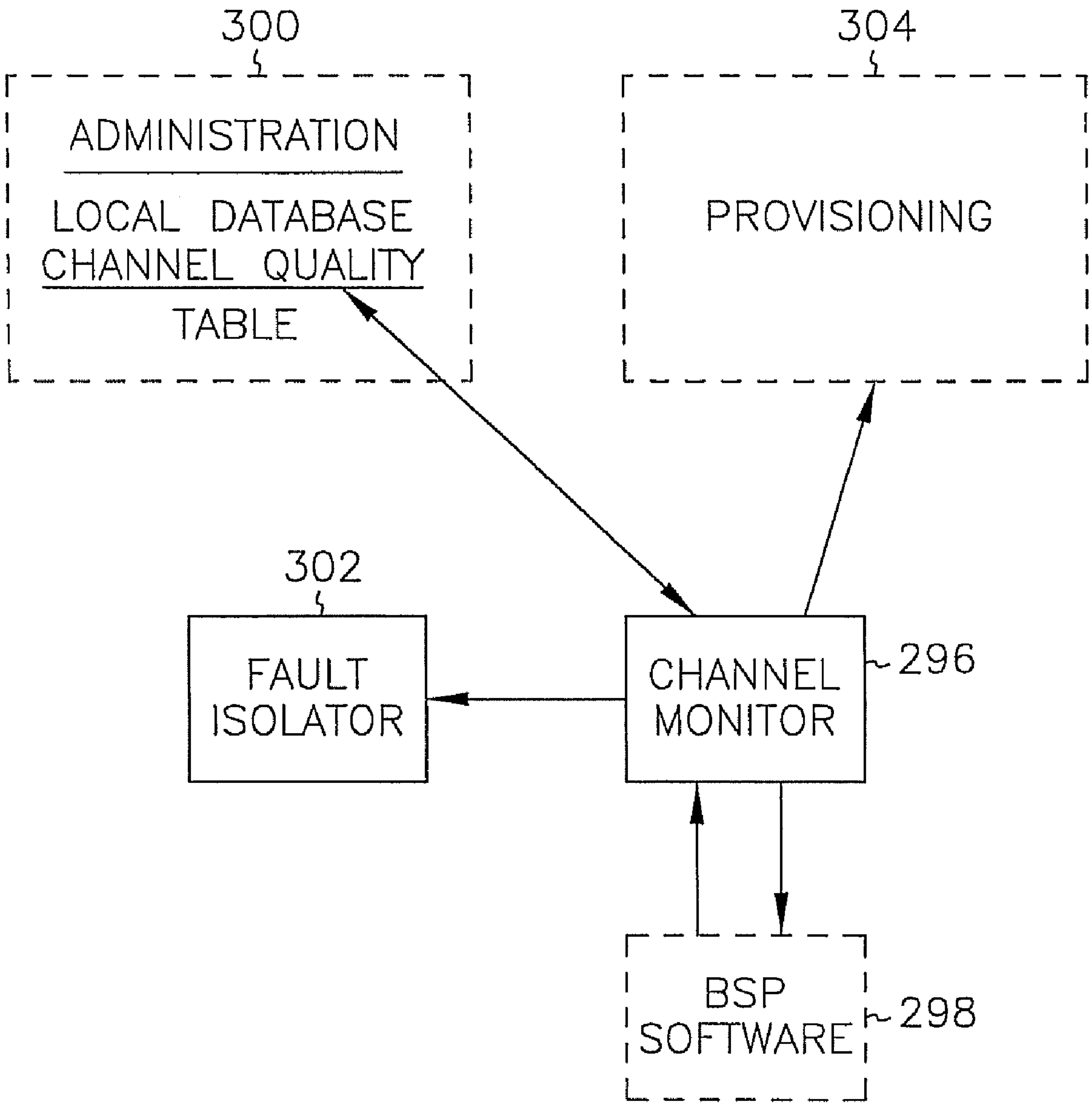
FIG. 40 is a block diagram for channel monitoring used in the system of FIG. 1.

Referring to FIG. 40, a channel monitoring method is used to detect and avoid use of corrupted channels. A channel monitor 296 is used to receive events from board support software 298 and update a channel quality table 300 in a local database. The monitor 296 also sends messages to a fault isolator 302 and to channel allocator 304 for allocation or reallocation. The basic input to the channel monitor is parity errors which are available from hardware per the DS0+ channels; the DS0+ channels being 10-bit channels with one of the bits having a parity or data integrity bit inserted in the channel as previously discussed. The parity error information on a particular channel is used as raw data which is sampled and integrated over time to arrive at a quality status for that channel.

Parity errors are integrated using two time frames for each of the different service types including POTS, ISDN, DDS, and DS1, to determine channel status. The first integration routine is based on a short integration time of one second for all service types. The second routine, long integration, is service dependent, as bit error rate requirements for various services require differing integration times and monitoring periods as seen in Table 4. These two methods are described below.

Figure 41:
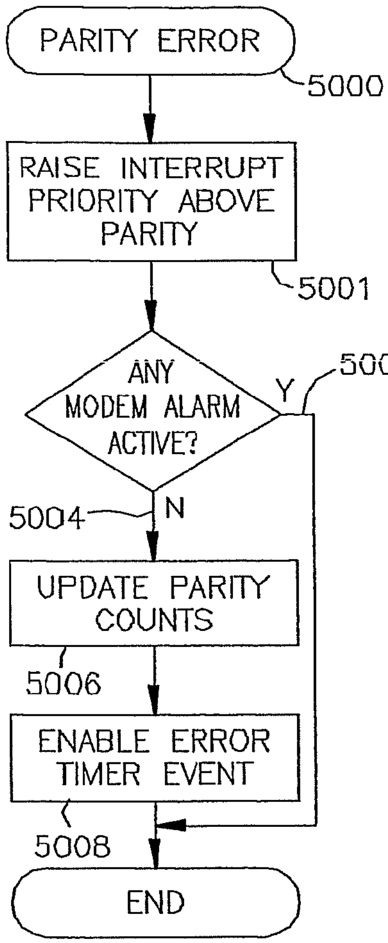
FIGS. 41, 42, 43 are flow diagrams for error monitor portions of channel monitor routines of FIG. 40.
Figure 42:
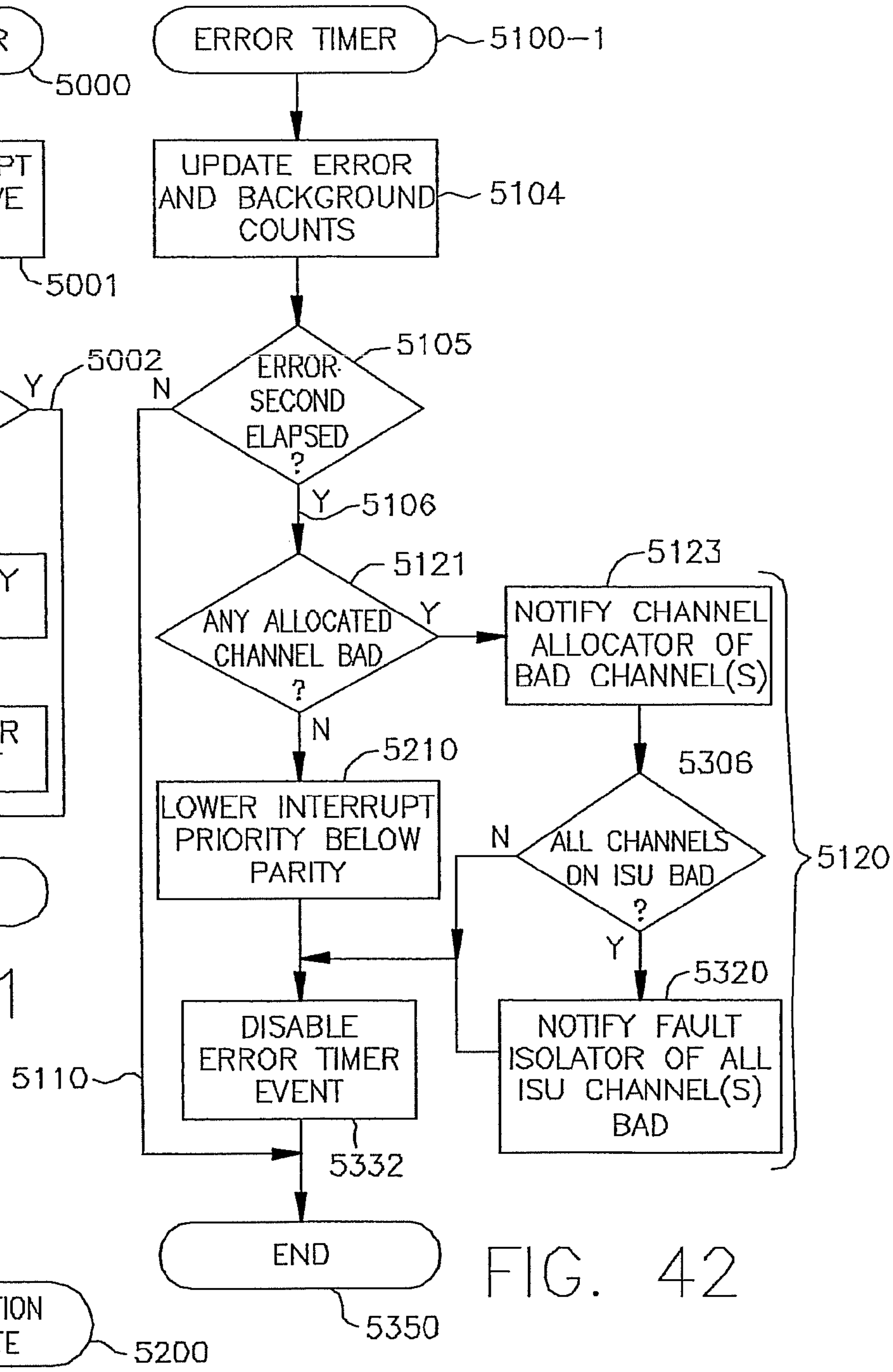
Figure 43:
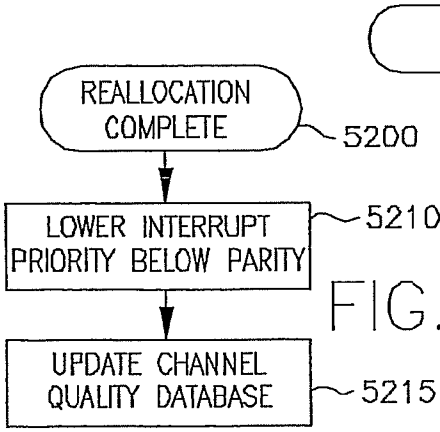

Referring to FIGS. 41, 42, and 43, the basic short integration operation is described. When a parity error 5000 of a channel is detected by the CXMU 56, a parity interrupt is disabled by setting the interrupt priority level above that of the parity interrupt 5001 (FIG. 41). If a modem alarm is received which indicates a received signal failure, parity errors will be ignored until the failure condition ends 5002. Thus, some failure conditions will supersede parity error monitoring. Such alarm conditions may include loss of signal, modem failure, and loss of synchronization. If a modem alarm is not active 5004, a parity count table is updated 5006 and an error timer event as shown in FIG. 42 is enabled (5008).

When the error timer event is enabled 5100, the channel monitor 296 enters a mode wherein parity error registers of the CXMU 56 are read every 10 milliseconds and error counts are summarized after a one second monitoring period 5105. Generally, the error counts are used to update the channel quality database 5334 and determine which (if any) channels require re-allocation. The channel quality table 300 of the database contains an ongoing record of each channel. The table organizes the history of the channels in categories such as: current ISU assigned to the channel, start of monitoring, end of monitoring, total error, errors in last day, in last week and in last 30 days, number of seconds since last error, severe errors in last day, in last week and in last 30 days, and current service type, such as ISDN, assigned to the channel.

As indicated in FIG. 41, after the parity interrupt is disabled and no active alarm exists, the parity counts are updated 5006 and the timer event is enabled 5008. The timer event (FIG. 42), as indicated above, includes a one second loop where the errors are monitored. As shown in FIG. 42, if the one second loop has not elapsed 5110, the error counts are continued to be updated 5104. When the second has elapsed 5106, the errors are summarized 5120. If the summarized errors over the one second period exceed an allowed amount indicating that an allocated channel is corrupted or bad 5121, as described below, channel allocator 304 is notified 5123 and ISU transmission is reallocated to a different channel. As shown in FIG. 43, when the reallocation has been completed 5200, the interrupt priority is lowered below parity 5210 so that channel monitoring continues and the channel quality database is updated 5215 concerning the actions taken. The reallocation task may be accomplished as a separate task from the error timer task or performed in conjunction with that task. For example, the reallocator 304 may be part of channel monitor 296.

Figure 44:
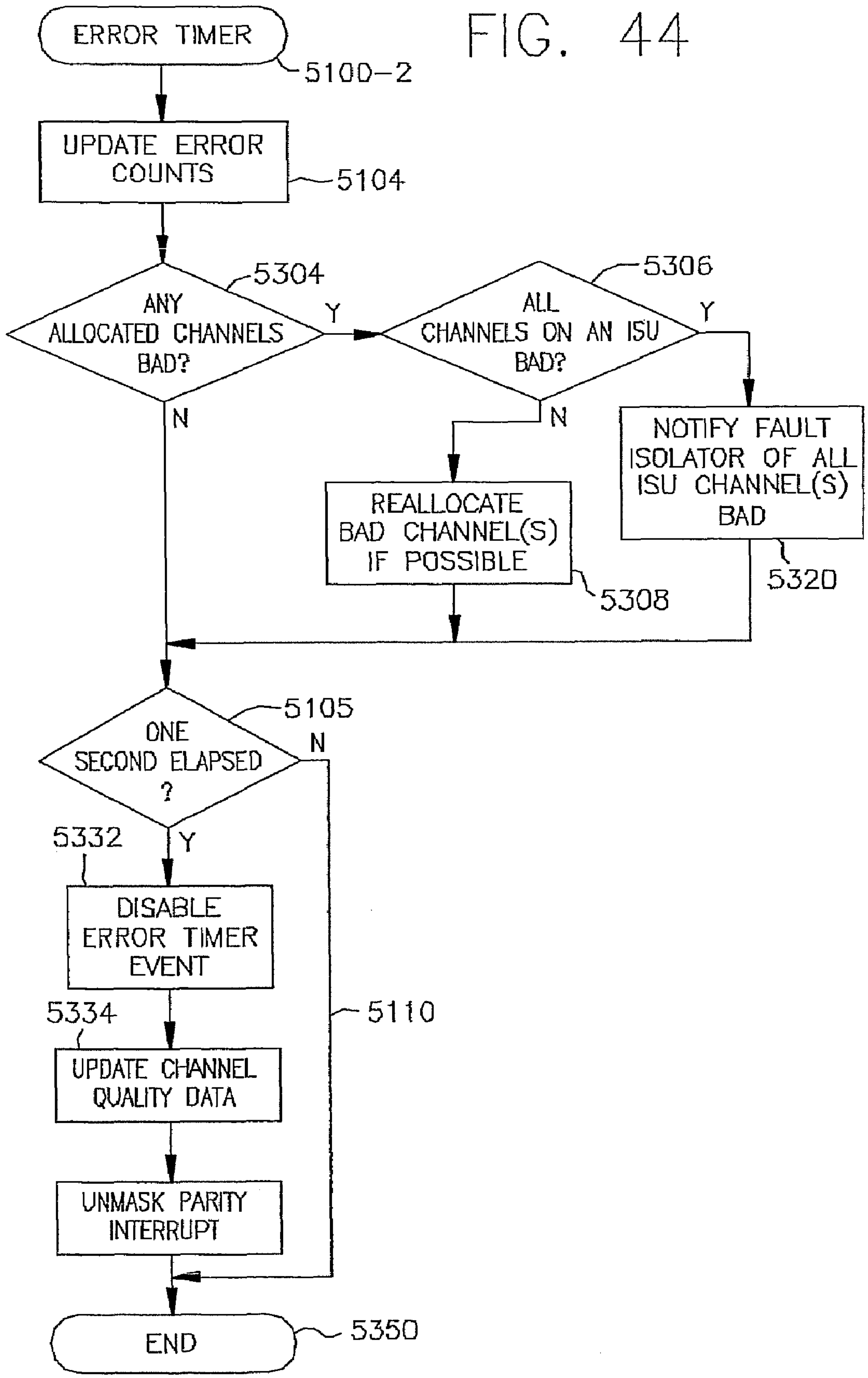
FIG. 44 is an alternate flow diagram for the diagram of FIG. 42.

As shown in FIG. 44 in an alternate embodiment of the error timer task 5110-2 of FIG. 42, channels can be determined to be bad 5304 before the one second has elapsed. This allows the channels that are determined to be corrupted during the initial portion of a one second interval to be quickly identified and reallocated 5308 without waiting for the entire one second to elapse.

Instead of reallocation, the power level for transmission by the ISU may be increased to overcome the ingress on the channel as indicated in FIG. 124. However, if the power level on one channel is increased, the power level of at least one other channel must be decreased as the overall power level must be kept substantially constant. If all channels are determined bad 5306, the fault isolator 302 is notified 5320 indicating the probability that a critical failure is present, such as a fiber break. If the summarized errors over the one second period do not exceed an allowed amount indicating that the allocated channel is not corrupted, the interrupt priority is lowered below parity 5210 and the error timer event is disabled 5332. Such event is then ended 5350 and the channels once again are monitored for parity errors per FIG. 41.

Two issues presented by periodic parity monitoring as described above must be addressed in order to estimate the bit error rate corresponding to the observed count of parity errors 1240 in a monitoring period of one second to determine if a channel is corrupted. The first is the nature of parity itself. Accepted practice for data formats using block error detection assumes that a block error represents one bit of error, even though the error actually represents a large number of data bits. Due to the nature of the data transport system, errors injected into modulated data are expected to randomize the data. This means that the average block error frame will consist of four (4) block error data bits (excluding the ninth bit). Since parity detects only odd bit errors, half of all block error frames are not detected by parity. Therefore, each parity (frame) error induced by transport interference represents an average of 8 (data) bits of error. Second, each monitoring parity error represents 80 frames of data (10 ms/125 μs). Since the parity error is latched, all errors will be detected, but multiple errors will be detected as one error.

The bit error rate (BER) used as a basis for determining when to reallocate a channel has been chosen as $10^{-3}$. Therefore, the acceptable number of parity errors in a one second interval that do not exceed $10^{-3}$ must be determined. To establish the acceptable parity errors, the probable number of frame errors represented by each observed (monitored) parity error must be predicted. Given the number of monitored parity errors, the probable number of frame errors per monitored parity error, and the number of bit errors represented by a frame (parity) error, a probable bit error rate can be derived 1242.

A statistical technique is used and the following assumptions are made:

1. Errors have a Poisson distribution, and
2. If the number of monitored parity errors is small (<10) with respect to the total number of "samples" (100), the monitored parity error rate (PER) reflects the mean frame error rate (FER).

Since a monitored parity error (MPE) represents 80 frames, assumption 2 implies that the number of frame errors (FEs) "behind" each parity error is equal to 80 PER. That is, for 100 parity samples at 10 ms per sample, the mean number of frame errors per parity error is equal to 0.8 times the count of MPEs in one second. For example, if 3 MPEs are observed in a one second period, the mean number of FEs for each MPE is 2.4. Multiplying the desired bit error rate times the sample size and dividing by the bit errors per frame error yields the equivalent number of frame errors in the sample. The number of FEs is also equal to the product of the number of MPEs and the number of FEs per MPE. Given the desired BER, a solution set is determined as illustrated below in Equation 1.

$$\left(MPE\frac{FE}{MPE}\right) = 0.8\ MPE \quad \text{(Equation 1)}$$

The Poisson distribution, as illustrated below in Equation 2, is used to compute the probability of a given number of FEs represented by a MPE (χ), and assumption 2, above, is used to arrive at the mean number of FEs per MPE (μ).

$$P(\chi) = \frac{e^{-\mu}\mu^{\chi}}{\chi!} \quad \text{(Equation 2)}$$

Since the desired bit error rate is a maximum, the Poisson equation is applied successively with values for χ of 0 up to the maximum number. The sum of these probabilities is the probability that no more than χ frame errors occurred for each monitored parity error.

The results for a bit error rate of $10^{-3}$ and bit errors per frame error of 1 and 8 are shown below in Table 3.

TABLE 3

Bit Error Rate Probability

| Bit Errors per Frame Error | Monitored Parity Errors | Maximum Frame Errors/Monitored Parity Error (χ) | Average Frame Errors/ Monitored Parity Error (μ) | Probability of BER <−10$^{-3}$ |
|---|---|---|---|---|
| 8 | 2 | 4 | 1.6 | 98% |
| | 3 | 3 | 2.4 | 78% |
| | 4 | 2 | 3.2 | 38% |
| 1 | 8 | 8 | 6.4 | 80% |
| | 9 | 7 | 7.2 | 56% |
| | 10 | 7 | 8.0 | 45% |

Using this technique, a value of 4 monitored parity errors detected during a one second integration was determined as the threshold to reallocate service of an ISU to a new channel. This result is arrived at by assuming a worst case of 8 bit errors per frame error, but a probability of only 38% that the bit error rate is better than $10^{-3}$. The product of the bit errors per fame, monitored parity errors and maximum frame errors per monitored parity error must be 64, for a bit error rate of $10^{-3}$ (64 errors in 64 k bits). Therefore, when the sampling of the parity errors in the error timer event is four or greater, the channel allocator is notified of a corrupted channel 1244. If the sampled monitored parity errors is less than 4, the interrupt priority is lowered below parity and the error timer event is disabled, ending the timer error event and the channels are then monitored as shown in FIG. 41.

Figure 45:
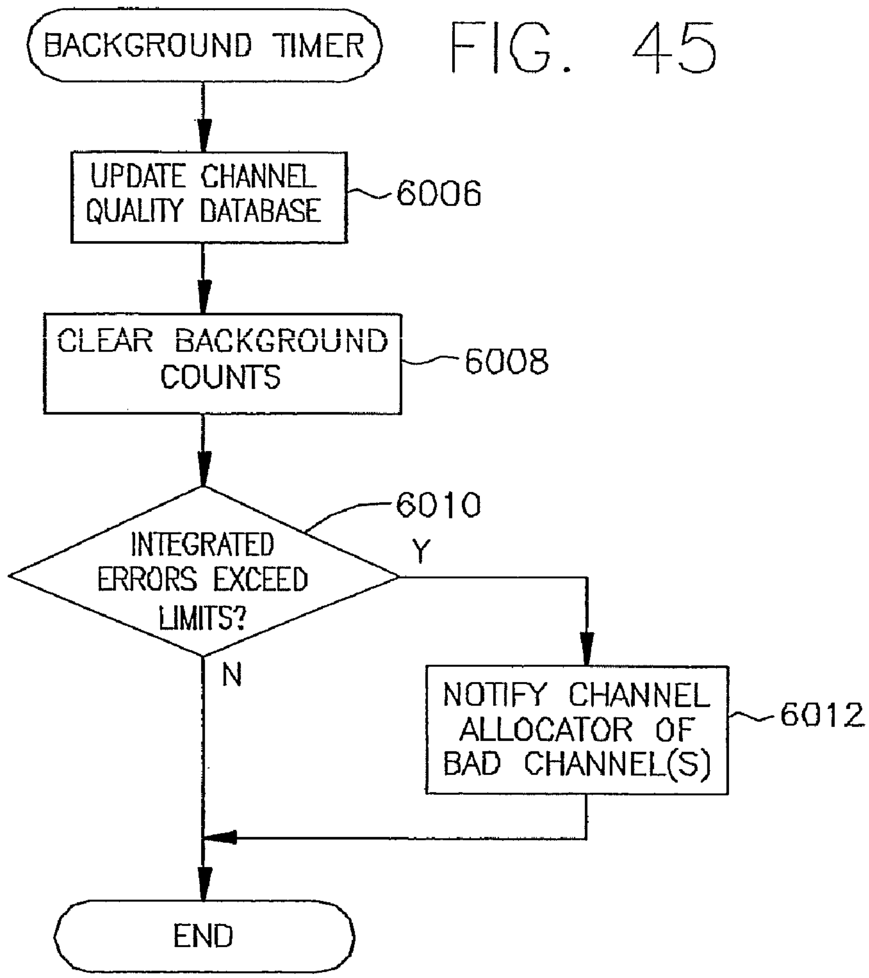
FIG. 45 is a flow diagram for a background monitor portion of the channel monitor routines of FIG. 40.

The following is a description of the long integration operation performed by the background monitor routine (FIG. 45) of the channel monitor 296. The background monitor routine is used to ensure quality integrity for channels requiring greater quality than the short integration $10^{-3}$ bit error rate. As the flow diagram shows in FIG. 45, the background monitor routine operates over a specified time for each service type, updates the channel quality database 6006 table 300, clears the background count 6008, determines if the integrated errors exceed the allowable limits determined for each service type 6010, and notifies the channel allocator 304 of bad channels as needed 6012.

In operation, on one second intervals, the background monitor updates the channel quality database 6006 table.

Updating the channel quality data table has two purposes. The first purpose is to adjust the bit error rate and number of errored seconds data of error free channels to reflect their increasing quality 1246. The second purpose is to integrate intermittent errors on monitored channels which are experiencing error levels too low to result in short integration time reallocation (less than 4 parity errors/second). Channels in this category have their BER and numbers of errored seconds data adjusted, and based on the data, may be re-allocated. This is known as long integration time re-allocation, and the default criteria for long integration time re-allocation for each service type are shown as follows in Table 4:

TABLE 4

| Service type: | Maximum BER: | Integration Time: | Errored seconds | Monitoring Period: |
|---|---|---|---|---|
| POTS | $10^{-3}$ | 1 second | | |
| ISDN | $10^{-6}$ | 157 seconds | 8% | 1 hour |
| DDS | $10^{-7}$ | 157 seconds | 0.5% | 1 hour |
| DS1 | $10^{-9}$ | 15,625 seconds | 0.04% | 7 hours |

Because POTS service does not require higher quality than $10^{-3}$, corrupted channels are sufficiently eliminated using the short integration technique and long integration is not required. As one example of long integration for a service type, the background monitor shall be described with reference to a channel used for ISDN transport. Maximum bit error rate for the channel may be $10^{-6}$, the number of seconds utilized for integration time is 157, the maximum number of errored seconds allowable is 8% of the 157 seconds, and the monitoring period is one hour. Therefore, if the summation of errored seconds is greater than 8% over the 157 seconds in any one hour monitoring period, the channel allocator 304 is notified of a bad channel for ISDN transport.

Figure 46:
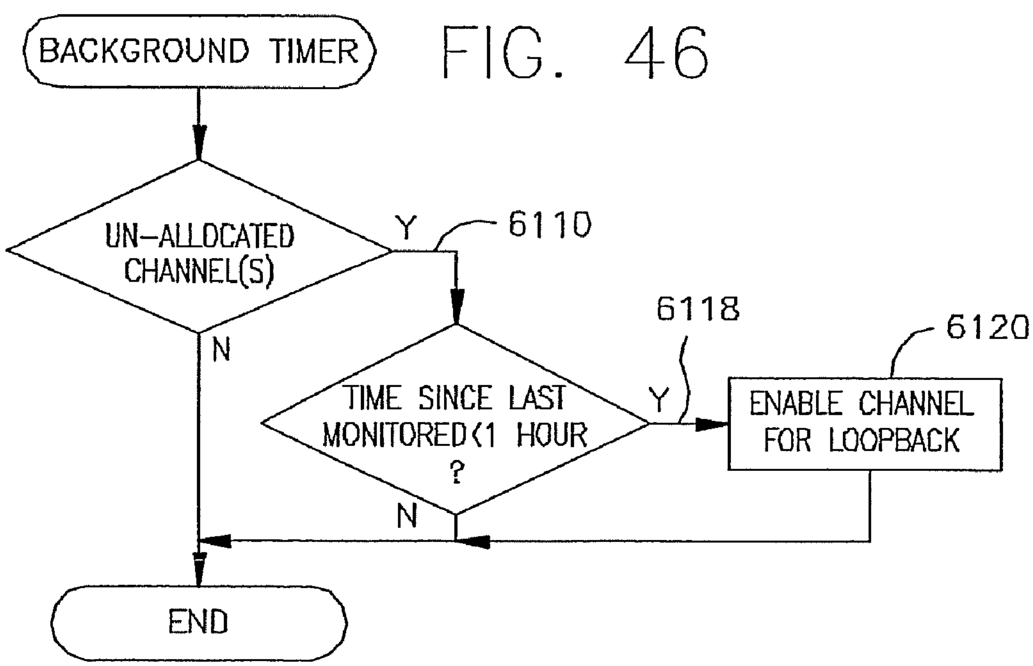
FIG. 46 is a flow diagram for a backup portion of the channel monitor routines of FIG. 40.

Unallocated or unused channels, but initialized and activated, whether used for reallocation for non-concentration services such as TR-8 or used for allocation or reallocation for concentration services such as TR-303, must also be monitored to insure that they are not bad, thereby reducing the chance that a bad channel will be allocated or reallocated to an ISU 100. To monitor unallocated channels, channel monitor 296 uses a backup manager routine (FIG. 46) to set up unallocated channels in a loop in order to accumulate error data used to make allocation or re-allocation decisions. When an unallocated channel experiences errors 6110, it will not be allocated to an ISU 100 for one hour 6118. After the channel has remained idle (unallocated) for one hour, the channel monitor places the channel in a loop back mode 6120 to see if the channel has improved. In loop back mode, the CXMU 56 commands an initialized and activated ISU 100 to transmit a message on the channel long enough to perform short or long integration on the parity errors as appropriate. In the loop back mode, it can be determined whether the previously corrupted channel has improved over time and the channel quality database is updated accordingly. When not in the loop back mode, such channels can be powered down. As described above, the channel quality database includes information to allow a reallocation or allocation to be made in such a manner that the channel used for allocation or reallocation is not corrupted. In addition, the information of the channel quality database can be utilized to rank the unallocated channels as for quality such that they can be allocated effectively. For example, a channel may be good enough for POTS and not good enough for ISDN. Another additional channel may be good enough for both. The additional channel may be held for ISDN transmission and not used for POTS. In addition, a particular standby channel of very good quality may be set aside such that when ingress is considerably high, one channel is always available to be switched to.

In addition, an estimate of signal to noise ratio can also be determined for both unallocated and allocated channels utilizing the equalizer 214 of the MCC modem 82 upstream receiver architecture as shown in FIG. 26 and FIG. 125. As described earlier, the equalizer was previously utilized to determine whether a channel was idle such that it could be allocated. During operation of the equalizer, as previously described, an error is generated to update the equalizer coefficients. The magnitude of the error can be mapped into an estimate of signal to noise ratio (SNR) by signal to noise monitor 305 (FIG. 26). Likewise, an unused channel should have no signal in the band. Therefore, by looking at the variance of the detected signal within the unused FFT bin, an estimate of signal to noise ratio can be determined. As the signal to noise ratio estimate is directly related to a probable bit error rate, such probable bit error rate can be utilized for channel monitoring in order to determine whether a bad or good channel exists.

Therefore, for reallocation for non-concentration services such as TR-8 services, reallocation can be performed to unallocated channels with such unallocated channels monitored through the loopback mode or by SNR estimation by utilization of the equalizer. Likewise, allocation or reallocation for concentration services such as TR-303 services can be made to unallocated channels based upon the quality of such unallocated channels as determined by the SNR estimation by use of the equalizer.

With respect to channel allocation, a channel allocator routine for channel allocator 304 examines the channel quality database table to determine which DS0+ channels to allocate to an ISU 100 for a requested service. The channel allocator also checks the status of the ISU and channel units to verify in-service status and proper type for the requested service. The channel allocator attempts to maintain an optimal distribution of the bandwidth at the ISUs to permit flexibility for channel reallocation. Since it is preferred that ISUs 100, at least HISUs, be able to access only a portion of the RF band at any given time, the channel allocator must distribute channel usage over the ISUs so as to not overload any one section of bandwidth and avoid reallocating in-service channels to make room for additional channels.

The process used by the channel allocator 304 is to allocate equal numbers of each ISU type to each band of channels of the 6 MHz spectrum. If necessary, in use channels on an ISU can be moved to a new band, if the current ISU band is full and a new service is assigned to the ISU. Likewise, if a channel used by an ISU in one band gets corrupted, the ISU can be reallocated to a channel in another subband or band of channels. Remember that the distributed IOC channels continue to allow communication between the HDT 12 and the HISUs as an HISU always sees one of the IOC channels distributed throughout the spectrum. Generally, channels with the longest low-error rate history will be used first. In this way, channels which have been marked bad and subsequently reallocated for monitoring purposes will be used last, since their histories will be shorter than channels which have been operating in a low error condition for a longer period.

Second Embodiment of Telephony Transport System

Figure 36:
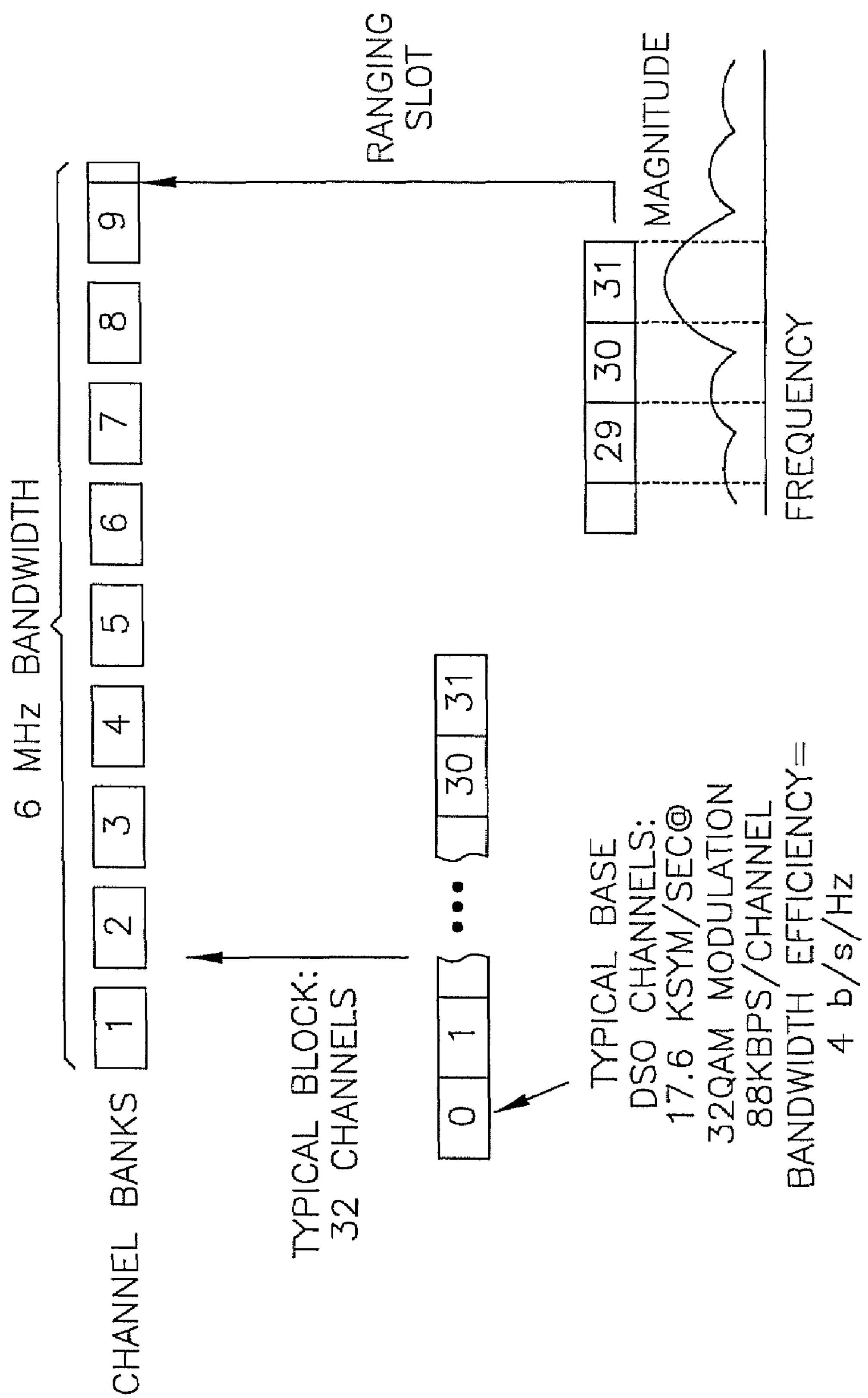
FIG. 36 is a spectral allocation of a second transport embodiment for transport in the system of FIG. 1.
Figure 37:
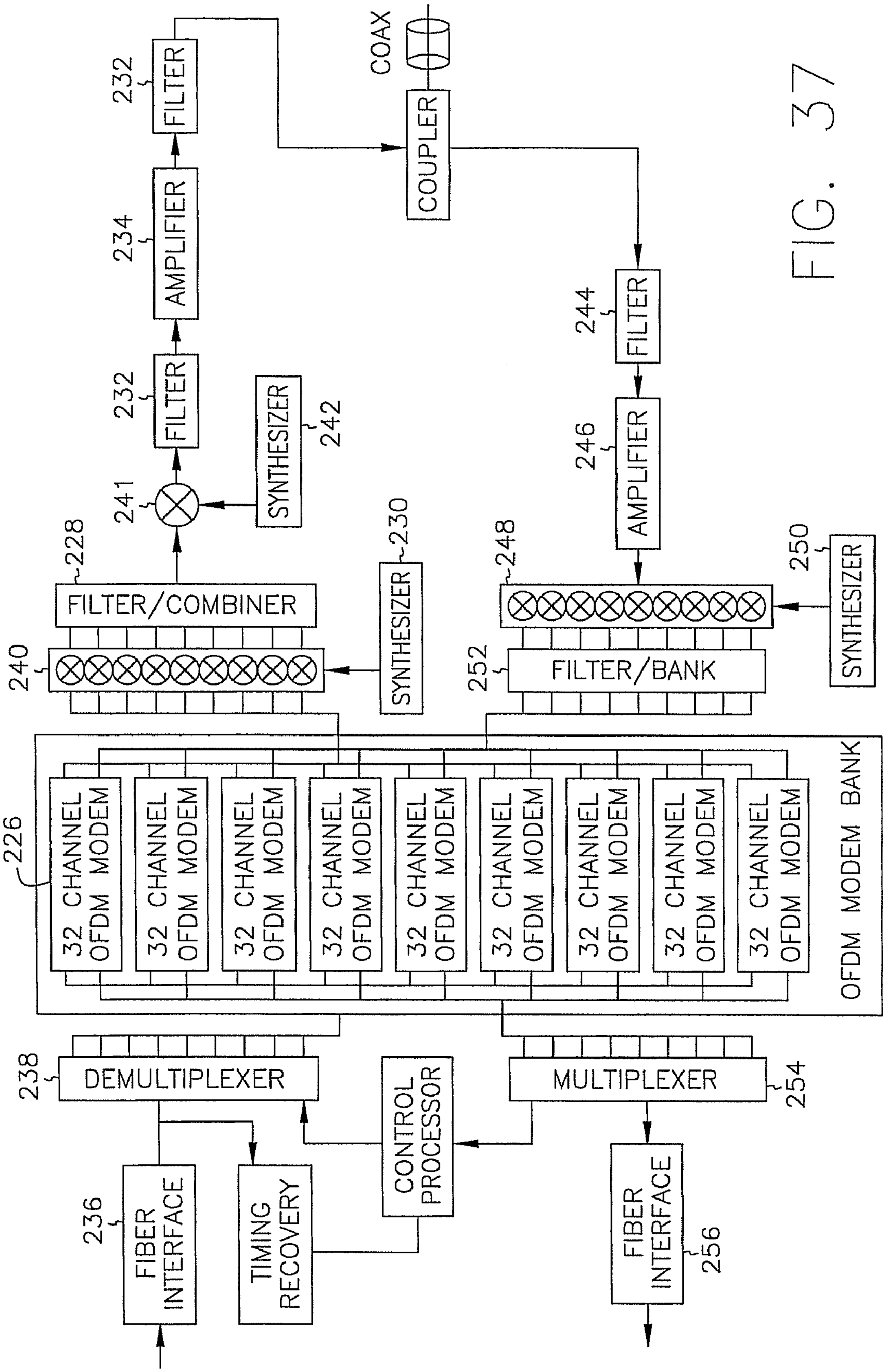
FIG. 37 is a block diagram of an MCC modem architecture of the CXMU for the second transport embodiment of the system of FIG. 1.

A second embodiment of an OFDM telephony transport system, referring to FIGS. 36-39 shall be described. The 6 MHz spectrum allocation is shown in FIG. 36. The 6 MHz bandwidth is divided into nine channel bands corresponding to the nine individual modems 226 (FIG. 37). It will be recognized by one skilled in the art that less modems could be used by combining identical operations. Each of the channel bands includes 32 channels modulated with a quadrature 32-ary format (32-QAM) having five bits per symbol. A single channel is allocated to support transfer of operations and control data (IOC control data) for communication between an HDT 12 and ISUs 100. This channel uses BPSK modulation.

The transport architecture shall first be described with respect to downstream transmission and then with respect to upstream transmission. Referring to FIG. 37, the MCC modem 82 architecture of the HDT 12 will be described. In the downstream direction, serial telephony information and control data is applied from the CXMC 80 through the serial interface 236. The serial data is de-multiplexed by demultiplexer 238 into parallel data streams. These data streams are submitted to a bank of 32 channel modems 226 which perform symbol mapping and FFT functions. The 32 channel modems output time domain samples which pass through a set of mixers 240 that are driven by the synthesizer 230. The mixers 240 create a set of frequency bands that are orthogonal, and each band is then filtered through the filter/combiner 228. The aggregate output of the filter/combiner 228 is then up-converted by synthesizer 242 and mixer 241 to the final transmitter frequency. The signal is then filtered by filter 232, amplified by amplifier 234, and filtered again by filter 232 to take off any noise content. The signal is then coupled onto the HFC distribution network via telephony transmitter 14.

Figure 38:
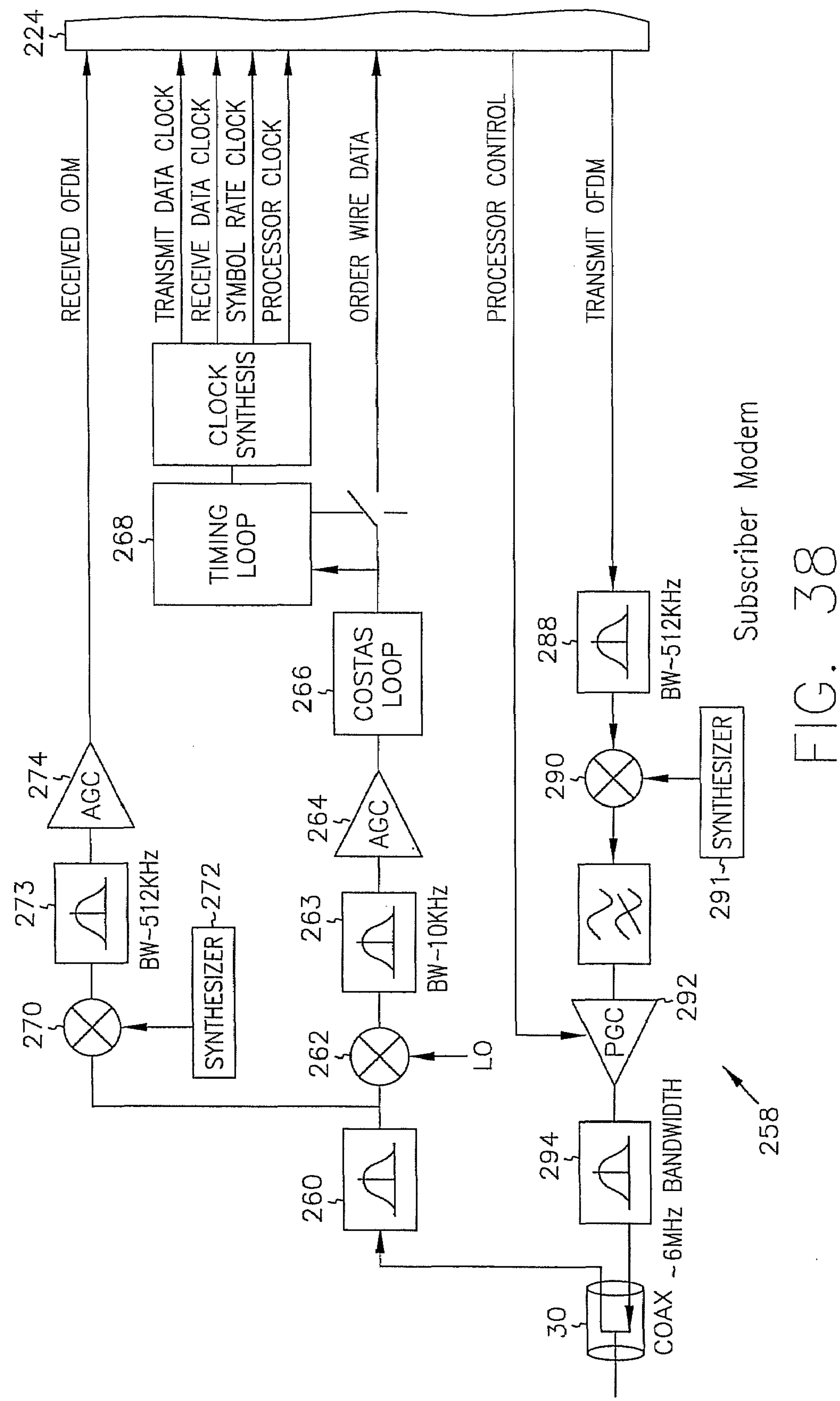
FIG. 38 is a block diagram of a subscriber modem architecture of the HISU for the second transport embodiment of the system of FIG. 1.

On the downstream end of the HFC distribution network 11, an ISU 100 includes a subscriber modem 258 as shown in FIG. 38. The downstream signals are received from the ODN 18 through the coax leg 30, and are filtered by filter 260 which provides selectivity for the entire 6 MHz band. Then the signal is split into two parts. The first part provides control data and timing information to synchronize clocks for the system. The second part provides the telephony data. With the control data received separately from the telephony data, this is referred to as an out of band ISU (as previously described above). The out of band control channel which is BPSK modulated is split off and mixed to baseband by mixer 262. The signal is then filtered by filter 263 and passed through an automatic gain control stage 264 and a Costas loop 266 where carrier phase is recovered. The signal that results is passed into a timing loop 268 so timing can be recovered for the entire modem. The IOC control data, which is a byproduct of the Costas loop, is passed into the 32 channel OFDM modem 224 of the ISU 100. The second part of the downstream OFDM waveform is mixed to base band by mixer 270 and associated synthesizer 272. The output of the mixer 270 is filtered by filter 273 and goes through a gain control stage 274 to prepare it for reception. It then passes into the 32 channel OFDM modem 224.

Figure 39:
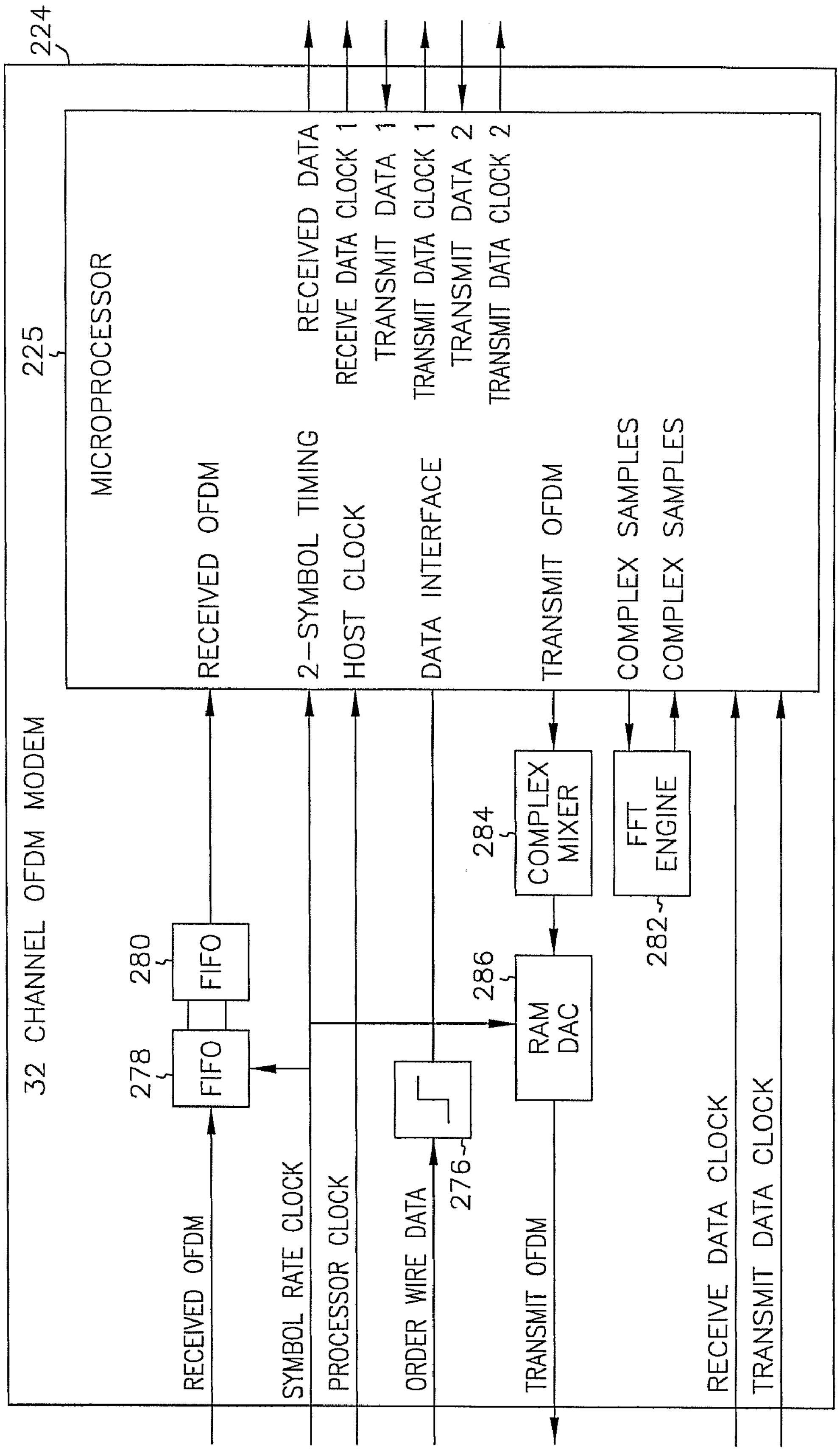
FIG. 39 is a block diagram of a modem of the subscriber modem architecture of FIG. 38.

Referring to FIG. 39, the IOC control data is hard limited through function block 276 and provided to microprocessor 225. The OFDM telephony data is passed through an analog to digital converter 278 and input to a first-in first-out buffer 280 where it is stored. When a sufficient amount of information is stored, it is accepted by the microprocessor 225 where the remainder of the demodulation process, including application of an FFT, takes place. The microprocessor 225 provides the received data to the rest of the system through the receive data and receive data clock interface. The FFT engine 282 is implemented off the microprocessor. However, one skilled in the art will recognize that the FFT 282 could be done by the microprocessor 225.

In the upstream direction, data enters the 32 channel OFDM modem 224 through the transmit data ports and is converted to symbols by the microprocessor 225. These symbols pass through the FFT engine 282, and the resulting time domain waveform, including guard samples, goes through a complex mixer 284. The complex mixer 284 mixes the waveform up in frequency and the signal is then passed through a random access memory digital to analog converter 286 (RAM DAC). The RAM DAC contains some RAM to store up samples before being applied to the analog portion of the ISU upstream transmitter (FIG. 38). Referring to FIG. 38, the OFDM output for upstream transport is filtered by filter 288. The waveform then passes through mixer 290 where it is mixed under control of synthesizer 291 up to the transmit frequency. The signal is then passed through a processor gain control 292 so that amplitude leveling can take place in the upstream path. The upstream signal is finally passed through a 6 MHz filter 294 as a final selectivity before upstream transmission on the coaxial leg 30 to the ODN 18.

In the upstream direction at the HDT 12 side, a signal received on the coax from the telephony receiver 16 is filtered by filter 244 and amplified by amplifier 246. The received signal, which is orthogonally frequency division multiplexed, is mixed to baseband by bank of mixers 248 and associated synthesizer 250. Each output of the mixers 248 is then filtered by baseband filter bank 252 and each output time domain waveform is sent then to a demodulator of the 32 channel OFDM modems 226. The signals pass through a FFT and the symbols are mapped back into bits. The bits are then multiplexed together by multiplexer 254 and applied to CXMC 56 through the other serial interface 256.

As shown in this embodiment, the ISU is an out of band ISU as utilization of separate receivers for control data and telephony data is indicative thereof as previously discussed. In addition, the separation of the spectrum into channel bands is further shown. Various other embodiments as contemplated by the accompanying claims of the transport system are possible by building on the embodiments described herein. In one embodiment, an IOC control channel for at least synchronization information transport, and the telephony service channels or paths are provided into a single format. The IOC link between the HDT 12 and the ISUs 100 may be implemented as four BPSK modulated carriers operating at 16 kbps, yielding a data rate of 64 kbps in total. Each subscriber would implement a simple separate transceiver, like in the second embodiment, which continuously monitors the service channel assigned to it on the downstream link separately from the telephony channels. This transceiver would require a tuned oscillator to tune to the service IOC channel. Likewise, an IOC channel could be provided for channel bands of the 6 MHz bandwidth and the channel bands may include orthogonal carriers for telephony data and an IOC channel that is received separately from the reception of the orthogonal carriers.

In another embodiment, instead of 4 BPSK channels, a single 64 kbps IOC channel is provided. This single channel lies on the OFDM frequency structure, although the symbol rate is not compatible with the telephony symbol rate of OFDM framework. This single wide band signal requires a wider band receiver at the ISU 100 such that the IOC link between the HDT 12 and ISUs is always possible. With single channel support it is possible to use a fixed reference oscillator that does not have to tune across any part of the band in the subscriber units. However, unlike in the first embodiment where the IOC channels are distributed across the spectrum allowing for narrow band receivers, the power requirements for this embodiment would increase because of the use of the wide band receiver at the ISU 100.

In yet another embodiment, the IOC link may include two IOC channels in each of 32 OFDM channel groups. This increases the number of OFDM carriers to 34 from 32 in each group. Each channel group would consist of 34 OFDM channels and a channel band may contain 8 to 10 channels groups. This approach allows a narrow band receiver to be used to lock to the reference parameters provided by the HDT 12 to utilize an OFDM waveform, but adds the complexity of also having to provide the control or service information in the OFDM data path format. Because the subscriber could tune to any one of the channel groups, the information that is embedded in the extra carriers must also be tracked by the central office. Since the system needs to support a timing acquisition requirement, this embodiment may also require that a synchronization signal be place off the end of the OFDM waveform.

It is to be understood, however, that even though numerous characteristics of the present invention have been set forth in the foregoing description, together with details of the structure and function of the invention, the disclosure is illustrative and changes in matters of order, shape, size, and arrangement of the parts, and various properties of the operation may be made within the principles of the invention and to the full extent indicated by the broad general meaning of the terms in which the appended claims are expressed.

In the following detailed description of the preferred embodiments, reference is made to the accompanying drawings that form a part hereof, and in which are shown by way of illustration specific embodiments in which this invention may be practiced. It is understood that other embodiments may be used and structural changes may be made without departing from the scope of the claimed invention.

FIG. 70 shows one embodiment of this invention having an apparatus, generally indicated as FFT system 2100, which performs both forward and inverse FFT functions. The input/output signals to FFT system 2100 include some (or, in one preferred embodiment, all) of the following: real data-in 2111 (having an N-bit-wide data path; in one embodiment, this is 10 bits wide, and bi-directional so it can be both written to and read from), imaginary data-in 2112 (having an N-bit-wide data path; in one embodiment, this is 10 bits wide, and bi-directional so it can be both written to and read from), address in 2113 (having enough bits to specify addresses for each input value or input-value pair), control and clock lines 2114 that control writing (and reading) data from the input side, test signals 2115, size-select bits 2116, bit-growth-select bits for each of P stages including bit-growth-1 bits 2117 through bit-growth-P bits 2118, forward/inverse select signal 2119 which specifies whether to perform a forward or inverse transform, power-down command signal input 2109, real data-out 2121 (having an M-bit-wide data path, in one embodiment, this is 10 bits), imaginary data-out 2122 (having an M-bit-wide data path, in one embodiment, this is 10 bits), address out 2123 (having enough bits to specify addresses for each output value or output value pair)(in one embodiment, these are driven by an external device to select output values as they are needed), control and clock lines 2124 that control reading data from the output side, overflow signal 2125 which indicates that one or more output values has overflowed, and FFT complete signal 2126 which is activated when a transform has been completed.

ASIC 2101 Fabrication

In one embodiment, the FFT system 2100 is fabricated on an application-specific integrated circuit ("ASIC") 2101, a chip fabricated by LSI Logic Inc. In this embodiment, full scan testing circuits are included into the ASIC 2101 for testability. In this embodiment, FFT system 2100 is fabricated in LSI Logic LCB500K technology, which is a 0.5 micron rule, 3.3 Volt CMOS (complementary metal-oxide semiconductor) process.

Functional Description Overview of FFT System 2100

In one embodiment, ASIC 2101 has four pins, size select 2116, to select between the various transform sizes (that is, transforms having $2^N$ points; where $5 \leqq N \leqq 110$, thus providing selectability for a 1024-point transform, a 512-point transform, a 256-point transform, a 128-point transform, a 64-point transform, or a 32-point transform). In one application, transforms are completed in less than 125 microseconds. See the "Execution Time" section below for the minimum clock frequencies necessary to meet this requirement. In one embodiment, when performing a 1024-point transform, a clock of at least approximately 32 MHz is required. In one embodiment, when performing a 512-point transform, a clock of at least approximately 16.5 MHz is required. In one embodiment, when performing a 32-point transform, a clock of at least approximately 4 MHz is required.

FIG. 71 is a block diagram of modem 2400 according to the present invention which includes a FFT system 2100 configured to perform an IFFT in transmitter section 2401 (similar to the transmitter shown in FIG. 21) and another FFT system 2100 configured to perform an FFT in receiver section 2402 (similar to the receiver shown in FIG. 26). In one embodiment, ASIC 2101 has three logical banks of RAM which are configurable as shown in FIG. 72: an input RAM 2251 (containing a plurality of real input values 2241 and a plurality of imaginary input values 2245), an output RAM 2253 (containing a plurality of real output values 2243 and a plurality of imaginary output values 2247), and a conversion RAM 2252 (containing a plurality of real conversion values 2242 and 2244 and a plurality of imaginary conversion values 2246 and 2248). In one embodiment, input RAM 2251 has 1024 complex-value positions, each 20 bits wide (10 bits wide for each real input value 2241 and 10 bits wide for each imaginary input value 2245), output RAM 2253 has 1024 complex-value positions, each 20 bits wide (10 bits wide for each real output value 2243 and 10 bits for each imaginary output value 2247) and conversion RAM 2252 has 1024 complex-value positions, each 30 bits wide (15 bits wide for each real conversion value 2242 and 2244 and 15 bits wide for each imaginary conversion value 2246 and 2248). (The 5 extra low-order real bits 2244 and 5 extra low-order imaginary bits 2248 in each position of the conversion RAM 2252 help to avoid loss of precision during calculations.) The internal functions of ASIC 2101 have exclusive access to the conversion RAM 2252 and perform the FFT calculations out of this conversion RAM 2252. The input RAM 2251 is accessible to the user's input device as an input to the FFT system 2100 (to be written under external control with input data). The output RAM 2253 is accessible to the user's output device as an output source (to be read under external control to obtain output data). In one embodiment, the rising edge of an approximately 8-KHz frame clock 2108 is used to start the computation of each transform (for example, either a 1024-point FFT, or a 1024-point IFFT).

In one embodiment, the functions of all three banks of RAM are also "permuted" on the rising edge of this 8-KHz frame clock 2108, before each FFT calculation starts. As used herein, this "permutation" changes the function of each bank of RAM without actually moving data: input RAM 2251 becomes conversion RAM 2252, conversion RAM 2252 becomes output RAM 2253, and output RAM 2253 becomes input RAM 2251. Note that, in this embodiment, no RAM data is moved when the functions are permuted. FIG. 73 shows one embodiment of a physical implementation which provides the function of input RAM 2251, conversion RAM 2252, and output RAM 2253. Bank control block 2131 permutes the function of the physical RAM banks 2151, 2152 and 2153 at the rising edge of frame clock 2139. One of the functions of bank control state machine 2131 is to control the routing of data through RAM input multiplexers (MUXs) 2171, 2172, and 2173 and the routing of data through RAM output multiplexers (MUXs) 2181, 2182, and 2183. For example, at a first given state, bank control 2131 controls input-select block 2132 to input data into physical RAM bank 2151 (in one embodiment, physical RAM bank 2151 includes 1024 ten-bit real values and 1024 ten-bit imaginary values). Thus, in the first state, physical RAM bank 2151 acts as logical input RAM bank 2251. Once all of the desired first set of input values (up to 1024 values or pairs of values) have been inputted, the frame clock 2139 is driven to change the state of bank control 2131 (permuting the three RAM bank's respective functions) to a second state, in which bank control 2131 controls input-select block 2132 to input data into physical RAM bank 2152 and bank control 2131 controls conversion-select block 2133 to direct computation accesses for data into physical RAM bank 2151. (The five low-order bits of values used for computation are always provided from physical RAM bank 2154.) Thus, in the second state, physical RAM bank 2152 acts as logical input RAM bank 2251 and physical RAM bank 2151 acts as logical conversion RAM bank 2252.

Once all of the desired second set of input values (up to 1024 values or pairs of values) have been inputted, the frame clock 2139 is driven to change the state of bank control 2131 (permuting the three RAM bank's respective functions again) to a third state, in which bank control 2131 controls input-select block 2132 to input data into physical RAM bank 2153, bank control 2131 controls conversion-select block 2133 to direct computation accesses for data into physical RAM bank 2152, and bank control 2131 controls output-select block 2134 to direct output requests for accesses for data from physical RAM bank 2151. Thus, in the third state, physical RAM bank 2153 acts as logical input RAM bank 2251, physical RAM bank 2152 acts as logical conversion RAM bank 2252, and physical RAM bank 2151 acts as logical output RAM bank 2253. Once all of the desired third set of input values (up to 1024 values or pairs of values) have been inputted, and the first set of converted output values (up to 1024 values or pairs of values) have been outputted, then the frame clock 2139 is driven to change the state of bank control 2131 (permuting the three RAM bank's respective functions again) back to the first state, in which bank control 2131 controls input-select block 2132 to input data into physical RAM bank 2151, bank control 2131 controls conversion-select block 2133 to direct computation accesses for data into physical RAM bank 2152, and bank control 2131 controls output-select block 2134 to direct output requests for accesses for data from physical RAM bank 2153. Thus, in the first state, physical RAM bank 2151 again acts as logical input RAM bank 2251, physical RAM bank 2153 acts as logical conversion RAM bank 2252, and physical RAM bank 2152 acts as logical output RAM bank 2253.

At the beginning of each transform (that is, each forward FFT or inverse FFT) process, the functions of the RAM bank memories (the mapping of RAMs 2151, 2152, and 2153 to RAMs 2251, 2252, and 2253) are permuted. The conversion RAM 2252 becomes the output RAM 2253, the input RAM 2251 becomes the conversion RAM 2252, and the output RAM 2253 becomes the input RAM 2251. Each RAM (2251, 2252, and 2253) has its own independent control and clock signals (2114, 2128, and 2124, respectively). While the current transform is being calculated in conversion RAM 2252, the results of the previously calculated FFT/IFFT may be read from the output RAM 2253 and the data for the next FFT calculation may be asynchronously and simultaneously written to the input RAM 2251. In one embodiment, access to the input RAM 2251 and output RAM 2253 is restricted for 3 clock cycles (one prior to and two after) relative to the rising edge of the frame clock. This allows the RAM permutation to proceed safely without undesirable data loss.

Forward Fast Fourier Transform (FFT) and Inverse Fast Fourier Transform (IFFT)

In one embodiment, FFT system 2100 is implemented on a single integrated circuit (IC) that performs both a forward FFT and an inverse FFT (IFFT, also called a reverse FFT). A pin, forward/inverse signal 2119, selects between the two types of transform. The inverse FFT uses the identical calculation sequence as the forward transform, but the complex values (that is, real and imaginary) of the twiddle factors and butterfly coefficients are conjugated relative to these values used for the FFT. A forward FFT is defined to convert a time-domain signal into frequency-domain signals and, in one embodiment, is used in the transmitter 2401 of modem 2400 (see FIG. 71). An inverse FFT is defined to convert frequency-domain signals to time-domain signals and is used in the receiver 2402 of the modem 2400.

In one embodiment, the underlying structure of FFT system 2100 supports five radix-4 butterflies (that is, butterfly operations) usable to perform the 1024-point transforms (FFT and IFFT). The butterflies and stages are reduced for lower-order transforms. (In one embodiment, every other twiddle factor of the 1024-point twiddle-factor lookup table 2610 is used when calculating the 512-point transforms by forcing to zero the low-order address bit to the twiddle-factor lookup table 2610. Every fourth twiddle factor of the 1024-point twiddle-factor lookup table 2610 is used when calculating the 256-point transforms by forcing to zero the two low-order address bits to the twiddle-factor lookup table 2610.) In one embodiment, all FFT transforms are calculated by using radix-4 butterflies, except for the last stage of the 512-point, 128-point, and 32-point transforms, which use the radix-4 structure to perform a radix-2 butterfly. (Obvious extensions are made if other transforms are used). Thus, the 1024-point transforms use five stages of radix-4 butterflies, the 512-point transforms use four stages of radix-4 butterflies followed by one stage of a radix-2 butterfly, etc.

Scaling of FFT Output

In one embodiment, scaling is controlled by ten external pins (bit-growth signals 2117 though 2118) on the ASIC 2101. Two pins are used for each of the five passes required for the 1024- and 512-point transform. The use of two pins at each stage allows a scaling factor (for example, a shift right of each intermediate result value) of from 0 bits to 3 bits which exceeds the nominal bit growth of 1 bit observed in the inventor's analysis. In one embodiment, the binary number represented by each pair of pins indicates the number of binary places that the results of each calculation are to be shifted right (divided) by before they are placed back into conversion RAM 2252. Note that in one such embodiment scaling the result after each butterfly operation requires at least some working registers to maintain bits greater than the MSB of the 15-bit values (each for real and imaginary) in the internal conversion RAM 2252, and the scaling to be applied prior to storage in the conversion RAM 2252.

Round-Off/Truncation Saturation and Scaling

In one embodiment, each input and output number is represented by 10 bits (that is, 10 bits for each real portion, plus 10 bits for each imaginary portion of a complex pair of numbers). Numbers are represented as two's-complement fractional arithmetic with the binary point immediately to the right of the sign bit. Fractional arithmetic helps prevent multiplies from causing overflow. The result portion of a double-precision multiply which is used is the upper fifteen bits.

Number growth is managed by the 10 scaling pins (bit growth signals 2117-2118) mentioned previously. In addition, the ASIC 2101 uses saturation logic that prevents number roll over. That is to say, that if the result of an addition or subtraction exceeds the maximum value that can be represented in 15 bits, the result is replaced by a value representing the maximum possible integer. Likewise, if the result of an addition or subtraction is less than the minimum value that can be represented in 15 bits, the result is replaced by a value representing the minimum possible integer.

In one embodiment, ASIC 2101 has the following registers for real and complex data: 10-bit input RAM 2251 and 10-bit output RAM 2253, and a 15 bit conversion RAM 2252. The input values are presented as a two's complement fractional binary value (2.bbbbbbbbb). In the internal conversion RAM, the five extra bits are appended at the bottom (that is, low-order position) of the input word. The resulting format is an extended 2's-complement value in the internal conversion RAM 2252 (for example, s.bbbbbbbbbxxxxx, where s is sign, b's are significant input bits, and x's are extra bits to maintain precision). Note that in one embodiment any extension bits in the working registers extend the sign bit to achieve the desired 2's-complement results.

In one embodiment, at the output of each transform pass, the result is shifted down as specified by the signals provided into the scaling pins 2117-2118 for that pass. The output RAM 2253 aligns precisely with the upper 10 bits of the conversion RAM 2252, in a manner similar to the input RAM 2251 (s.bbbbbbbbbxxxxx), each output value (after the final growth factor is applied prior to storage in the internal conversion RAM 2252 is rounded to produce the output results (s.bbbbbbbbr).

Power Down

In one embodiment, the ASIC has a single pin, power-down signal 2109, to control power down that gates off the internal clock in the ASIC, and places the input RAM 2251 and output RAM 2253 into a low power state. In one embodiment, access attempts to those RAMS 2251 and 2253 while in the low power state will be unsuccessful.

Execution Time

The maximum FFT execution frequency requires that a 1024-point transform be completed in 125 microseconds based on a 32 MHz clock. An approximately 8-KHz frame clock 2108 is provided to the ASIC 2101 to signify the beginning of a transform cycle. Prior to the rising edge of this clock, the previous FFT should be complete. Table 5 below summarizes the clock frequency to perform a 1024-point and a 512-point FFT in 125 ms.

TABLE 5

FFT Clock required to perform a transform in 125 microseconds

| Transform Size | Clock cycles per conversion | Clock Frequency for 125 μs conversion rate (MHz) |
|---|---|---|
| 1024 | 3845 | 30.8 |
| 512 | 1925 | 15.4 |
| 256 | 775 | 6.2 |
| 128 | 390 | 3.1 |
| 64 | 150 | 1.2 |
| 32 | 80 | 0.64 |

FFT Functional Blocks

The ASIC is partitioned into the following major functional blocks.

1. RAM banks 2151, 2152, 2153
2. Sequencer 2640
3. Dual radix (2, 4) core 2600, including multipliers 2620 through 2627
4. Twiddle-factor lookup table 2610

The algorithm used is decimation in time (DIT) FFT. The algorithm used is an in place algorithm which means that the results of each butterfly are put back into the same locations that the operands came from. The algorithm assumes digit reversed input order and normal output order. Since the three banks of RAMs are independent, the reordering of the input data is done internally to the ASIC. This reordering is transparent to the user. Thus the user writes the data into the input RAM bank in normal order and read the data from the output RAM bank in normal order. If the user requires some other ordering, this may be accomplished by simply permuting the address line ordering. The order of the memory for all transform sizes are given in the section titled "Sequencer."

Memory Banks

The ASIC 2101 includes three banks of RAM that are individually addressable. The RAM banks 2251, 2253, and 2252 are used for input data, output data, and conversion data, respectively. The three banks are used in order to obtain real-time execution of the FFT and to allow independent clock rates for the input and output of data in order to accommodate clocking needs of those devices connected to it. In one embodiment, the input RAM bank 2251 and output RAM bank 2252 are each organized as 1024 twenty-bit words. The lower 10 bits of each 20-bit word are used for real data, and the upper 10 bits of each 20-bit word are used for imaginary data. The conversion RAM bank 2252 is organized as 1024 thirty-bit words. In one embodiment, the lower 15 bits of each thirty-bit word are used for real data and the upper 15 bits for imaginary data. The connectivities of the three RAM banks of memory are controlled by a state machine which is advanced by the 8-KHz frame signal 2108. The state machine has three states which are defined in Table 6 as follows:

TABLE 6

| Typical processing states of memory banks | | | |
|---|---|---|---|
| State | BANK A | BANK B | BANK C |
| 0 | Input | Convert | Output |
| 1 | Convert | Output | Input |
| 2 | Output | Input | Convert |

In one embodiment, the RAM banks do not have a reset. For input and output, they are accessed at a maximum of 10.24 MHz rate. In one embodiment, a dead time of one clock cycle before the rising edge of the 8-KHz clock 2108 and two clock cycles after is required to assure the safety of the RAM bank switching. The ASIC 2101 clocks the data in on the rising edge of the input clock and clocks data out on the rising edge of the output clock.

Actual operation of the conversion RAM 2252 is a bit more complicated than is implied above. Actually only the top 10 bits of the conversion RAM 2252 participates in the bank switching between RAMs 2151, 2152, and 2153. The lower 5 bits 2154 are dedicated the conversion RAM 2252. Since all numbers are MSB aligned, no shifting needs to be done on input or output. However, the last stage of the FFT calculation rounds the results to ten bits. This eliminates a bias that would result had the results simply been truncated. The rounding is accomplished by adding a one to the eleventh bit position and then truncating this result.

Sequencer 264

The sequencer 2640 manages the processing of the FFT system 2100. The sequencer 2640 controls the generation of addresses for the conversion RAM bank 2252 and the twiddle factor ROMs 2610 through address generation blocks 2642 and 2641 respectively. Sequencer 2640 also configures the calculation commands for the radix butterfly calculator 2630. In addition, sequencer 2640 monitors the calculations for overflow. If at any time during the course of FFT calculation, an overflow or underflow is detected, then a flag is set indicating that the results of the FFT are suspect. This overflow flag is passed along with the output data block when the RAM banks are switched. Thus the flag pin 2125 indicates that the output data block presently being read out of the output RAM bank 2253 may not be accurate. This flag 2125 may aid the system designer in providing an indicator for AGC (automatic gain control).

Dual Radix (2, 4) Core 2600

The dual radix core 2600 is the arithmetic element of the ASIC 2101. In one preferred embodiment, it includes eight 16-bit-by-16-bit multipliers (2620 through 2627) and thirty-two multiplexed adder-subtractor-accumulators 2633. In another embodiment, it includes twelve 16-bit-by-16-bit multipliers and eight multi-branched adder/subtractor/accumulators.

FIG. 74 shows one embodiment of a dual radix core 2600. In the embodiment shown in FIG. 74, conversion RAM bank 2252 is shown as part of the dual radix core. In other embodiments, conversion RAM bank 2252 is a separate functional unit, not considered part of the dual radix core 2600. In FIG. 74, the data fetched from conversion RAM bank 2252 is fetched into holding latches 2612, with both the real (that is, X3R, X2R, X1R, and X0R) and imaginary parts (that is, X3I, X2I, X1I, and X0I) of four points being fetched in parallel, substantially simultaneously. As shown in FIG. 74, the real and imaginary data fetched from conversion RAM bank 2252 is addressed by address generation circuit 2642 which provides four separate addresses to conversion RAM bank 2252. The real and imaginary part of a single point both use the same address. The four separate addresses allow different sets of points to be fetched simultaneously during various stages of the transform operation.

As further shown in FIG. 74, the data fetched from conversion RAM bank 2252 includes real-and-imaginary pairs denoted X3, X2, X1, and X0. The data point pairs being denoted are X3 which includes X3R and X3I, X2 which includes X2R and X2I, X1 which includes X1R and X1I, and X0 which includes X0R and X0I. In one embodiment, the data fetched from conversion RAM bank 2252 is held for two successive multiplier clock cycles in holding latches 2612, so that the same value gets multiplied in each of two multiply cycles. The corresponding twiddle factors are fetched on every clock cycle from twiddle factor look-up table 2610. For example in one embodiment, on even clock cycles the real components for four twiddle factors are fetched in parallel denoted W0R, W1R, W2R, and W3R. These four real twiddle factors are fed to multipliers 2620 and 2621, 2622 and 2623, 2624 and 2625, and 2626 and 2627, respectively as shown, and multiplied by the real and imaginary components of all four data value pairs fetched from conversion RAM bank 2252. The products of these eight multipliers 2620-2627 are fed through routing logic 2634 into all thirty-two adder/subtractor accumulators 2633 of row-column array 2632. On the successive odd multiplier clock cycle, four imaginary twiddle factors are then fetched, shown as W0I, W1I, W2I, and W3I. As shown, imaginary twiddle factor W0I is fed to both multiplier 2620 and multiplier 2621. Similarly, imaginary twiddle factor W1I is fed to both multiplier 2622 and multiplier 2623. Imaginary twiddle factor W2I is fed to multiplier 2624 and 2625 and imaginary twiddle factor W3I is fed to multiplier 2626 and 2627. For the second multiplier clock, these eight multipliers are again fed with the same complex point data still held in holding latches 2612 as was used in the first clock multiplier cycle. Again after the second clock multiplier, the eight products are fed through routing logic 2634 and accumulated in adder/subtractor accumulators 2633. Note that each twiddle factor value in twiddle factor lookup table 2610 is a complex number having a real and imaginary part (in this embodiment, the real and imaginary parts are stored in successive locations which are fetched on successive clock cycles, thus presenting 4 real values followed by four imaginary values) and each point value in conversion RAM bank 2252 is also a complex number having a real part and an imaginary part (in this embodiment, the real and imaginary parts are stored in side-by-side locations which are fetched on only every other clock cycle, thus presenting 4 real values and four imaginary values on every other clock cycle).

These elements are configured to perform a radix-4 butterfly calculation. The radix-4 butterfly calculations needed to provide a 1024-point FFT or IFFT and the selection of addresses and twiddle coefficients for the, for example, 1024 points used for each of the five passes needed for a complete 1024-point transform are easily calculated and are well known in the art (see, for example, chapters 6 & 10 of *Theory and Application of Digital Signal Processing*, by Lawrence R. Rabiner and Bernard Gold, Prentice-Hall Inc, published in 1975; and page 612 et seq. of *Discrete-Time Signal Processing*, by Alan V. Oppenheim and Ronald W. Schafer, Prentice-Hall Inc, published in 1989). Although a radix-2 transform is also required, a separate radix-2 calculator is not required because the radix-2 operation is a subset of the radix-4 operation. Only the operands actually needed for the radix-2 operation are actually loaded. The remainder are set to zero. All arithmetic is performed in such a manner that, if an overflow or underflow should occur, then the results saturate. This prevents roll-over from contaminating the results. The function performed by the dual-radix core 2600 for a radix-4 butterfly operation supporting the forward transform is the following, where A, B, C and D are the four input points, A', B', C' and D' are the four output points, and $W^{1k}$, $W^{2k}$ and $W^{3k}$ are the twiddle coefficients:

$$A'=A+BW^{1k}+CW^{2k}+DW^{3k}$$

$$B'=A-jBW^{1k}-CW^{2k}+jDW^{3k}$$

$$C'=A-BW^{1k}+CW^{2k}-DW^{3k}$$

$$D'=A+jBW^{1k}-CW^{2k}-jDW^{3k}$$

The function performed in a reverse transform is simply the complex conjugate of the above set of equations.

$$A'=A+BW^{1k}+CW^{2k}+DW^{3k}$$

$$B'=A+jBW^{1k}+CW^{2k}-jDW^{3k}$$

$$C'=A-BW^{1k}+CW^{2k}-DW^{3k}$$

$$D'=A-jBW^{1k}-CW^{2k}+jDW^{3k}$$

Note that the twiddle-factor W which is used for each A on the right side of the above equations is one (that is, the complex number 1+j0).

The multiplication of two complex numbers, each having a real part and an imaginary part, for example, results in the following equation:

$$\begin{aligned} X0\times W0 &= (X0R+jX0I)\times(W0R+jW0I) \\ &= (X0R\times W0R - X0I\times W0I) + \\ &\quad j(X0I\times W0R + X0R\times W0I) + \\ &\quad X0R\times W0R + jX0I\times W0R \end{aligned}$$

(for example, the first multiplier cycle in multipliers 2620-2621)

$$-X0I\times W0I+jX0R\times W0I$$

(for example, the first multiplier cycle in multipliers 2620-2621).

Thus, four multiplier operations are needed for each complex multiply operation.

In order to speed the transform function, the factors for the parallel multipliers are fetched in parallel under the control of control and clocking sequencer 2640. Routing logic 2634 routes the products of the multipliers 2620-2627 to the thirty-two adder-subtractor-accumulators 2633. In one embodiment, eight multiplier cycles, C0 through C7, are used to generate four radix-4 butterfly operations, resulting in sixteen complex output values. For discussion purposes, row-column array 2632 is shown having four rows (A, B, C, and D) and four columns (W, X, Y, and Z) of complex value pairs. The real value and the imaginary value of each of these sixteen complex value pairs has its own associated adder-subtractor-accumulator 2633, for a total of thirty-two adder-subtractor-accumulators 2633, as shown in FIG. 74 and FIG. 91. In one embodiment, scaling-factor shift logic 2644 (under the control of bit-growth selector 2643) is provided in the path between adder-subtractor-accumulators 2633 and conversion RAM bank 2252. The scaling-factor shift logic 2644 provides a right-shift function of 0 bits, 1 bit, 2 bits or three bits (divide by 1, two, four or eight respectively) on each output data value as it is being returned to conversion RAM 2252. Bit-growth pins 2117 through 2118, which control the divide function for each of the passes are coupled to bit-growth selector 2643 under control of sequencer 2640.

FIGS. 75-82 are a table 2800 showing the order of calculations for a "normal butterfly sub-operation." The data points in conversion RAM 2252 are arranged within conversion RAM 2252 such that the four input points for one radix-4 operation are each located in different sub-banks if the points are successively addressed (for example, addresses 0, 1, 2, and 3 are each in different sub-banks, for example, sub-banks 2290, 2291, 2292, and 2293 respectively), but points whose addresses differ by a factor of 4 are located in the same bank (for example, addresses 0, 4, 8, and 12 are all within bank 2290, as are addresses 0, 16, 32, and 48, addresses 0, 64, 128, and 192, and addresses 0, 256, 512, and 768). The butterfly passes for this second set of points (those whose addresses-mod-4 are equal) are handled by the equations shown in the table of FIGS. 75-82. FIG. 75 shows the operations at each of the thirty-two adder-subtractor-accumulators 2633 at a multiplier clock cycle command denoted C0. For example, at C0, the adder-subtractor-accumulator 2633 for the real portion of the AW point in row-column array 2632 (called the AWR accumulator) gets loaded with the output (called WR) of multiplier 2620, and the adder-subtractor-accumulator 2633 for the imaginary portion of the DZ point in row-column array 2632 (called the DZI accumulator) gets loaded with the output (called ZI) of multiplier 2627. By performing load operations at clock C0, the previous values of the accumulators do not need to be zeroed. As shown in FIG. 91, multipliers 2620, 2621, 2622, 2623, 2624, 2625, 2626 and 2627 produce products called WR, WI, XR, XI, YR, YI, ZR and ZI, respectively, however the -R and -I designations of these products are not strictly correlated to real and imaginary numbers. FIG. 91 also shows the row and column locations for the thirty-two adder-subtractor-accumulators 2633, with AWR shown in the upper-left corner and DZI in the lower right corner.

FIG. 76 shows the operations at each of the thirty-two adder-subtractor-accumulators 2633 at a multiplier clock cycle command denoted C1. For example, at C1, the adder-subtractor-accumulator 2633 for the real portion of the AW point in row-column array 2632 (called the AWR accumulator) gets loaded with the difference of subtracting from its previous value (called AWR, this value happens to be the WR value loaded in cycle C0) the output (called WI) of multiplier 2621, and the adder-subtractor-accumulator 2633 for the imaginary portion of the DZI point in row-column array 2632 (called the DZI accumulator) gets loaded with the sum of its previous value (called DZI, this value happens to be the ZI value loaded in cycle C0) and output (called ZR) of multiplier 2626. Similarly, FIGS. 77 through 82 show the operations which take place at multiplier clocks C2 through C7, respectively.

Since each complex-multiply operation takes a total of four multiplier operations, and two multipliers (for example, the pair 2620 and 2621) are used, two multiplier cycles are needed for each complex-multiply operation. In a 1024-point transform (that is, either an FFT or an IFFT), four of the five passes involve sets of four points wherein all four points are in a single sub-bank (for example, 2290), and therefore must be fetched on four successive even-clocks. Each of these four passes takes eight clocks, called C0 through C7. These four passes are each called "normal butterfly." Table 2800 shows the order of calculation for all of the sub-operations for one embodiment of a normal butterfly (calculating four radix-4 butterfly operations in eight multiplier clock cycles), where each of the four points for one radix-4 butterfly are in the same sub-bank (for example, either sub-bank 2290 or 2291 or 2292 or 2293).

FIGS. 83-90 are a table 2810 showing the order of calculations for a "transposed butterfly sub-operation." The transposed butterfly sub-operation is used for one pass of each transform performed. The data points in conversion RAM 2252 are arranged within conversion RAM 2252 such that the four input points for one radix-4 operation are each located in different sub-banks if the points are successively addressed (for example, addresses 0, 1, 2, and 3 are each in different sub-banks; sub-banks 2290, 2291, 2292, and 2293 respectively). The transposed butterfly passes for this one set of points (those whose addresses-mod-4 are equal) are handled by the equations shown in the table of FIGS. 83-90. FIG. 83 shows the operations at each of the thirty-two adder-subtractor-accumulators 2633 at a multiplier clock cycle command denoted C0 (note that only eight adder-subtractor-accumulators 2633 are affected, the other twenty-four do nothing). For example, at C0, the adder-subtractor-accumulator 2633 for the real portion of the AW point in row-column array 2632 (called the AWR accumulator) gets loaded with the result of a four-way addition of the outputs (called WR+XR+YR+ZR, these are the real-times-real portions) of multipliers 2620, 2622, 2624 and 2626, and the adder-subtractor-accumulator 2633 for the imaginary portion of the AZ point in row-column array 2632 (called the AZI accumulator) gets loaded with the sum/difference of outputs (called WI−XR−YI+ZR) of multipliers 2621, 2622, 2625, and 2626, respectively. By performing load operations at clock C0 with no accumulation of the prior value (for example, in AWR), the previous values of the accumulators do not need to be zeroed. Note that, since all four points for a single butterfly operation can be fetched simultaneously from conversion RAM 2252, and the results of the respective multiply operations must all be combined as they are formed, five-way mixed add/subtract operations are provided for by each adder-subtractor-accumulator 2633.

FIG. 84 shows the operations at each of the thirty-two adder-subtractor-accumulators 2633 at a multiplier clock cycle command denoted C1. For example, at C1, the adder-subtractor-accumulator 2633 for the real portion of the AW point in row-column array 2632 (called the AWR accumulator) gets loaded with the result of a five-way subtraction/addition of the outputs (called AWR−(WI+XI+YI+ZI), these are the imaginary-times-imaginary portions) of multipliers 2621, 2623, 2625 and 2627 and the prior contents of AWR. The adder-subtractor-accumulator 2633 for the imaginary portion of the AZ point in row-column array 2632 (called the AZI accumulator) gets loaded with the sum/difference of outputs (called AZI+(WR+XI−YR−ZI)) of multipliers 2620, 2623, 2624, and 2627, respectively.

Similarly, FIGS. 85 through 90 show the four-way and five-way operations which take place at multiplier clocks C2 through C7, respectively. Table 2810 shows the order of calculation for one embodiment of a transposed butterfly (calculating four radix-4 butterfly operations in eight multiplier clock cycles), where each of the four points for one radix-4 butterfly are each in different sub-banks (for example, one point in sub-bank 2290, one point in 2291, one point in 2292, and one point in 2293).

Twiddle-Factor Lookup Table 2610

In one embodiment, the twiddle-factor lookup table 2610 (also called a sine-cosine ROM lookup table) comprises 512 fifteen-bit words, wherein four words can be fetched in parallel. Each complex twiddle factor value pair is fetched sequentially, wherein the first 15-bit word represents the real part of the twiddle factor value pair and the second 15-bit word represents the imaginary part, and four values are fetched simultaneously (that is, four real values, having 60 bits total, are fetched on an even clock (for example, clocks C0, C2, C4 or C6) and four imaginary values are fetched on the following odd clock (for example, clocks C1, C3, C5 or C7). In another embodiment, the twiddle factor lookup table 2610 comprises of 256 thirty-bit words. The upper 15 bits represent the real part of the twiddle factor whereas the lower 15 bits represent the imaginary part. Although 1024 complex-value pairs are required in order to produce a 1024-point FFT or IFFT, the values are not unique, and the number of twiddle factors was reduced by a factor of four by making use of the simple trigonometric identities in mapping 360 degrees of twiddle factors to a 90-degree lookup table. In one embodiment, the twiddle-factor lookup table was designed to minimize DC offset caused by integer-based twiddle factors.

FIG. 92 shows a more-detailed block diagram of an adder-subtractor-accumulator 2633. In one embodiment, multipliers 2620 through 2627 are each a 16-bit-by-16-bit multiplier. In one embodiment, only the upper-order 16 bits of the resultant product are passed by MUX 2834. (In one embodiment, MUX 2834 is part of router logic 2634.) Adder-subtractor 2833 performs a five-way addition/subtraction as defined in FIGS. 83-90 and the two-way addition/subtraction as defined in FIGS. 75-82, under the control of sequencer 2640. In one embodiment, accumulator 2835 maintains enough bits above the binary point to accommodate overflow bits and to provide an indication of overflow which does not get lost as further addition/subtractions are performed on the accumulating data (in other embodiments, one, two, or three such bits are maintained).

Input and Output Timing

Tables 7 and 8 below are the detailed timings for one embodiment of the input and output RAMs.

TABLE 7

Read Cycle for Output RAM bank 2253

| Symbol | Parameters | Condition | Nom |
|---|---|---|---|
| Tcc | Clock Cycle Time Pulse Width | Minimum | 20 ns |
| Tchpw | Minimum Positive CK Pulse Width | Minimum | 6 ns |
| Tclpw | Minimum Negative CK Pulse Width | Minimum | 6 ns |
| Tavch | Address valid to CK high | Minimum | 4 ns |
| Tchax | CK high to address change | Minimum | 1.0 ns |
| Tchdox | CK high to Data Output change | Minimum | 2 ns |
| Tcd | CK high to data valid | Maximum | 15 ns |
| Toe | Output Enable time | Minimum | 0 ns |
| Toz | Output Disable time | Maximum | 7 ns |

NOTE:
The RAM clocks for the input and output banks are limited to 10.24 MHz

TABLE 8

Write Cycle for Input RAM bank 2251

| Symbol | Parameters | Condition | Nom |
|---|---|---|---|
| Tcc | Clock Cycle time | Minimum | 20 ns |
| Tchpw | Minimum positive CK pulse width | Minimum | 6 ns |
| Tclpw | Minimum negative CK pulse width | Minimum | 6 ns |

TABLE 8-continued

| Write Cycle for Input RAM bank 2251 | | | |
|---|---|---|---|
| Symbol | Parameters | Condition | Nom |
| Tavch | Address valid to CK low | Minimum | 4 ns |
| Tchax | CK low to address change | Minimum | 1 ns |
| Twch | ~WE low to CK low | Minimum | 4 ns |
| Tchw | CK low to ~WE high | Minimum | 1 ns |
| Tdivch | Data Input valid to CK low | Minimum | 4 ns |
| Tchdix | CK low to Data input change | Minimum | 1 ns |
| Tchdov | CK low to Data Output valid | Maximum | 15 ns |
| Tchdox | CK low to Data Output change | Minimum | 2 ns |

NOTE:
The RAM clocks for the input and output banks are limited to 10.24 MHz

Package for ASIC 2101

Package Dimensions and pin out for one embodiment: The ASIC 2101 generates 5V TTL output levels and accepts 5V CMOS or 5V TTL input levels.

TTL Input Levels are defined as follows:
VIL max=0.8 Volts
VIH min=2.0 Volts

CMOS Input Levels are defined as follows:
VIL max=0.2*VDD(0.9V<VIL<1.1V over 4.5V to 5.5V VDD range)
VIH min=0.7*VDD(3.15V<VIH<3.85V over 4.5V to 5.5V VDD range)

TTL Output Levels:
VOL max=0.4 Volts
VOH min=2.4 Volts

Functional Tests

Testing is broken down into a functional segment to verify device functionality and a scan segment to test for faults in the physical silicon. In one embodiment, the vectors are included in a test bench compatible with LSI Logic's tools. The functions to be tested in the device are listed below.

a. FFT/IFFT Operation—Vectors are provided which are characteristic of the expected use in the system. The frequency domain vectors are passed through an inverse transform (with appropriate bit scaling) and the results stored. The vectors are then passed through a forward transform (with appropriate scaling), and this final result analyzed. These tests are performed for the 1024-, 512-, and 256-point transforms. There are 10 frames of data for each test. The test bench includes 1024 vectors for the 1024-point transform, 5120 for the 512-point transform, and 2560 for the 256-point transform. There are twice this number of vectors passed through the device to complete the test. The total number of test vectors for this test segment are about 36,000.

b. FFT/IFFT Verification—A single sinusoid is passed through the 128-, 64-, and 32-point transforms. Both forward and reverse directions are tested.

c. Bit Growth Tests. Each bit-growth pin (2117-2118) is exercised for the 1024- and 512-point transform in the forward and reverse direction.

d. Power Down Tests—The device is placed in the middle of a transform, then powered down. The outputs are evaluated for correct state. The device is then asked to perform a forward and reverse transform to validate that the device can function after the reset.

e. Overflow Tests—An overflow condition is induced, and the device evaluated for correct response (e.g. the overflow pin is actuated and the event does not cause an adder to wrap around). The test includes an overflow in the positive and negative direction.

f. Reset—The device is placed into the middle of a transform operation, then reset. The outputs are evaluated for correct state. The device is then asked to perform a forward and reverse transform to validate that the device can function after the reset.

FIG. 93 is a high-level block diagram of one embodiment of modem receiver 2402 as shown in FIG. 71. The analog received signal-in is first processed by bandpass-and-down-convert block 2750. In one embodiment, the analog received signal-in is either 425 to 600 MHz or 550 to 770 MHz, and is converted by bandpass-and-down-convert block 2750 to a signal which is 100 kHz on both sides of a 18.432 MHz center frequency. In one embodiment, the tuning step size is 99 MHz. In one embodiment, analog-to-digital decimator system (ADDS) 2850 (in one embodiment, this is a Sigma-Delta decimator system that uses a Sigma-Delta analog-to-digital converter 2840) converts this band-limited signal into decimated I and Q quadrature signals, each 15 bits wide, which have a symbol rate of 288 K symbols per second (denoted 288 KBS), which are then processed by FFT block 2849. In one embodiment, FFT block 2849 is equivalent to FFT system 2100 of FIG. 70. The outputs of FFT block 2849 are then processed by post-processing block 2990 into digital data out.

FIG. 94 is a more detailed block diagram of modem receiver 2402. Analog received signal in is fed to band-pass filter (BPF) 2740 which limits the input signal to either 425 to 600 MHz or 550 to 770 MHz. The signal is then amplified by variable-gain amplifier 2741, and mixed by mixer 2742 with a demodulator signal of either 627-802 MHz or 752-973 MHz generated by signal generator 2747 as controlled by phase-locked-loop block 2746. The mixer 2742 produces a difference-frequency signal centered at 202.752 MHz which is filtered by BPF 2743. The resultant signal is again amplified, this time by variable-gain amplifier 2744, and then mixed by mixer 2745 with a demodulator signal of either 221.184 MHz generated by signal generator 2749 as controlled by phase-locked-loop block 2748. The resultant signal is an analog signal centered at 18.432 MHz and having a 200 kHz bandwidth. The resultant 18.432 MHz analog signal is then passed to an analog-to-digital decimator which, in this embodiment, is denoted as the components encircled by the dotted line referenced as Sigma-Delta decimator system (SDDS) 2850'. The exact mix of components which are included in SDDS 2850 can vary from embodiment to embodiment (that is, where the dotted line for SDDS 2850' is drawn may vary).

In FIG. 94, the 18.432 MHz analog signal is passed through BPF 2839 which is centered at 18.432 MHz. The 221.183 MHz signal is divided by divider network 2838 to produce a 73.728 MHz signal which drives Sigma-Delta converter 2840, and two 18.432 MHz signals (one of which is 90 degrees shifted from the other) which drive digital I/Q detector 2841. Sigma-Delta converter 2840 is any conventional Sigma-Delta converter, such as described in *An overview of Sigma-Delta Converters*, by Pervez M. Aziz et al., Vol. 13, No. 1, IEEE Signal Processing Magazine, January 1996, which is hereby incorporated by reference. Sigma Delta converter 2840 achieves high resolution by oversampling the input signal at a frequency much above the Nyquist frequency, and by providing a negative feedback path which uses an analog representation, $y_a[n]$ of the quantized output signal y[n]. FIG. 95 shows one such Sigma Delta converter 2840, having difference block 2860 that forms u[n] which is input x[n] minus feedback $y_a[n]$. Signal u[n] then is processed by discrete-time integrator 2863 and quantizer 2864, which is simply a comparator. By providing a sampling frequency which is high enough, the Sigma-Delta converter 2840 allows the use of a 1-bit quantizer to achieve high overall resolution.

Referring back to FIG. 94, the 73.728 MHz quantized output of Sigma-Delta converter 2840 is coupled to digital I/Q block 2841. In one embodiment, digital I/O block 2841 is simply two 2-input AND-gates; one input of both AND gates is connected to the 73.728 MHz quantized output of Sigma-Delta converter 2840, the other input of the first and the second AND-gate is coupled to the 0□ and the 90□ 18.432 MHz outputs of divider 2838. The outputs of digital I/Q detector 2841 are thus two serial streams, that represent I and Q quadrature signals respectively. The serial I and Q signals are then fed to coarse decimator and MUX 2842, which converts the two serial streams into a single N-bit-wide time-multiplexed I/Q parallel stream. In one embodiment, this time-multiplexed I/Q parallel stream is 10 bits wide. This time-multiplexed I/Q parallel stream is clocked at 2.304 MHz, and provides 10 bits of I followed by 10 bits of Q, thus having 1.152 million samples of I interleaved in time with 1.152 million samples of Q. This time-multiplexed I/Q parallel stream is then fed to I/Q demux 2843 which de-multiplexes the time-multiplexed I/Q parallel stream into separate I and Q streams clocked at 1.152 MHz each, and each 10 bits wide. These separate I and Q streams are then processed by three digital-processing blocks: DC-offset adjust block 2844 that digitally adjusts for DC (direct current) balance, DS_gain adjust block 2845 that digitally adjusts the decimated signal gain, and DS_mix block 2846 that digitally adjusts the phase.

The Sigma Delta decimator system (SDDS) 2850 is a N-bit A-to-D converter which generates a one-bit serial data stream having resolution and accuracy of N bits (in one embodiment, 15-bit resolution is obtained; in another embodiment, the A/D has a 10-bit resolution with 9-bit linearity). SDDS 2850 is running on the clock generator 2749 divided to 73.728 MHz which oversamples the SDDS input signal in order that it only passes data at the 18.432 MHz±100 kHz, approximately. The following circuits 2841-2847 then take that 200 kHz of frequency that Sigma-Delta converter 2840 passes and shift it down a base band, providing a range from 0-200 kHz. SDDS 2850 turns this relatively slow signal into 10-bit parallel words. The Sigma-Delta converter 2840 outputs a 1-bit serial stream, which is ANDed with two 18.432 MHz square waves to produce serial digital I and Q that are two 18.432 MHz gated square waves.

In one embodiment, the entire SDDS 2850 is integrated on a single VLSI chip using 0.8 micron BiCMOS 4S+ technology fabricated by IBM Corporation, with the analog circuits operating from a 5 volt supply voltage and the digital circuits operating from a 3.3 volt supply voltage. This single-chip implementation facilitates bit growth from stage-to-stage in order to prevent or reduce truncation or round-off errors. Thus 10-bit I and Q signals at the output of I/Q demux block 2843 are allowed, in one embodiment, to grow to 25-bits at the output of DS_mix block 2846 through the digital processing of DC-offset adjust block 2844, DS_gain adjust block 2845, and DS_mix block 2846. For example, the N bits each of the I and Q data streams at the output of I/Q demux block 2843 grow a little to $N^+$ bits after the digital processing of DC-offset adjust block 2844, $N^{++}$ bits after DS_gain adjust block 2845, and $N^{+++}$ bits after DS_mix block 2846. Decimators 2847 and 2847' select one out of every four values from the I and Q data streams, respectively, thus producing a 288 kHz rate of 25 bits each for the I and Q streams. These then pass through scaling blocks 2848 and 2848' which scale each data stream to 15 bits, which are denoted I' and Q' and are coupled to 15-bit FFT 2849.

One consideration with the large number of signals on such a single-chip implementation is to minimize the number of different clock signals. In the embodiments described for FIG. 94, for example, this is accomplished by running a large number of blocks from a single clock, even though some of those blocks might be able to run off a different and slower clock.

Overview of Data-Delivery Architecture

Referring now to FIGS. 96 and 97, there is shown the overall architecture of a data delivery system 500 according to another embodiment of the invention. The data delivery system 500 provides high speed data access to the home 510 or office 512 (alternately referred to above in FIG. 1 as remote units 46) over the HFC distribution network 11 using the infrastructure of the modem-based telephony transport system 10 described hereinabove. FIG. 97 illustrates the integration of the data delivery elements in the HDT 12. The system allows users to have access to local content 520 and the Internet 530 through services available at the cable providers' premises or head end 32.

Among other things, system 500 provides: (1) user data access to the Internet 530 and local content on a head-end server 520 through the above-described access platform; (2) support for TCP/IP and transparent bridging at the data link layer using a Dynamically Adaptive Transport Switching (DATS) methodology (described below); (3) guaranteed, reliable symmetrical data service at transfer rates from 64 Kbps to 512 Kbps, in increments of 64 Kbps, for geographically dispersed individuals; (4) guaranteed, reliable, symmetric shared access to a 8.192 Mbps data pipe for geographically limited group of users connected in a routed configuration; (5) mixing of data and telephony within a single HDT 12; (6) network management for telephony, video, and data through integrated CMISE and SNMP; (7) routed service through a head-end server; and (8) use of HISU and MISU RF modem technology for transport.

Referring now to FIGS. 98-100, the Cable Data Modem (CDM) 535 for the system 500 preferably can take three forms: a stand-alone box called the Personal Cable Data Modem (PCDM) 540, a HISU add-in card called the Data Modem Service Module (DMSM) 550, or a MISU add-in card called the Data Modem Channel Unit (DMCU) 560. The stand-alone PCDM 540 has several connector options; including standard F style coax cable, 10baseT Ethernet 542, and RS232 544. The DMSM add-in card preferably resides in an expansion slot on HISU 68 enclosure and will terminate a customer's computer with a 10BaseT Ethernet connection. The DMCU 560 add-in card will reside in a line-card slot of the MISU and will provide a 10BaseT Ethernet routed connection to four users. Customers without an integrated Ethernet port can add one to their system at minimal cost.

The system 500 provides connection to head end 32 services via the DATS methodology. The DATS methodology intelligently allocates bandwidth in the system to maximize both transport bandwidth and number of users while providing guaranteed bandwidth. Under TR303/V5 switching environments a central resource within the HDT 12 (described below) provides the intelligence to allocate bandwidth and efficiently manage transport load. This capability is implemented at the customer end by initiating a connection to the head end 32 when data is available to send. When the session is initiated, the head end 32 equipment determines the amount of bandwidth to be allocated to the subscriber as configured during pre-provisioning. The connection is maintained as needed and dropped when transmission is complete. During the time that the connection is maintained, bandwidth is guaranteed, providing the efficiency of packet switching and the guaranteed bandwidth of connection switching. All processing is performed through standard TR303/V5 call processing and therefore integrates completely with telephony provided over system 500. The architecture of the system 500 provides guaranteed bandwidth and latency to all supported users. As indicated in FIG. 101, up to 24 concurrent users can be supported at 512 Kbps within a single 6 MHz transport channel.

Using the DATS methodology, bandwidth is dynamically allocated to support a maximum of 240 users per 6 MHz channel (for example, see FIG. 13) at 64 Kbps. Each user on the system is guaranteed the allocated bandwidth for the duration of the session. As such, the bandwidth and latency seen by the user remains constant, independent of the traffic load, application type, or number of users. Assuming even distribution across all applications, the average frame size carried downstream is 378 bytes, while the average upstream frame size is 69 bytes.

The downstream latency from the HDT 12 is dominated by filling a 512 K data pipe, all other latencies in the system are insignificant. Therefore on average the latency to transfer a TCP/IP frame from the HDT to the customer is 5.9 ms. With Forward Error Correction (FEC) disabled, the average latency in the upstream direction, from the customer end to the HDT is also dominated by filling a 512 K data pipe. Therefore, on average the latency to transfer a TCP/IP frame from the HDT to the customer is 1 ms. Adding FEC will add up to 7 ms to the upstream latency.

Data Transport and Framing

The system 500 provides transparent bridging and data transport. A schematic representation of the data transport and framing is shown in FIG. 102. Upstream data traffic begins at the customer end equipment 511 where frames are put out on the Ethernet link 542. The CDM 535 buffers the frames and encapsulates them with HDLC framing 570. The HDLC frame 570 is then sent out over the coax by a modem 101 as one or more of the possible 240 payloads on the coax. The frame, along with other data and telephony streams is converted at the ODN 18 and sent to the head end 32 over optical fiber. At the head end, the CXMU 56 demodulates and sends the stream to the CTSU 54, where it is routed to the appropriate LANU 580 as part of a MARIO data stream. The LANU 580 buffers the complete frame, stripping the HDLC framing prior to putting the frame on the local Ethernet. All routing for the Internet is performed by the head-end server 590. The routing services could also be incorporated in LANU 580.

In the case of downstream traffic, the head-end server 590 puts Ethernet packets on the LAN. One to potentially seven LANUs 580 examine the Ethernet address and selectively pick up packets destined for the customer-end machines. Once the Ethernet packet has been accepted, the packet is framed in HDLC and sent, via a MARIO stream, to the CTSU 54 according to the routing established when the call was initially provisioned (explained further below). The CTSU 54 forwards the stream to the CXMU 56 where it is sent over the HFC distribution network 11 to the customer premises equipment 511. At the CDM 535, all packets received are passed on to the local Ethernet connection 542. In the case of a broadcast message, the LANU 580 at the head end will replicate the packet across all attached connections. This allows the bridge to support protocols such as ARP.

The system 500 will utilize the telephony error correction mechanism described above with respect to system 10 of FIG. 1. Under the telephony error correction scheme, forward error correction codes are generated for upstream traffic but not for downstream traffic. Forward error correction on upstream is generated at the ISU 100 (HISU 68 or MISU 66) and consumes the 10th bit of each DS0, thereby protecting each DS0 separately. The error correction can be disabled, but this is not recommended for data transport.

The error detection/correction processing occurs on the CXMU 56 of FIG. 3 and corrected data is delivered to LANUs 580, DS1Us 48, in MARIO streams. Therefore, the system 500 data architecture does not explicitly have to deal with error correction. The CRC of the HDLC frames provide for a level of error detection above the error detection/correction of the CXMU 56. Errors detected in the LANU 580 will be reported through the SNMP agent of the LANU 580.

Component Design

The data delivery hardware for the head end 32 equipment consists of the LANU 580 which interfaces with the HDT 12. The LANU 580 includes a board responsible for all data transport to and from the head-end server LAN 591. In that function, the LANU 580 operates as a point-to-multipoint connection that is responsible for concentrating up to 128 DS0s onto a single Ethernet connection. The LANU 580 has the following features:

(1) It sits in a DS1U 48 slot and is form/fit compatible with the HDT 12 backplane.

(2) It provides 10BaseT Ethernet connection to head-end LAN.

(3) It supports multiple LANUs 580 on a single LAN through a 10BaseT connection or fast Ethernet through hub.

(4) It concentrates up to 128 DS0s into a single Ethernet Connection.

(5) It supports time slot assignment and super-channel aggregation across four MARIO data streams independent of the CTSU 54.

(6) It supports Dual HDT 12 LAN ports.

(7) It maintains on-board FLASH for storage of operational code image.

(8) It supports Nx64 service for super-channels up to 512 Kbps.

(9) It guarantees time ordering of multi-channel calls independent of transport system.

(10) It provides transparent bridging and broadcast of Ethernet frames between head-end LAN 591 and CDM 535.

(11) It self-discovers Medium Access Control (MAC) addresses of CDM 535 and filters Ethernet frames with on-board CAM.

A high-level block diagram of the LANU 580 is shown in FIG. 103. The LANU 580 preferably employs a single processor, unified memory design. In this embodiment, the main processor on the LANU 580 is the Motorola MC68 MH360 QUICC32 (581), running at 33 MHz, which can deliver approximately 5 MIPS. The QUICC32 is actually a dual processor embedded controller that also contains a dedicated independent RISC processor communications called the CPM. The CPM along with Direct Memory Access (DMA) can access memory and move communication traffic without placing any performance burden on the main processor. In addition to acting as the host processor, the QUICC32 can also act as a slave. The LANU 580 implementation is preferably based on 4 QUICC32s with one acting as master and the remaining three operating in slave mode. The combination of the four QUICC32s provide the majority of the system peripherals.

There are several types of memory 582 on the LANU 580. The first and largest is 8 MB of page-mode DRAM for the storage of LANU operational code. In addition to operational code, the DRAM also holds the routing tables, data buffers, and buffer descriptors needed to process data traffic. Second, the LANU contains 2 MB of FLASH memory to store an image of its operational code. On power-up, the image is loaded into DRAM. Finally, the LANU also contains 128 Kbytes of EPROM to hold boot code. The boot code will load the contents of the FLASH into DRAM on power-up. If greater performance is desired, fast SRAM can be added to hold the data buffers and buffer descriptors for the data traffic.

There are two sets of system peripherals on the LANU: those that are contained within the QUICC32s and those that are not. Regardless of location, peripheral control on the LANU 580 is managed by the System Integration Module (software) (SIM) of the master QUICC32. The SIM is responsible for managing generation of Chip Select (CS) and other control lines.

The most important of the system peripherals are the QMC HDLC controllers 586 located in the QUICC32s. The QMC of the QUICC32 can implement up to 32 HDLC controllers running at 64 Kbps and are used to process the data traffic in the MARIO streams from the CTSU 54. The QMCs 586 can also support super channels by aggregating multiple 64 Kbit channels into higher data rate channels. The QMC 586 is implemented in the CPM of each QUICC32 and with the addition of SDMA can autonomously move communications data to and from main memory 582. Operation of the QMC 586 is controlled by the master processor 581 through the use of buffer descriptors that reside in external memory 582.

In addition to the QMC 586, three additional HDLC controllers 587 are used to provide two 2 Mbps HDT backplane LAN ports and a 10 Mbit Ethernet port. As with the QMC 586, the master processor 581 controls the HDLCs through the use of buffer descriptors, but unlike the QMC, these data structures reside in dual ported RAM (DPR) that are internal to the QUICC32s.

There are two additional system peripherals that reside outside of the master and salve QUICC32s. The first is the Rate Adaptation/Ninth Bit Signaling/Time Slot Assigner logic block (RA/NBS/TSA) 588. The RA/NBS/TSA 588, as its name suggests has three functions. The rate adaptation function is responsible for converting the 2.56 Mbps, 9 bit data format of the input MARIOs to the 2.048 Mbps, 8 bit data format of the QMC 586 in both receive and transmit directions. In both directions the RA is also responsible for managing any information that may be placed in the 9th bit.

The NBS is responsible for transmitting and receiving the data that is carried with each DS0 in the ninth bit. The ninth bit is used for two distinct functions. In the upstream direction the ninth bit carries information regarding the ordering of data within a multi-channel call. The signaling consists of a repeating number that indicates which time position the DS0 occupies in the multi-channel call. The format of the upstream ninth bit signaling is shown in Table 9.

TABLE 9

Upstream Ninth Bit Signaling

| Bit | Contents | Description |
|---|---|---|
| 1 | "1" | Sync Pattern |
| 2 | "1" | Sync Pattern |
| 3 | "1" | Sync Pattern |
| 4 | "1" | Sync Pattern |
| 5 | "0" | Sync Pattern |
| 6 | "0" | Sync Pattern |
| 7 | D[8] | Order Number, Bit 8 [MSB] |
| 8 | D[8]* | Inv. Order Number, Bit 8 [MSB] |
| 9 | D[7] | Order Number, Bit 7 |
| 10 | D[7]* | Inv. Order Number, Bit 7 |
| 11 | D[6] | Order Number, Bit 6 |
| 12 | D[6]* | Inv. Order Number, Bit 6 |
| 13 | D[5] | Order Number, Bit 5 |
| 14 | D[5]* | Inv. Order Number, Bit 5 |
| 15 | D[4] | Order Number, Bit 4 |
| 16 | D[4]* | Inv. Order Number, Bit 4 |
| 17 | D[3] | Order Number, Bit 3 |
| 18 | D[3]* | Inv. Order Number, Bit 3 |
| 19 | D[2] | Order Number, Bit 2 |
| 20 | D[2]* | Inv. Order Number, Bit 2 |
| 21 | D[1] | Order Number, Bit 1 |
| 22 | D[1]* | Inv. Order Number, Bit 1 |
| 23 | "0" | Sync Pattern |
| 24 | "0" | Sync Pattern |

The numbers can range from 1 to 128 with a 0 indicating that the DS0 has not been assigned a position. During a call, the processor 581 will monitor the ninth bit signals from all the channels and once the order has been established, the processor will configure the TSA function to order the channels. Once the order has been established, the processor will periodically monitor the ninth bit signaling to detect any changes in ordering (that is, frequency hoping due to excessive errors). In the downstream direction, the NBS is used to enable data transmission. Once the LANU 580 receives the ordering information for the channels, the processor will enable transmission by sending a data pattern over the downstream ninth bit of the first DS0 of a multi-channel call. The format for the "Data Dial Tone" signaling is shown in Table 10.

TABLE 10

"Data Dial Tone" Downstream Ninth Bit Signaling

| Bit | Contents | Description |
|---|---|---|
| 1 | "1" | Sync Pattern |
| 2 | "1" | Sync Pattern |
| 3 | "1" | Sync Pattern |
| 4 | "1" | Sync Pattern |
| 5 | "0" | Sync Pattern |
| 6 | "0" | Sync Pattern |
| 7 | CMD[15] | Command Bit 15, MSB |
| 8 | CMD[14] | Command Bit 14 |
| 9 | CMD[13] | Command Bit 13 |
| 10 | CMD[12] | Command Bit 12 |
| 11 | CMD[11] | Command Bit 11 |
| 12 | CMD[10] | Command Bit 10 |
| 13 | CMD[9] | Command Bit 9 |
| 14 | CMD[8] | Command Bit 8 |
| 15 | CMD[7] | Command Bit 7 |
| 16 | CMD[6] | Command Bit 6 |
| 17 | CMD[5] | Command Bit 5 |
| 18 | CMD[4] | Command Bit 4 |
| 19 | CMD[3] | Command Bit 3 |
| 20 | CMD[2] | Command Bit 2 |
| 21 | CMD[1] | Command Bit 1 |
| 22 | CMD[0] | Command Bit 0, LSB |

TABLE 10-continued

| "Data Dial Tone" Downstream Ninth Bit Signaling | | |
|---|---|---|
| Bit | Contents | Description |
| 23 | "0" | Sync Pattern |
| 24 | "0" | Sync Pattern |

Two commands are defined. The first is "Idle Sync" (bit pattern for CMD[15:0] is 0000 0000 0000 0000) is sent during idle times to synchronize the receivers. All idle syncs sent from the LANU 580 will be synchronized themselves to simplify the reception of order information in the upstream ninth bit signaling. The second command is "Data Dial Tone" (bit pattern for CMD[15:0] is 1000 0000 0000 0000) and is sent once the order of the super-channel has been established. This command will instruct the CDMs to enable transmission.

The TSA is responsible for ordering and aggregating channels that are sent to the QMCs 586. Although TSA has the ability to aggregate up to 128 channels into a single data stream, most applications will aggregate multiple super-channels, up to 8 DS0s per super-channel, among four DS1-like channels feeding the four onboard HDLC controllers. For 1 to 32 DS0 data streams, the DS0s are aggregated and sent to the QMC 586 as a 2.048 Mbps serial stream. Within a single DS1-like stream, multiple super-channels can be supported by connecting to a single QUICC32 QMC 586. The TSA can also aggregate 128 DS0s into a single 8.192 Mbps data stream and connect it to a QUICC32 HDLC controller. In both cases the TSA is configured to insure that the time ordering of the data is maintained.

The final peripheral that does not reside in a QUICC32 is the Contents Addressable Memory (CAM) 589. The CAM performs memory accesses based upon data rather than address and is used to quickly determine whether an Ethernet frame should be accepted. The Ethernet controller 587*a* interfaces to the CAM 589 through glue logic and the reject input. When a frame is received that is not in the CAM, the CAM logic asserts the reject control line and the received portion of the frame is discarded. The buffer depth of the Ethernet controller is set so that no memory accesses are generated on rejected frames. The CAM is available off the shelf from MUSIC semiconductor.

The LANU 580 sits in a DS1U 48 slot at the HDT 12 and is form and fit compatible with the DS1U 48 to be backplane compatible. The LANU 580 has four major system connections: MARIO 592, Ethernet 593, HDT LAN 591, and clocking (input not shown in FIG. 103). The four MARIO connections connect the LANU to the CTSU over the backplane. The four MARIO connections provide up to 128 bi-directional, 64 Kbit channels. The Ethernet connection connects the LANU to a local 10 Mbit, 10BaseT LAN. The 10BaseT connection will take the place of a single T1 connection of a DS1U. The connection is terminated by wire-wrapping the 10BaseT to the backplane and routing to a patch panel. For call provisioning and other system functions, the LANU 580 connects to two common 2 Mbps HDLC LANs on the backplane. Finally, system clocking is provided by an external source such as a Building Integrated Timing Supply (BITS).

Functional Description of Upstream Communications

For upstream traffic, the HDLC framed data available on the MARIO interface passes through the rate adaptation and TSA block 588. In this block, the 2.56 Mbps MARIO interface is rate adapted down to 2.048 Mbps. As part of rate adaption, the ninth bit of each DS0+ of the MARIO stream is stripped and sent to the NBS logic. The ninth bit carried an order number that is used to time order the DS0s in multi-channel calls. Once the order numbers are established, the processor 581 configures the TSA to re-order the multi-channel calls and target the super-channel to a QMC 586. For super-channels composed of 32 or less DS0s, the call is placed in a single 2.048 Mbps data stream, along with other calls and sent to a QMC 586. For 128 DS0 calls, the DS0s are placed in a single 8.192 Mbps stream that is target to a QUICC32 HDLC controller 586 configured for 8.192 Mbps HDLC. Whether targeted to a 2.048 Mbps QMC or 8.192 Mbps HDLC, the frames are accumulated and transmitted on the local Ethernet LAN.

Functional Description of Downstream Communications

For downstream traffic, data on the LAN is filtered according to the destination MAC address. If the MAC address is in the Content Addressable Memory (CAM) 589, the LANU 580 will accept the Ethernet frame. Once the frame is accepted, the LANU 580 accesses a routing table in memory 582 to select the appropriate MARIO slot for transport. The frame is then scheduled for transmission and the HDLC controller 586 takes over. In the downstream direction for 32 DS0 or less calls, the HDLC controller 586 is responsible for creating the MARIO stream and encoding the data into HDLC format. For 128 DS0 calls, the 8.192 Mbps HDLC data stream is split among the four MARIO interfaces (A-D). The time ordering and aggregation in the downstream direction is controlled by the TSA. After the data passes through the TSA, the ninth bit signaling information is added to indicate that data transmission is enabled. At the same time that the ninth bit signal is added, the data stream is rate adapted up to the 2.56 Mbps rate of the MARIOs.

For data movement the on-board memory 582 provides the switching and buffering necessary to move traffic from the Ethernet to the MARIO and vice-versa. The data switching provides a virtual circuit based upon routing information constructed during call provisioning that maps the MAC address to MARIO time slot. The LANU 580 constructs this routing table from information provided during call provisioning and by examining the source MAC address of Ethernet frames received from the customer end. The MAC addresses supported by the LANU are then placed in the CAM 589 where they can be used to filter Ethernet traffic.

In addition to the MARIO and Ethernet interfaces, the LANU 580 also supports two HDT backplane LAN 591 interfaces at 2.048 Mbps. The HDT LAN is maintained by the SCNU 58 at the head end 32 and is used to pass configuration information to the LANU 580. The combination of LANU 580, call processing, and pre-provisioning will provide the MARIO route (time slot in the MARIO data stream) to all customer devices.

Customer Premises Equipment (CPE)

The CPE of the system 500 comes in different implementations. Although the basic data framing and transport remain the same across all the implementations the underlying modem technology and form factor differs. There are currently three general types of CPE defined: HSU based, MISU based, and Stand-alone (a variant of the HISU based implementation). Each of these implementations are discussed separately below.

Data Modem Service Module

A simplified block diagram of the DMSM is shown in FIG. 104. DMSM 550 supports up to 8 DS0's for data traffic. Data is interfaced to the HISU 68 through a Service Growth Module (SGM) interface that implements the bridge router functions of the data connection. The bridge/router is based upon a 68302 embedded processor 605 with 2 MB of DRAM 604 and 256 Kbytes of FLASH memory 606. One embodiment of the customer interface is a 10BaseT, 10 Mbit Ethernet connection 602. The interface between the bridge/router and the HISU modem is a Super-LUIGI (SLUIGI) interface operating at 2.048 Mbps. Data in the upstream direction is accepted by the Ethernet connection and relayed to the HISU 101 modem over the SLUIGI interface as HDLC encoded data. In the downstream direction, data from the SLUIGI interface is passed to the HDLC controller 607 and then sent out the Ethernet connect through Ethernet controller 609. System memory consists of 2 Mbytes of DRAM 604 which contains the operational code that implements the bridge/router functions as well as an SNMP agent. The 256 KBytes of FLASH 606 is used for storage of the operational image and can be updated with TFTP transfers.

In the upstream direction, the HISU interface logic 608 is responsible for generating the ninth bit signaling information for each DS0 and interfacing with the SLUIGI stream of the HISU. The 2.048 Mbps serial data from the HDLC controller is stuffed in the appropriate time slots of the SLUIGI interface. In the case of 64 Kbit traffic, all HDLC data is placed in a single SLUIGI time slot. In the case of multi-channels calls, all HDLC is placed in adjacent SLUIGI time slot receiving the first byte of HDLC data. In addition, the interface logic will generate an order number for each DS0 with "1" assigned to the first DS0 and "8" assigned to the last DS0, "0" is reserved to indicate that the position of the DS0 has not been set. In the event of frequency hopping, the interface logic will continue to number the DS0 time-slots in the order that they are received. For example, under normal circumstances DS0 ninth bit signaling would tag the time slots as "12345678-" for an eight channel call. If DS0 4 is lost due to ingress, then the new order would be "123-45678." This signaling information is used at the head-end to reorder the DS0s independent of the frequency hopping and transport services.

In the downstream direction the HISU interface logic 608 is responsible for taking data from the SLUIGI interface from the RF modem 101 and giving it to the HDLC controller. In addition, the HISU interface logic monitors the ninth bit signaling information of the first DS0 to detect the "Data Dial Tone" sequence. The "Data Dial Tone" sequence is sent by the head-end to enable data transmission. During the call provisioning process the HISU interface logic sends the ninth bit ordering information as soon as the SLUIGI time slots indicate that they can accept data. It is not until the HISU interface logic gets a positive acknowledgment through the "Data Dial Tone" that data is sent to the head-end in the upstream direction.

Data Modem Channel Unit (DMCU)

A simplified block diagram of a DMCU 610 is shown in FIG. 105. The DMCU supports up to 128 DS0s for data traffic. The data interface to the MISU is a specialized channel that sits on the MISU backplane. The basic design of the DMCU 560 is very similar to the design of DMSM 550. The most notable difference is the interface to the RF portion is two 8.192 MHz serial channels. This allows the MISU interface to support a symmetrical 8.192 Mbps Ethernet connection. Because of the higher throughput the MISU is based on the MC68360 614 that can support both the 8.192 Mbps HDLC connection as well as the 10 Mbit Ethernet. In front of the 10 Mbit Ethernet interface 612 is a router 616 that allows four users access to the 8.192 Mbit data connection. The router 616 design ensures security for all connected users. The design contains 2 Mbytes of DRAM 618 and 256 bytes of FLASH 619. Like the HISU design, the FLASH can be remotely updated with TFTP.

The DMCU 610 has an equivalent interface function that moves data from the HDLC controller 611 to the RF modem and works in a very similar way to the DMSM 600 with the exception that the MISU modem interface is formatted as two SLUIGI streams that are clocked at 8.192 Mbps. Between the two SLUIGI streams, 128 DS0s can be carried between the HDLC controller 611 and the modem. The MISU interface logic 613 is responsible for buffering and then sending data over the dual S-LUIGI interface to and from the RF modem. In the upstream direction the MISU interface logic 613 generates order numbers for each of the 128 DS0s over the ninth bit of the DS0+ (the order numbers generated on the MISU work in the same way as they do on the HISU). In the downstream direction, the MISU interface logic 613 is responsible for moving data from the S-LUIGI streams to the HDLC controller 611. The MISU interface logic also monitors the ninth bit data stream from the first DS0 to detect the "Data Dial Tone" that enables data transmission. Ethernet controller 617 moves the data to the router 616.

Stand-Alone Data Modems

The stand-alone data CDMs are based upon the HISU design. In the stand-alone designs, the RF modem 101 of the HISU is tightly integrated with the bride/router design. Like the DMSM 600, the stand-alone supports from 64 K to 512 K. The interfaces are identical with several options: standard "F" style connector to the cable, 10 Mbit Ethernet and RS232 connection to the customers equipment.

System Software and Call Processing

In the TR-008/V2 system, calls are provisioned and nailed up at time of installation. Under this scenario an operator at the head-end 32 is responsible for determining the MARIO configuration and transfer rates (64 K to 512 K). The DATS methodology of present invention utilizes TR-303/V5 call processing to provide dynamic allocation of bandwidth. To maintain the telephony oriented architecture of the access platform of the present invention, the LANU 580 takes on responsibility of a limited subset of the Central Office (CO) functions. This approach has the distinct advantage that the data sessions are fully integrated with telephony.

At the time of deployment, a LANU 580 will be identified as a "Master" LANU (mLANU). The mLANU will have the responsibility to maintain the CO-like functionality for all data calls to the HDT 12. In order to perform these functions, the mLANU will represent itself to the HDT as an IDT. When the mLANU is pre-provisioned, the mLANU will be given an IDT identifier and assigned a Time Slot Management Channel (TMC) channel from the CTSU 54. Regardless of the number of LANUs 588 in the HDT 12 a single mLANU will allocate and keep track of available DS0s for all the LANUs in the HDT. As customers are configured, a Call Reference Value (CRV) for the selected CDM will be assigned to identify the customer. The CRV along with the number of data channels will be added to a call provisioning database on the mLANU.

The call processing sequence for call origination is shown in FIGS. 106-109. Call processing begins when the CDM generates an "Off-Hook" message over the IOC associated with the HISU, MISU, or Stand alone CDM (described above). After the "Off-Hook" message is received at the CXMU 56 then sends a "Request Service" message over the backplane. LAN 591 to the CTSU 54 identifying the CRV of the originator. After receiving the "Request Service" message, the CTSU 54 sends a set-up message to the mLANU 580 over the TMC (DS0 in a MARIO stream). The mLANU uses the CRV to access the on-board database in memory 582 and determine the number of DS0s to allocate the call. Once the number of channels has been determined, the mLANU identifies the DS0 and DS1 for the call. The mLANU then sends a "Make Cross Connect" message to the CTSU 54 over the TMC identifying the DS0 and DS1 and their association with the CRV. In response the CTSU 54 sends a "Req. Bandwidth" message to the CXMU 56 over the backplane LAN 591 to allocate the bandwidth in the transport.

Figure 107:
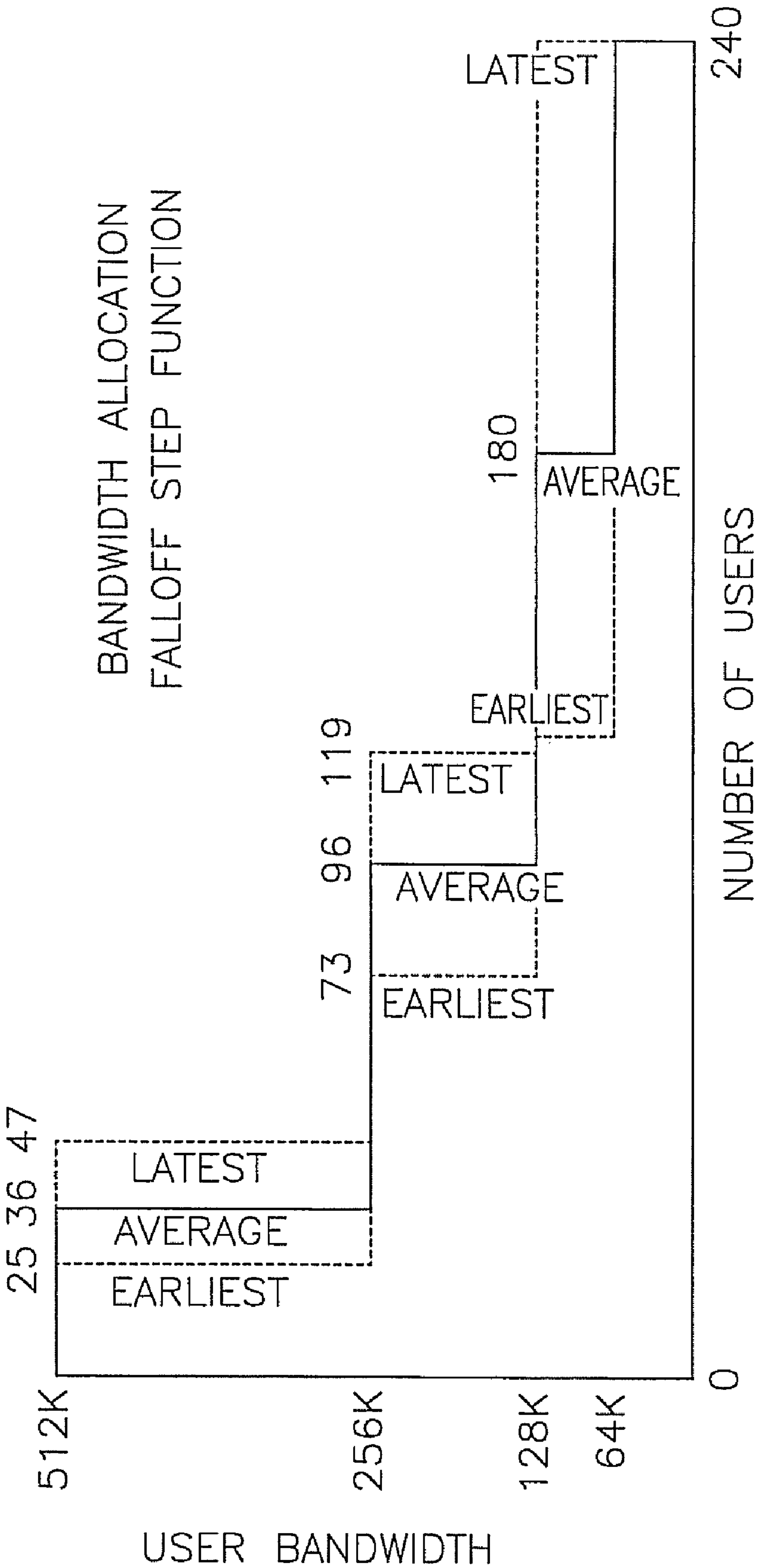
Figure 108:
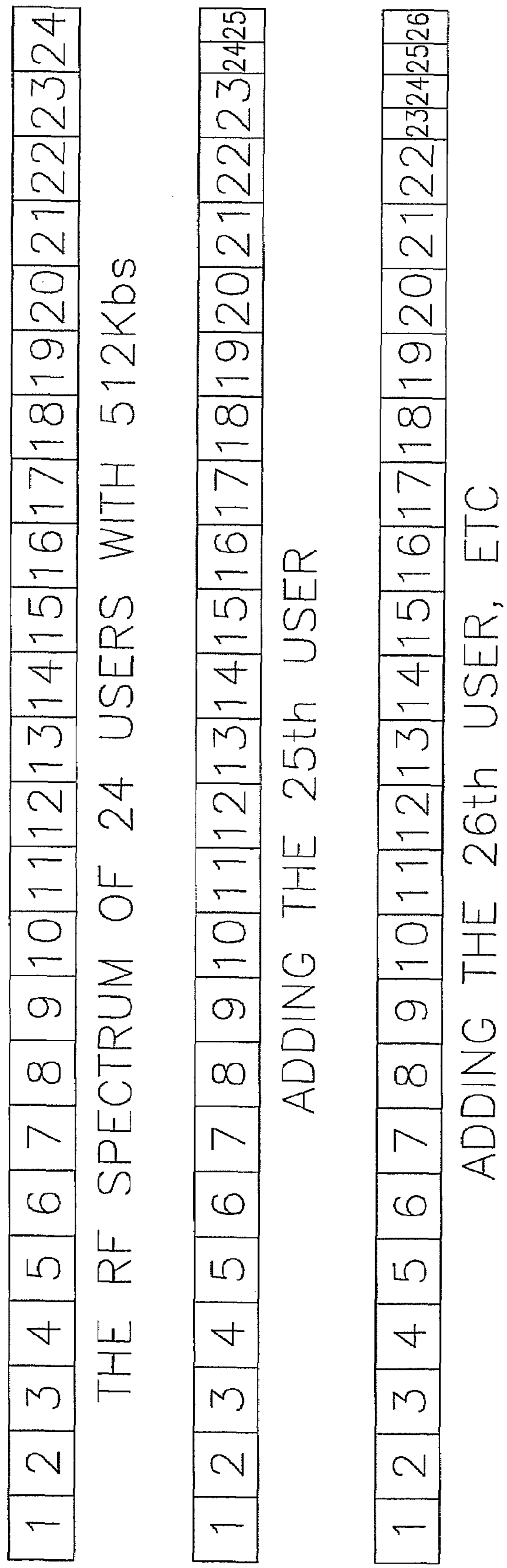

Preferably, the DAT methodology and system provides that each subscriber is represented in the database as having subscribed to a certain level of bandwidth per data connection. For example, a subscriber may sign up for 512K of bandwidth. Upon call setup or connection, the DAT methodology thus assigns each user the number of channels required to achieve the subscriber's bandwidth. However, in certain cases, the transport system 500 may not have the necessary bandwidth to allocate to a subscriber their normal subscripted bandwidth. Under these circumstances, the subscriber is allocated a lesser amount of bandwidth, for example 64K of bandwidth. By dynamically adjusting the amount of bandwidth assigned at call setup for each call, the mLANU can maintain a minimum level of bandwidth for each subscriber. However, existing constraints prevent small decremental bandwidth re-allocations. Constraints existing within the system 500 as described above will enforce the halving of bandwidth of some subscribers to accommodate additional subscribers, rather than by means of a more evenly distributed loading. As shown in FIG. 107, as the number of subscribers increase (on the horizontal axis) any given user's allocated bandwidth will halve at a certain user density. The spread around the average indicates that some users will necessarily lose half their existing bandwidth earlier under loading than will others.

Figure 109:
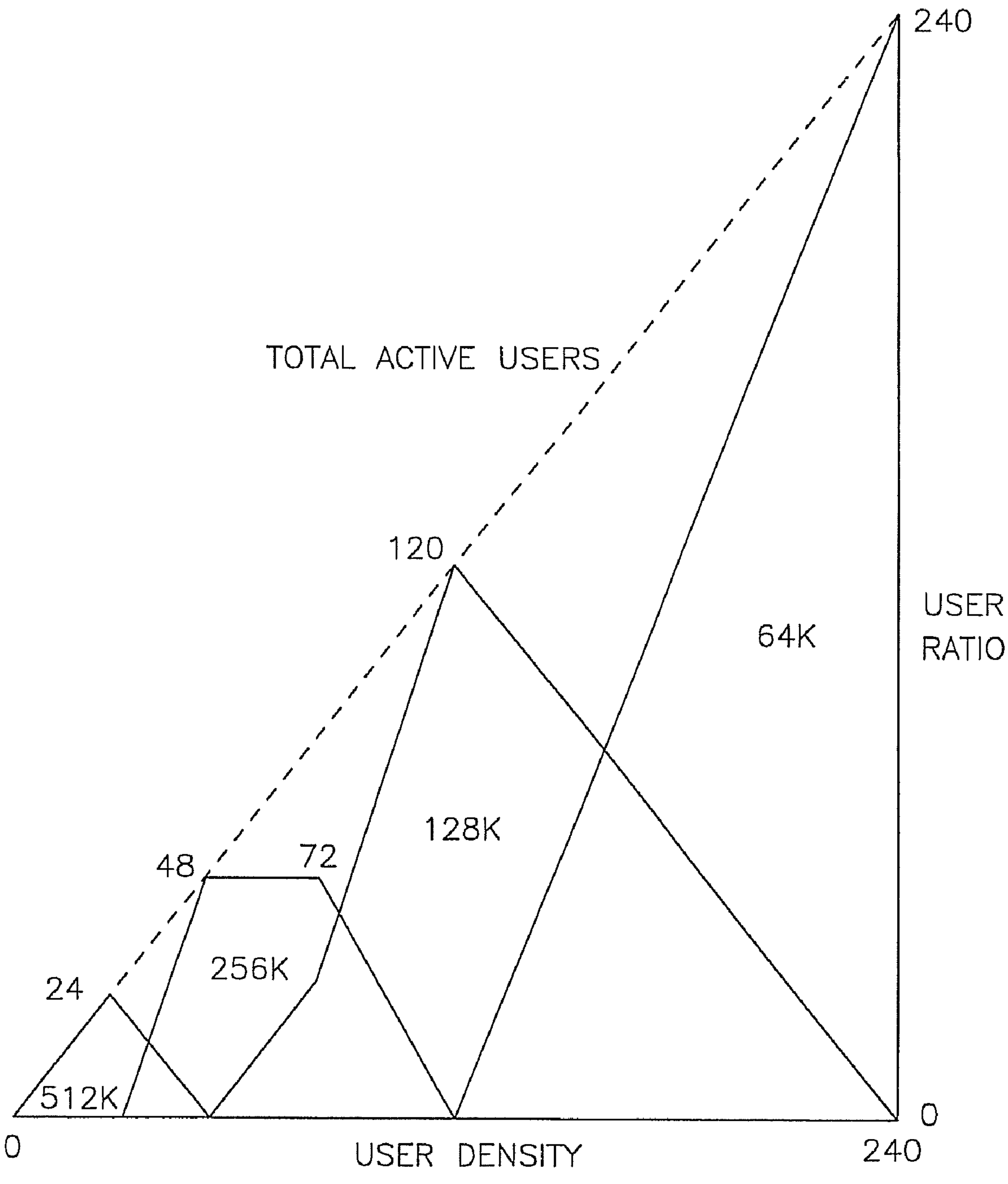

The constraining factor in preventing a more equitable burden is the window nature of the present HISU 68 RF tuning. As noted above, the HISU tunes to one of 24 IOC channels spread throughout the 6 MHz cable channel and has access to five payload channels above and five payload channels below the selected IOC frequency. It cannot borrow payload channels outside this window of ten channels, so therefore there is no way for the "25th" user to borrow just one channel each from seven other users. It can only sit on top of one of the existing IOC payload windows and takeover half of the window bandwidth. At that point, 23 users would be granted 512 kbs bandwidth and two users would each get 256 kbs bandwidth. The "26th" user would result in 22 users with 512 kbs and four users with 256 kbs, and so on. This general pattern is repeated at a load of 72 users and 120 users. (There is a discontinuity in the pattern from 48 to 72 users due to the previously unused two of ten DS0's per window being pressed into two DS0 128 kbps service.) The graph of FIG. 109 illustrates the distribution of bandwidth to users as the number of users increases. It is also contemplated that a subscriber could have different default or standard data rates depending on the time of day or day of week, or based on system loading, such that a user can receive even more bandwidth than their standard rate under certain system loading conditions, such as if the system is loaded below a predetermined threshold at the time the subscriber seeks a connection. Also, using the ninth bit signaling, the mLANU can "steal" bandwidth from other (e.g. high capacity) users. This is done by removing the Data Dial Tone from a subscriber using the ninth bit signaling. This quiesces the user's line, allowing, the number of channels for that user can be reassigned to increase the bandwidth allocated to the user. This technique can also be used to decrease the number of channels assigned to a user.

In order to establish the transport, the CXMU 56 trains the modems (as described above with respect to system 10) and associates the available tones with DS0s. Once the training is complete, the CXMU 56 sends a "Pass" message to the CTSU 54, which in turn informs the mLANU over the TMC that the call is complete with the "Call Complete" message. In response, the mLANU configures the HDLC controllers 586 and the TSA 588 on the mLANU or another LANU through communications over the backplane LAN. At this point the pipe is established but data is not yet enabled.

In order to actually begin data transmission two additional steps have to occur across the ninth bit signaling of the DS0s. At the point where the modems are trained the HISU 68 or MISU 66 interface logic (608,613) will be enabled to transmit data. Once the transmit is enabled, the interface logic will begin transmitting the DS0 ordering number in the ninth bit of each DS0. At the LANU 580, the processor 581 will monitor the ninth bit signaling to determine when all DS0s have established their order. Once all DS0s have established order, the LANU 580 will send the "Data Dial Tone" pattern on the ninth bit of the first DS0 in the multi-channel call. When the ISU 100 receives the "Data Dial Tone" data communications are enabled and data transmission begins.

A session is terminated at the customer end when no data is available for transmission by generating an "On Hook" message. The call processing sequence for an "On Hook" message is shown in FIG. 110. When the CDM terminates the connection, an "On Hook" message is sent over the IOC to the CXMU 56. The CXMU 56 in response sends an "On Hook" message, identifying the CRV, to the CTSU 54. The CTSU 54 then sends a "Tear Down" message to the mLANU 584 over the TMC. At the mLANU 580, the connection is deleted from the connection database and then released. If the connection is not on the mLANU, the mLANU will send a "Release Channel" message to the target LANU 580 and also will send a "Release Cross Connect" message to the CTSU 54. The CTSU 54 will release the cross connects used for the connection and then send a "Release Bandwidth" message to the CXMU 56. At the CXMU 56 the mapping between tones and DS0s is lost and the connection is lost. When the connection is lost, the CDM will lose the "Data Dial Tone" in the ninth bit signaling of the first DS0 of the call.

The LANU 580 can also be configured to bring up connections to customer-end equipment. This allows for notification of incoming e-Mail and personal Web pages without tying up idle bandwidth. To do this, the master LANU in each system will maintain a mapping between the MAC address for each data element in the system and cross that with the CRV. Then an Ethernet packet is put on the head-end LAN 591, and a LANU 580 will read its MAC address and determine whether the connection is up to the device. If the connection is up, the packet will be forwarded over the HFC transport. If the connection is not in place, the receiving LANU 580 will generate a connection request to the mLANU. The mLANU will then signal the transport system over the TMC to bring up a connection to that device using the IOC. The receiving LANU 580 will then send the data once the connection has been established.

LANU Software

The LANU software 620 is responsible for the all major function of the data concentration of the head-end equipment. A simplified schematic diagram of the LANU software is shown in FIG. 111. The software 620 consists of three major components: bridging 621, HDLC LAN manager 622, and data IDT 623. All three tasks will operate as applications on top of the embedded controller operating system "pSOS" kernel in the processor 581. The pSOS kernel will provide the base for the multi-tasking operation of the software 620.

The most important task to the actual transport of data will be the bridging task. The bridging task has several functions. First, the task will be responsible for providing the virtual switch between the MARIO and Ethernet interfaces. The task will be implemented as an "interrupt on receive" task that will execute at interrupt level. At either interface, an interrupt is issued when an entire frame has been received and stored in buffer memory (FIG. 103, 582). During the interrupt service routine, the packet will be handed off by modifying the associated buffer descriptor after looking up the routing in the bridging table (stored in memory 582). For upstream traffic (HDLC to Ethernet), the source of the first packet will be read to discover its MAC address. This address will be added to the bridging table and written to the Ethernet CAM 589 for filtering.

A second function of the bridging task is the creation and maintenance of the bridging table. The bridging table will match the MAC address of the CDM 535 with the MARIO DS0s so that data can be moved between the Ethernet and HDLC. During call processing, the DS0s that are allocated to the call will be identified by the mLANU 580 through backplane LAN (591) Messaging and installed in the bridging table. As described above, when the first frames begin to flow from the CDM, the source MAC address will be identified and the table entry for the CDM will be complete. At this point data will flow in both directions. Once the MAC address has been discovered, the bridging table entry will remain intact until the connection is terminated by the CDM.

A third function of the bridging task is maintenance of an SNMP agent. SNMP traffic will be handled and processed from the Ethernet port. The agent will support a standard MB-II information database for transparent bridging. In addition, objects will be added to the MIB that are specific to the data architecture to facilitate CMISE-SNMP integration and different billing options.

Finally, the bridging function may support link-layer encryption/decryption on the bridged data. Encryption/Decryption may be software only or hardware assisted depending upon the desired performance of the system. In either case, this function will execute as an application on top of pSOS.

Another component of the LANU software 620 is the HDT LAN manager 622. The HDT 12 LAN 591 is used to communicate system messages between the elements of the HDT 12. During pre-provisioning, the SCNU 58 will communicate system parameters such as CRV, IDT ID, and number of channels accessible by the CDM to the mLANU 580. These parameters will be used in the construction of the call provisioning table resident on the mLANU. During call provisioning, the mLANU will examine the provisioning table for available DS0s and use the HDT LAN 591 to set up MARIO configurations on other LANUs 580.

Another important function of the HDT LAN manager software 622 is support for field software upgrades. During download, the LANU 580 will take the image from the HDT LAN and store it in on-board FLASH memory. Aside from the SCNU 58, the LANU will be the only board in the HDT 12 that will load its image from its own FLASH on power up. As such, support for image download from the SCNU 58 Ethernet port will need to be added to the SCNU software. A final function of the LAN manager software 622 is to provide the network management access to the SNMP environment of the LANU.

The final major task of the LANU software 620 is the data IDT 623. As described above, the system 10 of the present invention is designed to provide access from POTS to a CO switch. As such, the burden of resource allocation and assignment of DS0 terminates at the switch. Since the data architecture of the system 10 terminates at the head-end there is no such centralized resource in the architecture to provide the services of the switch. In order to provide the services required to terminate the data "calls" a single LANU 580 functions as the data IDT.

The function of the data IDT is to provide a single point of reference for the data resources of the HDT 12. During pre-provisioning of the LANU hardware a LANU 580 will be designated the "Master" LANU (mLANU) and assigned an IDT identifier. The mLANU 580 will then take on the function of the switch for data calls by maintaining a table that maps CRVs to service level (# of channels). In addition, the mLANU will maintain a map of all available DS0s an all LANUs (including the mLANU itself) installed at the HDT. A copy of the call provisioning table will be kept in on-board FLASH so it can survive a power loss.

In order to maintain compatibility with standard telephony traffic, the means of communication between the CTSU 54 and mLANU will be a TMC connection over one of the DS0s within a MARIO. During call provisioning, the CTSU 54 sends a setup message over the TMC and the mLANU will respond with a "Make Cross Connect" message that identifies the DS0, DS1, and CRV for the connection. As discussed previously, the mLANU will also configure the LANU 580 for the connection through communications over the HDT 12 LAN 591. Therefore the data IDT software 623 will emulate the switch though its communications with the CTSU 54 over the TMC using Q.931 compatible messaging.

On all LANUs in the HDT 12, whether master or not, the data IDT software 623 will be responsible for configuring the TSA and communicating with the bridging task. In configuring the TSA, the data IDT will monitor the sequence numbers in the ninth bit signaling and appropriately configure the interconnect so that the order within a multichannel call is maintained. In addition, the data IDT software 623 will communicate the state of the connection to the bridging task to open up the data pipe.

Another important function of the data IDT software 623 is to provide the information needed to provide billing and other accounting functions. As an IDT like function the data IDT will also support standard CMISE objects.

CDM Software

Software provided in a CDM 535 (executing on the local processor 605 or 614 and represented by such elements) will provide the same types of functions. The major function of the CDM software is to provide the bridge/router (brouter) functionality at the customer-end. In supporting the brouter function the CDM software supports IP routing, PPP, and SLIP. As part of IP support the CDM supports TFTP for downloading new code images. The CDM also supports a standard SNMP agent with a full MIB-II information base. Preferably, the software executes on either the 68302 (605) or 68360 (614) processor.

The control of the modem portion is with the standard MISU or HISU software running on a Motorola 68HC11. This code supports all the alarm conditions and communications set out above for IOC communications. The interface between the RF modem and the brouter is preferably a hardware only implementation.

Network Management

Network management of the data architecture of system 500 is preferably provided by both CMISE and SNMP. The CMISE portion of network management will be responsible for the transport mechanism for data, while SNMP will be used for data network oriented management. In this environment, SNMP is an overlay to the CMISE environment.

As with all telephony services, the data architecture will depend upon CMISE for network management of call provisioning and other transport related functions. In addition, CMISE will be responsible for accounting on data connections. This approach provides for a very flexible billing system where services can be billed per connection time, bytes passed, or packets passed. Statistics will be collected in the mLANU and reported to the network manager.

SNMP management is used to provide data services management for the data architecture. In this way the data architecture will resemble a standard data network. Within SNMP management, the LANU 580 and CDM will maintain SNMP agents compliant with the MIB-II standard. In order to support an SNMP agent both the LANU and the CDM will need to support the UDP and IP protocols in addition to the SNMP protocol. In order to provide a single point of management for data and telephony, both CMISE and SNMP are preferably integrated into the same element manager. This level of integration will simplify billing by providing several options such as bill by connection time, bytes passed and packet passed.

Asymmetrical Data Delivery

For many casual residential users, data traffic can be characterized as mostly “bursty” (intermittent), downstream traffic with relatively, small upstream needs. The most cost effective means of delivering services such as Web browsing, file downloads, and CD-ROM preview is asymmetrical transport. The asymmetrical data transport embodiment of the invention includes a customer premise unit or Personal Cable Data Modem that contains a 30 Mbps, QAM downstream demodulator (PCDM-30) 620*a*, as shown in FIG. 112. PCDM-30 also includes an OFDM upstream modulator supporting a minimum of 64 Kbps guaranteed, non-shared bandwidth. The connection to the customer-end equipment is 10BaseT Ethernet that supports standard TCP/IP.

At the head end 32, an ASMU 622*a* supports multiple users on a single 30 Mbps channel which occupies 6 MHz of spectrum outside of the channels of the telephony transport system 10. In addition to the downstream modulator, the ASMU 622*a* concentrates the return channels by interfacing with the HDT 12. Upstream traffic is carried over as a single DS0 and integrated with the downstream transport on the ASMU 622*a*. The connection from the ASMU to the head-end services is 10BaseT, but higher capacity industry standard connections are also possible.

The ASMU 622*a* sits at the head end 32, but not in the HDT 12. The function of the ASMU 622*a* is to integrate the upstream path for up to 400 DS0s (Configurable from 64 Kbps to 512 Kbps) and a 30 Mbps shared downstream. Each LANU 580 will generate an 8.2 Mbps HDLC stream that contains the 64 Kbps Ethernet packets from all the users that are attached to LANU through the transport system. On the ASMU 622*a*, up to four of these, are aggregated, and sent out to the head services over 10BaseT Ethernet. In the downstream direction, the data on the 100BaseT is filtered on the ASMU, and those packets destined for the customer end products are accepted and then modulated onto the 30 Mbps shared medium.

In order to register a modem, the customer-end modem sends out an IP packet to identify itself. This causes the LANU 580 to assign an HDLC address that is mapped to the MAC address of device. This information is passed to the ASMU 622*a* so that the HDLC address can be used by the modulator over the HDT 12 backplane LAN 591. The HDLC address and frequency for the tuner is also sent to the customer-end over the downstream telephony path and registered at the customer end. This address is then used by the customer-end equipment to filter the 30 Mbps downstream channel.

One advantage of the asymmetrical system is that a relatively large number of casual users (300+) can be supported by a single multi-megabit downstream transport, with an optimal amount of upstream capacity. The implementation of the downstream matches the downstream of other cable data modems in use and additionally provides superior, high capacity upstream. Since casual users place lesser demands on the network (peak utilization is lower than that of business), users can be concentrated on the return channel, thus lowering head-end 32 costs.

The upstream channel in asymmetrical applications is still important due to the nature of the acknowledge protocol of TCP/IP, where blocks of data sent in the downstream must wait on an acknowledge message from the receiver before subsequent data blocks are sent. If the upstream channel is too small, the downstream channel will stall, reducing the utilization of the downstream bandwidth. By guaranteeing a minimum of 64 Kbps to each user, the asymmetrical system can deliver greater than 1 Mbps sustained to each user, matching the capacity of most residential computer equipment. Another advantage is the superior security of OFDM in the upstream. Unlike other shared upstream modem products currently available, the asymmetrical system herein described prevents information, such as bank accounts and credit card numbers exchanged during on-line Internet shopping, from being “seen” by other modems on the network.

Summary of Data Delivery System Advantages

Thus, the symmetrical embodiment of system 500 provides many options for the delivery of data services over HFC distribution network 11 to the residence or business. The DMSM 550 provides from 64 Kbps to 512 Kbps access to head-end resources over a 10BaseT connection or RS232 (64 Kbps service). The service is symmetrical (same data rate upstream and downstream), non-shared and dedicated to each user, providing a guaranteed level of service. As an add-in card to the HISU, the DMSM 550 provides complete transport integration with telephony, supplying high-speed data and two POTS lines to the residence. The PCDM 540 provides the same data transport capabilities as the DMSM 550 in a standalone configuration, packaged in a traditional modem housing. This implementation is ideal for premises or installations where telephony is not deployed.

The DMCU 560 is an MISU channel unit that provides higher data rates than either the DMSM or PCDM-512K. The DMCU 560 router manages four subscribers who share up to 8.192 Mbps of symmetrical bandwidth. The router implementation guarantees that all four subscribers on the DMCU 560 have private connections. The DMCU 560 works well for multiple dwelling installations for Internet access and small business connections where symmetrical, non-shared data access is required.

At the head end, the LANU 580 provides the concentration of up to 100 DS0s in flexible combinations of various data rates, from 641 Kbps to 512 Kbps for residential, and up to 8.192 Mbps for business applications on a single, industry standard 10BaseT connection. An HDT 12 can be configured with up to seven LANUs, concentrating up to 700 DS0s. In addition to the industry standard transparent bridging function, the LANU also provides the intelligence for the dynamic, adaptive allocation of bandwidth capacity to optimize transport during times of heavy loading. This capability enables an HFC service provider using system 10 to mix residential and business data services in a single 6 MHz channel without compromising the quality of service for business connections during peak Internet access times. Dynamic-allocation allows the customer units to efficiently utilize the data transport by dropping connections at times of no traffic and re-establishing them when data is ready to send. Each time a connection is established the LANU 580 will allocate bandwidth of up to a maximum of 512 Kbps, depending upon the network load, with a minimum of 64 Kbps. Finally, the LANU collects detailed traffic statistics that can be used for a variety of billing methods, for instance bill by connect time.

System 500 is particularly effective in meeting the special needs and higher expectations of business applications. Businesses tend to require a higher level of upstream signaling in order to support applications such as telecommuting and videoconferencing. Most cable data modem network architectures can provide only limited upstream capacity, but ADC is able to, offer a very high capacity upstream due to the efficiency of OFDM and frequency agility. Guaranteed bandwidth is of equal importance to upstream capabilities. Businesses must have full access to their pipeline at all times, regardless of other traffic on the network. With system 500, once a premium user's bandwidth has been established, it cannot be diminished, regardless of the number of users who subsequently access the network.

The security of the data being transported is also a major concern to businesses. Security at the transport layer (encryption and secure key exchange) and at the network layer (filtering) is provided by current transport technologies. System 500 also provides additional security at the physical layer, made possible by utilizing frequency scrambling within the OFDM transport.

The symmetrical product line is well suited for "power" Internet users who use their PC's not only for casual Web browsing but for remote LAN access, telecommuting, real-time audio, and possibly video teleconferencing. While these users are demanding, they are frequently early adopters of technology who will push the limits of Internet access and Internet applications, making the symmetrical, non-shared, guaranteed quality of service of the symmetrical products a requirement.

For both residence and business users, the symmetrical embodiment of system 500 provides for superior integration with telephony. By utilizing OFDM transport in both the upstream and downstream, the symmetrical system can carry data in the same 6 MHz channel as telephony traffic. This capability is ideal for smaller installations and early deployment where efficient use of spectrum is important. In addition, OFDM provides a very secure data delivery stern by implementing a point-to-multipoint bridge for data where two customer premises units never share the same digital data stream. The delivery of data over system 500 requires the efficient allocation of available bandwidth and network management of system resources.

System 500 provides a completely scalable data architecture by dynamically allocating bandwidth for data traffic through its utilization of a subset of standard TR303/V5 call processing software. This system capability gives HFC service providers the flexibility to tailor the configuration of head-end resources to satisfy the diverse needs of their subscriber base. Subscriber services can be provisioned at the head end as symmetrical fixed, symmetrical variable, or asymmetrical services. As the subscriber mix changes or subscribers upgrade service, head-end resources can be re-provisioned to meet the new requirements. For example, users can be easily reconfigured to upgrade from 64 Kbps service to 512 Kbps or even from asymmetrical to symmetrical. For capacity planning, data bandwidth is allocated as a number of DS0s to potential users with a single HDT supporting up to 720 DS0s. The number of users supported is then a function of service level (number of DS0S) and concentration ratio (number of users per DS0).

To ensure that service providers have an effective tool to manage their cable data networks, system 500 offers an integrated data/telephony network management solution. Data management is based on industry standard SNMP agents and MIBs (management information bases), which are then combined into an integrated data/telephony network management environment. Integration of data delivery and telephony into a single network management system has several advantages:

(1) Symmetrical data, asymmetrical data, and telephony elements can be managed by the same element manager.

(2) Less support staff is required.

(3) Better integration with billing.

(4) Better fault isolation.

(5) Lower Mean Time To Repair (MTTR).

Thus, system 500 provides a single, integrated system that can meet the diverse needs of potential subscribers, from casual Internet browsers to high-capacity business users. The integrated solution gives HFC service providers a single point of network management that results in reduced support costs, reduced staffing costs, and shortened time to turn-up new services. Finally, the OFDM technology of system 500 provides data, video and telephony services in a bandwidth-efficient system that reduces the demands on a very valuable commodity for HFC service providers spectrum.

ATM Embodiment

The system 500 of the present invention can also be configured to carry data from an Asynchronous Transport Mode (ATM) network. As shown in FIGS. 114 and 115, system 10 or 500 of the present invention is modified to include an ATM multiplexer/modulator 650 which can receive ATM data from an ATM network 652 and modulate it onto the HFC network. In one preferred embodiment, digital video data is delivered over ATM network 652, multiplexed and modulated using multiplexer/modulator 650 onto the HFC network in RF digital OFDM format on assigned data and/or telephony channels between the head end and a subscriber, as for example described above with respect to system 10 or 500. A digital set top box 654 receives the digital video, formatted for example in 4.0 Mbps MPEG or equivalent, and converts it to video for display on a television 656. A return path to the HDT 12 over a telephony or data channel allows for interactive digital video. A video server 658 and ATM switch 660, feeding the ATM multiplexer/modulator 650, is shown in FIG. 115.

Embodiment of Control Aspects of Telecommunications System Channel Manager

In one embodiment, communication system 10 of FIG. 1 includes channel manager 900 of FIG. 59 to control various aspects of the dynamic allocation of channels to ISUs 100. For example, channel manager 900 assigns each ISU 100 to a subband, allocates channels in the subband to an ISU to complete a communication link, and monitors the channel to detect and avoid use of corrupted channels. Channel manager 900 implements further functions as described below to coordinate the use of the channels in a 6 MHz transmission channel to ISUs 100.

Channel manager 900 may comprise software executed by a processor resident in each CXMU 56 of each HDT 12. Channel manager 900 receives events from board support software 902, IOC and modem communicators 904, ISU ranger 906, and administrator 908. Channel manager 900 also sends messages to IOC and modem communicators 904 for allocation or reallocation of channels. Channel manager 900 uses two types of channels to communicate control data to the ISUs. First, channel manager 900 broadcasts control data over the IOC channels to the ISUs. The control data on the IOC channels contains an identification signal that indicates the ISU to receive the control data. Further, channel manager 900 uses an ISU demand link channel, referred to as an IDL channel, for non-time-critical transport of data between head end 32 and an ISU when the data is of a size that would benefit from a transmission channel with more bandwidth than the IOC. Typically, the data rate for the IOC channel is 16 Kbps and the data rate for the IDL channel is 64 Kbps due to the amount of data contained in each package or frame. Typically, control signals contain four data bytes or less per frame or package. The IDL channel is used to transmit data packages that are larger than this. For example, the IDL channel is used to download software to an ISU, provision a channel unit, transmit future channel unit functions, or transmit protocols. In one embodiment, HDT 12 only implements one IDL at a time. The IDL channel is described in more detail below.

Subband Assignment and Channel Allocation

Channel manager 900 is responsible for assigning an ISU to a subband and for allocating payload channels for communications links to the ISU. Appropriate selection of subband and payload channel improve the performance of communication system 10. Channel manager 900 further monitors the channels and reassigns subbands and reallocates channels as necessary to maintain acceptable communications links between head end 32 and ISUs 100.

Channel manager 900 selects a subband for an ISU in several circumstances: during acquisition, when an HISU is assigned to a subband that has insufficient payload channels to meet a request, and during an HISU IOC timeout event. An IOC timeout event occurs when acknowledgments are not received by channel manager 900 from an ISU within a specified time period. With a timeout, it is assumed that the downstream communications to the ISU are still in tact even though the upstream communications have become corrupted due to noise or collisions. Thus, a message on the IOC to retune to a new subband is assumed to reach the ISU despite the lack of an acknowledgment.

In each case in which an ISU is assigned to a subband, channel manager 900 uses various criteria to select the subband for an ISU. FIG. 62 is a flow chart that illustrates one embodiment of a method for assigning an ISU to a subband. According to this method, channel manager 900 first selects a subband 6202. Channel manager 900 then determines whether addition of the ISU to the subband would provide an acceptable load on the IOC channel 6204. For example, channel manager considers the number of ISUs assigned to a subband. Further, channel manager considers the type of ISU and the likely load that the ISU will place on the IOC channel. By considering these factors, channel manager 900 can selectively distribute the load on the IOC channels so as to facilitate timely communication of control data to and from the ISU. This also allows channel manager 900 to evenly distribute the ISUs over the available subbands such that a like number of ISUs occupy each subband. Channel manager 900 also weighs the number of available channels 6206 within the subband and their transmission quality 6208 as recorded in the tables of channel manager 900. Channels with longer low-error rate histories will be used first. Channels previously marked bad and reallocated for monitoring will be used last. Based on these criteria, channel manager selects a subband for each ISU 6210.

Figure 63:
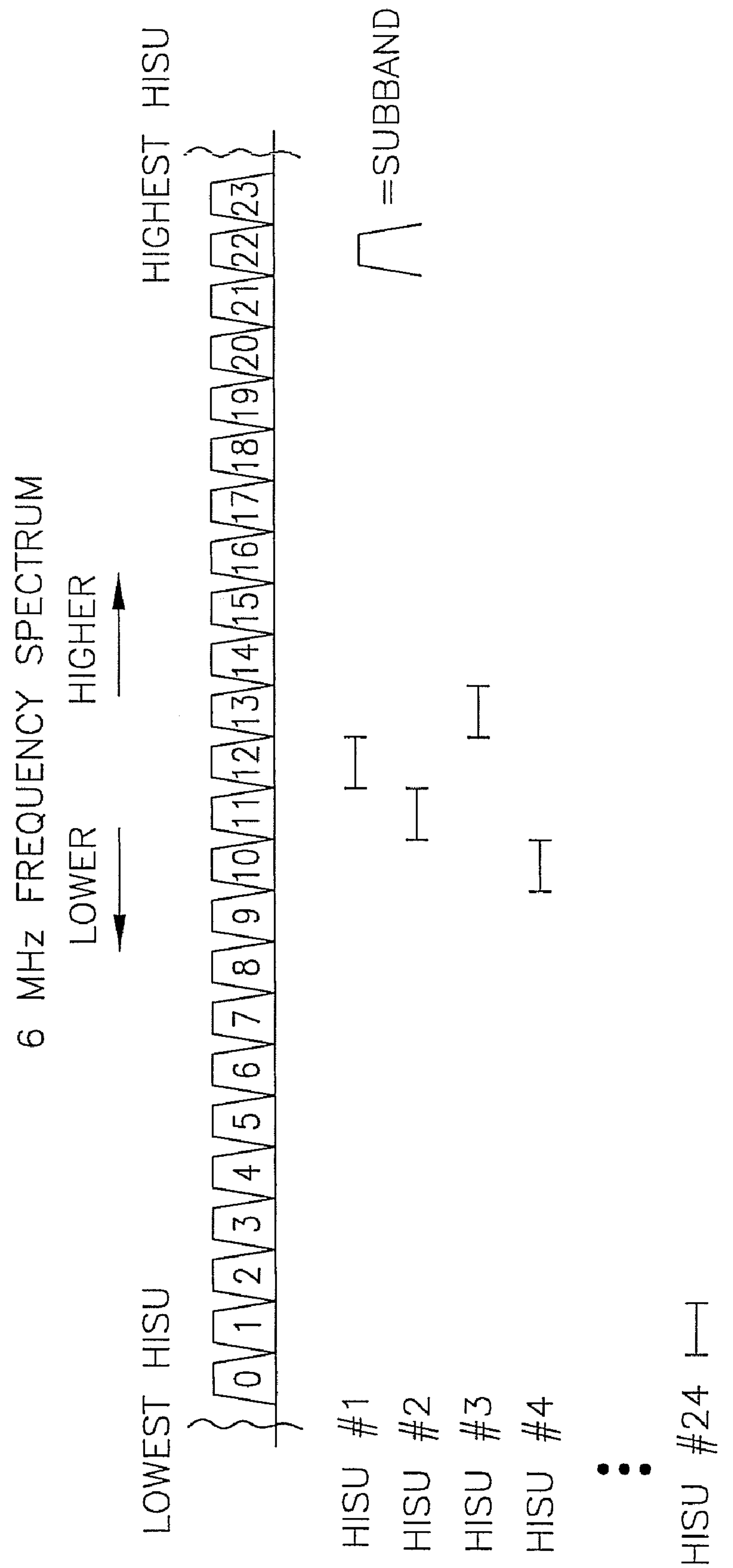
Figure 64:
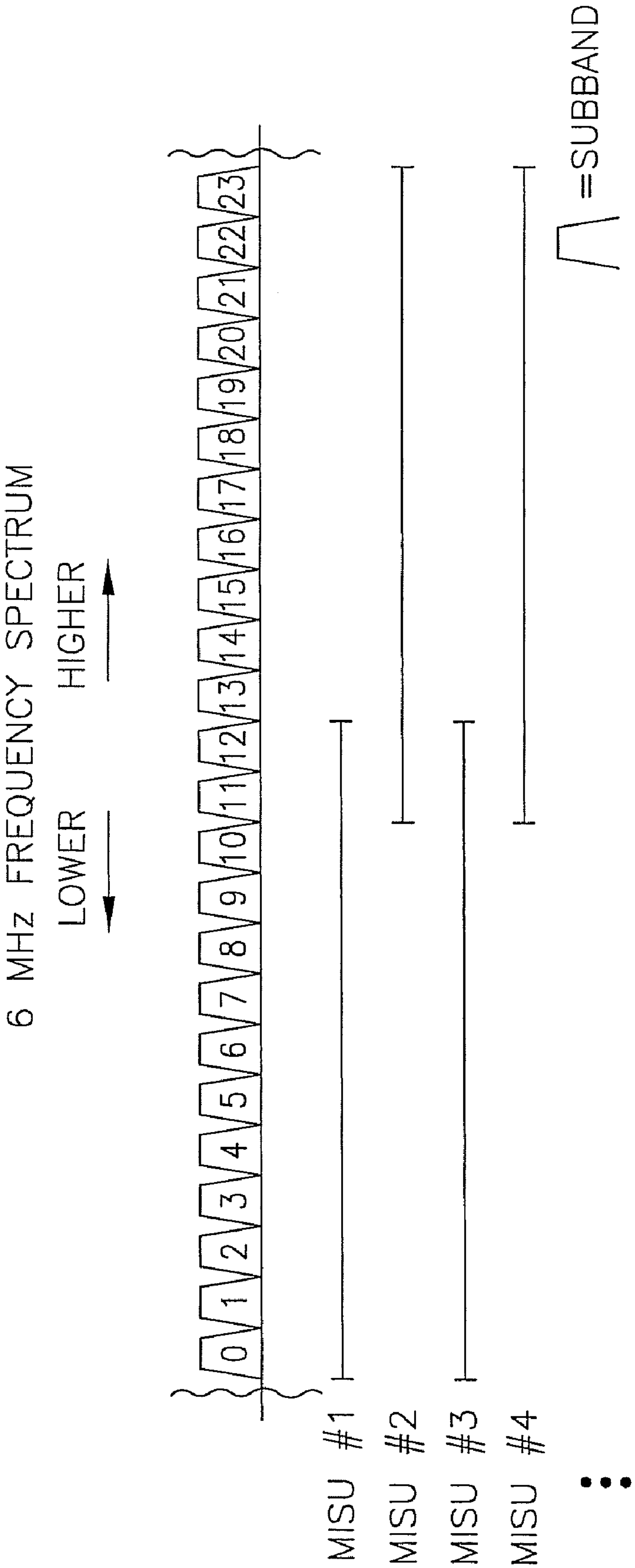
Figure 65:
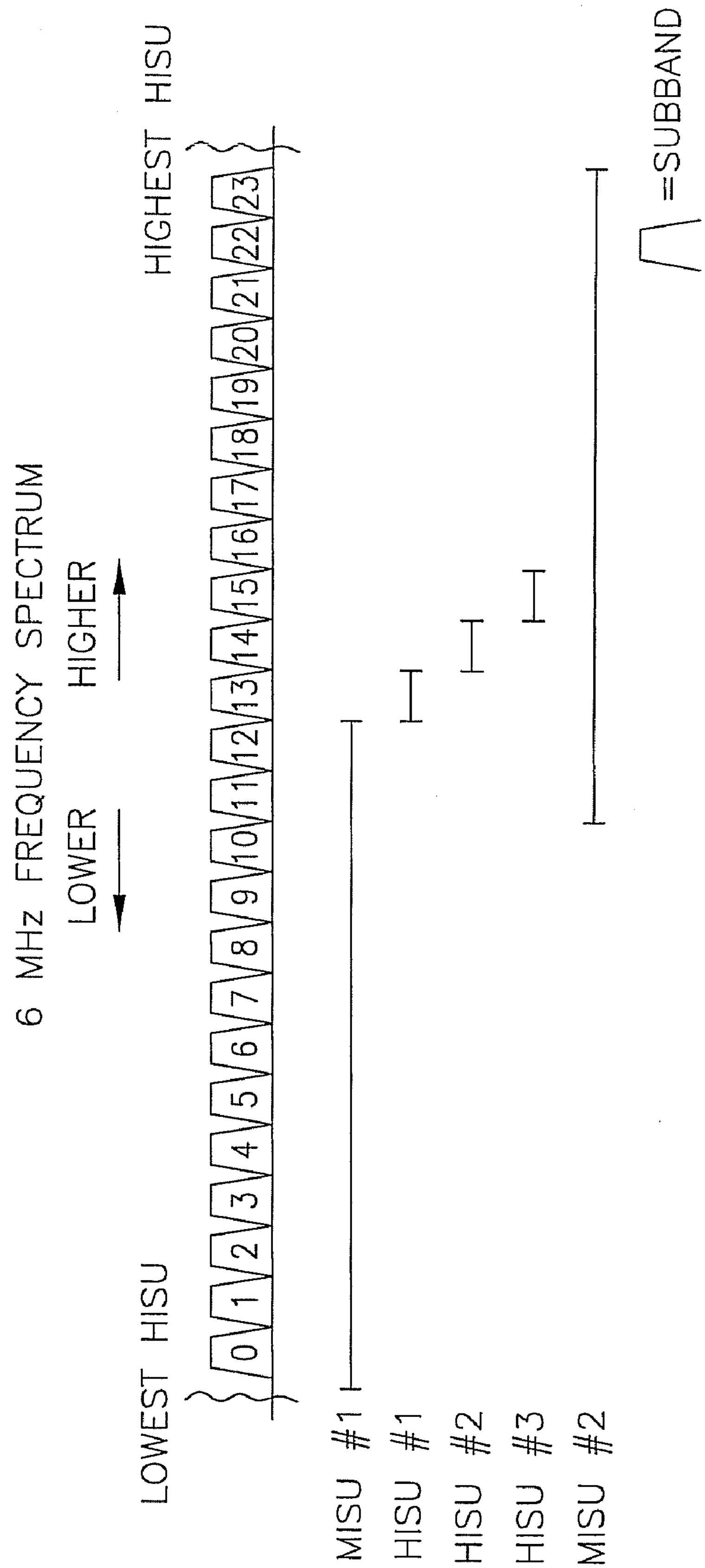

FIGS. 63, 64 and 65 are frequency spectrum diagrams that illustrate initial assignment of HISUs and MISUs to various subbands in a 6 MHz transmission channel. These Figures show that channel manager 900 attempts to evenly distribute the ISUs across the transmission channel. As depicted in FIG. 63, channel manager 900 begins assigning subbands at the middle of the 6 MHz transmission channel. Channel manager 900 then moves out toward the ends of the transmission channel. For example, the first HISU is assigned to subband number 12 and the twenty-fourth HISU is assigned to subband 0. It is noted that more than one ISU can be assigned to a subband. As depicted in FIG. 64, channel manager 900 initially assigns the first MISU to subbands 0 through 12 and the next MISU to subbands 11 through 23. As depicted in FIG. 65, when HISUs and MISUs are assigned to the same subbands, channel manager assigns the subbands so as to evenly distribute the ISUs over the available subbands. It is noted that the factors listed for use in selecting a subband are shown by way of example and not by way of limitation. Other factors can be added and the weight given to each factor can be adjusted without departing from the spirit and scope of the present invention.

FIG. 60 is a flow chart that illustrates one embodiment for a method for allocating payload channels in a subband by channel manager 900. Channel manager 900 attempts to maintain an acceptable distribution of bandwidth within a subband to reduce the need for reallocation of payload channels within the subband. Further, the goal is to allocate channels appropriately across the 6 MHz transmission channel to avoid having to reallocate channels that are currently in use. A channel can be allocated to an ISU only from the available channels in the subband to which the ISU is assigned.

Channel manager 900 receives a request for allocation of a payload channel from either the SCNU 58 or CTSU 54. At block 912, channel manager 900 decides whether sufficient payload channels are available in the current subband to fulfill the request. If sufficient channels are available, the method proceeds to block 914 and determines whether one of the available channels is the IDL channel. If the IDL channel is not one of the available channels, channel manager 900 allocates a channel for each channel requested by CTSU 54 or SCNU 58 at blocks 916 and 918. Channel manager 900 selects the channels based on several criteria that increase the likelihood of achieving a connection with acceptable quality levels. For example, channel manager 900 can use the method shown in FIG. 61. According to this method, channel manager 900 begins the selection process 6100 by identifying available payload channels 6102 that are located toward the center of the 6 MHz transmission channel. Typically, channels that are nearer to the edge of the 6 MHz channel exhibit higher bit error rates than the channels that are closer to the center. Further, channel manager 900 can also consider limitations of the ISU and the requested service in selecting a payload channel. For example, the ISU may be preset for use only with odd or even payload channels. This information may be included in a ROM on the ISU and provided to the channel manager when channel allocation is requested or during acquisition. Further, channel manager 900 uses data on the quality of transmissions over the identified channels stored in tables in channel manager 900 to determine which available payload channels have an acceptable error history 6104, for example, bit error rate. Other appropriate criteria can be used in channel selection that also tend to increase the chances of producing a connection with acceptable quality 6104. Based on these criteria, channel manager selects a payload channel to allocate to the ISU 6106.

If, at block 914, channel manager 900 determines that one of the available channels is the IDL channel, channel manager 900 deallocates the payload channel allocated to be the IDL channel at blocks 920 and 922 due to the lower priority of communications over the IDL channel.

If, at block 912, channel manager 900 determines that sufficient payload channels are not available in the current subband, channel manager 900 determines whether the request is for an HISU 68 or an MISU 66 at block 924. If the request is for an MISU 66, channel manager 900 sends a message to the requestor that the request has failed at block 926.

If, at block 924, channel manager determines that the request is for an HISU, then channel manager 900 selects a different subband at block 928 by weighing the criteria as described above with respect to selecting a subband. Channel manager 900 further marks the channels unavailable in the new subband at block 930 and deallocates channels allocated to the ISU in the prior subband at block 932. At block 934, channel manager 900 assigns the new subband and proceeds to allocate channels as necessary at blocks 916 and 918.

Figure 66:
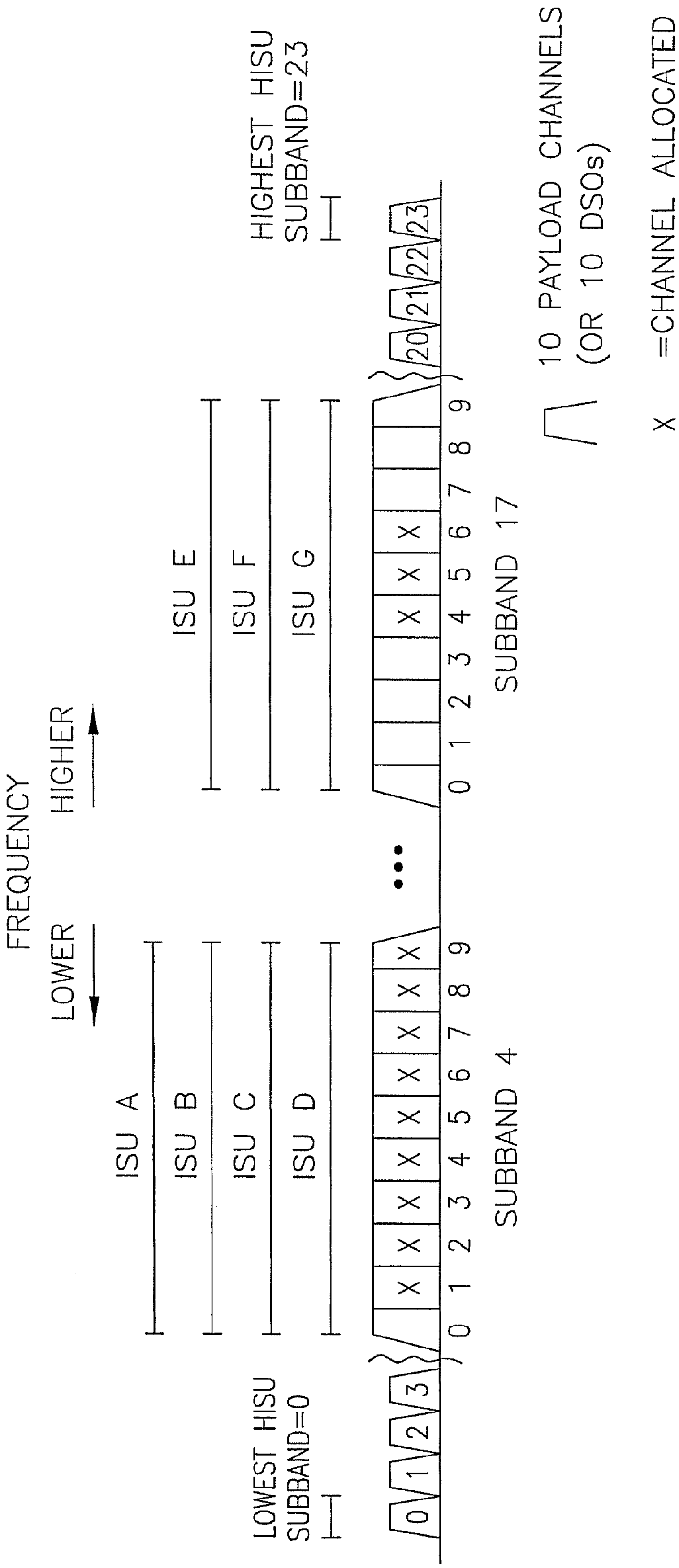
Figure 67:
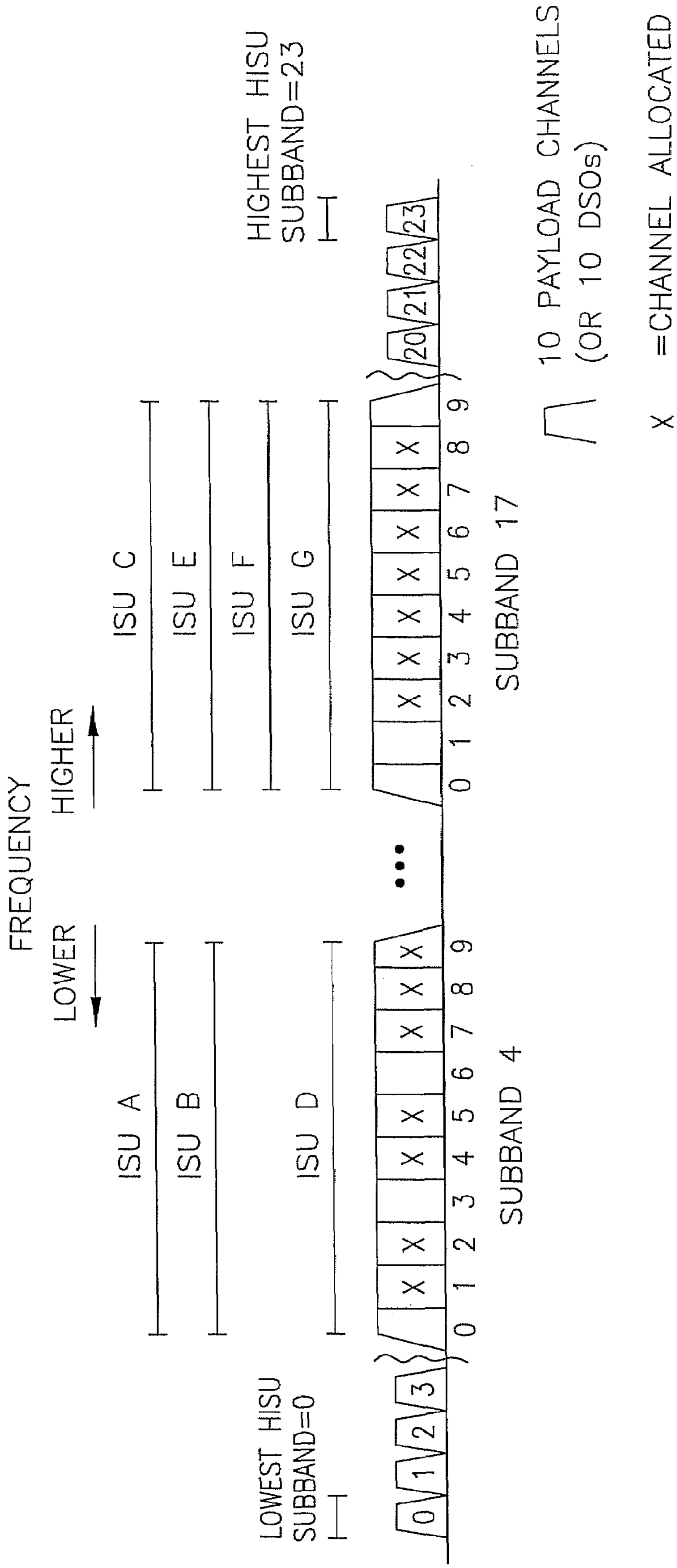

An example of reassigning an ISU to a new subband to accommodate a request for a payload channel is shown in FIGS. 66 and 67. In this example, ISUs A, B, C, and D are initially assigned to subband 4 and ISUs E, F, and G are assigned to subband 17 as depicted in FIG. 66. In subband 4, all payload channels except payload channel 0 are allocated. In this case, channel manager 900 receives a request for two payload channels for ISU C. Since only one payload channel is available, channel manager 900 reassigns ISU C to subband 17 which has sufficient payload channels available to handle the current load of ISU C plus the additional two payload channels as shown in FIG. 67.

Channel Reallocation

Channel monitoring and allocation or reallocation based thereon may be used to avoid ingress. External variables can adversely affect the quality of a given channel. These variables are numerous, and can range from electromagnetic interference to a physical break in an optical fiber. A physical break in an optical fiber severs the communication link and cannot be avoided by switching channels, however, a channel which is electrically interfered with can be avoided until the interference is gone. After the interference is gone the channel could be used again.

Channel Monitoring

Channel monitor 900 monitors the payload channels for errors to help in determining which channels are acceptable for transmission for specific services. One input to channel manager 900 is parity errors which are available from hardware per the DS0+ channels; the DS0+ channels being 10-bit channels with one of the bits having a parity or data integrity bit inserted in the channel as previously discussed. The parity error information on a particular channel is used as raw data which is sampled and integrated over time to arrive at a quality status for that channel. In one embodiment, parity errors that are detected on downstream payload channels are communicated to head end 32 over an associated upstream channel. When the error is detected in the downstream transmission, the parity bit for the upstream transmission is corrupted by intentionally setting the parity bit to the wrong value to indicate the incorrect parity in the downstream transmission path. Thus, the ISU informs the head end of errors in the downstream path.

To monitor the payload channels, channel manager 900 needs an active upstream signal on each payload channel. However, at any given time, some payload channels may not be allocated and some allocated channels may not be active. Thus, these payload channels do not provide the necessary upstream signals to the head end to monitor the quality of the payload channels. To compensate for these idle and unallocated payload channels, channel manager 900 places these channels in loop back mode to monitor the quality. In this case, channel manager 900 sets up the payload channel, transmits data to the ISU on the payload channel and the ISU transmits back specified data on an associated upstream payload channel. Channel manager 900 monitors these channels at the head end to determine error rates for the channels. Thus, the unallocated or idle payload channel can be monitored for errors the same as with active channels. The goal of channel manager 900 is to have payload established on all of the payload channels at a given time. However, it may be acceptable to monitor the performance of each channel at least once an hour if not active.

Channel manager 900 randomly selects and uses ISUs to monitor payload channels in loopback mode described above. This provides several benefits to the system. First, this allows channel manager to handle the diverse layout of a cable plant. Channel manager 900 sets up and uses paths over different legs from the various ODNs of the system. Further, random cycling of the ISUs used in the loop back mode allows the system to properly distribute power in the coaxial network. Specifically, this random selection of ISUs for loopback mode applies to concentration type services.

As described below, some ISUs are powered down when not active. When the ISU is powered down, the upstream modem at the head end detects this condition and sends a specified signal to the CXMC so that channel manager does not use the ISU for loop back purposes. Thus, powered down ISUs do not produce unnecessary errors.

FIG. 68 is a flow chart that illustrates a method for monitoring payload channels by channel manager 900. Channel manager 900 reads parity error registers 901 of the CXMU 56 are read every 10 ms. Generally, the error counts are used to update the channel quality database and determine which (if any) channels require reallocation. The database of channel manager 900 contains an ongoing record of each channel 903.

An accumulator sums the errors 905 with previously recorded errors to update the database. The database organizes the history of the channels in categories such as: current ISU assigned to the channel, start of monitoring, end of monitoring, total error, errors in last day, in last week, number of seconds since last error, severe errors in last day, in last week, and current service type, such as ISDN, assigned to the channel. When the channel is a regular (non-loop back) payload channel 907, channel manager 900 determines whether the performance statistics in the database are within service specific threshold 909. When the statistics unacceptably exceed the threshold 910, channel manager 900 reallocates the channel 911 using a "make before break" procedure to reduce the disruption from reallocating the channel. Thus, channel manager 900 allocates the new payload channel for the connection before deallocating the current payload channel.

Two issues presented by periodic parity monitoring as described above must be addressed in order to estimate the bit error rate corresponding to the observed count of parity errors in a monitoring period to determine if a channel is corrupted. The first is the nature of parity itself. Accepted practice for data formats using block error detection assumes that an errored block represents one bit of error, even though the error actually represents a large number of data bits. Due to the nature of the data transport system, errors injected into modulated data are expected to randomize the data. This means that the average errored frame will consist of four (4) errored data bits (excluding the ninth bit). Since parity detects only odd bit errors, half of all errored frames are not detected by parity. Therefore, each parity (frame) error induced by transport interference represents an average of 8 (data) bits of error. Second, each monitoring parity error represents 80 frames of data (10 ms/125 μs). Since the parity error is latched, all errors will be detected, but multiple errors will be detected as one error.

The bit error rate (BER) used as a basis for determining when to reallocate a channel has been chosen as $10^{-3}$. Therefore, the acceptable number of parity errors in a one second interval that do not exceed $10^{-3}$ must be determined. To establish the acceptable parity errors, the probable number of frame errors represented by each observed (monitored) parity error must be predicted. Given the number of monitored parity errors, the probable number of frame errors per monitored parity error, and the number of bit errors represented by a frame (parity) error, a probable bit error rate can be derived.

A statistical technique is used and the following assumptions are made:

1. Errors have a Poisson distribution, and
2. If the number of monitored parity errors is small (<10) with respect to the total number of "samples" (100), the monitored parity error rate (MPER) reflects the mean frame error rate (FER).

Since a monitored parity error (MPE) represents 80 frames, assumption 2 implies that the number of frame errors (FEs) "behind" each parity error is equal to 80 MPER. That is, for 100 parity samples at 10 ms per sample, the mean number of frame errors per parity error is equal to 0.8 times the count of MPEs in one second. For example, if 3 MPEs are observed in a one second period, the mean number of FEs for each MPE is 2.4. Multiplying the desired bit error rate times the sample size and dividing by the bit errors per frame error yields the equivalent number of frame errors in the sample. The number of FEs is also equal to the product of the number of MPEs and the number of FEs per MPE. Given the desired BER, a solution set is illustrated below in Equation 3.

$$\left(MPE\frac{FE}{MPE}\right) = 0.8\ MPE \qquad \text{(Equation 3)}$$

The Poisson distribution, as illustrated below in Equation 4, is used to compute the probability of a given number of FEs represented by a MPE (χ), and assumption 2, above, is used to arrive at the mean number of FEs per MPE (μ).

$$P(\chi) = \frac{e^{-\mu}\mu^{\chi}}{\chi!} \qquad \text{(Equation 4)}$$

Since the desired bit error rate is a maximum, the Poisson equation is applied successively with values for χ of 0 up to the maximum number. The sum of these probability is the probability that no more than χ frame errors occurred for each monitored parity error. The results for a bit error rate of $10^{-3}$ and bit errors per frame error of 1 and 8 are shown in Table 11.

TABLE 11

Bit Error Rate Probability

| Bit Errors per Frame Error | Monitored Parity Errors | Maximum Frame Errors/Monitored Parity Error (χ) | Average Frame Errors/ Monitored Parity Error (μ) | Probability of BER <−$10^{-3}$ |
|---|---|---|---|---|
| 8 | 2 | 4 | 1.6 | 98% |
| | 3 | 3 | 2.4 | 78% |
| | 4 | 2 | 3.2 | 38% |
| 1 | 8 | 8 | 6.4 | 80% |
| | 9 | 7 | 7.2 | 56% |
| | 10 | 7 | 8.0 | 45% |

Using this technique, a value of 4 monitored parity errors detected during a one second integration was determined as the threshold to reallocate service of an ISU to a new channel. This result is arrived at by assuming a worst case of 8 bit errors per frame error, but a probability of only 38% that the bit error rate is better than $10^{-3}$. The product of the bit errors per frame, monitored parity errors and maximum frame errors per monitored parity error must be 64, for a bit error rate of $10^{-3}$ (64 errors in 64 k bits). Therefore, when the sampling of the parity errors in the error timer event is four or greater, the channel allocator is notified of a corrupted channel.

DS0 Reordering

Some telecommunications services use multiple DS0s (payload channels) to form a communication link in communication system 10. For example, ISDN uses three DS0s to form three payload channels identified namely as B1, B2, and D. To operate properly, the DS0s typically are assigned in a specific sequence. Once the payload channels for the service are assigned, the channel unit associated with the service expects to receive the payload channels in a specific order. When one of the payload channels becomes corrupted, channel manager 900 allocates a different DS0 channel for the corrupted channel and the sequence of the DS0s is altered.

This problem could be avoided by reallocating all three DS0s. However, this is a time consuming process and could cause transient disruption of the service. As an alternative, channel manager 900 can assign an address to the DS0s when the multiple DS0 service is initiated. This address can be used by the channel unit to reconstruct the order of the DS0s on the fly if one or more of the DS0s is reallocated out of sequence with the other DS0s. For example, in the channel enable signal from CXMU 56 on the IOC channel, a BIC state signal can be used to identify the correct order for each DS0. Thus, channel manager 900 can allocate the DS0s in any order and the channel unit can remap the DS0s to the correct order at the ISU. It is noted that the DS0s must still be allocated in different time slots.

ISU Data Link (IDL) Channel

The IDL is a standard payload channel that is dynamically assigned to transmit control data between HDT 12 and ISU 100 when the amount of data exceeds the parameters of the lower bandwidth IOC channel. The IDL channel can provide full duplex communication or simplex broadcast from HDT 12 to one or more ISUs 100. Channel manager 900 dynamically allocates the IDL channel as needed for non-time critical transport of data as described above.

The IDL messages in both directions are variable in length. The IDL data is transmitted over HFC distribution network 11 at a rate of 64 Kbps which is one byte per 8 kHz frame. The IDL channel uses one of the 240 payload channels and the protocol for transmitting IDL messages is handled by the processor on CXMU 56. The processor uses cyclical redundancy codes (CRC) and positive acknowledgments to manage error checking of IDL messages.

The IDL channel can be used to transmit various kinds of data. For example, the IDL channel can be used to provide data to an ISU to configure a payload channel for use with a specific protocol. For example, the IDL channel can be used to down load data to configure a payload channel for use with the LAPB protocol or any other appropriate protocol, including proprietary protocols. Similarly, the IDL channel can be used to download software to an ISU. Transmission over the IDL channel has a lower priority than regular payload transmissions. Thus, channel manager 900 deallocates an IDL channel before completion of the data transmission when channel manager 900 receives a request that requires use of the payload channel that is currently allocated to the IDL.

FIG. 69 is a flow chart that illustrates an embodiment of a method for allocating a payload channel to the ISU data link. At block 330*a*, channel manager 900 receives a request for an IDL channel. At block 332*a*, channel manager 900 determines whether a payload channel is available. If a payload channel is available, channel manager 900 allocates the payload channel to the IDL channel 335 and the data is transmitted to the identified ISU. If, however, a channel is not available, channel manager determines whether one of the allocated channels is idle by checking the hook state of a line of a channel unit 342. If the line is on hook 339, then channel manager 900 reallocates the channel to the IDL channel 343 until the IDL transmission is complete. If however, channel manager receives a request for a communication link to the line of the channel unit, channel manager interrupts the IDL channel and reallocates the payload channel to the channel unit.

Power Down

Channel manager 900 can power down an ISU during periods of non-use to reduce energy costs of communication system 10. To power down the ISU, channel manager 900 must determine that all conditions for powering down the ISU are met. For example, channel manager 900 can determine if the lines of the channel units of the ISU provide service that can be powered down. Such services may include, for example, analog services such as POTS and COIN. Further, the lines must be idle. For example, channel manager 900 can determine if a line is idle based on the line's hook status or other appropriate criteria. Channel manager 900 checks the status of the lines each time a line goes from off-hook to on-hook. Channel manager 900 further checks the status of the lines every second to monitor the hook status. It is noted, however, that channel manager 900 will not power down an ISU that is the monitoring ISU for a subband.

When channel manager 900 determines that an ISU can be powered down, the ISUs' transmitter is disabled. Head end 32 detects the loss of power to the ISU and sends an idle pattern upstream to the switch. An IOC control message to or from the IOC will power-up the ISU. The IOC traffic to or from the ISU indicates to the background task in charge of powering down ISUs to check the ISU against the criteria for powering down again.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

Further Embodiment of Telephony Transport System

With reference to FIG. 116, a general description of a hybrid fiber/coax communications network 1006 in accordance with the present invention shall be described. Telephony and video information from existing telephone and video services generally shown by trunk line 1008 is received by and processed by head end 1010. Head end 1010 includes a plurality of host distribution terminals (HDT) 1012 for telephony data interface and video host distribution terminal (VHDT) 1014 for video data interface. Host distribution terminals 1012 and VHDT 1014 include transmitters and receivers for communicating the video and telephony information between the video and telephony signal distribution network 1006 in accordance with the present invention and the existing telephony and video services as represented generally by trunk line 1008.

The video information is optically transmitted downstream via optical fiber line 1017 to splitter 1018 which splits the optical video signals for transmission on a plurality of optical fibers 1022 to a plurality of optical distribution nodes 1026. The HDT 1012 transmits optical telephony signals via optical fiber link 1020 to the optical distribution nodes 1026. The optical distribution nodes 1026 convert the optical video signals and telephony signals for transmission as electrical outputs via a coaxial distribution system 1007 to a plurality of remote units 1042. The electrical downstream video and telephony signals are distributed via a plurality of coaxial lines 1029 and coaxial taps 1034 of the coaxial distribution system 1007.

The remote units 1042 include means for transmitting upstream electrical data signals including telephony information from telephones 1076 and data terminals 1073 and in addition may include means for transmitting set top box information from set top boxes 1078. The upstream electrical data signals are provided by a plurality of remote units 1042 to an optical distribution node 1026 connected thereto. The optical distribution node 1026 converts the upstream electrical data signals to an upstream optical data signal for transmission via optical fiber link 1020 to the head end 1010.

The present invention shall now be described in further detail with reference to FIGS. 116-123. The first part of the description shall primarily deal with downstream transmission and the second part of the description shall primarily be with regard to upstream transmission. The video and telephony distribution network 1006 in accordance with the present invention, includes head end 1010 which receives video and telephony information from video and telephony service providers via trunk line 1008. Head end 1010 includes a plurality of host distribution terminals 1012 and a video host distribution terminal 1014. The HDT 1012 includes transmitters and receivers for communicating telephony information, such as T1, ISDN, or other data services information, to and from telephony service providers via trunk line 1008 and the VHDT 1014 includes transmitters and receivers for communicating video information, such as cable TV video information and interactive data of subscribers to and from video service providers via trunk line 1008.

The VHDT 1014 transmits downstream optical signals to a splitter 1018 via video feeder optical fiber line 1017. The passive optical splitter 1018 effectively makes four copies of the downstream high bandwidth optical video signals. The duplicated downstream optical video signals are distributed to the correspondingly connected optical distribution nodes 1026. One skilled in the art will readily recognize that although four copies of the downstream video signals are created, that any number of copies may be made by an appropriate splitter and that the present invention is not limited to any specific number.

The splitter 1018 is a passive means for splitting broad band optical signals without the need to employ expensive broad band optical to electrical conversion hardware. Optical signal splitters are commonly known to one skilled in the art and available from numerous fiber optic component manufacturers such as Gould, Inc. In the alternative, active splitters may also be utilized. In addition, a cascaded chain of passive or active splitters would further multiply the number of duplicated optical signals for application to an additional number of optical distribution nodes and therefore increase further the remote units serviceable by a single head end. Such alternatives are contemplated in accordance with the present invention as described by the accompanying claims.

The VHDT 1014 can be located in a central office, cable TV head end, or a remote site and broadcast up to about 112 NTSC channels. The VHDT 1014 includes a transmission system like that of the LITEAMP system available from American Lightwave Systems, Inc., currently a subsidiary of the assignee hereof. Video signals are transmitted optically by amplitude modulation of a 1300 nm laser source at the same frequency at which the signals are received (that is, the optical transmission is a terahertz optical carrier which is modulated with the RF video signals). The downstream video transmission bandwidth is about 54-725 MHz. One advantage in using the same frequency for optical transmission of the video signal as the frequency of the video signals when received is to provide high bandwidth transmission with reduced conversion expense. This same-frequency transmission approach means that the modulation downstream requires optical to electrical conversion or proportional conversion with a photodiode and perhaps amplification, but no frequency conversion. In addition, there is no sample data bandwidth reduction and little loss of resolution.

Alternative embodiments of the VHDT may employ other modulation and mixing schemes or techniques to shift the video signals in frequency, and other encoding methods to transmit the information in a coded format. Such techniques and schemes for transmitting analog video data, in addition to those transmitting digital video data, are known to one skilled in the art and are contemplated in accordance with the spirit and scope of the present invention as described in the accompanying claims.

Telephony information is transmitted downstream by HDT 1012 via optical fiber link 1020 to a corresponding optical distribution node 1026. A more detailed block diagram of one of the HDTs 1012 is shown in FIG. 117. Each HDT 1012 includes an RF modem bank 1050 which receives telephony information via trunk line 1008. The RF modem bank 1050 includes four RF modem modules 1052 and a protection modem module 1054. Each RF modem module receives telephony information, for example time division multiplexed channel signals from a public switched telephone service, via trunk line 1008 and the telephony information modulates an analog carrier for transmission of the downstream optical telephony data by downstream optical telephony transmitter 1080 of downstream telephony electrical to optical converter 1064 to a corresponding distribution node 1026. Each RF modem module includes a transceiver 1053 and provides a downstream electrical telephony signal in one of four frequency bandwidths, each bandwidth being about 6 MHz in width like that of a CATV channel. Each 6 MHz bandwidth channel transmits data at 22 Mbits/sec and can provide for transmission of 8T1 digital telephone signals; T1 being a conventional telephone signal where 24 voice channels are sampled at an 8 kHz rate, with 8 bits per sample (each 8 bit conversation sample is termed a DS0). Each of these signals from the four RF modem modules 1052 are transmitted via coax patch cables to a combiner 1082 of downstream telephony electrical to optical converter 1064 for transmission by optical transmitter 1080. Therefore, the spectrum for the downstream optical telephony data is four separated 6 MHz frequency bands containing 22 Mbits/sec of data within each 6 MHz bandwidth. The four 6 MHz frequency bands, separated by a guard band as is known to one skilled in the art, are transmitted in about the 725-800 MHz bandwidth.

Any number of modulation techniques may be used for transmission of the telephony information downstream. The transmission downstream is point to multipoint transmission using broadcast type transmission schemes. The modulation techniques utilized and performed by RF modem module 1052 may include quadrature phase shift keying (QPSK), quadrature amplitude modulation (QAM), or other modulation techniques for providing the desired data rate. Modulation techniques, such as QPSK and QAM, are known to those skilled in the art and the present invention contemplates the use of any such modulation techniques for downstream broadcast transmission.

The electrical to optical converter 1064 includes two transmitters 1080 for downstream telephony transmission to protect the telephony data transmitted. These transmitters are conventional and relatively inexpensive narrow band laser transmitters. One transmitter is in standby if the other is functioning properly. Upon detection of a fault in the operating transmitter, controller 1060 switches transmission to the standby transmitter. In contrast, the transmitter of the VHDT 1014 is relatively expensive as compared to the transmitters of HDT 1012 as it is a broad band analog DFB laser transmitter. Therefore, protection of the video information, non-essential services unlike telephony data, is left unprotected. By splitting the telephony data transmission from the video data transmission, protection for the telephony data alone can be achieved. If the video data information and the telephony data were transmitted over one optical fiber line by an expensive broad band analog laser, economies may dictate that protection for telephony services may not be possible. Therefore, separation of such transmission is of importance.

As an alternative embodiment for providing transmission of optical video and telephony signals to the optical distribution nodes 1027 from head end 1010 as shown in FIG. 120, the HDT 1012 and VHDT 1014 can utilize the same optical transmitter and the same optical fiber line 1016. The signal then is split by splitter 1018 and four split signals are provided to the optical distribution nodes 1027 for distribution to the remote units 1042 by the coaxial distribution system 1007 as further discussed below. However, as described above, the optical transmitter utilized would be relatively expensive due to its broad band capabilities, lessening the probabilities of being able to afford protection for essential telephony services.

As one skilled in the art will recognize, optical link 1020, as shown in FIG. 117, may include four fibers, two for transmission downstream from electrical to optical converter 1064 and two for transmission upstream to optical to electrical converter 1066. With the use of directional couplers, the number of such fibers may be cut in half. In addition, the number of protection transmitters and fibers utilized may vary as known to one skilled in the art and any listed number is not limiting to the present invention as described in the accompanying claims.

RF modem bank 1050 includes a protection RF modem module 1054 with a transceiver 1053 connected to combiner 1082 of electrical to optical converter 1064. Protection RF modem module 1054 is further coupled to controller 1060. When a fault is detected with regard to the transmission of one of the RF modem modules 1052, a signal is generated and applied to an input 1062 of controller 1060. Controller 1060 is alerted to the fault and provides appropriate signaling to switch the protection RF modem module 1054 for the faulted RF modem such that the protection RF modem module 1054 transmits within the 6 MHz bandwidth of the faulted RF modem module 1052 so that the four 6 MHz bandwidth signal transmission is continued on optical fiber link 1020. The use of one protection RF modem module 1054 for four RF modem modules 1052 is only one embodiment of the present invention and the number of protection RF modem modules relative to RF modem modules may vary as known to one skilled in the art and described in the accompanying claims. As shown in FIG. 123, RF modem bank 1050 may include one protection module 1054 for each RF modem module 1052. In this embodiment, the RF modem bank 1050 includes three RF modem modules 1052 and three protection modules 1054 for one-to-one protection.

An optical distribution node 1026 as shown in FIG. 118 receives both the downstream optical telephony signal and the split downstream optical video signal. The downstream optical video signal is applied by the optical fiber 1022 from splitter 1018 to a downstream video receiver 1120 of optical distribution node 1026. The optical distribution node 1026 further includes downstream telephony receiver 1121 for receiving the downstream optical telephony signal on optical link 1020. The optical video receiver 1120 utilized is like that available in the LITEAMP product line. The converted signal from video receiver 1120, proportionally converted utilizing photodiodes, is applied to bridger amplifier 1127 along with the converted telephony signal from downstream telephony receiver 1121. The bridging amplifier 1127 simultaneously applies four downstream electrical telephony and video signals to diplex filters 1134. The diplex filters 1134 allow for full duplex operation by separating the transmit and receive functions when signals of two different frequency bandwidths are utilized for upstream and downstream transmission. There is no frequency conversion performed at the optical distribution nodes with respect to the video or downstream telephony signals as the signals are passed through the optical distribution nodes to the remote units via the coaxial distribution system in the same frequency bandwidth as they are received.

After the optical distribution node 1026 has received downstream optical video signals via optical link 1022 and downstream optical telephony signals via optical link 1020 and such signals are converted to downstream electrical video and telephony signals, the four outputs of the optical distribution nodes 1026 are applied to four coaxial cables 1029 of coaxial cable distribution system 1007 for transmission of the downstream electrical video and telephony signals to the remote units 1042; such transmission occurs in about the 725-800 MHz bandwidth for telephony signals and about the 54-725 MHz bandwidth for the downstream electrical video signals. Each optical distribution node 1026 provides for the transmission over a plurality of coaxial cables 1029 and any number of outputs is contemplated in accordance with the present invention as described in the accompanying claims.

As shown in FIG. 116, each coaxial cable 1029 can provide a significant number of remote units with downstream electrical video and telephony signals through a plurality of coaxial taps 1034. Coaxial taps are commonly known to one skilled in the art and act as passive bidirectional pick-offs of electrical signals. Each coaxial cable 1029 may have a number of coaxial taps connected in series. In addition, the coaxial cable distribution system may use any number of amplifiers to extend the distance data can be sent over the coaxial portions of the network 1006.

The downstream electrical video and telephony signals are provided from the coaxial taps to the remote units 1042 in a number of different ways. In one embodiment, the signal from the coaxial tap 1034 is provided to a home integrated service unit 1070 as shown in FIG. 119. The home integrated service unit 1070 of FIG. 119 includes a power tap 1099 coupled to a conventional power supply and ring generator 1101. The downstream electrical video and telephony signals are provided to a tap 1097 for application of the signals to both diplex filter 1110 and ingress filter 1098. The downstream video signal is provided from ingress filter 1098 to video equipment 1072 via set top box 1078. The downstream telephony signal is applied from diplex filter 1110 to RF demodulator 1104 of RF modem module 1102 and the demodulated signal is applied to an applicable service interface for processing and connection to user equipment. For example, the RF demodulated signal is processed via Plain Old Telephone Service (POTS) service interface 1112 for output on twisted pairs 1118 to telephone 1076 by POTS connection 1114. The other service interfaces such as ISDN interface or a T1 interface perform their conventional functions as are known to those skilled in the art for transmittal of such information on outputs thereof to user equipment.

Ingress filter 1098 provides the remote unit 1042 with protection against interference of signals applied to the video equipment 1072 as opposed to those provided to other user equipment such as telephones or computer terminals. Filter 1098 passes the video signals; however, it blocks those frequencies not utilized by the video equipment. By blocking those frequencies not used by the video equipment, stray signals are eliminated that may interfere with the other services provided by the network to at least the same remote unit. The set top box 1078 is an optional element in the network 1006. It may include an additional modem for sending interactive data therefrom back to head end 1010 at frequencies unused by the video and telephony transmissions. Upstream transmission of such data is further discussed below.

Depending on the modulation processing techniques utilized at the head end 1010, the RF demodulator 1104 would include circuitry capable of demodulating the modulated signal. For example, if QPSK modulation is utilized then the demodulator would include processing circuitry capable of demodulating a QPSK modulated waveform as is known to one skilled in the art.

In another embodiment of providing downstream electrical video and telephony signals from the coaxial taps 1034 to remote units 1042, as shown in FIG. 116, a separate coaxial line from coaxial tap 1034 is utilized to provide transmission of the signals therefrom to set top box 1078, and thus for providing the downstream video signals to video equipment unit 1072. In such a case, a second coaxial line from coaxial tap 1034 would be utilized to provide the downstream telephony signals to a multiple integrated service unit (MISU) 1044 which would be much like the home integrated service unit 1070 as described with regard to FIG. 119 except lacking an ingress filter 1098 and tap 1097. Unlike home integrated service unit 1070, the MISU 1044 would be utilized to service several remote units 1042 with telephony services via various service interfaces. Whether the video and telephony signals are provided to the curb with use of the MISU 1044 or whether the video and telephony signals are provided directly to a home integrated service unit is strictly one of application and either can be utilized with regard to the same or different coaxial taps 1034 and within the same or different coaxial distribution systems 1007.

In addition, an optional network interface device (NID) 1075 is utilized in the connection of telephone services to the remote units 1042, whether they are homes or businesses, as is known to those skilled in the art and as shown in FIG. 116. The NID is generally shown by block 1070 representing the home integrated service unit but is not shown in the detail of FIG. 119. The NID performs service functions for the telephone service provider such as looping back signals to the service provider that reach the NID so as to indicate whether a failure has occurred somewhere in transmission to the NID or in connections from the NID to the user equipment when a failure is reported to the service provider.

The above description primarily involves the downstream transmission of video and telephony information from head end 1010 to remote units 1042. The upstream transmission of interactive data from set top boxes 1078 and other data, for example telephony from telephones 1076, shall now be described with reference to FIGS. 116-123. The description shall be limited to transmission from remote units via home integrated service units as transmission from an MISU is substantially similar and easily ascertainable from such description. Home integrated service unit 1074 provides set top box information from set top box 1078 and telephony information from the service interfaces 1112, including information from telephone 1076, to the optical distribution node 1026 connected thereto by the same coaxial path as for the downstream communication. The set top box signals are transmitted by a separate RF modem of the video service provider at a relatively low frequency in the bandwidth of about 5 to 40 MHz which is unused by telephony and video services. The telephony signals are also transmitted upstream in the 5-40 MHz bandwidth, usually from 10 MHz to 30 MHz. This 5-40 MHz bandwidth is reused in each coaxial path 1029 from each remote unit 1042 to the respectively connected optical distribution node 1026. As such, upstream electrical telephony data signals from the remote units are transmitted at the same reused frequency bandwidth of 5-40 MHz on each coaxial line 1029 for input to the optical distribution node 1026. Therefore, as shown in FIG. 118, four upstream electrical telephony signals, each in the 5-40 MHz bandwidth, are input to optical distribution node 1026, via the respectively connected coaxial cables 1029.

The upstream transmission from an integrated service unit for multipoint to point transmission utilizes time multiplexing techniques, although any of a number of multiple access techniques known to those skilled in the art are contemplated in accordance with the present invention. All the remote units are designated a time slot for transmission. In such a case each remote unit must transmit at a particular time to maintain multiple access with the timing being supplied using data on the downstream paths. The upstream data is transmitted on a bit-by-bit basis. With each remote unit assigned a time slot, the RF modem 1102 of the unit knows that it will not interfere with the others because it has determined the time delay for each one of them and each RF modem 1102 is signaled to transmit at a precise time. Due to the high volumes of multiplexed serial data from several outlining remote stations and limited bandwidth for transmission, short pulse durations are required for better resolution of the data transmitted to the head end 1010. Although the data modulates a carrier and is transmitted in the 5 to 40 MHz bandwidth by RF modulator 1108, because of the limited bandwidth in the upstream direction, a pulse shaping network at each remote unit is used to generate raised cosine pulses for the rectangular or square wave bit-by-bit stream of data transmitted along the coaxial cable in the coaxial network.

An optimal pulse shape for transmission in a band limited coaxial cable network is determined by the use of Fourier calculations with a given set of boundary conditions. Also, the Fourier calculations implement a spectral limitation constraint for the purposes of limiting the spectral content of the optimal pulse shape. Limiting the spectral content of the pulse shape serves two functions. The first function is to limit the spectral characteristics of the optimal pulse shape in order to prevent phase dispersion at the receiving end of the transmission system. The second benefit from the spectral limitation constraint is to allow the use of relatively simple finite impulse response filters with a minimal number of taps.

In one embodiment of the pulse shaping network as shown in FIG. 121, 50 nanosecond pulses from the RF modulator 1108 of RF modem 1102 are transmitted to a pulse sequencer 1301 for uniform digitization. The output from the pulse sequencer is then applied to a ten tapped finite impulse response filter (FIR filter) 1302 with associated electronics 1303 to provide the addition and subtraction necessary for the filtering process. The output is sent to a line driver circuit for output to the coaxial cable through diplex filter 1110. The optimal pulse waveform is a raised cosine waveform. Using such pulse shaping techniques, overcomes the difficulty of sending extremely short pulse duration information along a band limited coaxial cable.

The upstream electrical telephony signals from a plurality of remote units, including signals from the RF modems 1102 and from modems in set top boxes 1078, are transmitted to the respectively connected optical distribution node 1026 as shown in FIG. 118 via the individual coaxial cables 1029. The upstream electrical signals are applied to a diplex filter 1134 respectively connected to a coaxial cable 1029. One of the diplex filters 1134 passes the upstream electrical telephony signal applied thereto through to combiner 1125 while the other diplex filters pass the upstream electrical telephony signals applied thereto to frequency shifters 1128, 1130, and 1132. Frequency shifter 1128 shifts the upstream electrical telephony signal into the 50-85 MHz bandwidth, frequency shifter 1130 shifts another upstream electrical telephony signal into the 100-135 MHz bandwidth and frequency shifter 1132 shifts the other upstream electrical telephony signal into the 150-185 MHz bandwidth. The shifted signals are combined by combiner 1125 and provided to upstream telephony and set top control transmitters 1123. The conventional optical transmitters 1123 transmit the upstream electrical telephony signal as an upstream optical telephony signal to head end 1010 via fiber optic link 1020. Once again, two transmitters are available for transmission, one in standby mode, like that in the downstream transmission path.

The upstream optical telephony signals are received by upstream telephony and set top box receiver 1084 of optical to electrical converter block 1066. The upstream optical telephony signals are converted, split, and all the split electrical signals in the 5-40 MHz, 50-85 MHz, 100-135 MHz, and 150-185 MHz are frequency shifted back to the 5-40 MHz bandwidth by frequency shifters 1086, 1088, and 1090 with the exception of the signal already in the 5-40 MHz bandwidth which is passed through with the other frequency shifted signals from the frequency shifters to RF switch 1094. A combined signal in the 5-40 MHz bandwidth from combiner 1092 is provided to the VHDT and the signal is processed for obtaining the interactive information transmitted from set top boxes 1078. The RF switch 1094 is controlled by controller 1060 and provides the upstream telephony signals to the transceivers 1053 of the corresponding RF modems 1052. The upstream telephony signals are then demodulated by RF modem modules 1052 and the telephony data is provided to the service providers via trunk line 1008. The RF modem modules 1052 include RF demodulator corresponding to the modulation techniques utilized to transmit the information upstream so such information can be recovered.

As discussed previously, the controller 1060 switches protection RF modem module 1054 for a transmitting RF modem module 1052 in the downstream communication when a fault is detected in that module. The controller also provides signaling for switching the RF switch 1094 such that the information which would have been provided to the faulted RF modem module 1052 is applied to the transceiver of the protection RF modem module 1054. Therefore, the protection modem module 1054 is then fully within the transmit and receive loop of the system.

As shown in FIG. 122, an alternative embodiment of the present invention includes an optical to electrical converter 1066 wherein the received optical upstream telephony signal is converted by receivers 1084 and the entire upstream electrical signal in the 5-200 MHz bandwidths is applied to the transceivers 1053 of the RF modem modules 1052. The RF modem modules 1052 are then operated under control of controller 1060 which assigns the RF modem module a carrier frequency to tune to for the recovery of telephony information; the assigned frequency being a function of the frequency shifting of the upstream signal. The electrical signal is still separated and frequency shifted by frequency shifters 1086, 1088 and 1090 except for the signal already in the 5-40 MHz bandwidth and then combined by combiner 1092 for application to VHDT 1014.

In this embodiment, the switching of the protection modem module 1054 into the system is accomplished through the controller 1060. When the controller 1060 detects and indicates a faulted modem module 1052, the controller 1060 assigns the frequency previously assigned to the faulted RF modem module to the protection module, thus establishing the protection RF modem module 1054 fully within the transmit and receive loop.

In another embodiment shown in FIG. 123 including one-to-one protection for the RF modem module, neither the RF switch used for protection switching for the configuration of FIG. 123 nor the additional control required for protection switching for the configuration of FIG. 122 is necessary. In this embodiment, the same electrical signal provided to the RF modem modules 1052 is applied to the corresponding protection module 1054, thus only a control signal indicating which module is to be used for transmission or reception is required for the one-to-one protection.

What is claimed is:

1. A host unit for a multi-point to point communication system, the host unit comprising:

a transceiver communicatively coupled with a plurality of remote units in a multi-point to point configuration, the transceiver configured to communicate with the plurality of remote units using orthogonal frequency division multiplexing (OFDM), wherein upstream OFDM signals from at least two of the plurality of remote units combine to a unified OFDM waveform of adjacent spectrally overlapping carriers at the host unit;

a multi-carrier modem coupled to the transceiver and configured to demodulate upstream information from the unified OFDM waveform based on a Fourier transform algorithm, the multi-carrier modem further configured to modulate downstream information data onto a downstream OFDM waveform based on an inverse Fourier transform algorithm;

wherein the multi-carrier modem is further configured to estimate an overall path delay correction based on at least one tone of the orthogonal frequency division multiplexing waveform transmitted by a first remote unit of the plurality of remote units; and wherein the transceiver is further configured to transmit the overall path delay correction to the first remote unit.

2. The host unit of claim 1, wherein the multi-carrier modem is further configured to adjust a round trip path delay associated with the first remote unit.

3. The host unit of claim 1, wherein the multi-carrier modem is further configured to adjust at least one characteristic of the plurality of tones such that when OFDM waveforms are transmitted from the first remote unit and at least one other remote unit of the plurality of remote units, the orthogonality of the unified OFDM waveform when received at the host unit is improved.

4. The host unit of claim 1, wherein the multi-carrier modem is configured to adjust at least one of a carrier frequency, a carrier amplitude, and a timing.

5. The host unit of claim 2, wherein the plurality of tones are received concurrently from at least two of the plurality of remote units.

6. The host unit of claim 1, the transceiver communicatively coupled with the plurality of remote units by a distribution network.

7. The host unit of claim 6, wherein the distribution network comprises one of a wireless system and a hybrid fiber/coax network.

8. A remote service unit for a multi-point to point communication system, the remote service unit comprising:

a transceiver communicatively coupled with a host unit in a multi-point to point configuration, the transceiver configured to communicate with the host unit via an orthogonal frequency division multiplexing waveform;

a multi-carrier modem coupled to the transceiver and configured to demodulate downstream information data from the orthogonal frequency division multiplexing waveform, the multi-carrier modem further configured to modulate upstream information data onto the orthogonal frequency division multiplexing waveform;

wherein the multi-carrier modem modulates upstream information data onto distinct subcarriers of the orthogonal frequency division multiplexing waveform, the multi-carrier modem synchronized with the host unit such that upstream orthogonal frequency division multiplexing signals transmitted by the transceiver and other upstream orthogonal frequency division multiplexing signals received at the host unit combine to a unified orthogonal frequency division multiplexing waveform of adjacent spectrally overlapping carriers at the host unit;

wherein the multi-carrier modem is configured to adjust a round trip path delay between the remote service unit and the host unit based on a path delay correction received from the host unit.

9. The remote service unit of claim 8, wherein the modulator is configured to adjust at least one of a carrier frequency, a carrier amplitude, and a timing of the upstream orthogonal frequency division multiplexing signals transmitted by the transceiver.

10. The remote service unit of claim 8, the transceiver communicatively coupled with the host unit by a distribution network.

11. The remote service unit of claim 8, wherein the distribution network comprises one of a wireless system and a hybrid fiber/coax network.

12. A bi-directional communication system, the system comprising:

a plurality of remote units;

a multipoint-to-point host unit communicatively coupled with the plurality of remote units in a multi-point to point configuration, the multipoint-to-point host unit including a multi-carrier modem configured to communicate with the plurality of remote units using orthogonal frequency division multiplexing (OFDM), wherein upstream OFDM signals from at least two of the plurality of remote units combine to a unified OFDM waveform of adjacent spectrally overlapping carriers at the host unit;

wherein the multipoint-to-point host unit is configured to estimate a round trip path delay correction associated with at least one of the plurality of remote units; and wherein the multipoint-to-point host unit is configured to adjust the round trip path delay associated with the at least one of the plurality of remote units.

13. The system of claim 12, wherein the at least one of the plurality of remote units is configured to adjust a round trip path delay based on the round trip path delay correction estimated by the host unit.

14. The system of claim 12, the plurality of remote units each including a modulator for modulating up to a plurality of tones with upstream information using orthogonal frequency division multiplexing, wherein the modulator is configured to adjust at least one characteristic of the plurality of tones such that when OFDM waveforms are transmitted from the first remote unit and at least one other remote unit of the plurality of remote units, the orthogonality of the unified OFDM waveform when received at the host unit is improved.

15. The system of claim 12, wherein the modulator is configured to adjust at least one of a carrier frequency, a carrier amplitude, and a timing.

16. The system of claim 14, wherein the plurality of tones are received concurrently from at least two of the plurality of remote units.

17. The system of claim 12, further comprising a distribution network coupled between the multipoint-to-point host unit and the plurality of remote units.

18. The system of claim 17, wherein the distribution network comprises one of a wireless system and a hybrid fiber/coax network.

* * * * *